(12) United States Patent
Hayakawa

(10) Patent No.: US 7,212,385 B2
(45) Date of Patent: May 1, 2007

(54) FERROMAGNETIC TUNNEL MAGNETORESISTIVE DEVICES AND MAGNETIC HEAD

(75) Inventor: Jun Hayakawa, Kokubunji (JP)

(73) Assignee: Hitachi Global Storage Technologies Japan, Ltd., Kanagawa-ken (JP)

(*) Notice: Subject to any disclaimer, the term of this patent is extended or adjusted under 35 U.S.C. 154(b) by 0 days.

(21) Appl. No.: 11/486,115

(22) Filed: Jul. 14, 2006

(65) Prior Publication Data

US 2006/0256480 A1 Nov. 16, 2006

Related U.S. Application Data

(60) Division of application No. 11/353,028, filed on Feb. 14, 2006, now Pat. No. 7,099,126, which is a division of application No. 10/958,326, filed on Oct. 6, 2004, now Pat. No. 7,031,111, which is a continuation of application No. 09/942,908, filed on Aug. 31, 2001, now Pat. No. 6,826,023.

(30) Foreign Application Priority Data

Dec. 26, 2000 (JP) .............................. 2000-395843

(51) Int. Cl.
*G11B 5/39* (2006.01)
(52) U.S. Cl. .................................................. 360/324.2

(58) Field of Classification Search ............. 360/324.2, 360/314, 315, 316
See application file for complete search history.

(56) References Cited

U.S. PATENT DOCUMENTS

| | | | |
|---|---|---|---|
| 5,378,885 A | 1/1995 | Jones, Jr. et al. | |
| 6,185,079 B1 * | 2/2001 | Gill | ........................ 360/324.2 |
| 6,191,925 B1 | 2/2001 | Watson | |
| 6,259,586 B1 * | 7/2001 | Gill | ........................ 360/324.2 |
| 6,469,873 B1 | 10/2002 | Maruyama et al. | |
| 6,771,472 B1 * | 8/2004 | Mao et al. | ................ 360/314 |
| 6,819,530 B2 * | 11/2004 | Gill | ............................ 360/314 |
| 6,934,133 B2 * | 8/2005 | Hayakawa et al. | ...... 360/324.2 |
| 2003/0214762 A1 * | 11/2003 | Sharma et al. | ........... 360/324.2 |

FOREIGN PATENT DOCUMENTS

JP 2000-332317 5/1999

* cited by examiner

*Primary Examiner*—Tianjie Chen
(74) *Attorney, Agent, or Firm*—Reed Smith LLP; Stanley P. Fisher, Esq.; Juan Carlos A. Marquez, Esq.

(57) ABSTRACT

The present invention provides a ferromagnetic tunnel magnetoresistive film which is associated with a high output and whose magnetoresistive ratio is less dependent on a bias voltage. In a three-terminal ferromagnetic tunnel magnetoresistive element, a decrease in an output is suppressed by a bias voltage $V_1$ applied to one of the tunnel junctions. By employing half-metallic ferromagnets 11 and 12 in the element, the output can be enhanced and the dependency on the applied bias voltage can be reduced.

4 Claims, 115 Drawing Sheets

FERROMAGNETIC TUNNEL MAGNETORESISTIVE DEVICES AND MAGNETIC HEAD

CROSS-REFERENCE TO RELATED APPLICATIONS

This application is a Divisional application of U.S. application Ser. No. 11/353,028 filed Feb. 14, 2006, now U.S. Pat. No. 7,009,126 which is a Divisional application of U.S. application Ser. No. 10/958,326 filed Oct. 6, 2004, now U.S. Pat. No. 7,031,111 which is a Continuation application of U.S. application Ser. No. 09/942,908 filed on Aug. 31, 2001 now U.S. Pat. No. 6,826,023. Priority is claimed based on U.S. application Ser. No. 11/353,028 filed Feb. 14, 2006, which claims priority to U.S. application Ser. No. 10/958, 326 filed Oct. 6, 2004, which claims priority to U.S. application Ser. No. 09/942,908 filed on Aug. 31, 2001, which claims priority to Japanese Patent Application No. 2000-395843 filed on Dec. 26, 2000, all of which is incorporated by reference.

BACKGROUND OF THE INVENTION

1. Field of the Invention

The present invention relates to a ferromagnetic tunnel magnetoresistive element and a magnetic head using the same.

2. Description of Related Prior Art

Conventionally, ferromagnetic tunnel magnetoresistive (TMR) elements have been proposed as one type of magnetoresistive elements. JP-A-10-4227 describes a magnetic head using a TMR element. However, the magnetoresistance of such a conventional TMR element depends greatly on an applied voltage where a TMR ratio becomes lower as a voltage is applied. In order to employ the TMR element in a magnetic head or a magnetic memory, it is necessary to increase the output while decreasing the dependency thereof on the applied voltage. An increase in the output can be achieved by applying a half-metallic ferromagnet whose degree of spin-polarization is higher than that of a magnetic ferromagnet used in the conventional TMR element. An attempt to increase a TMR ratio in a TMR element using a material associated with a high degree of spin-polarization ($La_{0.7}Sr_{0.3}MnO_3/SrTiO_3/La_{0.7}Sr_{0.3}MnO_3$) is described in *Europhysics Letters*, 39(5), pp. 545–549 (1997). *Physical Review Letters* describes that 40% to 50% TMR ratio can be obtained up to an applied voltage of about 1 V in $Co/SrTiO_3/La_{0.7}Sr_{0.3}MnO_3$.

SUMMARY OF THE INVENTION

There has been no solution to the decrease in the TMR ratio as well as its dependency on an applied bias voltage. Thus, the present invention has an objective of providing a ferromagnetic tunnel magnetoresistive element whose output is higher and whose magnetoresistive ratio is less dependent on an applied bias voltage compared to conventional elements. In addition, the present invention has an objective of providing a magnetoresistive magnetic head and a magnetic memory device using such a ferromagnetic tunnel magnetoresistive element.

The degree of spin-polarization (P) of electrons is generally understood as a difference between the numbers (densities of states) of electrons in different rotation directions (about their own axes) (where a clockwise spin is referred to as a downward spin and an anticlockwise spin as an upward spin). For example, the degree of spin-polarization P=0.8 indicates that the number of upward spins is nine times higher than that of downward spins.

A half-metallic ferromagnet is a completely polarized ferromagnet having a gap of densities of states of upward and downward $3d$ electronic spins of about 1 eV. Fermi energy ($E_F$) is present across either one of the densities of state. Since electrons in charge of electronic transport exist at around the Fermi energy, only one of the spins will have a transport property. Thus, the degree of spin-polarization (P) in a half-metallic ferromagnet is 1. On the other hand, ferromagnetic metals such as Co (Co-based alloy), Fe (Fe-based alloy) and Ni (Ni-based alloy) have a degree of polarization of about 0.4, with no gap in the 3d band, and with both upward and downward spins present at Fermi energy.

The magnetoresistance (TMR ratio) of a TMR element may be represented as $2P_1P_2/(1-P_1P_2)$ using the above-mentioned degree of spin-polarization P, where $P_1$ and $P_2$ are degrees of spin-polarization of two respective ferromagnetic layers sandwiching an insulating barrier layer of the TMR element. In order to obtain a high TMR ratio, a half-metallic ferromagnet with a high degree of spin-polarization P ($Fe_3O_4$, $CrO_2$, etc.) is advantageously used.

The dependency of the TMR element on an applied bias voltage is known to depend on profiles of the densities of states at interfaces of the two ferromagnetic layers with the insulating barrier layer, within the barrier height. Accordingly, a desirable bias voltage dependency of a TMR ratio can be obtained by appropriately combining the insulating barrier layer with the ferromagnetic layers of the TMR element.

Basically, the present invention has a three-terminal structure including upper ferromagnetic layer/insulating barrier layer/intermediate ferromagnetic layer/insulating barrier layer/lower ferromagnetic layer, each ferromagnetic layer having an electrode terminal. Two electric closed-circuits (for example, a closed-circuit between the upper ferromagnetic layer and the lower ferromagnetic layer, and a closed-circuit between the intermediate ferromagnetic layer and the lower ferromagnetic layer) are provided to vary the bias voltage applied to the tunnel element in one of the closed-circuits, thereby decreasing the bias voltage dependency of a magnetoresistive ratio in the other closed-circuit.

Specifically, the objective of the present invention can be achieved with the following ferromagnetic tunnel magnetoresistive elements.

(1) A ferromagnetic tunnel magnetoresistive element, comprising: a first ferromagnetic layer; a first insulating barrier layer formed on the first ferromagnetic layer; a second ferromagnetic layer formed on the first insulating barrier layer; a second insulating barrier layer formed on the second ferromagnetic layer; and a third ferromagnetic layer formed on the second insulating barrier layer, wherein the element further comprises a terminal for applying a first bias voltage between the first ferromagnetic layer and the third ferromagnetic layer, and a terminal for applying a second bias voltage between the second ferromagnetic layer and the first or third ferromagnetic layer.

(2) A ferromagnetic tunnel magnetoresistive element according to (1), further comprising a first antiferromagnetic layer under the first ferromagnetic layer for fixing the magnetization direction of the first ferromagnetic layer, and a second antiferromagnetic layer on the third ferromagnetic layer for fixing the magnetization direction of the third ferromagnetic layer.

(3) A ferromagnetic tunnel magnetoresistive element according to either one of (1) and (2), wherein the second ferromagnetic layer is formed of a lamination of three ferromagnetic metal layers.

(4) A ferromagnetic tunnel magnetoresistive element according to (1), wherein each of the first and second ferromagnetic layers is formed of a lamination of two ferromagnetic metal layers.

(5) A ferromagnetic tunnel magnetoresistive element according to any one of (1) to (4), wherein at least one of the first, second and third ferromagnetic layers makes contact with a non-magnetic metal layer.

The objective of the present invention can also be achieved with the following magnetic head.

(6) A magnetic head provided with a magnetoresistive element comprising: a first ferromagnetic layer; a first insulating barrier layer formed on the first ferromagnetic layer; a second ferromagnetic layer formed on the first insulating barrier layer; a second insulating barrier layer formed on the second ferromagnetic layer; and a third ferromagnetic layer formed on the second insulating barrier layer, wherein the element further comprises a terminal for applying a first bias voltage between the first ferromagnetic layer and the third ferromagnetic layer, and a terminal for applying a second bias voltage between the second ferromagnetic layer and the first or third ferromagnetic layer.

(7) A magnetic head according to (6), wherein the element further comprises a first antiferromagnetic layer under the first ferromagnetic layer for fixing the magnetization direction of the first ferromagnetic layer, and a second antiferromagnetic layer on the third ferromagnetic layer for fixing the magnetization direction of the third ferromagnetic layer.

(8) A magnetic head according to either one of (6) and (7), wherein the second ferromagnetic layer is formed of a lamination of three ferromagnetic metal layers.

(9) A magnetic head according to (6), wherein each of the first and second ferromagnetic layers is formed of a lamination of two ferromagnetic metal layers.

(10) A magnetic head according to any one of (6) to (9), wherein at least one of the first, second and third ferromagnetic layers makes contact with a non-magnetic metal layer.

Furthermore, the objective of the present invention can be achieved with the following ferromagnetic tunnel magnetoresistive element.

(11) A ferromagnetic tunnel magnetoresistive element, comprising: a first half-metallic ferromagnetic layer; a first insulating barrier layer formed on the first half-metallic ferromagnetic layer; a ferromagnetic metal layer formed on the first insulating barrier layer; a second insulating barrier layer formed on the ferromagnetic metal layer; and a second half-metallic ferromagnetic layer formed on the second insulating barrier layer, wherein the element further comprises a terminal for applying a first bias voltage between the first half-metallic ferromagnetic layer and the second half-metallic ferromagnetic layer, and a terminal for applying a second bias voltage between the ferromagnetic metal layer and the first or second half-metallic ferromagnetic layer.

(12) A ferromagnetic tunnel magnetoresistive element according to (11), further comprising a first antiferromagnetic layer under the first half-metallic ferromagnetic layer for fixing the magnetization direction of the first half-metallic ferromagnetic layer, and a second antiferromagnetic layer on the second half-metallic ferromagnetic layer for fixing the magnetization direction of the second half-metallic ferromagnetic layer.

(13) A ferromagnetic tunnel magnetoresistive element according to either one of (11) and (12), wherein the ferromagnetic metal layer is formed of a lamination of three ferromagnetic metal layers.

(14) A ferromagnetic tunnel magnetoresistive element, comprising: a first ferromagnetic metal layer; a first insulating barrier layer formed on the first ferromagnetic metal layer; a half-metallic ferromagnetic layer formed on the first insulating barrier layer; a second insulating barrier layer formed on the half-metallic ferromagnetic layer; and a second ferromagnetic metal layer formed on the second insulating barrier layer, wherein the element further comprises a terminal for applying a first bias voltage between the first ferromagnetic metal layer and the second ferromagnetic metal layer, and a terminal for applying a second bias voltage between the half-metallic ferromagnetic layer and the first or second ferromagnetic metal layer.

(15) A ferromagnetic tunnel magnetoresistive element according to (14), wherein each of the first and second ferromagnetic metal layers has a lamination of two ferromagnetic metal layers.

(16) A ferromagnetic tunnel magnetoresistive element according to (14), further comprising a first antiferromagnetic layer under the first ferromagnetic metal layer for fixing the magnetization direction of the first ferromagnetic metal layer, and a second antiferromagnetic layer on the second ferromagnetic metal layer for fixing the magnetization direction of the second ferromagnetic metal layer.

(17) A ferromagnetic tunnel magnetoresistive element according to any one of (11) to (16), wherein the half-metallic ferromagnetic layer is an oxide or a compound comprising Fe, Co or Mn.

(18) A ferromagnetic tunnel magnetoresistive element, comprising: a first antiferromagnetic layer; a half-metallic ferromagnetic layer formed on the first antiferromagnetic layer; a first insulating barrier layer formed on the first half-metallic ferromagnetic layer; a first ferromagnetic metal layer formed on the first insulating barrier layer; a second insulating barrier layer formed on the first ferromagnetic metal layer; a second ferromagnetic metal layer formed on the second insulating barrier layer; and a second antiferromagnetic layer formed on the second ferromagnetic metal layer, wherein the element further comprises a terminal for applying a first bias voltage between the half-metallic ferromagnetic layer and the second ferromagnetic metal layer, and a terminal for applying a second bias voltage between the first ferromagnetic metal layer and the half-metallic ferromagnetic layer or the second ferromagnetic metal layer.

(19) A ferromagnetic tunnel magnetoresistive element according to (18), wherein the first ferromagnetic metal layer is formed of a lamination of three ferromagnetic metal layers.

(20) A ferromagnetic tunnel magnetoresistive element, comprising: a first antiferromagnetic layer; a first ferromagnetic metal layer formed on the first antiferromagnetic layer; a first insulating barrier layer formed on the first ferromagnetic metal layer; a second ferromagnetic metal layer formed on the first insulating barrier layer; a second insulating barrier layer formed on the second ferromagnetic metal layer; a third ferromagnetic metal layer formed on the second insulating barrier layer; and a second antiferromagnetic layer formed on the third ferromagnetic metal layer, wherein the element further comprises a terminal for applying a first bias voltage between the first ferromagnetic metal layer and the third ferromagnetic metal layer, and a terminal for applying a second bias voltage between the second ferromagnetic metal layer and the first or third ferromagnetic metal layer.

(21) A ferromagnetic tunnel magnetoresistive element according to any one of (11) to (20), wherein each of the first and second insulating barrier layers is made of an oxide or a compound comprising at least one of Al, Mg, Ti, Ta, Hf, Nb, Mo, Cr, Ga and As.

The objective of the present invention can also be achieved with the following magnetic head.

(22) A magnetic head provided with a magnetoresistive element comprising: a first half-metallic ferromagnetic layer; a first insulating barrier layer formed on the first half-metallic ferromagnetic layer; a ferromagnetic metal layer formed on the first insulating barrier layer; a second insulating barrier layer formed on the ferromagnetic metal layer; and a second half-metallic ferromagnetic layer formed on the second insulating barrier layer, wherein the element further comprises a terminal for applying a first bias voltage between the first and second half-metallic ferromagnetic layers, and a terminal for applying a second bias voltage between the ferromagnetic metal layer and the first or second half-metallic ferromagnetic layer.

(23) A magnetic head according to (22), wherein the element further comprises a first antiferromagnetic layer under the first half-metallic ferromagnetic layer for fixing the magnetization direction of the first half-metallic ferromagnetic layer, and a second antiferromagnetic layer on the second half-metallic ferromagnetic layer for fixing the magnetization direction of the second half-metallic ferromagnetic layer.

(24) A magnetic head according to either one of (22) and (23), wherein the ferromagnetic metal layer is formed of a lamination of three ferromagnetic metal layers.

(25) A magnetic head provided with a magnetoresistive element comprising: a first ferromagnetic metal layer; a first insulating barrier layer formed on the first ferromagnetic metal layer; a half-metallic ferromagnetic layer formed on the first insulating barrier layer; a second insulating barrier layer formed on the half-metallic ferromagnetic layer; and a second ferromagnetic layer formed on the second insulating barrier layer, wherein the element further comprises a terminal for applying a first bias voltage between the first ferromagnetic metal layer and the second ferromagnetic metal layer, and a terminal for applying a second bias voltage between the half-metallic ferromagnetic layer and the first or second ferromagnetic metal layer.

(26) A magnetic head according to (25), wherein each of the first and second ferromagnetic metal layers is formed of a lamination of two ferromagnetic metal layers.

(27) A magnetic head according to (25), wherein the element further comprises a first antiferromagnetic layer under the first ferromagnetic metal layer for fixing the magnetization direction of the first ferromagnetic metal layer, and a second antiferromagnetic layer on the second ferromagnetic metal layer for fixing the magnetization direction of the second ferromagnetic metal layer.

(28) A magnetic head according to any one of (22) to (27), wherein the half-metallic ferromagnetic layer is an oxide or a compound comprising Fe, Co or Mn.

(29) A magnetic head provided with a magnetoresistive element comprising: a first antiferromagnetic layer; a half-metallic ferromagnetic layer formed on the first antiferromagnetic layer; a first insulating barrier layer formed on the first half-metallic ferromagnetic layer; a first ferromagnetic metal layer formed on the first insulating barrier layer; a second insulating barrier layer formed on the first ferromag- netic metal layer; a second ferromagnetic metal layer formed on the second insulating barrier layer; and a second antiferromagnetic layer formed on the second ferromagnetic metal layer, wherein the element further comprises a terminal for applying a first bias voltage between the half-metallic ferromagnetic layer and the second ferromagnetic metal layer, and a terminal for applying a second bias voltage between the first ferromagnetic metal layer and the half-metallic ferromagnetic layer or the second ferromagnetic metal layer.

(30) A magnetic head according to (29), wherein the first ferromagnetic metal layer is formed of a lamination of three ferromagnetic metal layers.

(31) A magnetic head provided with a magnetoresistive element comprising: a first antiferromagnetic layer; a first ferromagnetic metal layer formed on the first antiferromagnetic layer; a first insulating barrier layer formed on the first ferromagnetic metal layer; a second ferromagnetic metal layer formed on the first insulating barrier layer; a second insulating barrier layer formed on the second ferromagnetic metal layer; a third ferromagnetic metal layer formed on the second insulating barrier layer; and a second antiferromagnetic layer formed on the third ferromagnetic metal layer, wherein the element further comprises a terminal for applying a first bias voltage between the first ferromagnetic metal layer and the third ferromagnetic metal layer, and a terminal for applying a second bias voltage between the second ferromagnetic metal layer and the first or third ferromagnetic metal layer.

(32) A magnetic head according to any one of (22) to (31), wherein each of the first and second insulating barrier layers is made of an oxide or a compound comprising at least one of Al, Mg, Ti, Ta, Hf, Nb, Mo, Cr, Ga and As.

In using the ferromagnetic tunnel magnetoresistive element, a current is provided in a thickness direction of the layers.

Moreover, the ferromagnetic tunnel magnetoresistive element is preferably formed on an alignment film. Examples of the alignment film include an oxide or a compound containing at least one of Ni, Zr, Zn, Al, Mg, Ti, Ta, Hf, Nb, Mo, Cr and Co.

BRIEF DESCRIPTION OF THE DRAWINGS

FIG. 2A shows a $V_1$ dependency of a magnetoresistive ratio of the three-terminal ferromagnetic tunnel element shown in FIG. 1 where $V_2=0$, while FIG. 2B shows a $V_2$ dependency of a magnetoresistive ratio of the three-terminal ferromagnetic tunnel element shown in FIG. 1 where $V_1=V_1'$;

FIG. 19A shows a $V_1$ dependency of a magnetoresistive ratio of the three-terminal ferromagnetic tunnel element shown in FIG. 18 where $V_2=0$, while FIG. 19B shows a $V_2$ dependency of a magnetoresistive ratio of the three-terminal ferromagnetic tunnel element shown in FIG. 18 where $V_1=V_1'$;

FIG. 36A shows a $V_1$ dependency of a magnetoresistive ratio of the three-terminal ferromagnetic tunnel element shown in FIG. 35 where $V_2=0$, while FIG. 36B shows a $V_2$ dependency of a magnetoresistive ratio of the three-terminal ferromagnetic tunnel element shown in FIG. 35 where $V_1=V_1'$;

FIG. 101A shows a $V_1$ dependency of a magnetoresistive ratio of the three-terminal ferromagnetic tunnel element shown in FIG. 100 where $V_2=0$, while FIG. 101B shows a $V_2$ dependency of a magnetoresistive ratio of the three-terminal ferromagnetic tunnel element shown in FIG. 100 where $V_1=V_1'$;

FIG. 120 is a schematic cross-sectional view showing other example of a three-terminal ferromagnetic tunnel element of the invention;

FIG. 121 is a schematic cross-sectional view showing other example of a three-terminal ferromagnetic tunnel element of the invention;

FIG. 122 is a schematic cross-sectional view showing other example of a three-terminal ferromagnetic tunnel element of the invention;

FIG. 123 is a schematic cross-sectional view showing other example of a three-terminal ferromagnetic tunnel element of the invention;

FIG. 124 is a schematic cross-sectional view showing other example of a three-terminal ferromagnetic tunnel element of the invention;

FIG. 125 is a schematic cross-sectional view showing other example of a three-terminal ferromagnetic tunnel element of the invention;

FIG. 126 is a schematic cross-sectional view showing other example of a three-terminal ferromagnetic tunnel element of the invention;

FIG. 127 is a schematic cross-sectional view showing other example of a three-terminal ferromagnetic tunnel element of the invention;

FIG. 128 is a schematic cross-sectional view showing other example of a three-terminal ferromagnetic tunnel element of the invention;

FIG. 129 is a schematic cross-sectional view showing other example of a three-terminal ferromagnetic tunnel element of the invention;

FIG. 130 is a schematic cross-sectional view showing other example of a three-terminal ferromagnetic tunnel element of the invention;

FIG. 131 is a schematic cross-sectional view showing other example of a three-terminal ferromagnetic tunnel element of the invention;

Figure 132:
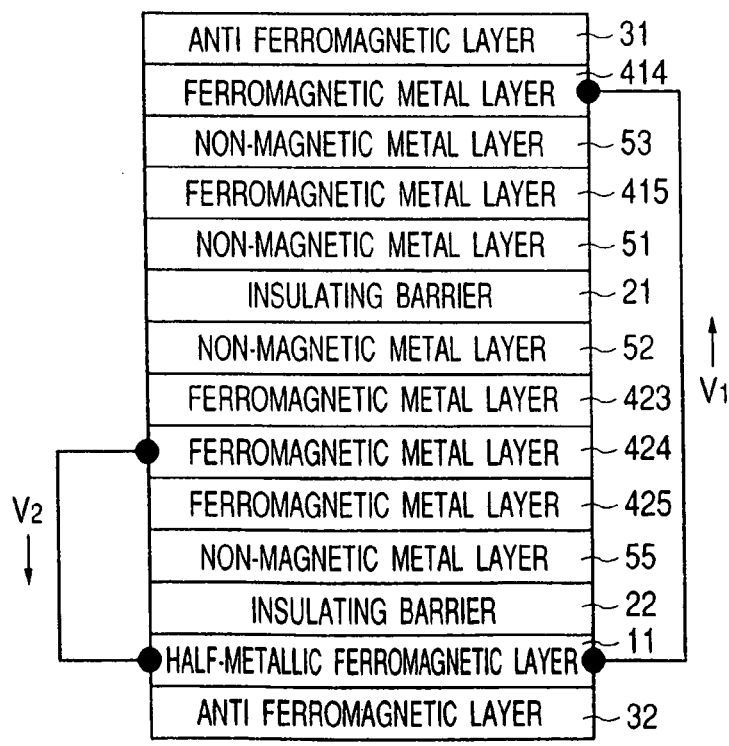
Figure 133:
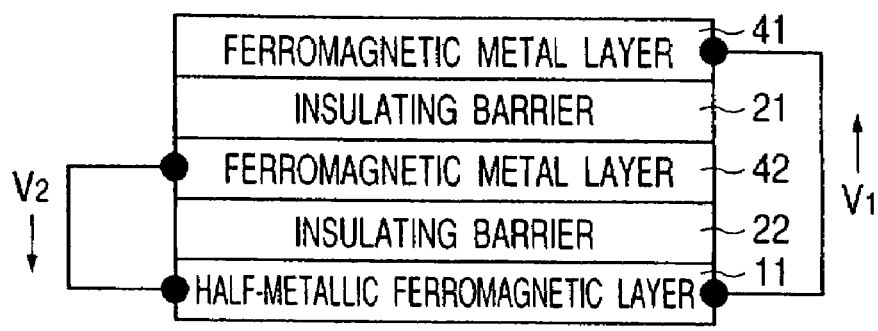
Figure 134:
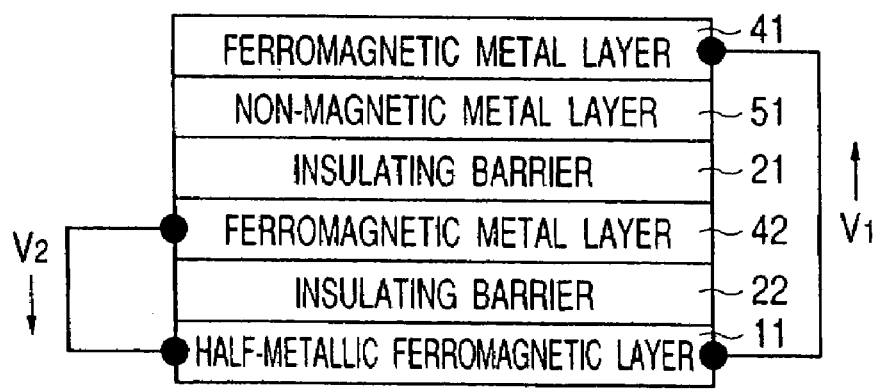
Figure 135:
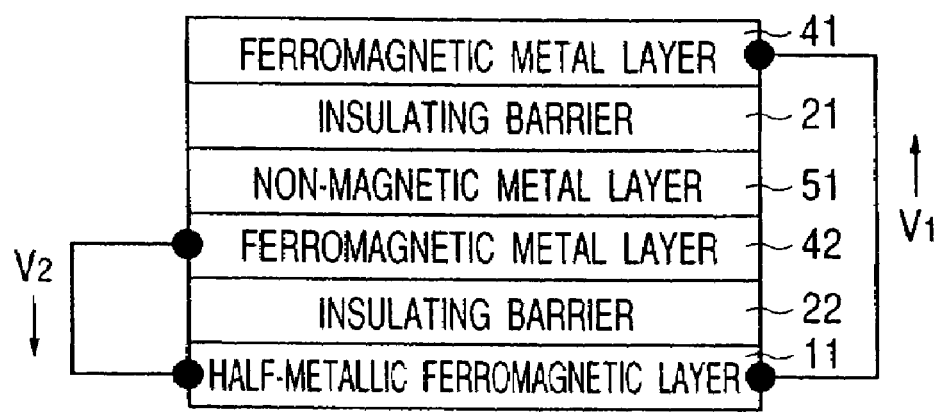
Figure 136:
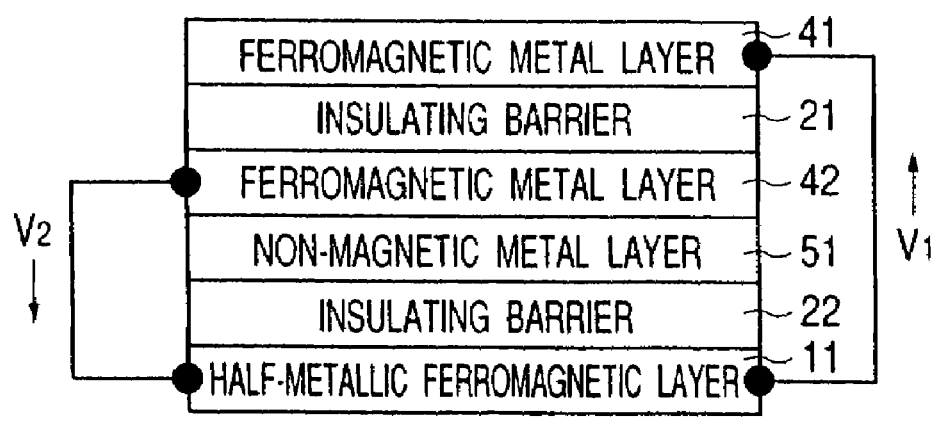
Figure 137:
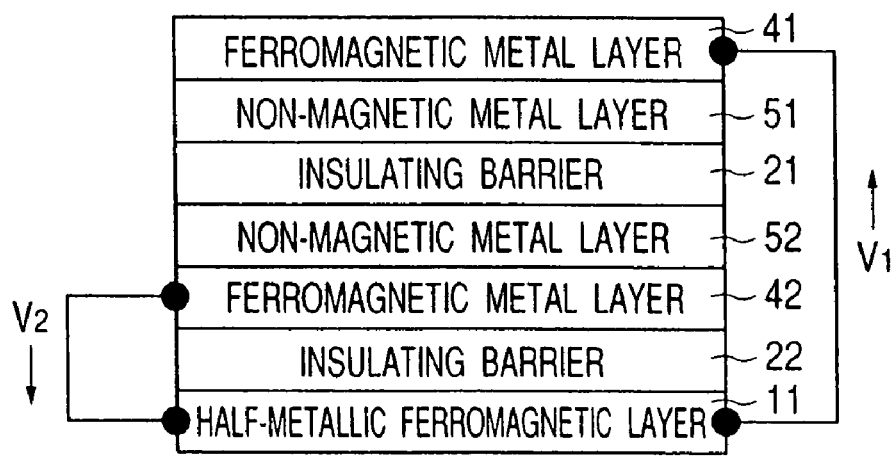
Figure 138:
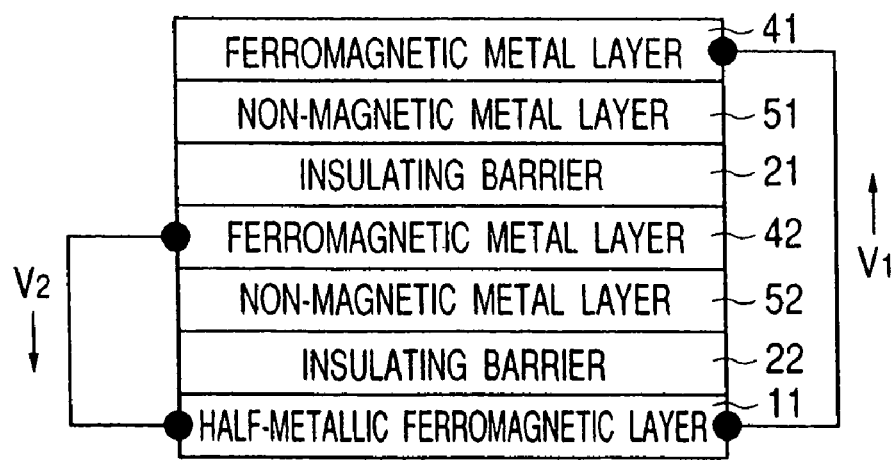
Figure 139:
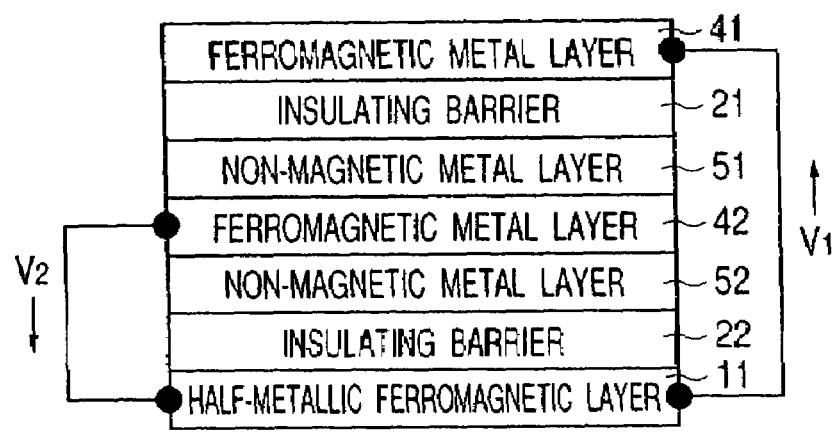
Figure 140:
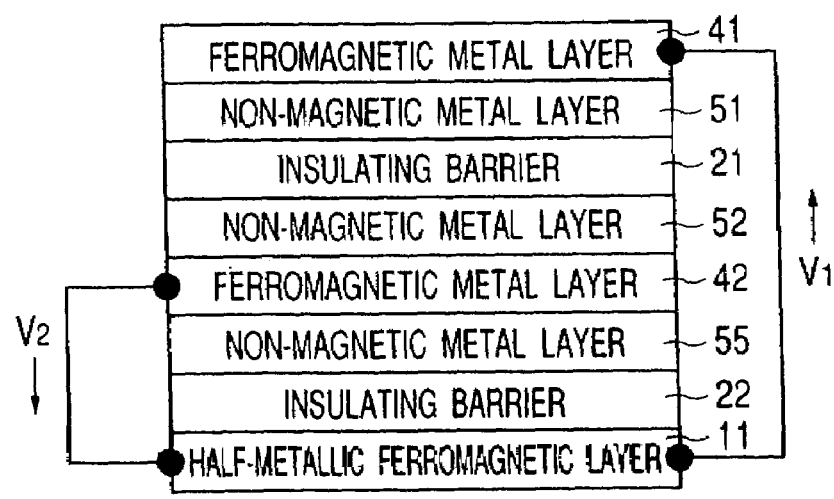
Figure 141:
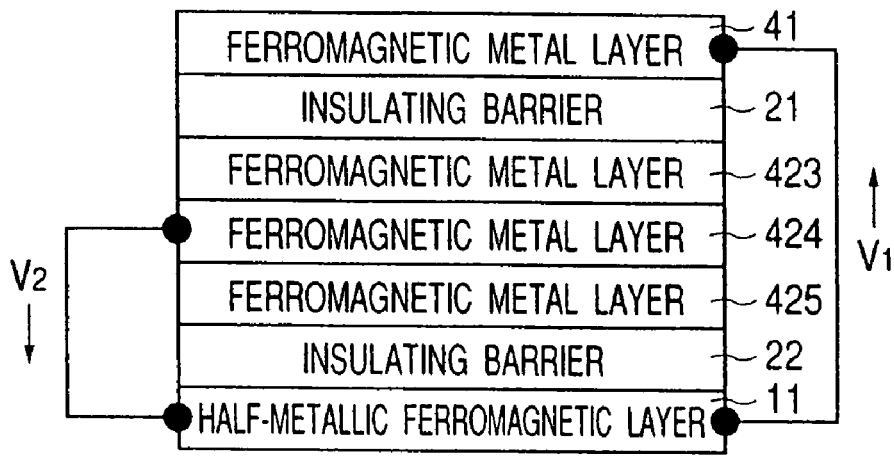
Figure 142:
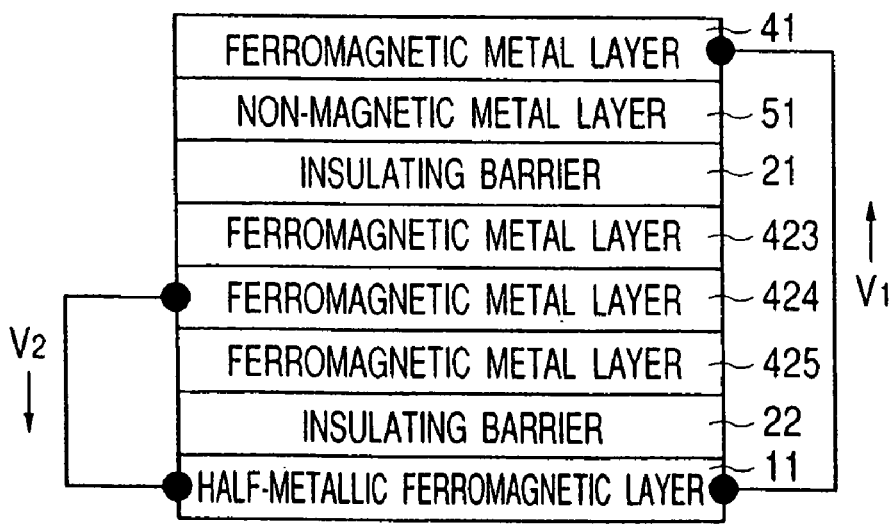
Figure 143:
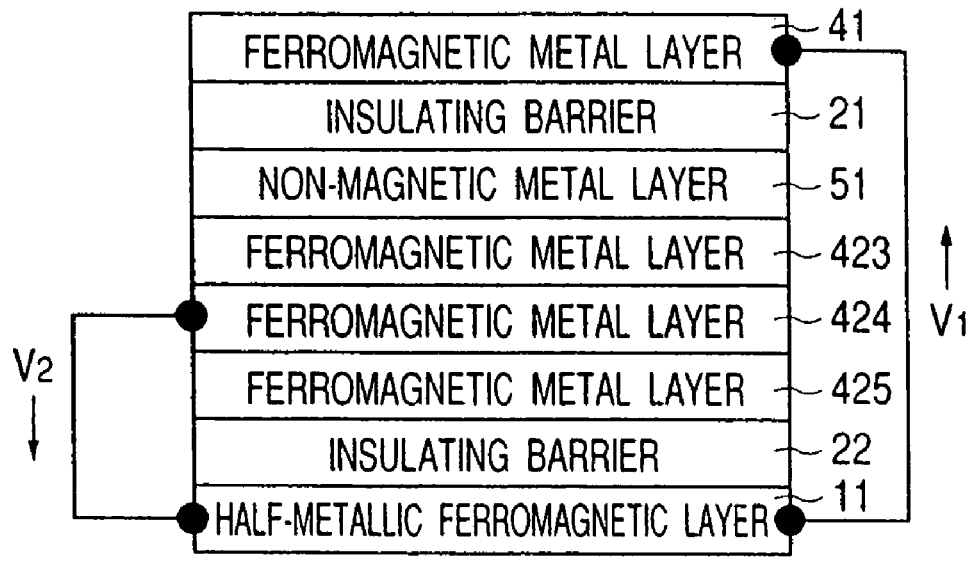
Figure 144:
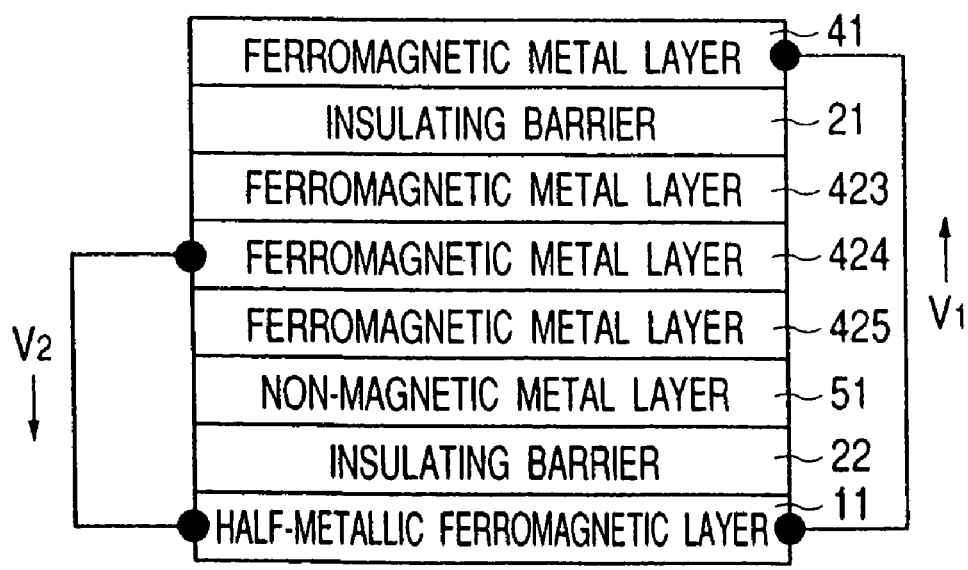
Figure 145:
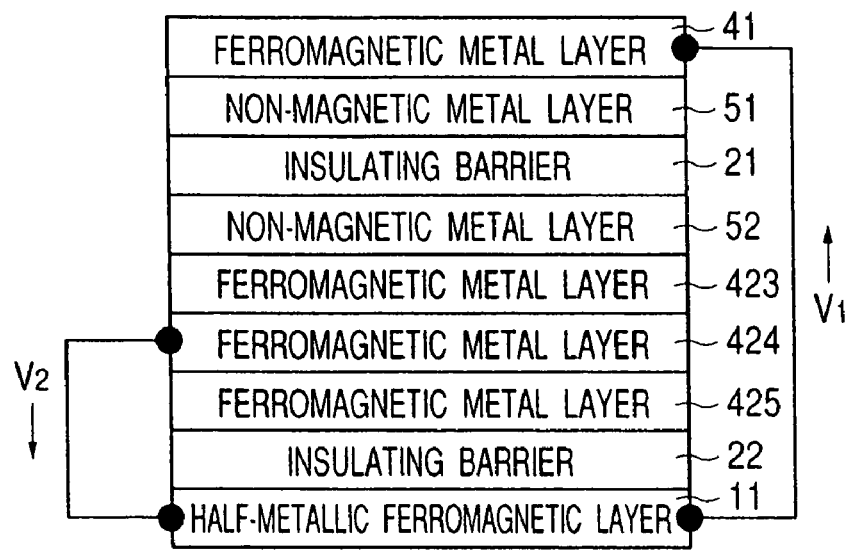
Figure 146:
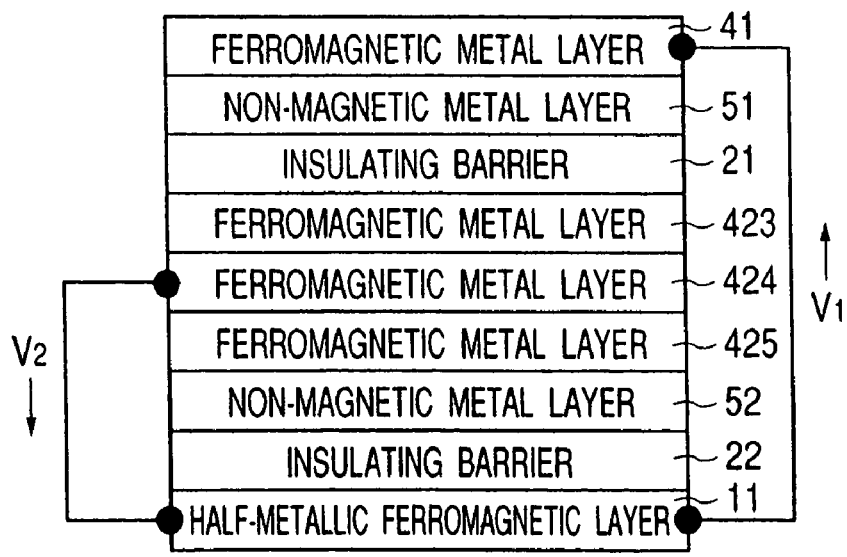
Figure 147:
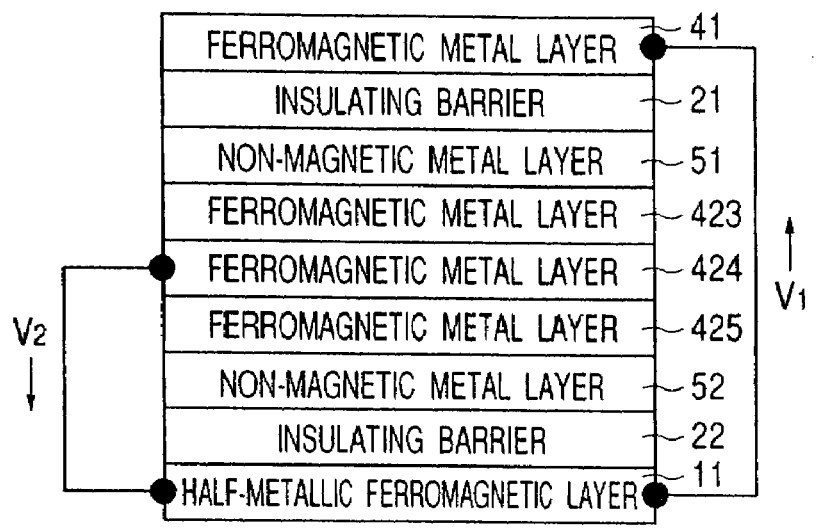
Figure 148:
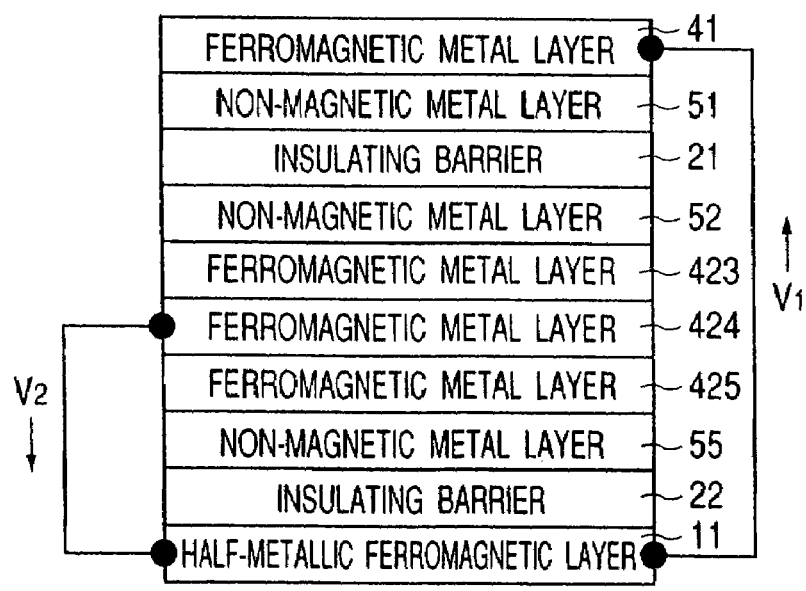
Figure 149:
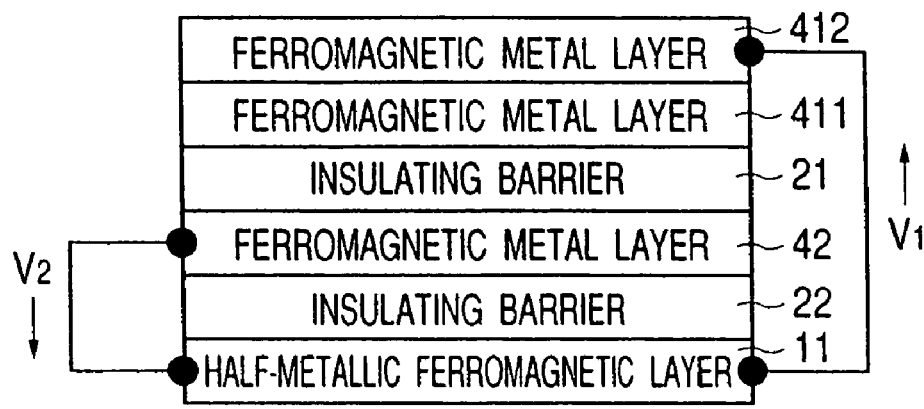
Figure 150:
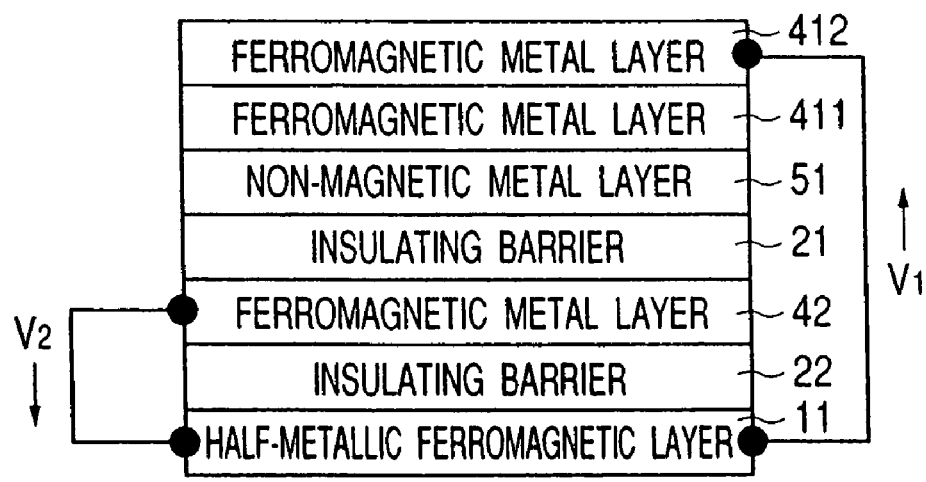
Figure 151:
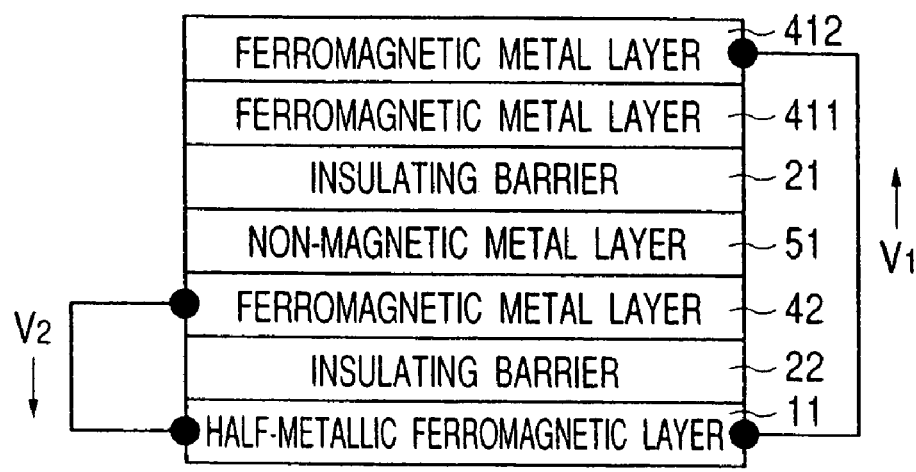
Figure 152:
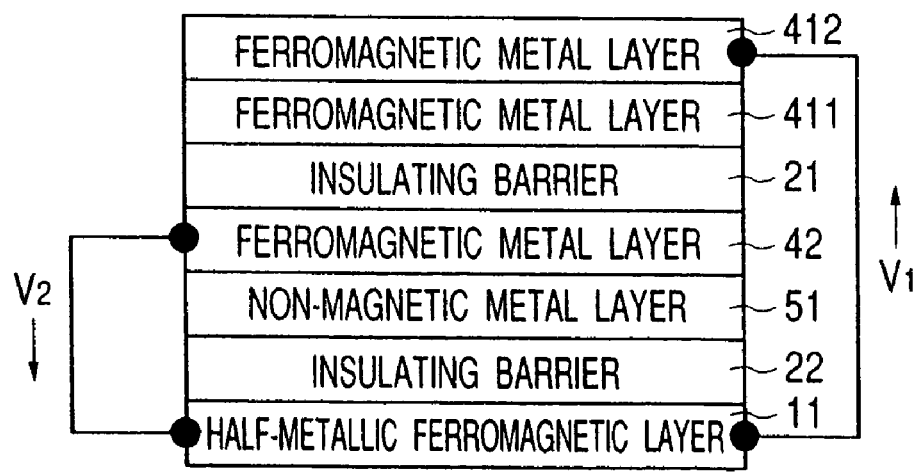
Figure 153:
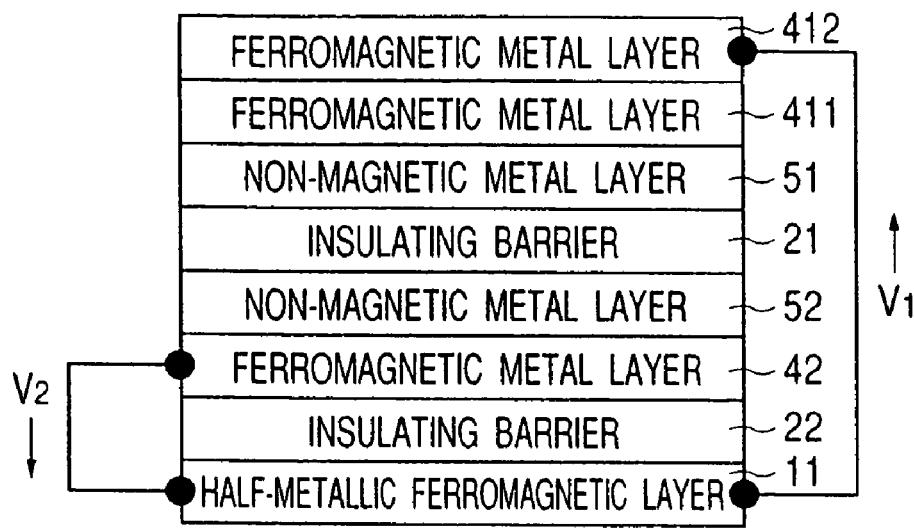
Figure 154:
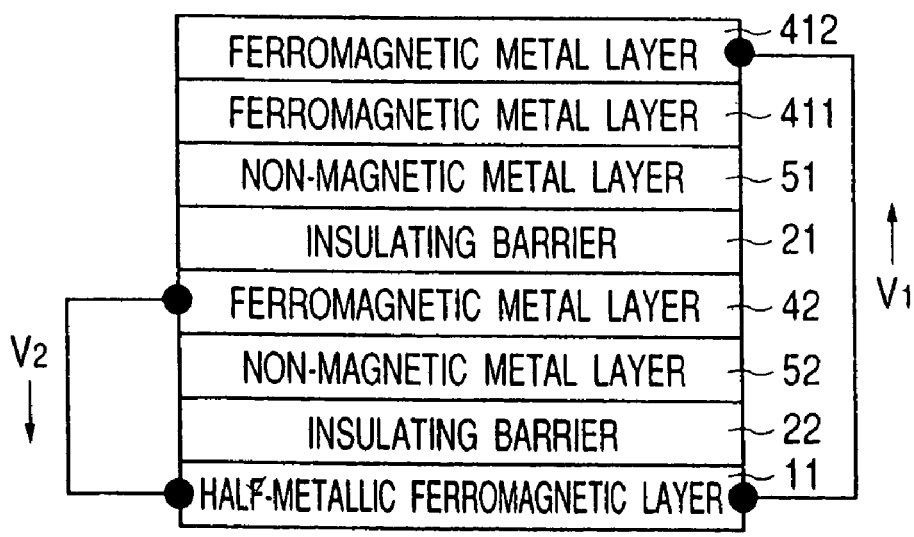
Figure 155:
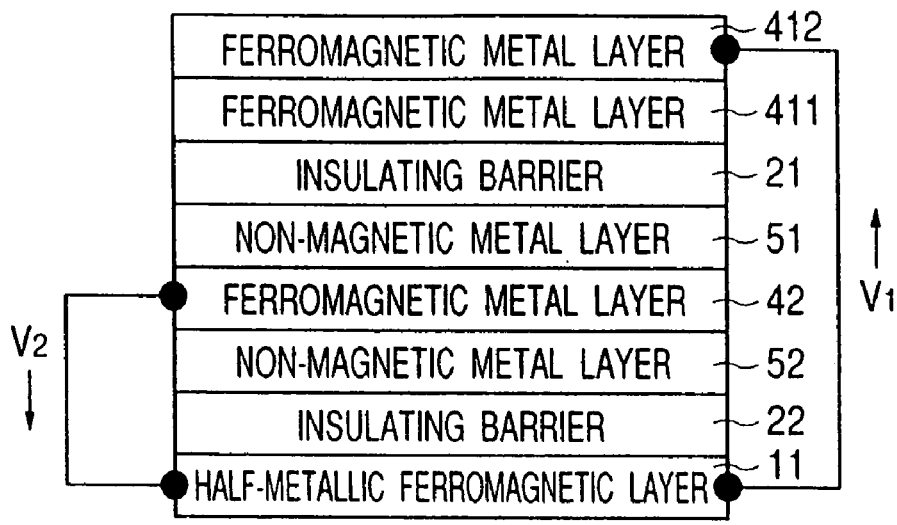
Figure 156:
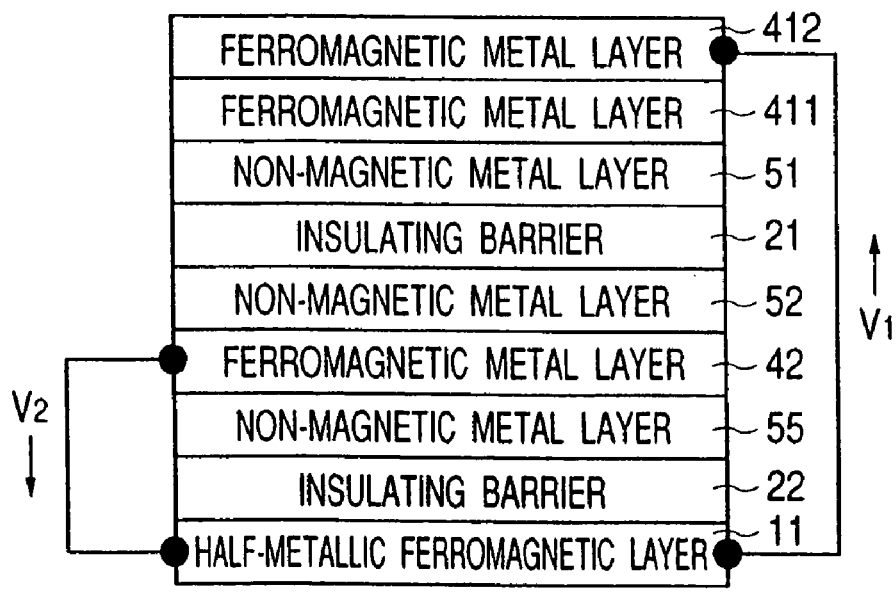
Figure 157:
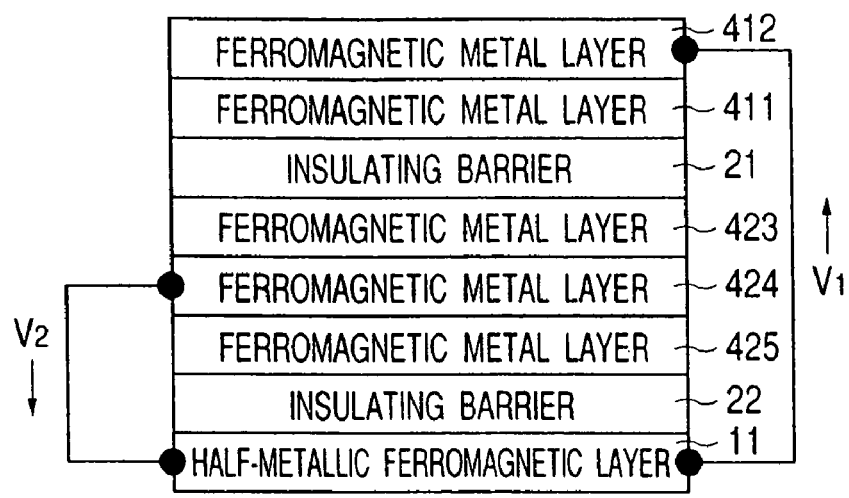
Figure 158:
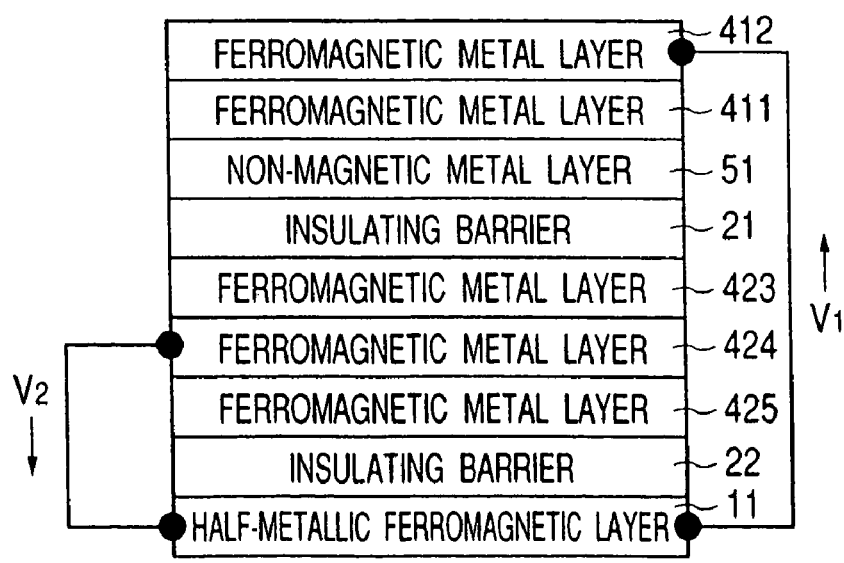
Figure 159:
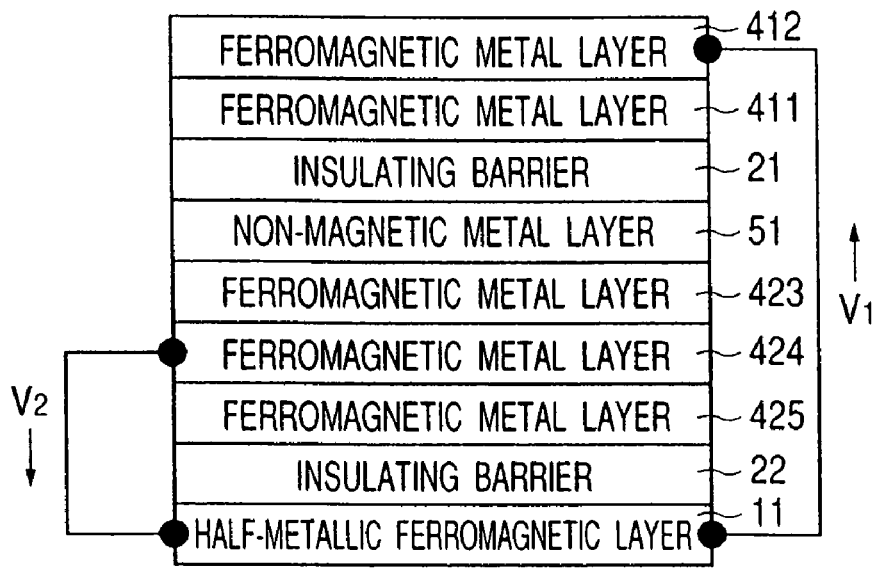
Figure 160:
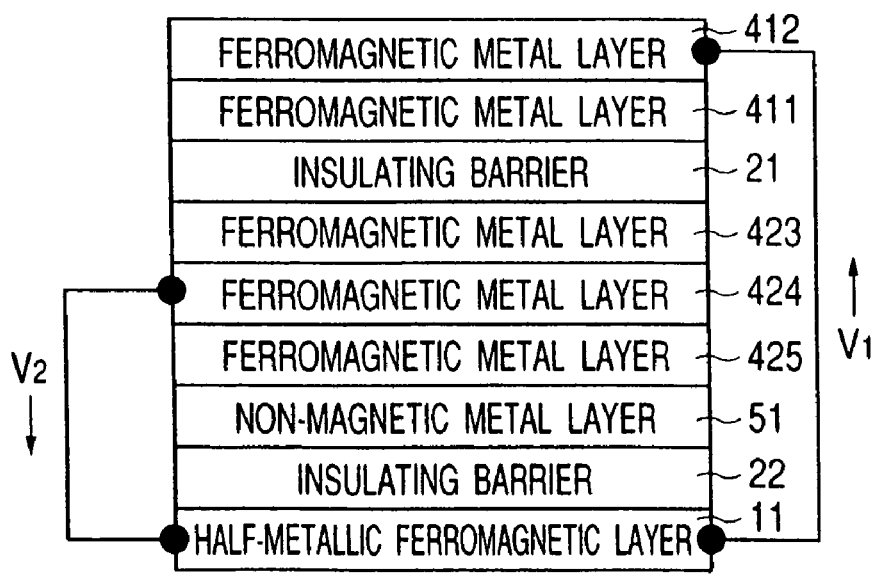
Figure 161:
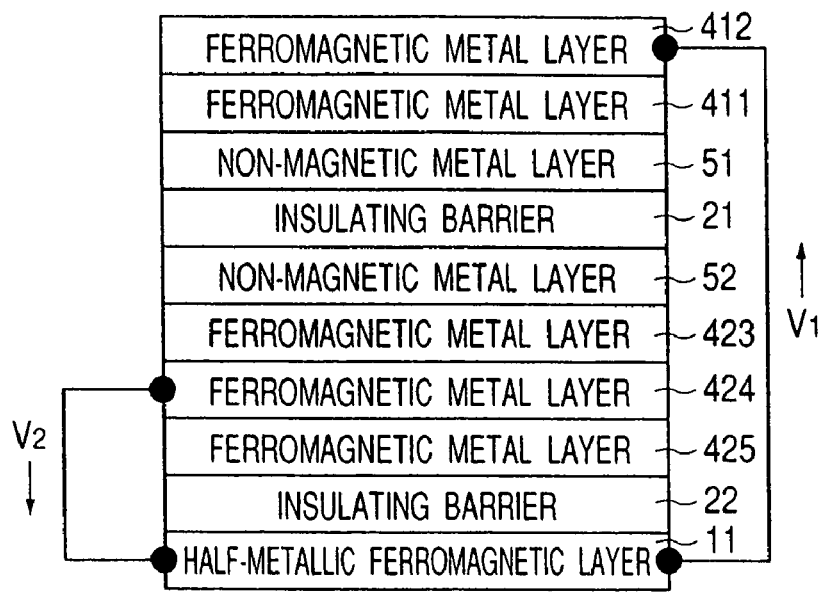
Figure 162:
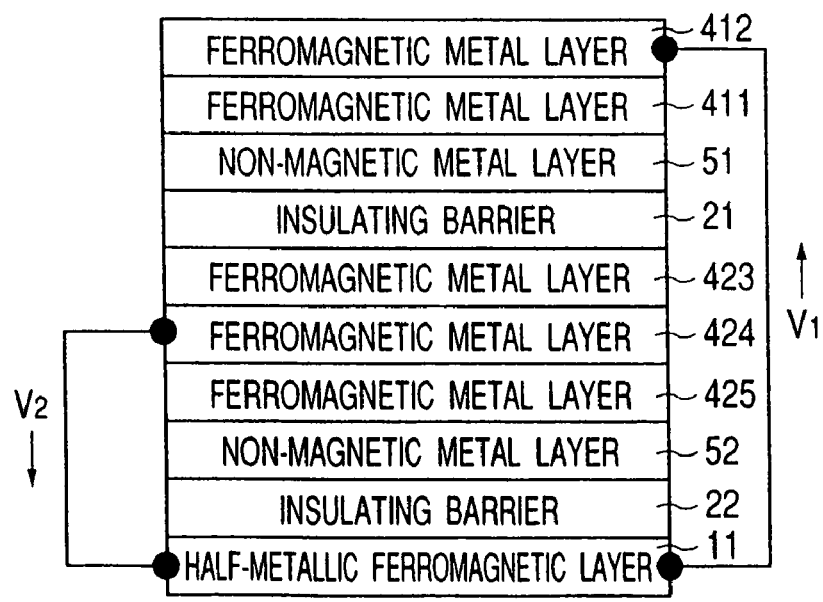
Figure 163:
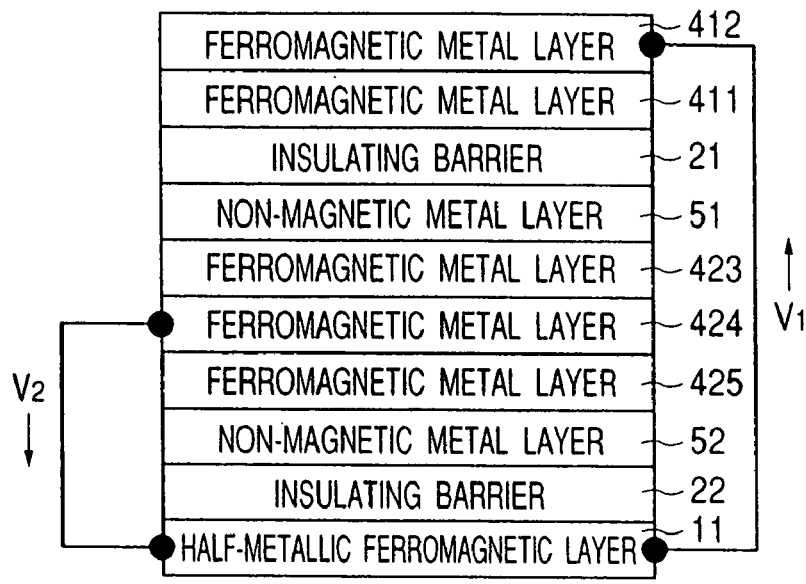
Figure 164:
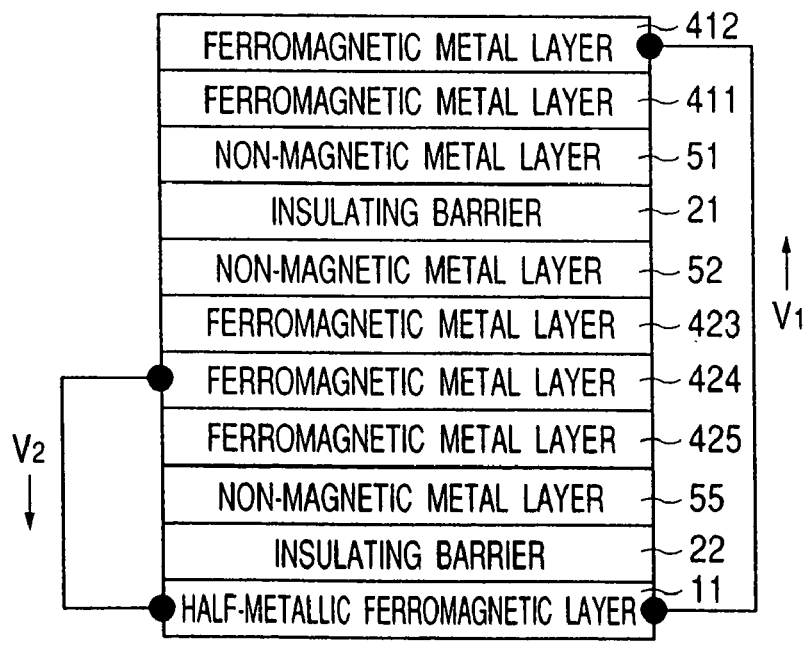
Figure 165:
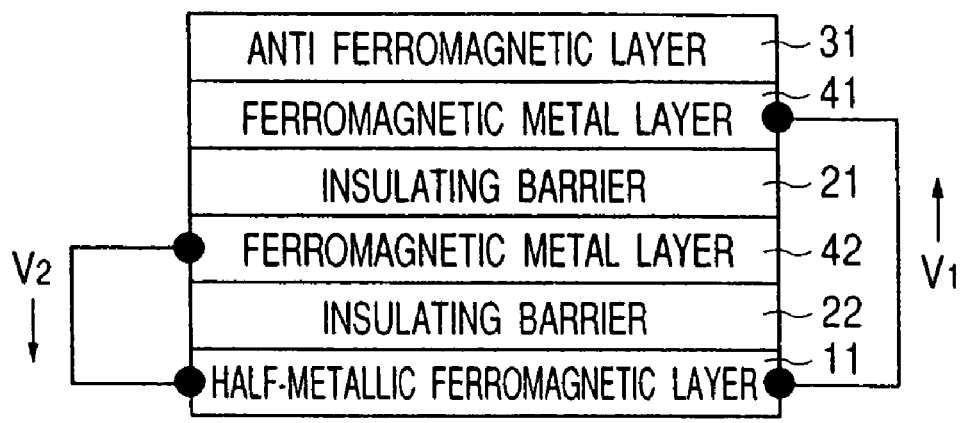
Figure 166:
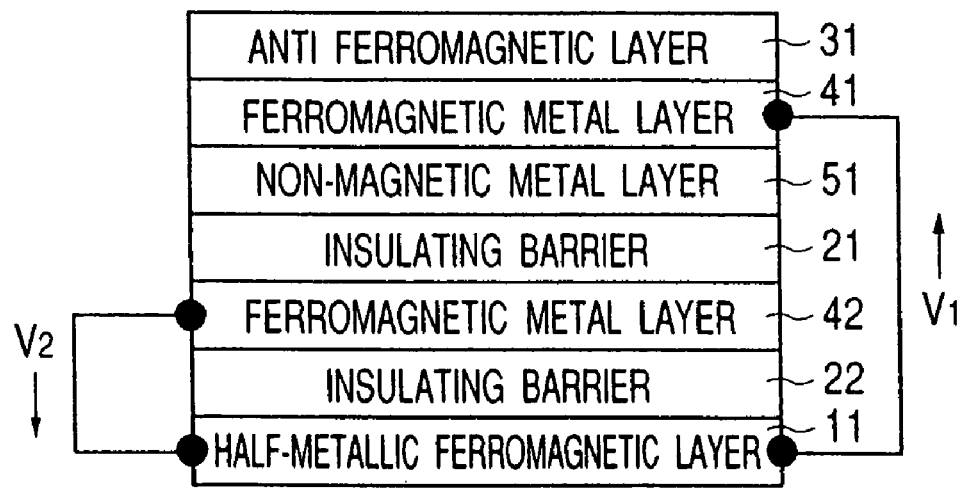
Figure 167:
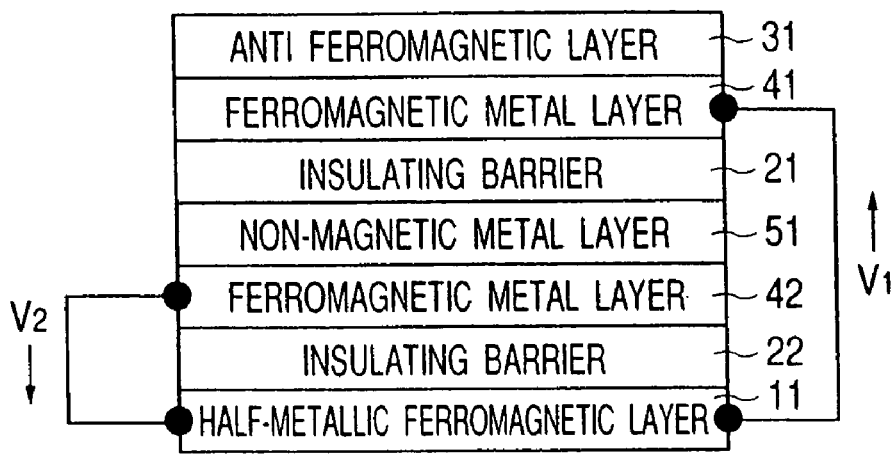
Figure 168:
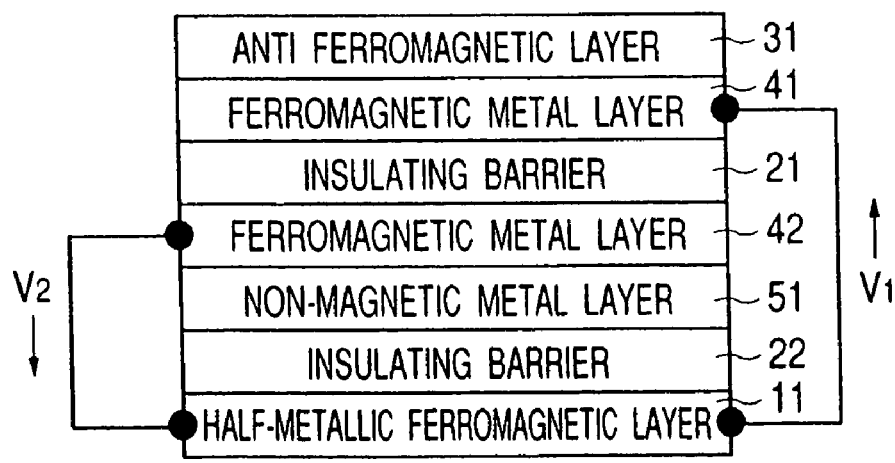
Figure 169:
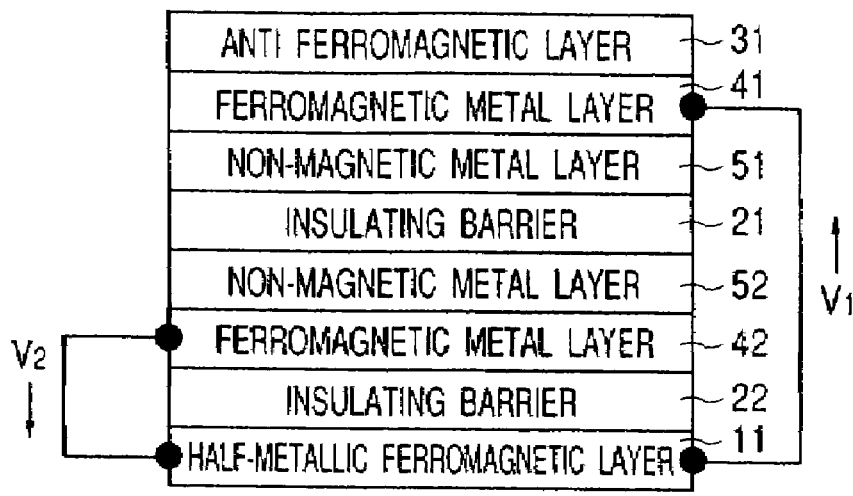
Figure 170:
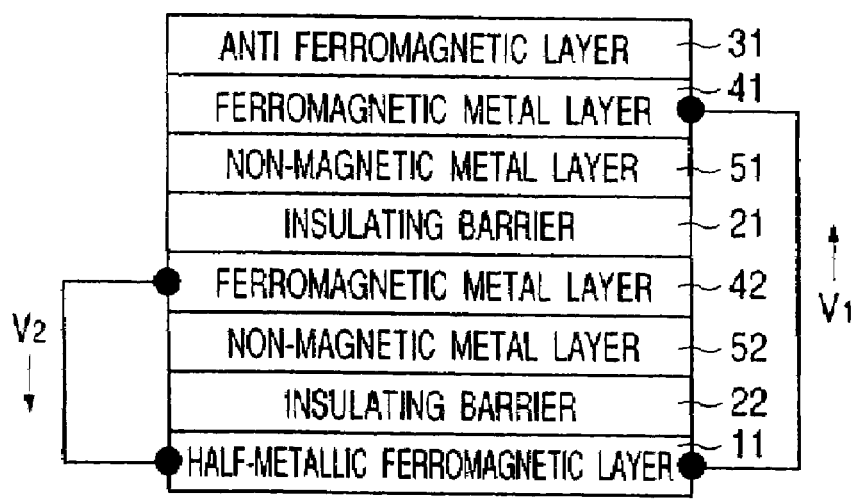
Figure 171:
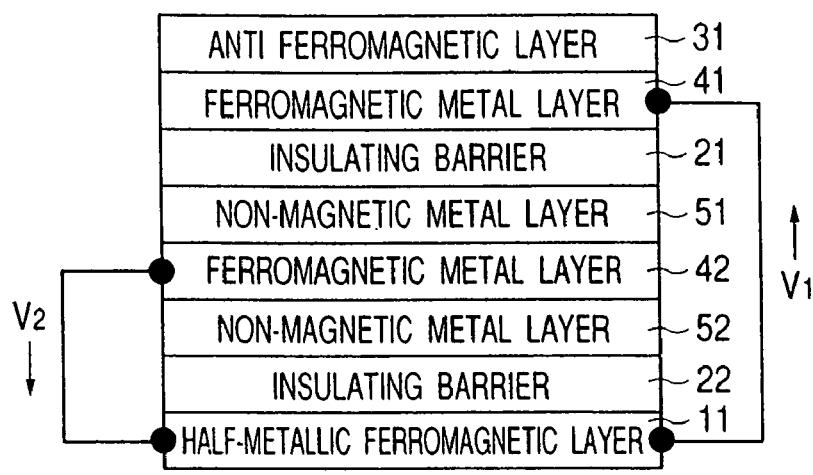
Figure 172:
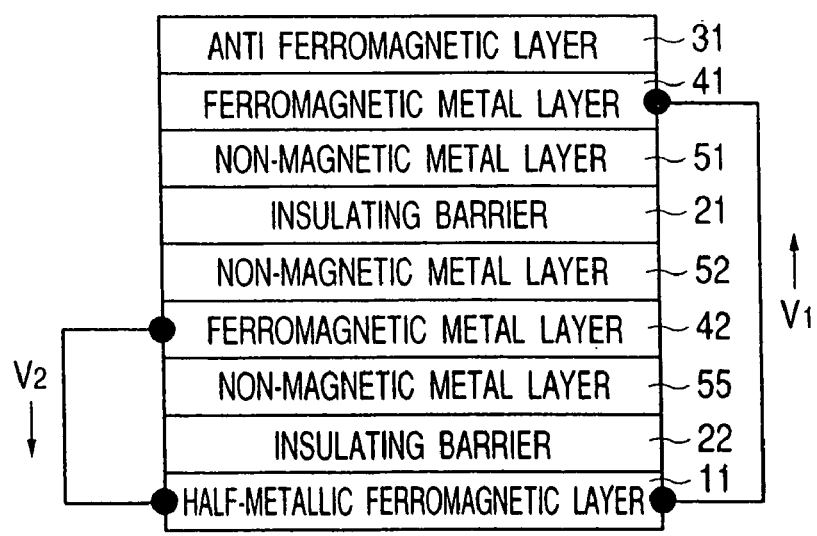
Figure 173:
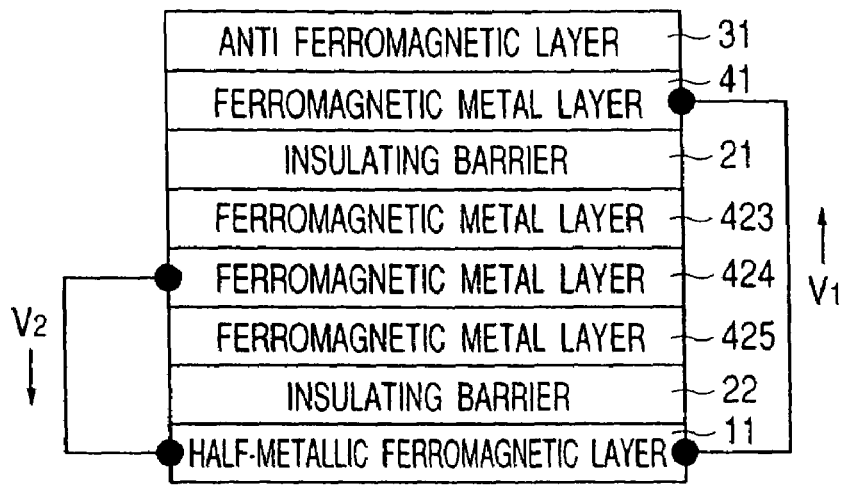
Figure 174:
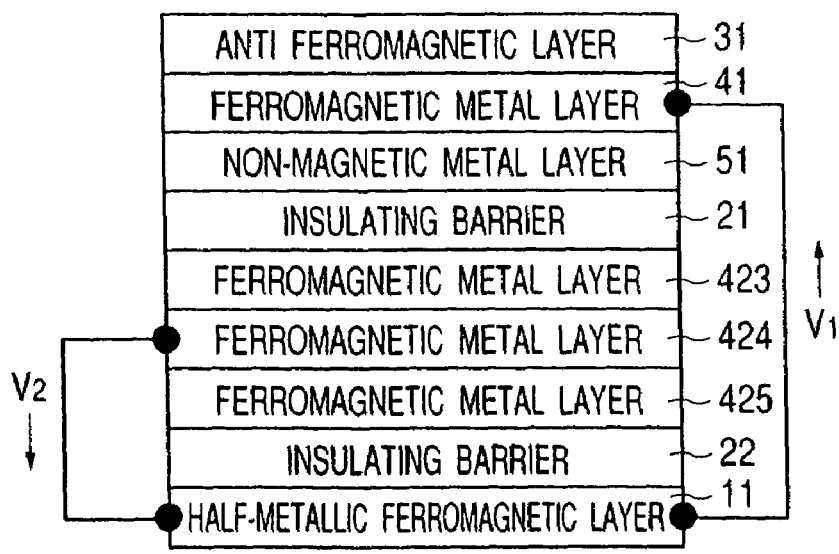
Figure 175:
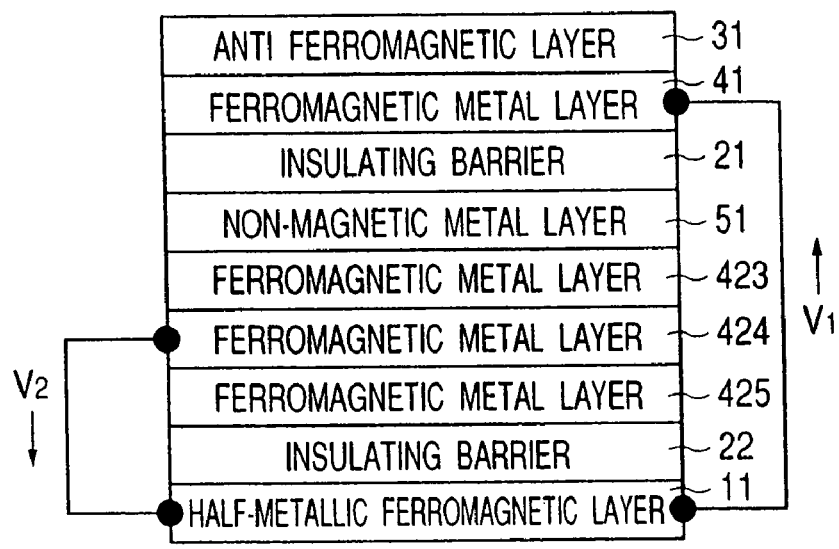
Figure 176:
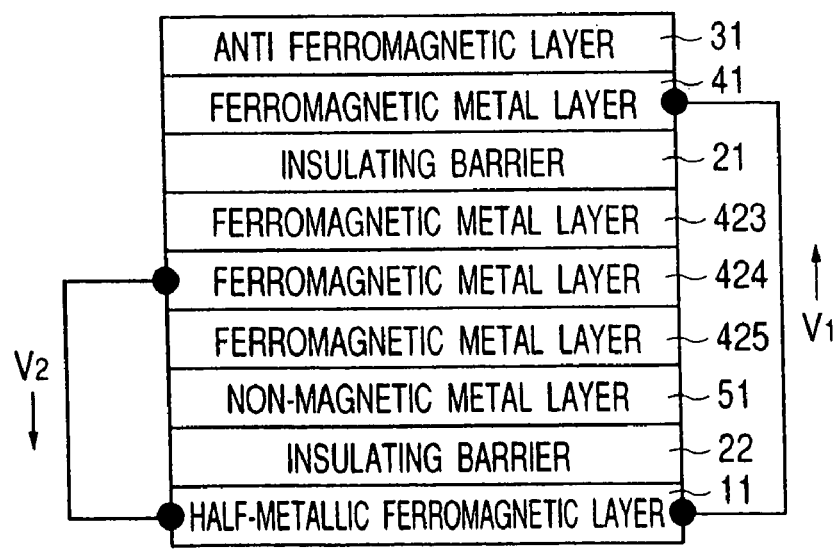
Figure 177:
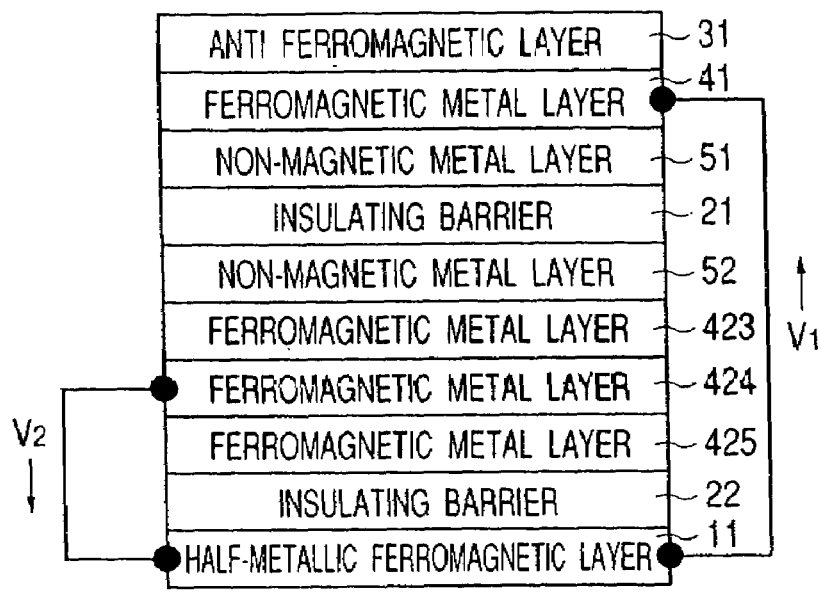
Figure 178:
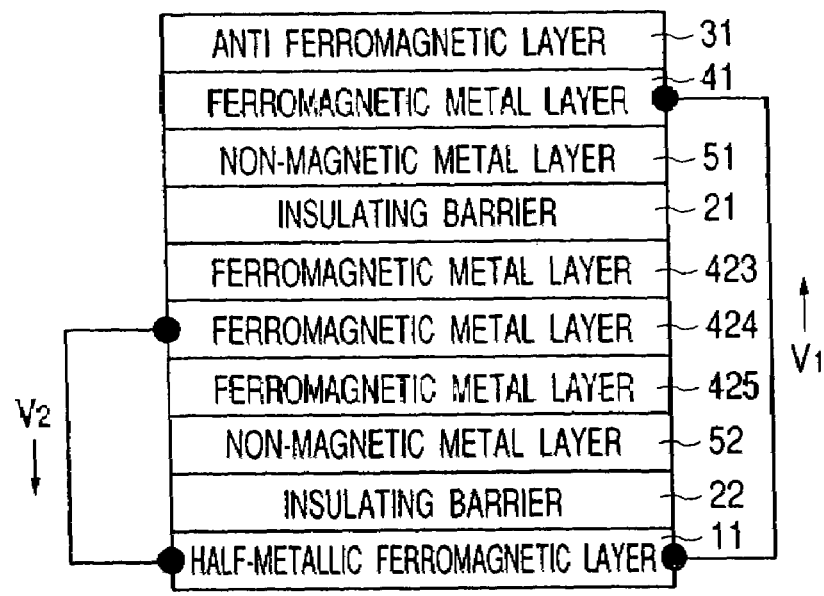
Figure 179:
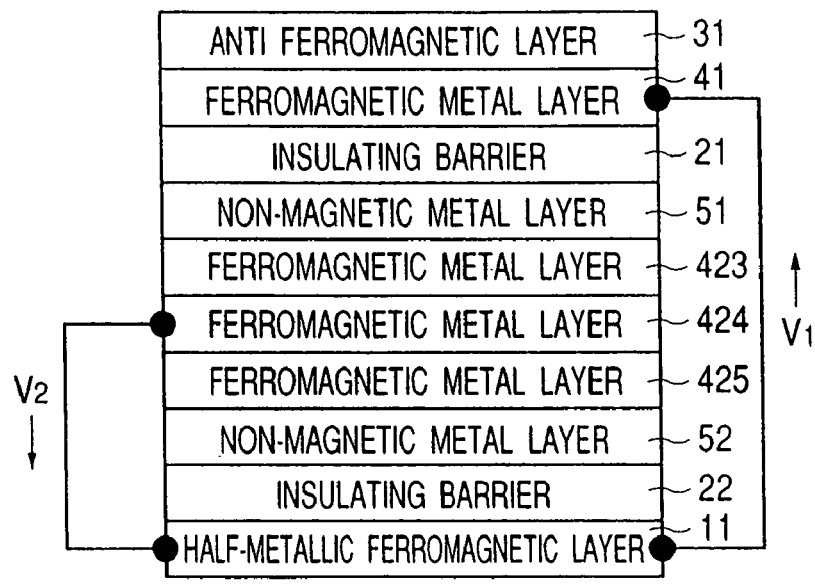
Figure 180:
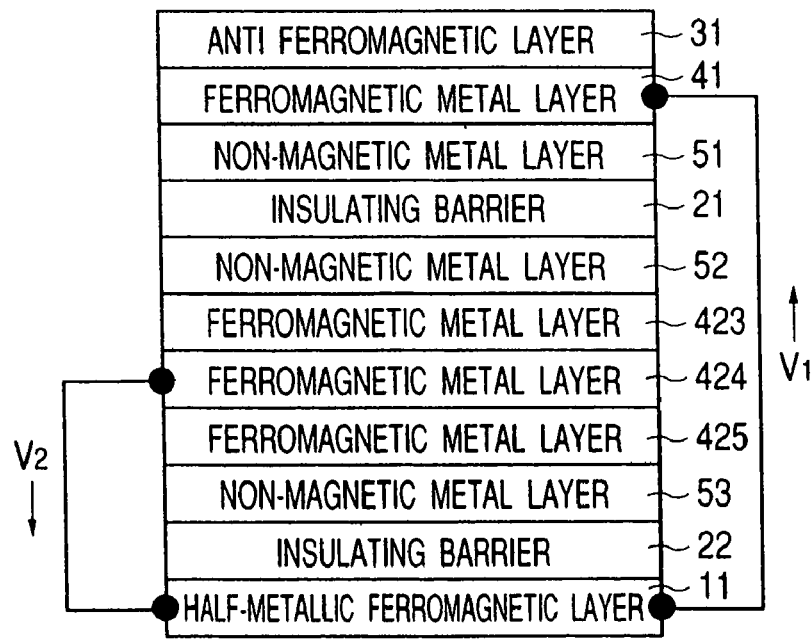
Figure 181:
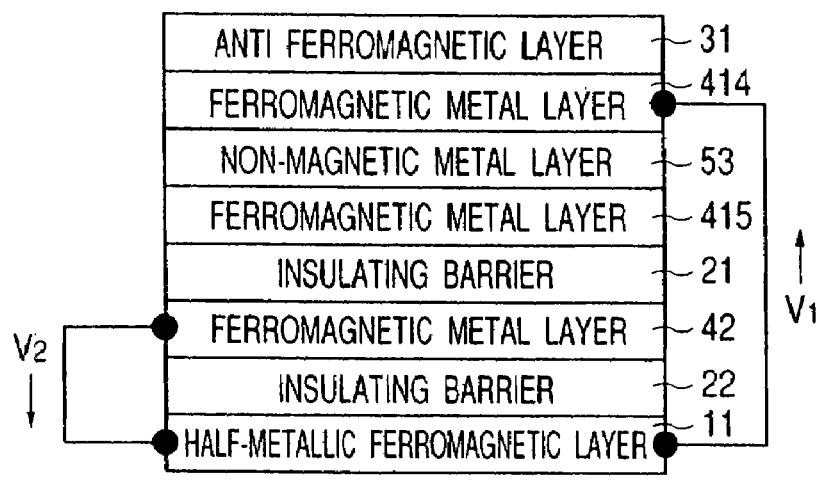
Figure 182:
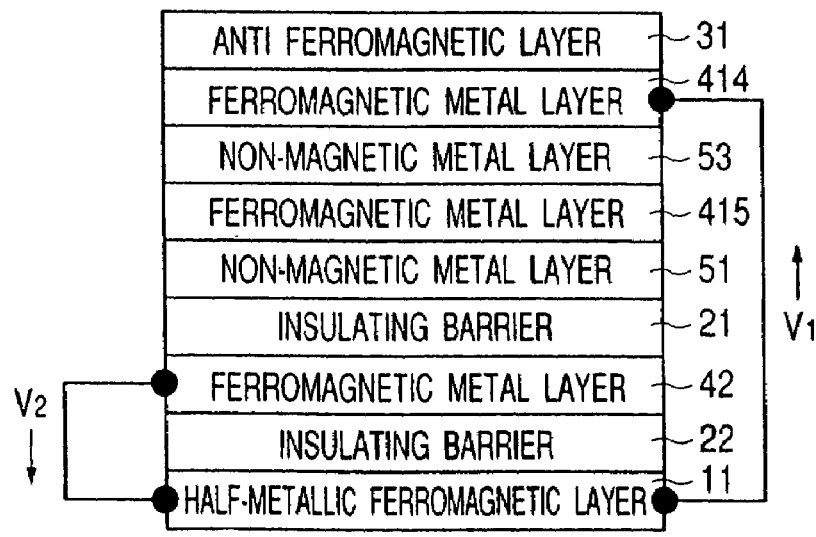
Figure 183:
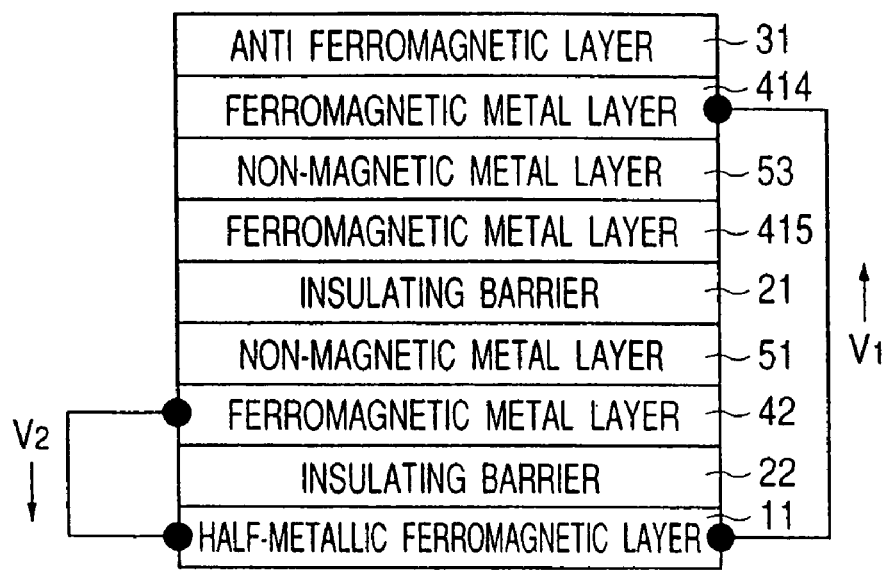
Figure 184:
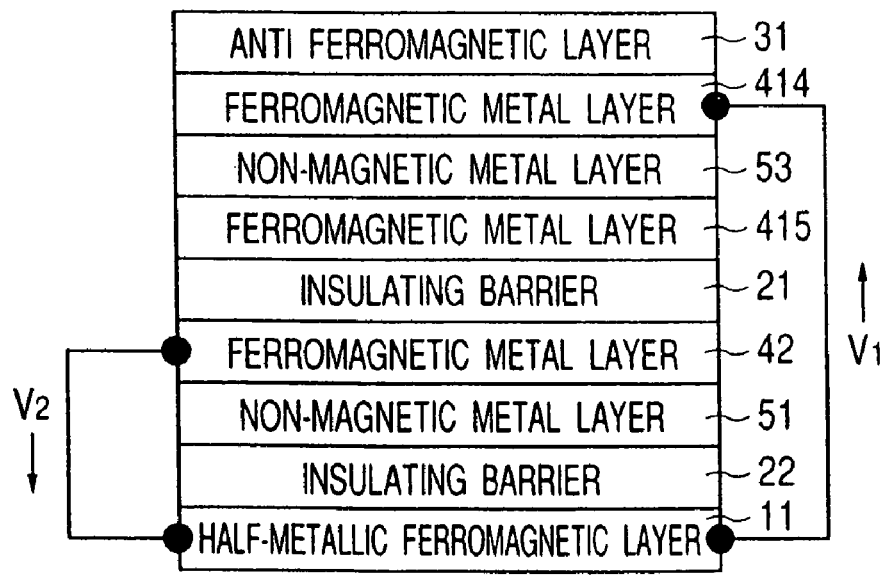
Figure 185:
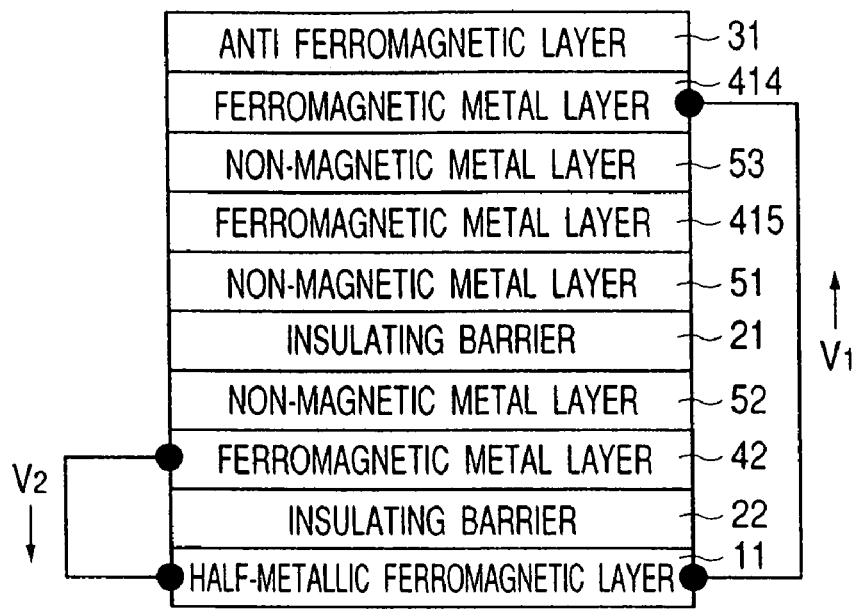
Figure 186:
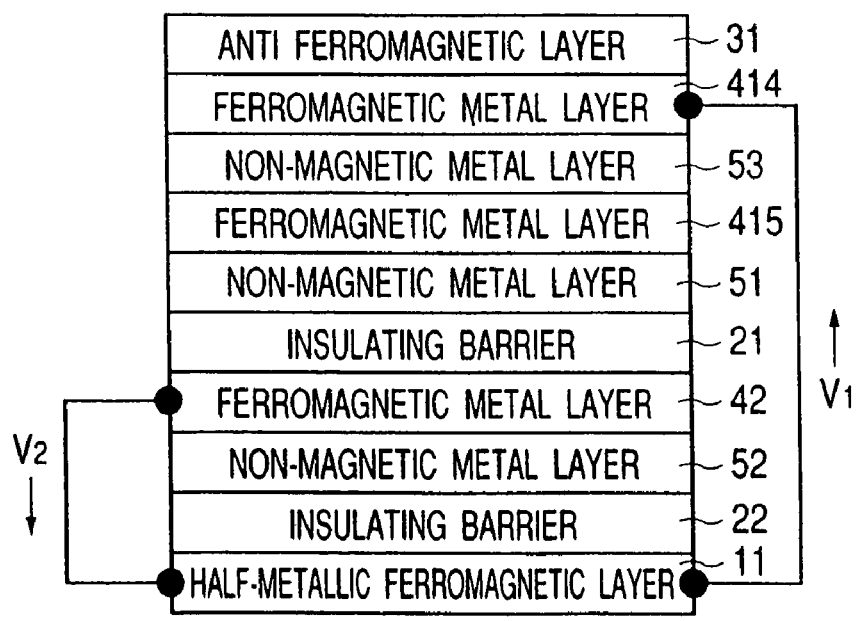
Figure 187:
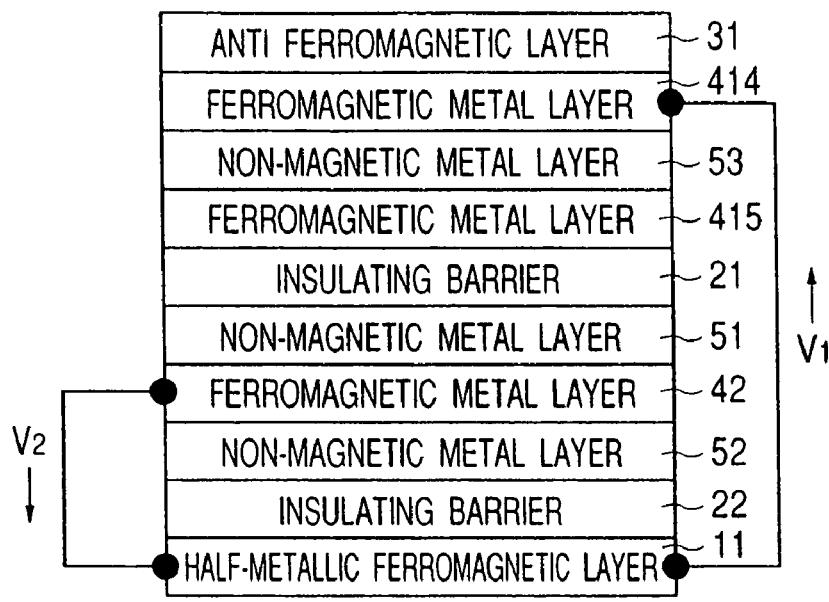
Figure 188:
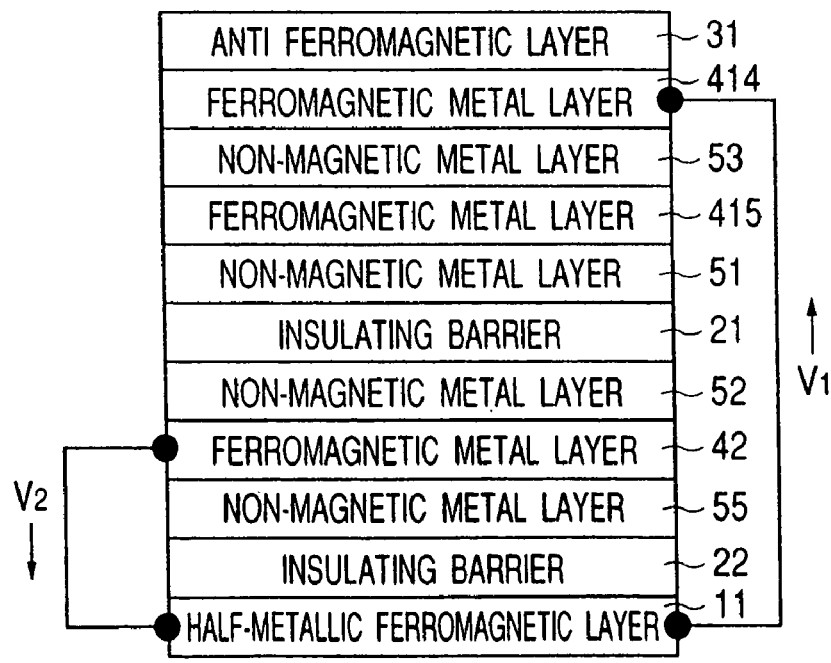
Figure 189:
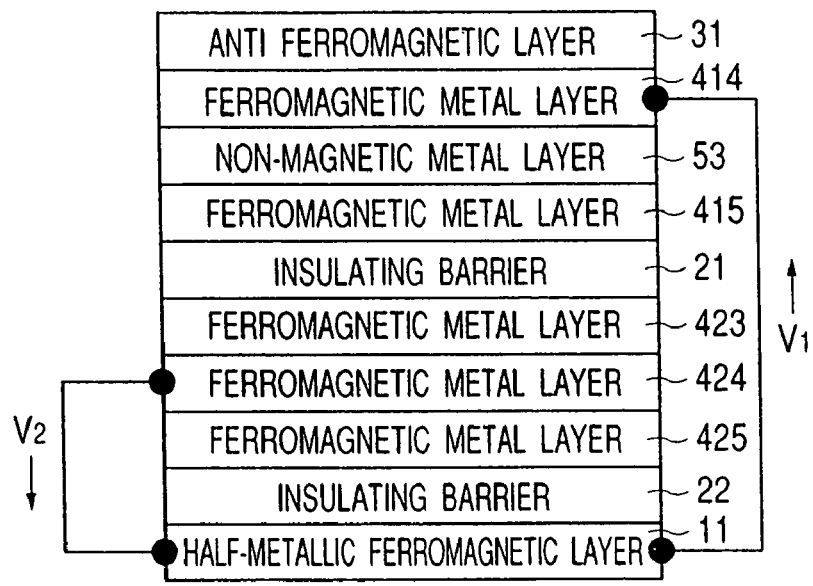
Figure 190:
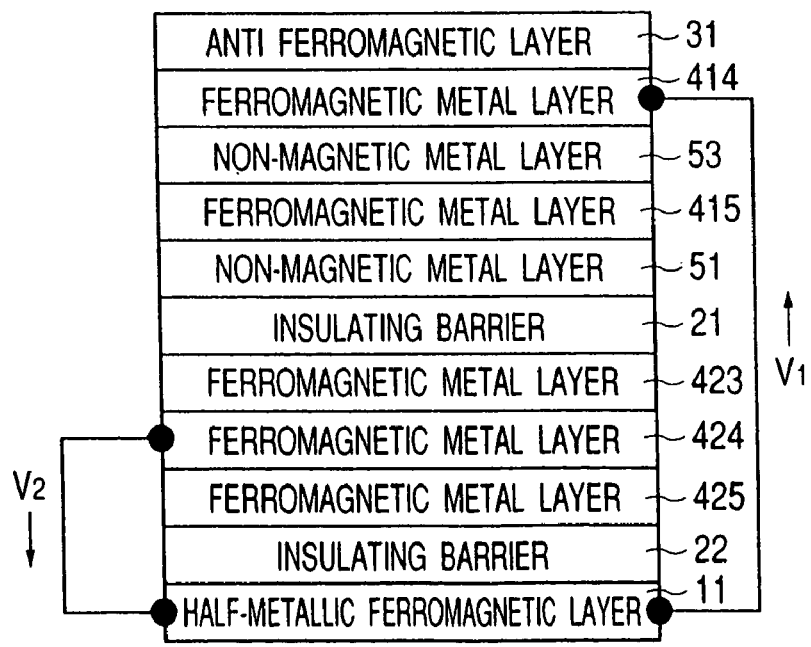
Figure 191:
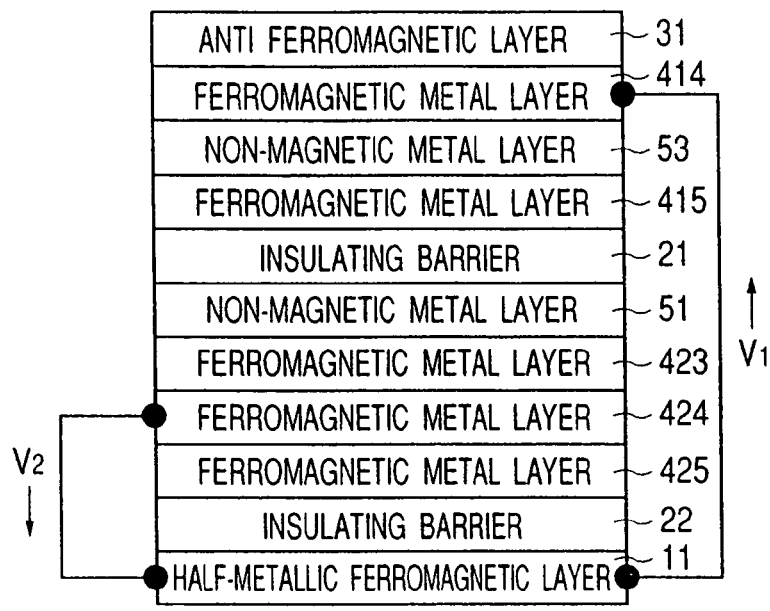
Figure 192:
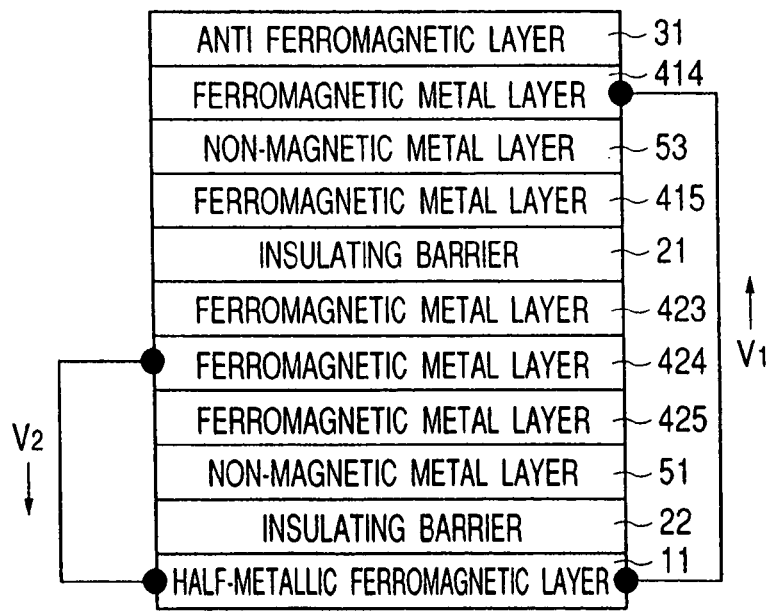
Figure 193:
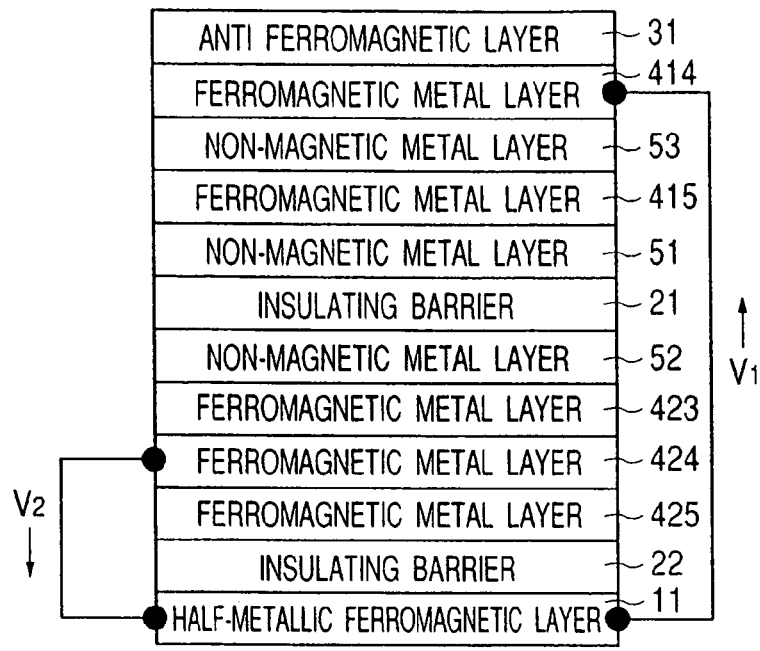
Figure 194:
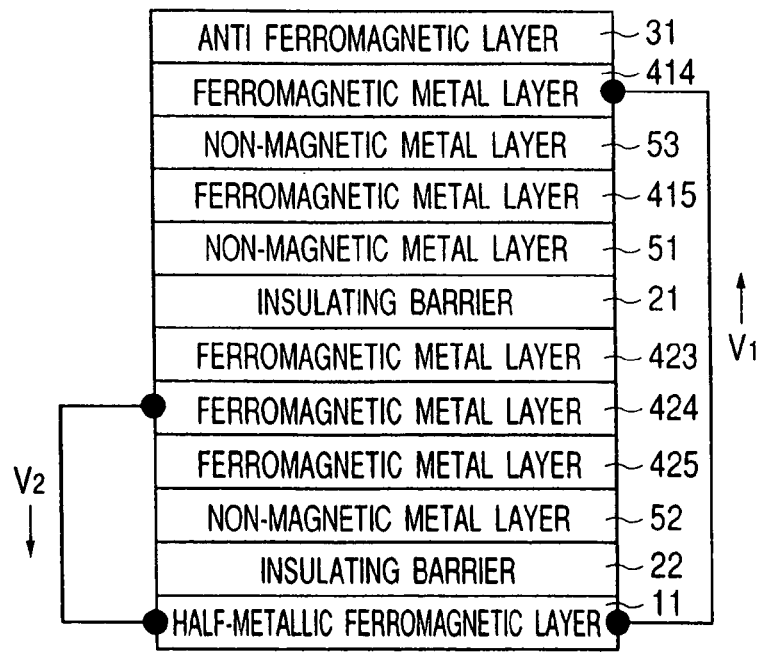
Figure 195:
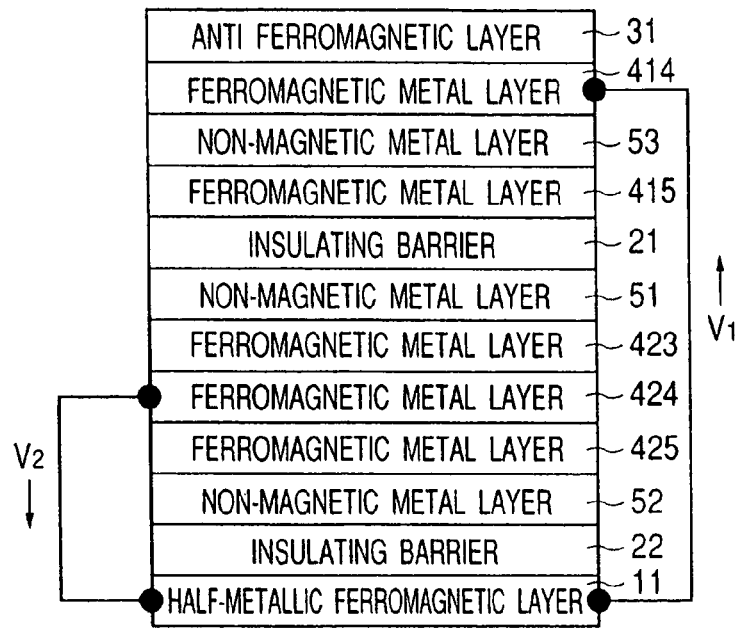
Figure 196:
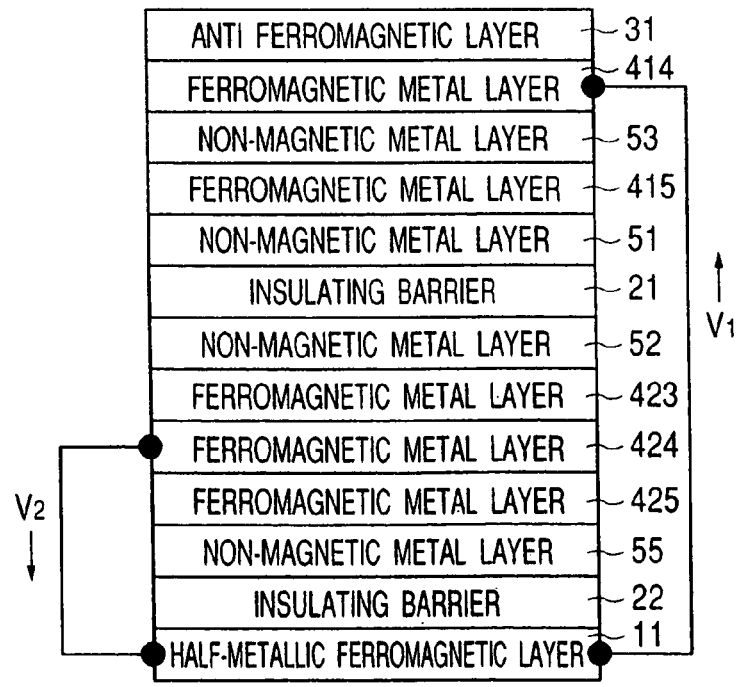
Figure 197:
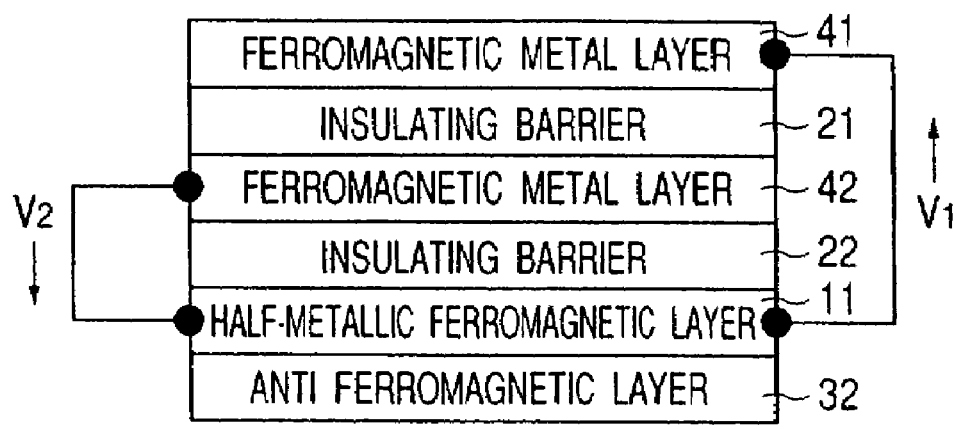
Figure 198:
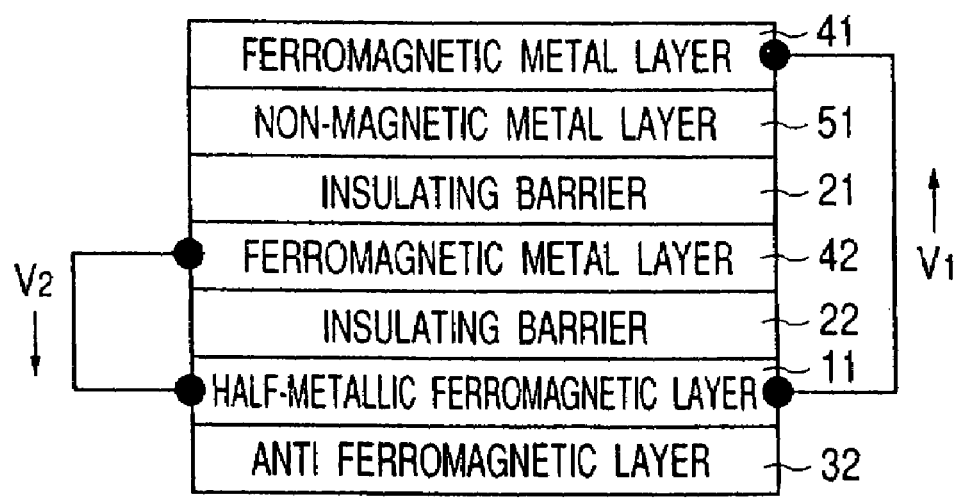
Figure 199:
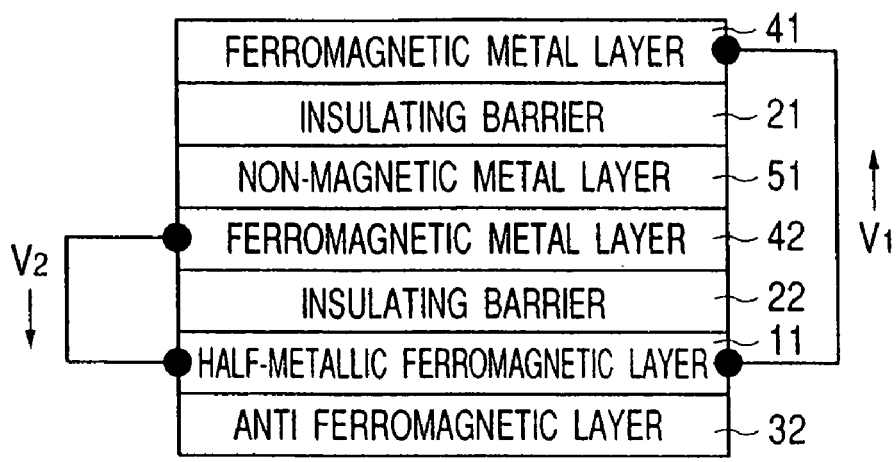
Figure 200:
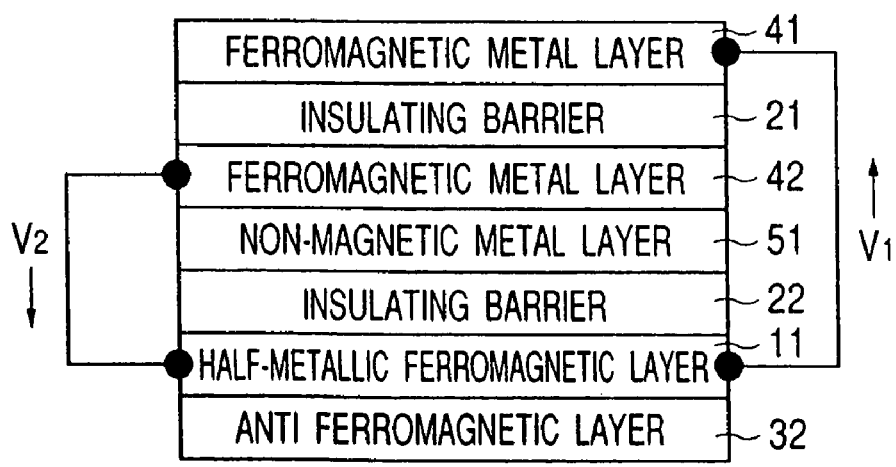
Figure 201:
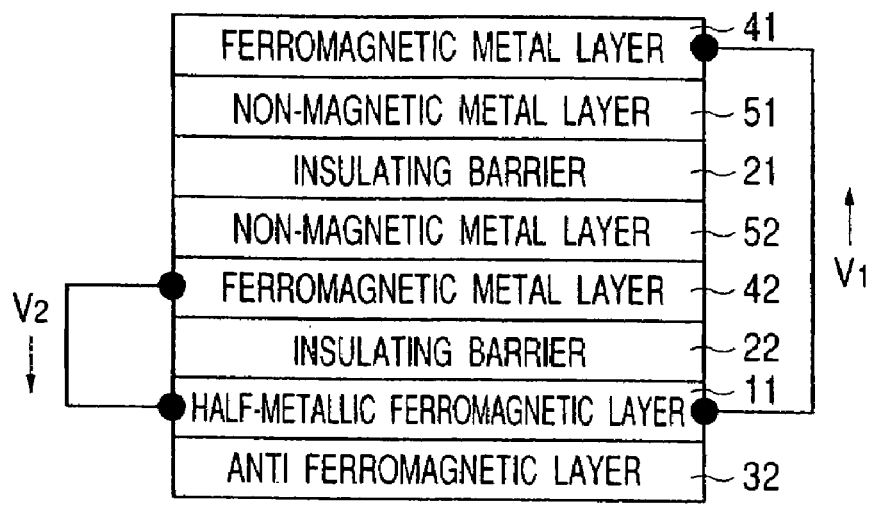
Figure 202:
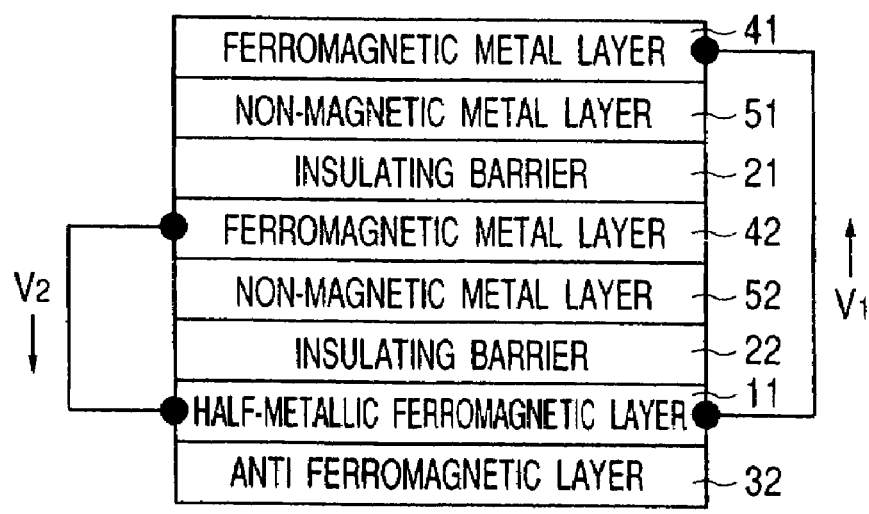
Figure 203:
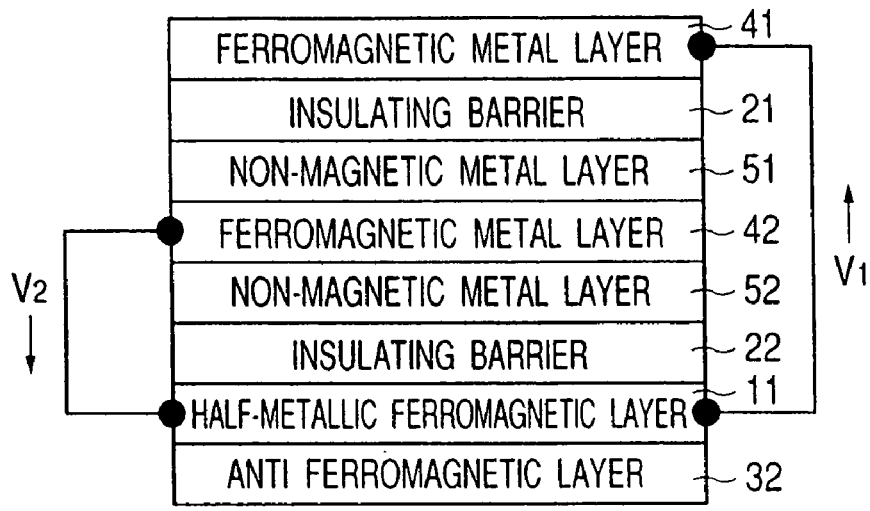
Figure 204:
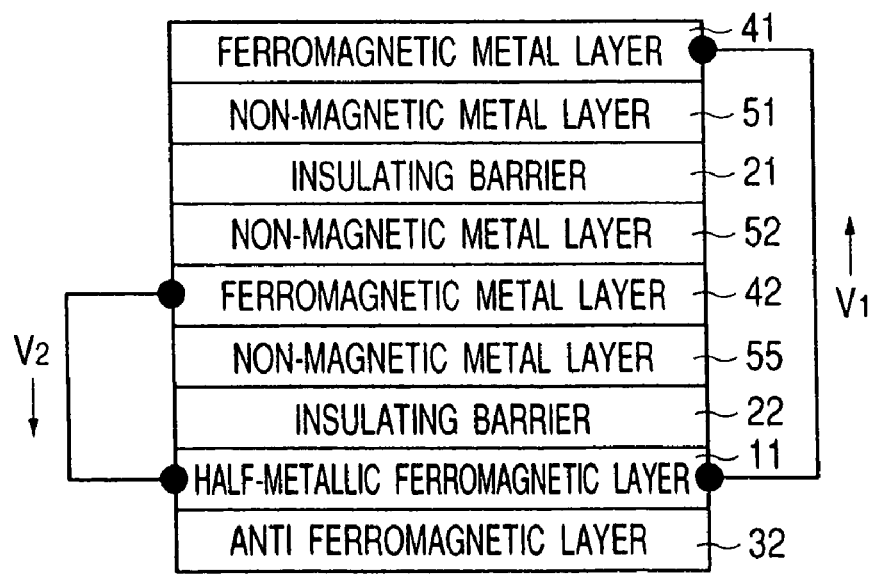
Figure 205:
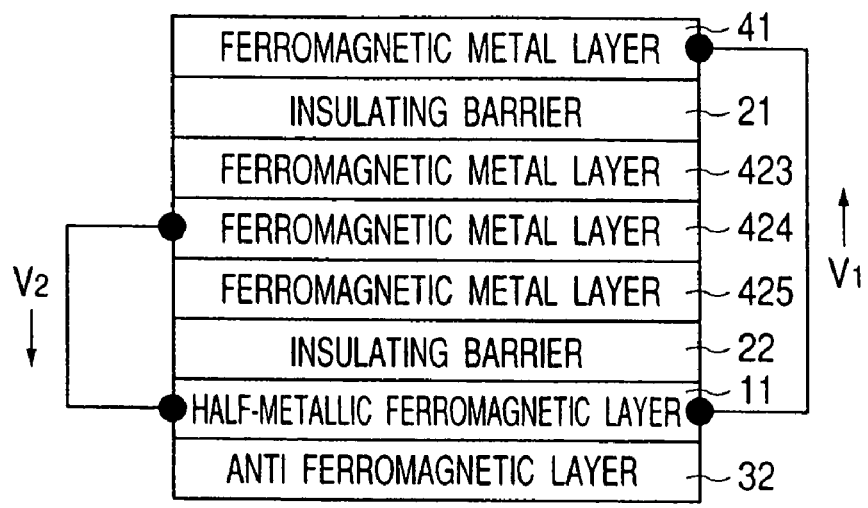
Figure 206:
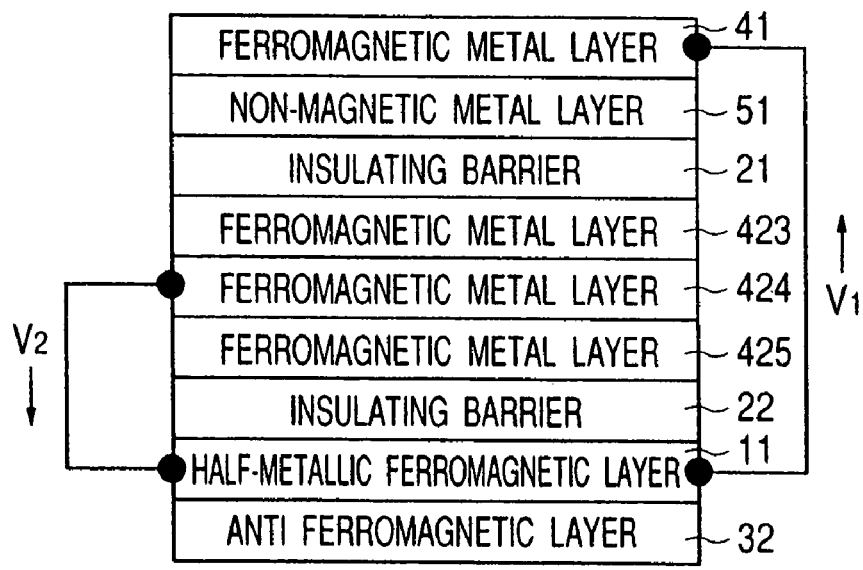
Figure 207:
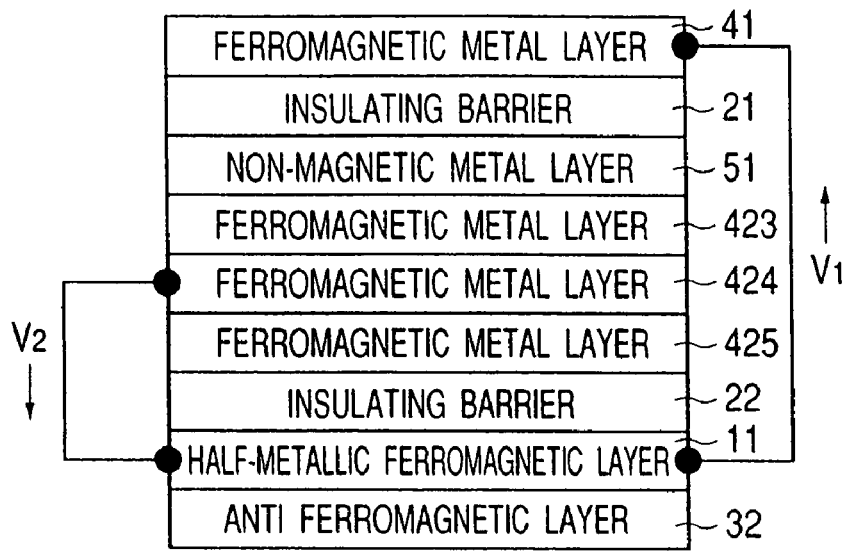
Figure 208:
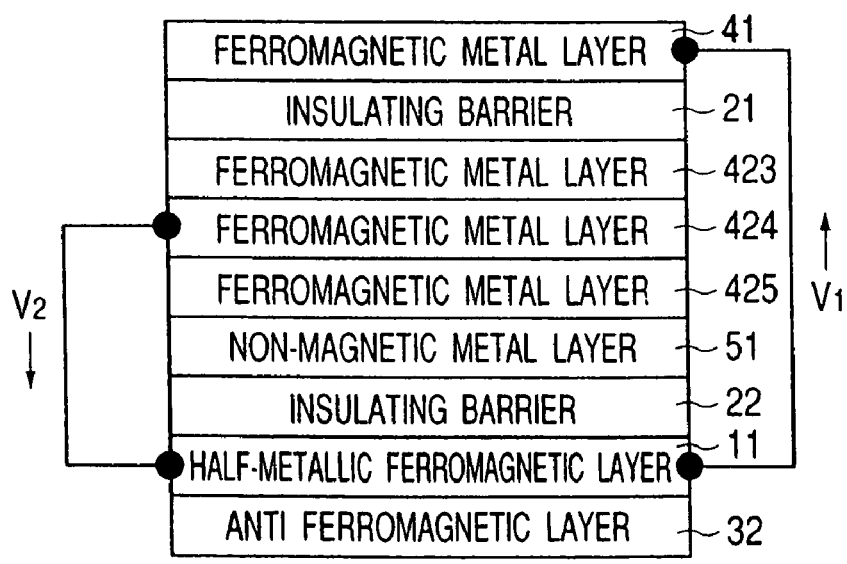
Figure 209:
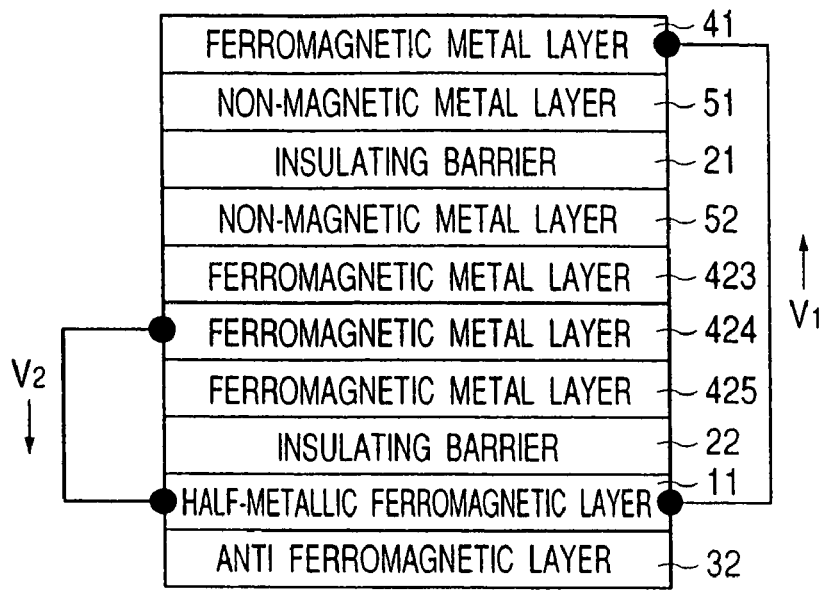
Figure 210:
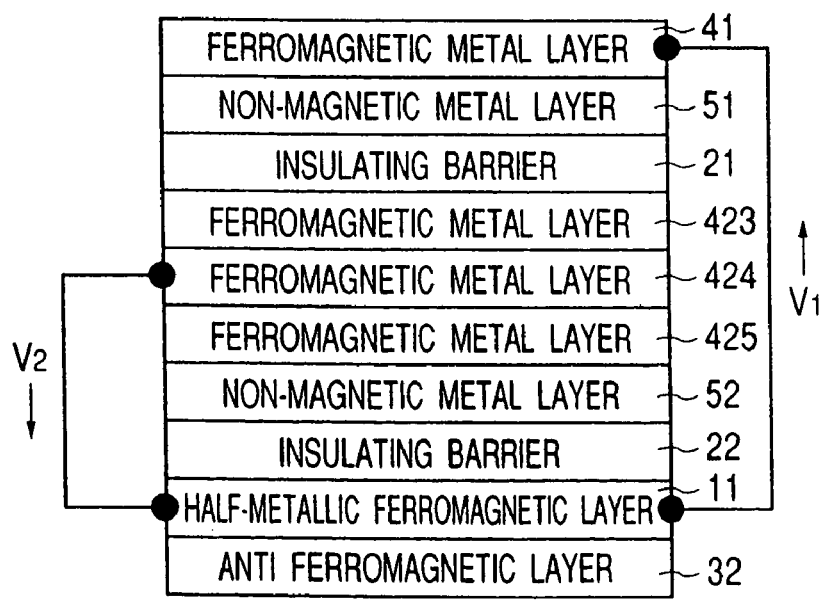
Figure 211:
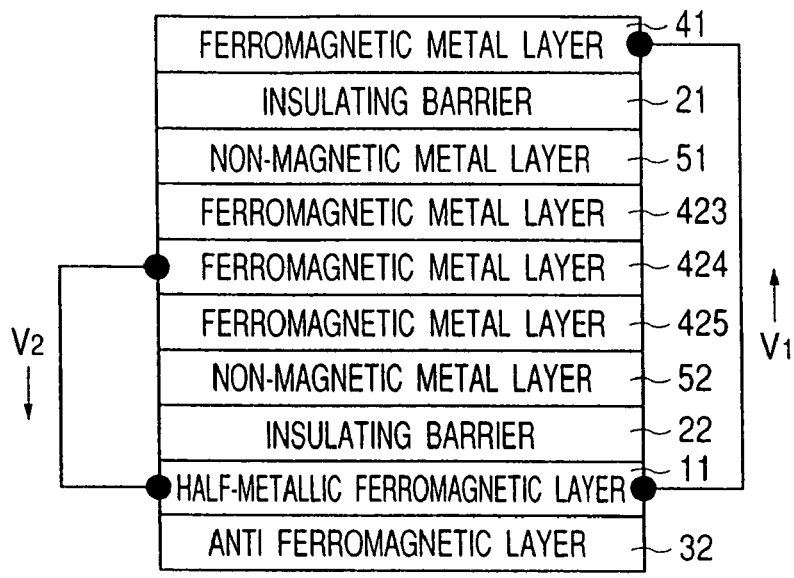
Figure 212:
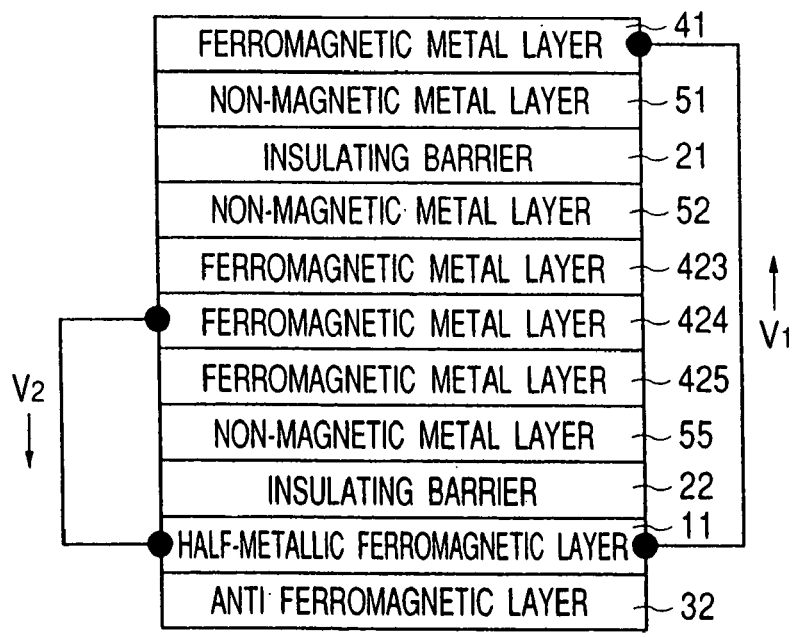
Figure 213:
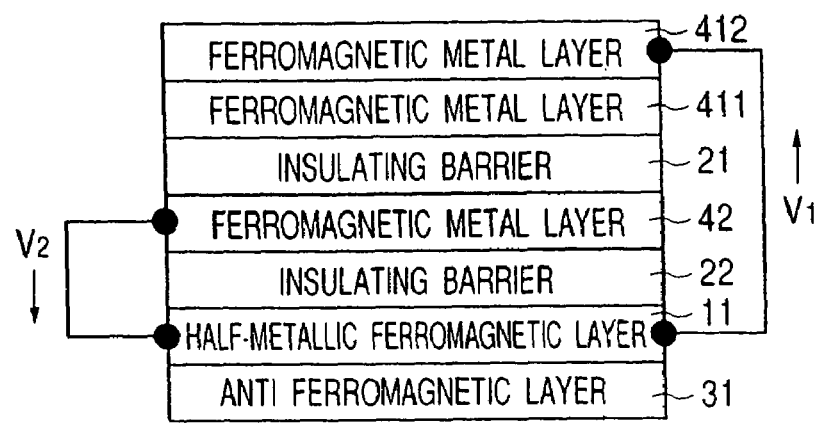
Figure 214:
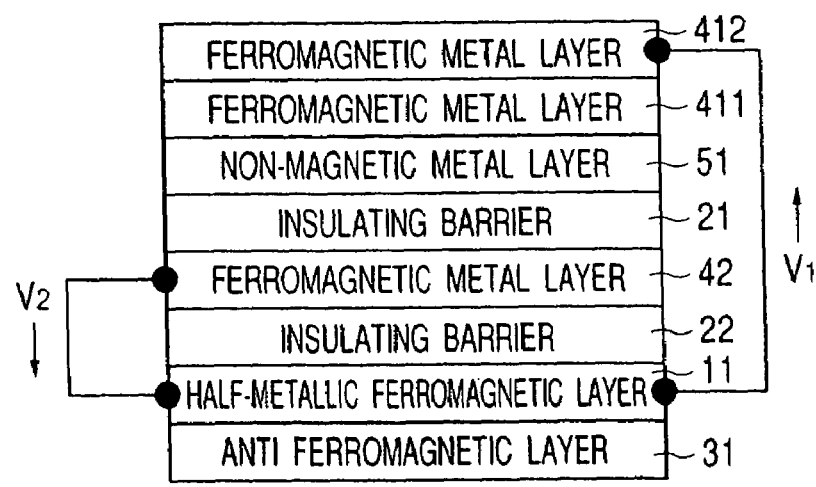
Figure 215:
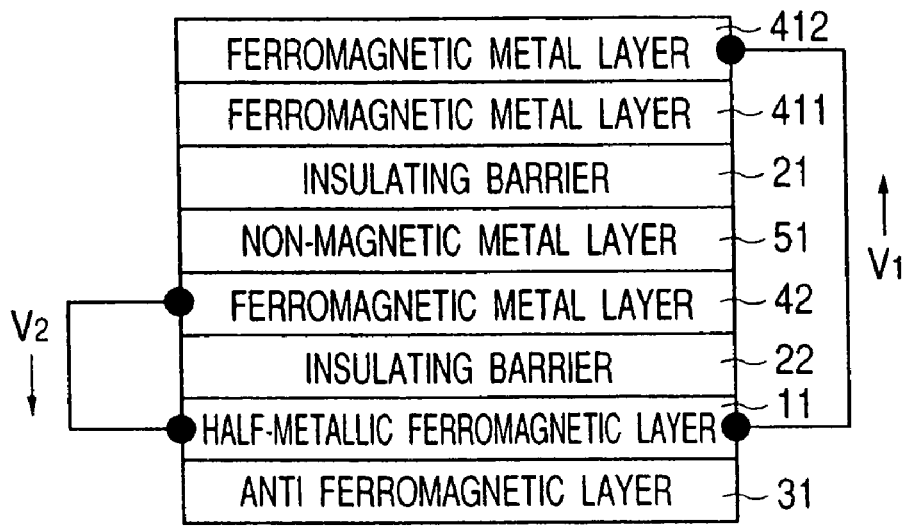
Figure 216:
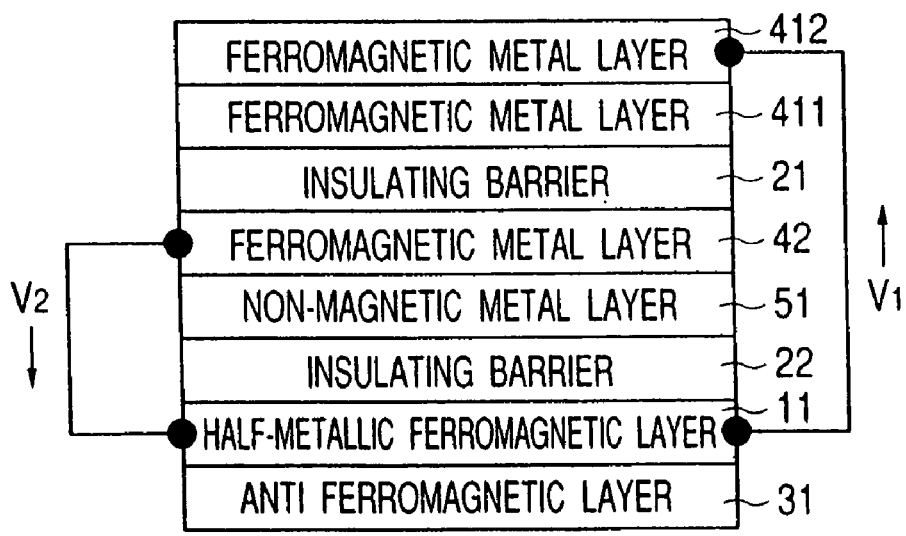
Figure 217:
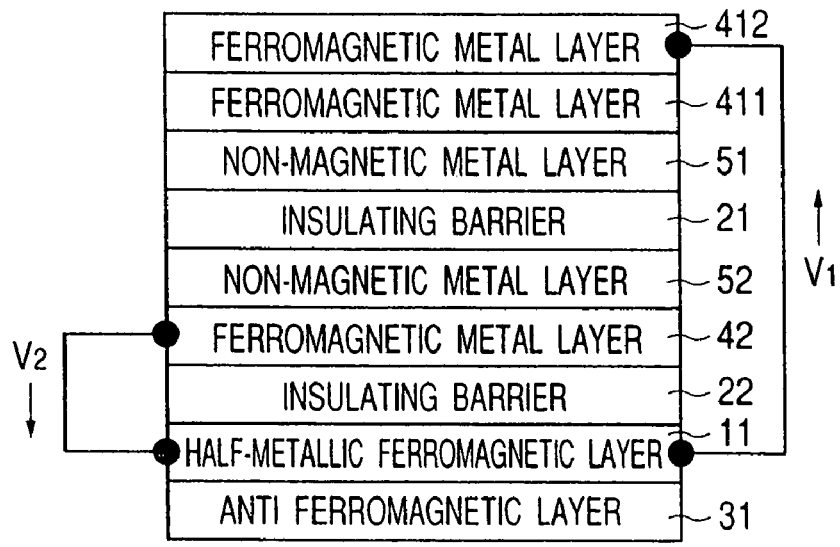
Figure 218:
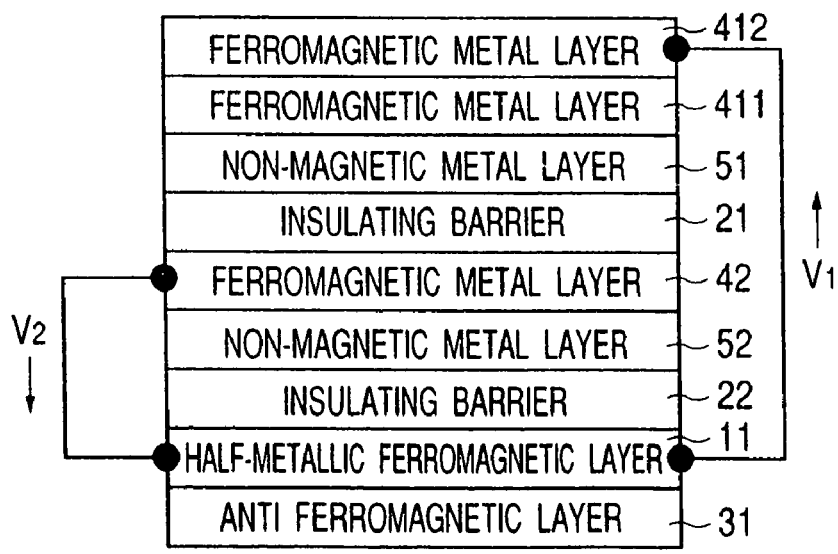
Figure 219:
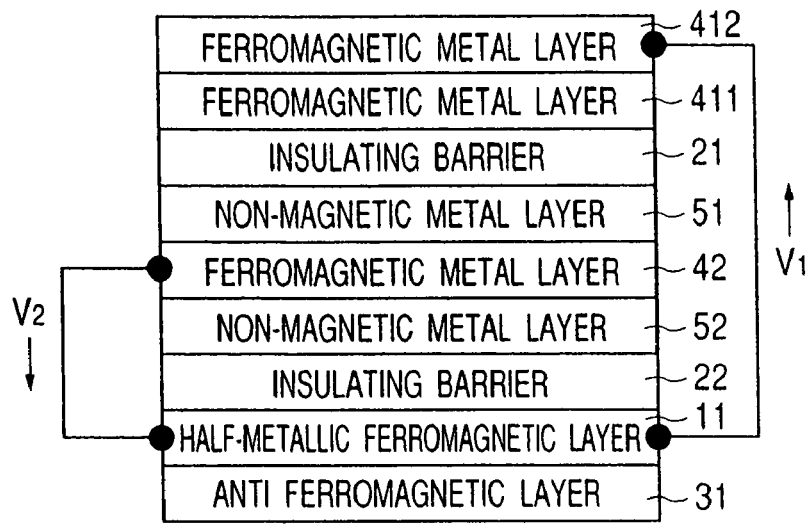
Figure 220:
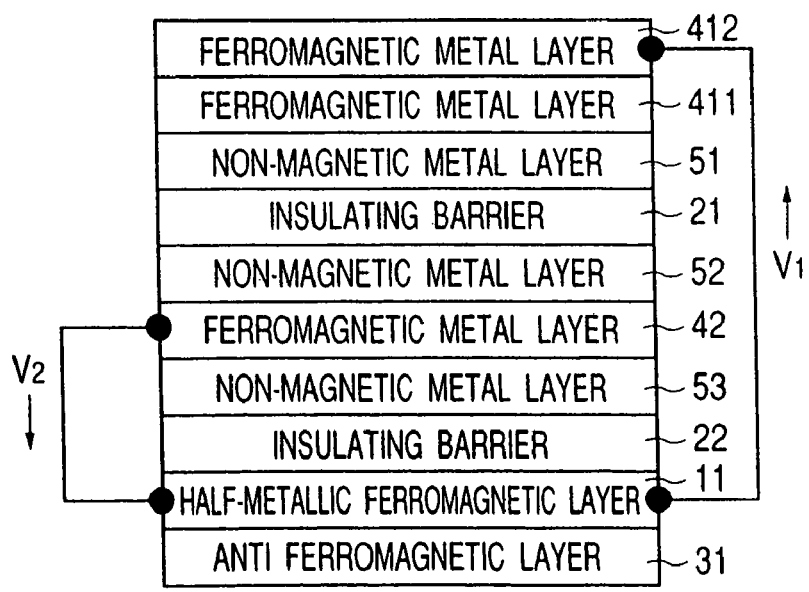
Figure 221:
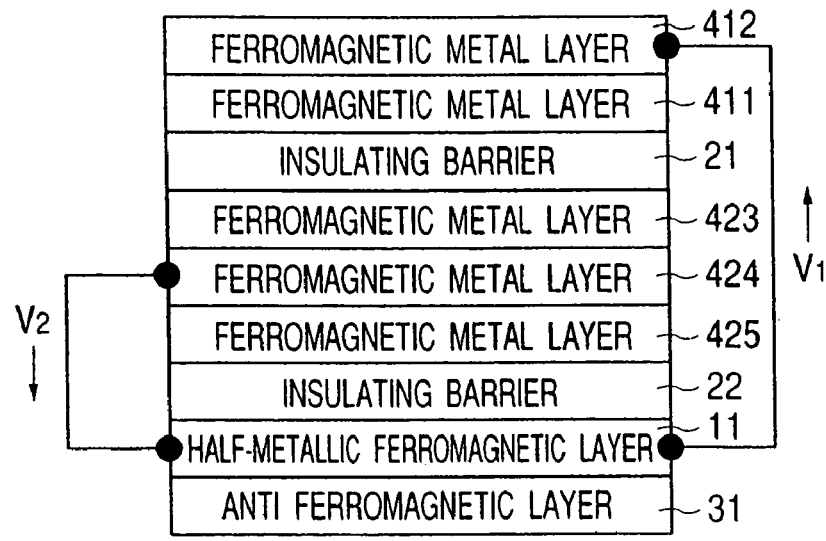
Figure 222:
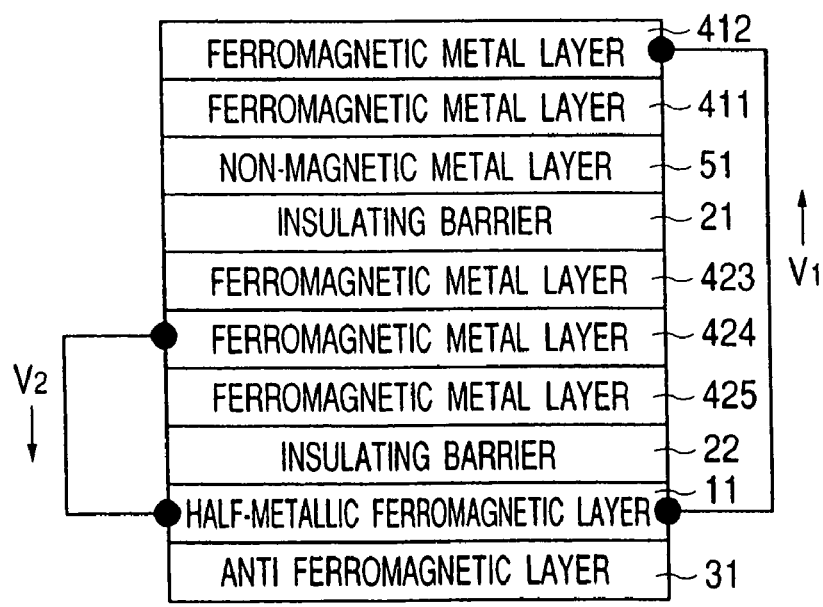
Figure 223:
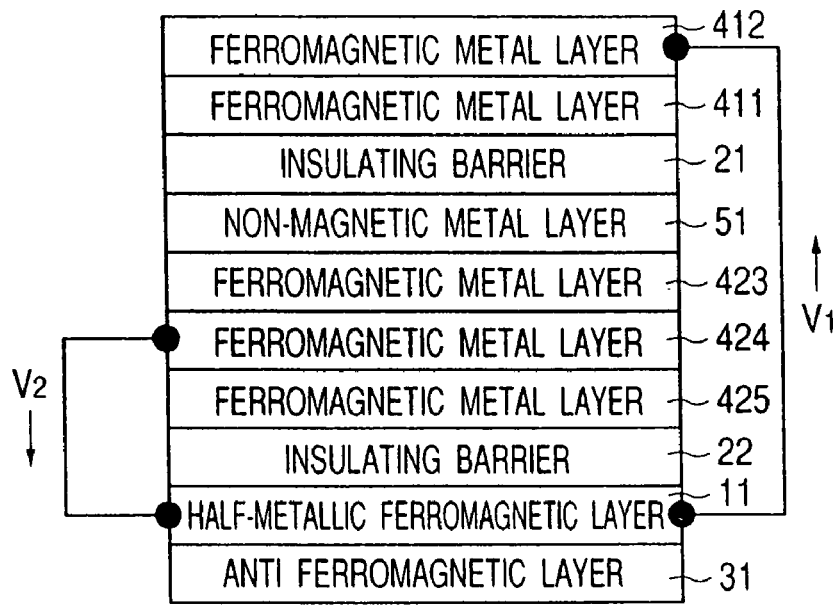
Figure 224:
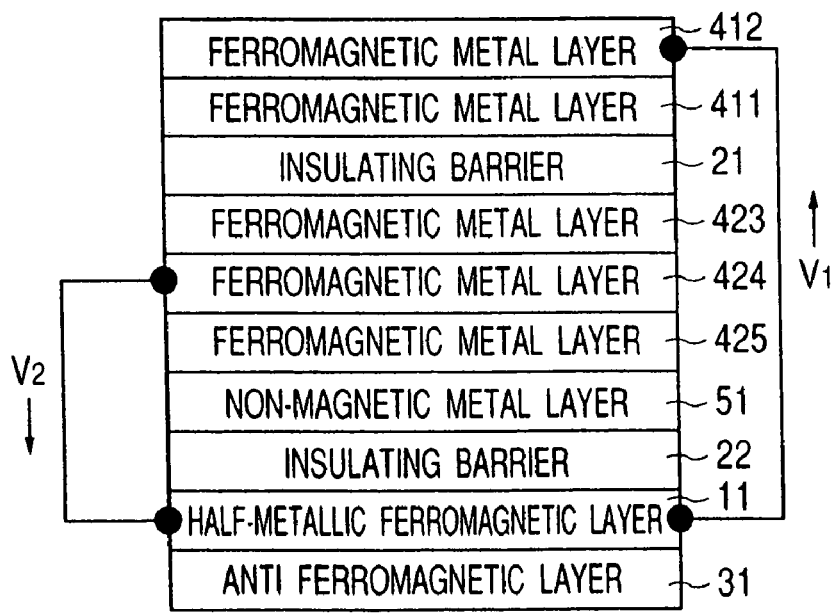
Figure 225:
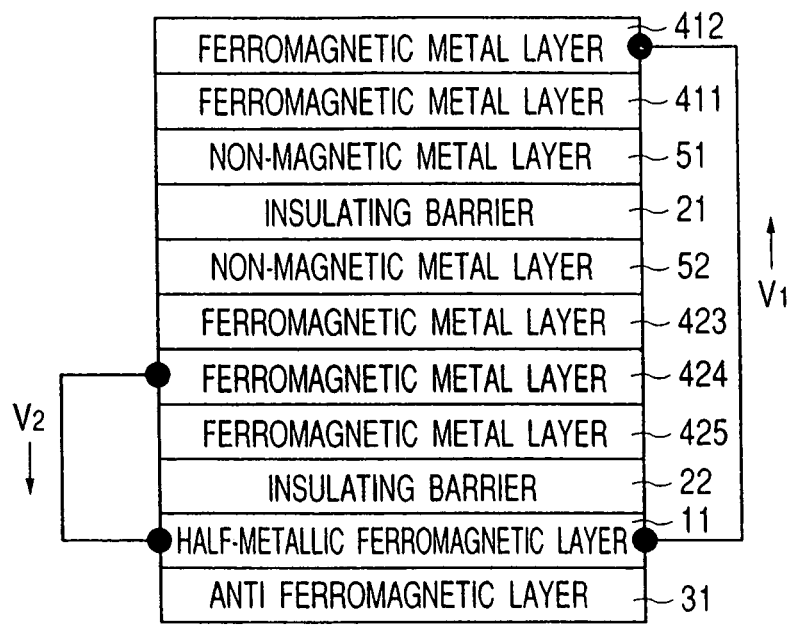
Figure 226:
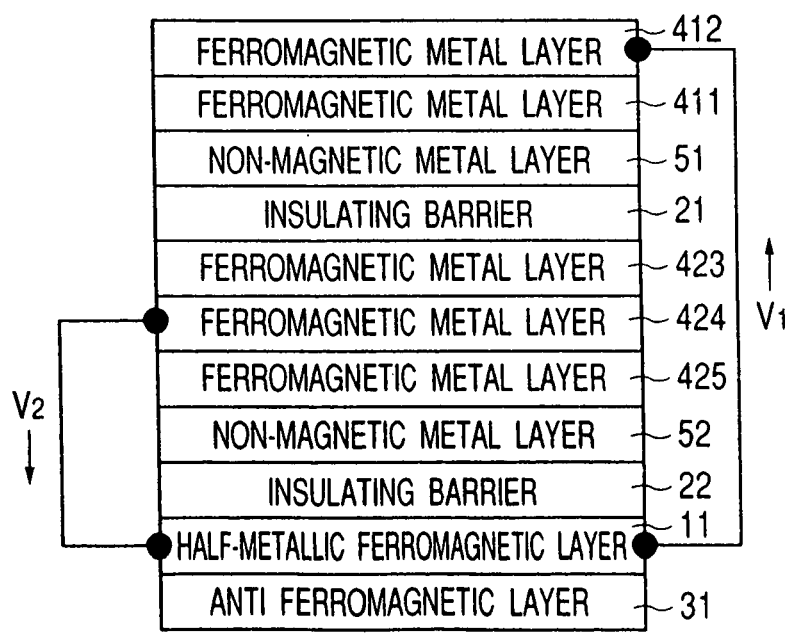
Figure 227:
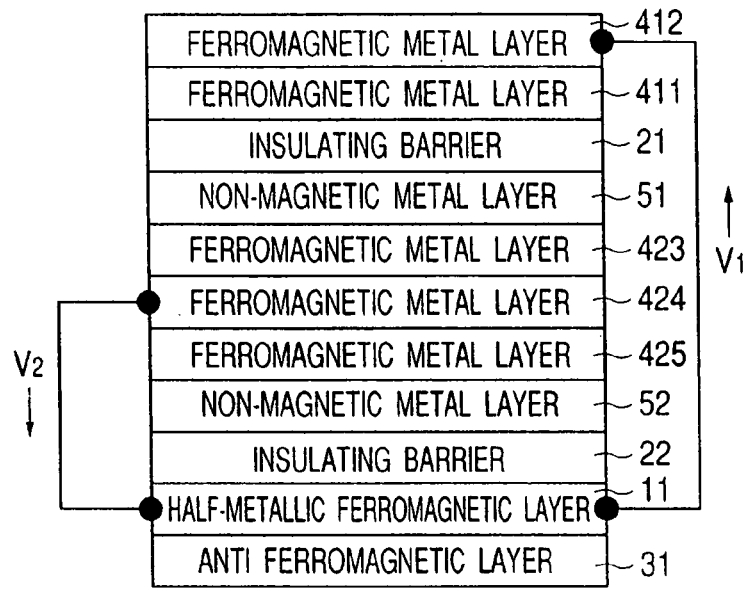
Figure 228:
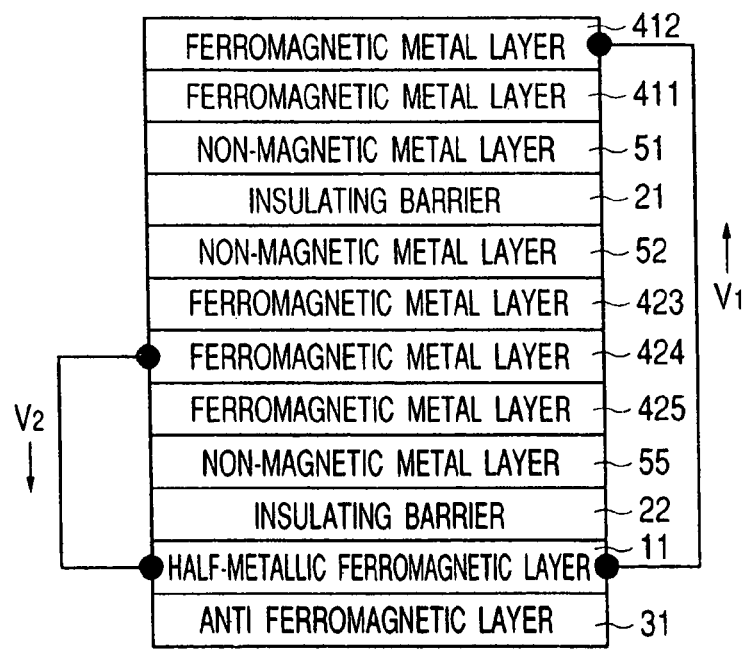
Figure 229:
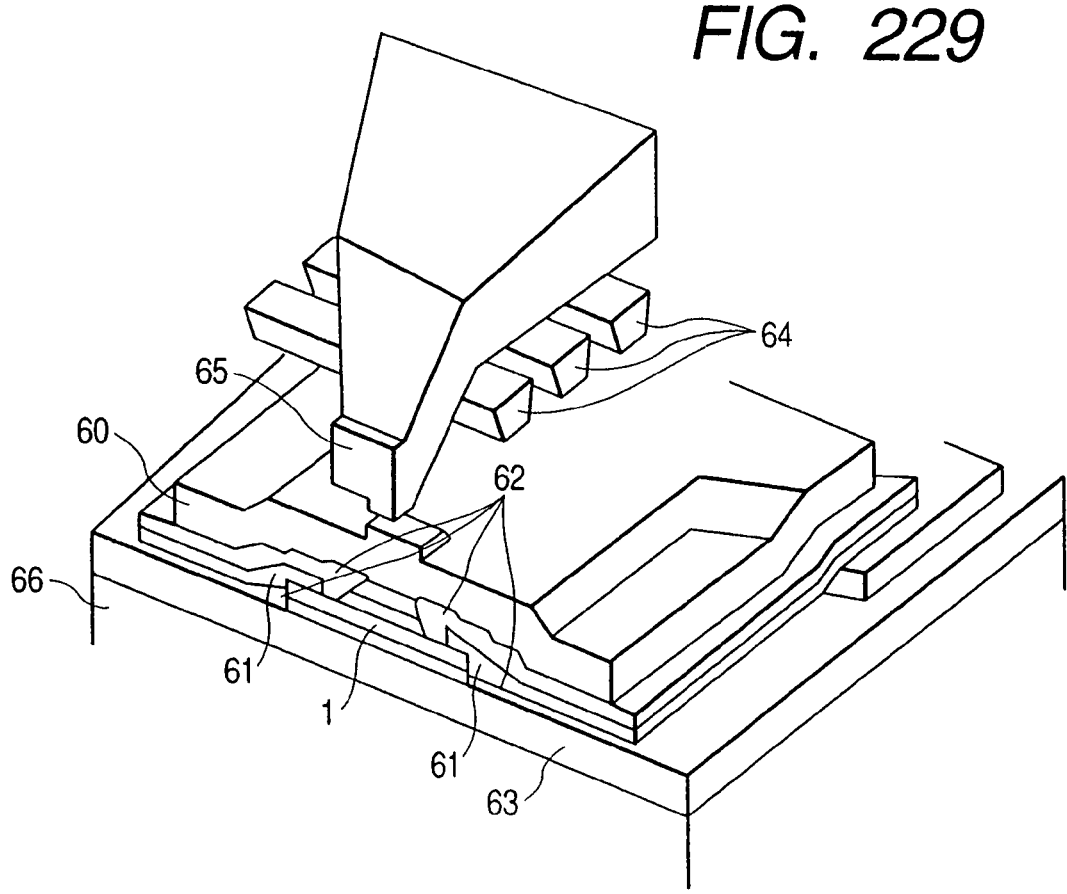
Figure 230:
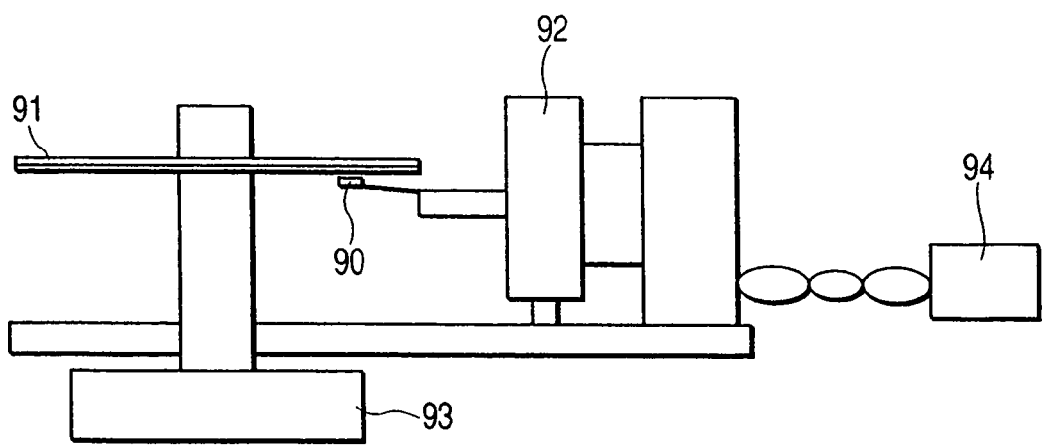

FIG. 132 is a schematic cross-sectional view showing other example of a three-terminal ferromagnetic tunnel element of the invention;

FIG. 133 is a schematic cross-sectional view showing other example of a three-terminal ferromagnetic tunnel element of the invention;

FIG. 134 is a schematic cross-sectional view showing other example of a three-terminal ferromagnetic tunnel element of the invention;

FIG. 135 is a schematic cross-sectional view showing other example of a three-terminal ferromagnetic tunnel element of the invention;

FIG. 136 is a schematic cross-sectional view showing other example of a three-terminal ferromagnetic tunnel element of the invention;

FIG. 137 is a schematic cross-sectional view showing other example of a three-terminal ferromagnetic tunnel element of the invention;

FIG. 138 is a schematic cross-sectional view showing other example of a three-terminal ferromagnetic tunnel element of the invention;

FIG. 139 is a schematic cross-sectional view showing other example of a three-terminal ferromagnetic tunnel element of the invention;

FIG. 140 is a schematic cross-sectional view showing other example of a three-terminal ferromagnetic tunnel element of the invention;

FIG. 141 is a schematic cross-sectional view showing other example of a three-terminal ferromagnetic tunnel element of the invention;

FIG. 142 is a schematic cross-sectional view showing other example of a three-terminal ferromagnetic tunnel element of the invention;

FIG. 143 is a schematic cross-sectional view showing other example of a three-terminal ferromagnetic tunnel element of the invention;

FIG. 144 is a schematic cross-sectional view showing other example of a three-terminal ferromagnetic tunnel element of the invention;

FIG. 145 is a schematic cross-sectional view showing other example of a three-terminal ferromagnetic tunnel element of the invention;

FIG. 146 is a schematic cross-sectional view showing other example of a three-terminal ferromagnetic tunnel element of the invention;

FIG. 147 is a schematic cross-sectional view showing other example of a three-terminal ferromagnetic tunnel element of the invention;

FIG. 148 is a schematic cross-sectional view showing other example of a three-terminal ferromagnetic tunnel element of the invention;

FIG. 149 is a schematic cross-sectional view showing other example of a three-terminal ferromagnetic tunnel element of the invention;

FIG. 150 is a schematic cross-sectional view showing other example of a three-terminal ferromagnetic tunnel element of the invention;

FIG. 151 is a schematic cross-sectional view showing other example of a three-terminal ferromagnetic tunnel element of the invention;

FIG. 152 is a schematic cross-sectional view showing other example of a three-terminal ferromagnetic tunnel element of the invention;

FIG. 153 is a schematic cross-sectional view showing other example of a three-terminal ferromagnetic tunnel element of the invention;

FIG. 154 is a schematic cross-sectional view showing other example of a three-terminal ferromagnetic tunnel element of the invention;

FIG. 155 is a schematic cross-sectional view showing other example of a three-terminal ferromagnetic tunnel element of the invention;

FIG. 156 is a schematic cross-sectional view showing other example of a three-terminal ferromagnetic tunnel element of the invention;

FIG. 157 is a schematic cross-sectional view showing other example of a three-terminal ferromagnetic tunnel element of the invention;

FIG. 158 is a schematic cross-sectional view showing other example of a three-terminal ferromagnetic tunnel element of the invention;

FIG. 159 is a schematic cross-sectional view showing other example of a three-terminal ferromagnetic tunnel element of the invention;

FIG. 160 is a schematic cross-sectional view showing other example of a three-terminal ferromagnetic tunnel element of the invention;

FIG. 161 is a schematic cross-sectional view showing other example of a three-terminal ferromagnetic tunnel element of the invention;

FIG. 162 is a schematic cross-sectional view showing other example of a three-terminal ferromagnetic tunnel element of the invention;

FIG. 163 is a schematic cross-sectional view showing other example of a three-terminal ferromagnetic tunnel element of the invention;

FIG. 164 is a schematic cross-sectional view showing other example of a three-terminal ferromagnetic tunnel element of the invention;

FIG. 165 is a schematic cross-sectional view showing other example of a three-terminal ferromagnetic tunnel element of the invention;

FIG. 166 is a schematic cross-sectional view showing other example of a three-terminal ferromagnetic tunnel element of the invention;

FIG. 167 is a schematic cross-sectional view showing other example of a three-terminal ferromagnetic tunnel element of the invention;

FIG. 168 is a schematic cross-sectional view showing other example of a three-terminal ferromagnetic tunnel element of the invention;

FIG. 169 is a schematic cross-sectional view showing other example of a three-terminal ferromagnetic tunnel element of the invention;

FIG. 170 is a schematic cross-sectional view showing other example of a three-terminal ferromagnetic tunnel element of the invention;

FIG. 171 is a schematic cross-sectional view showing other example of a three-terminal ferromagnetic tunnel element of the invention;

FIG. 172 is a schematic cross-sectional view showing other example of a three-terminal ferromagnetic tunnel element of the invention;

FIG. 173 is a schematic cross-sectional view showing other example of a three-terminal ferromagnetic tunnel element of the invention;

FIG. 174 is a schematic cross-sectional view showing other example of a three-terminal ferromagnetic tunnel element of the invention;

FIG. 175 is a schematic cross-sectional view showing other example of a three-terminal ferromagnetic tunnel element of the invention;

FIG. 176 is a schematic cross-sectional view showing other example of a three-terminal ferromagnetic tunnel element of the invention;

FIG. 177 is a schematic cross-sectional view showing other example of a three-terminal ferromagnetic tunnel element of the invention;

FIG. 178 is a schematic cross-sectional view showing other example of a three-terminal ferromagnetic tunnel element of the invention;

FIG. 179 is a schematic cross-sectional view showing other example of a three-terminal ferromagnetic tunnel element of the invention;

FIG. 180 is a schematic cross-sectional view showing other example of a three-terminal ferromagnetic tunnel element of the invention;

FIG. 181 is a schematic cross-sectional view showing other example of a three-terminal ferromagnetic tunnel element of the invention;

FIG. 182 is a schematic cross-sectional view showing other example of a three-terminal ferromagnetic tunnel element of the invention;

FIG. 183 is a schematic cross-sectional view showing other example of a three-terminal ferromagnetic tunnel element of the invention;

FIG. 184 is a schematic cross-sectional view showing other example of a three-terminal ferromagnetic tunnel element of the invention;

FIG. 185 is a schematic cross-sectional view showing other example of a three-terminal ferromagnetic tunnel element of the invention;

FIG. 186 is a schematic cross-sectional view showing other example of a three-terminal ferromagnetic tunnel element of the invention;

FIG. 187 is a schematic cross-sectional view showing other example of a three-terminal ferromagnetic tunnel element of the invention;

FIG. 188 is a schematic cross-sectional view showing other example of a three-terminal ferromagnetic tunnel element of the invention;

FIG. 189 is a schematic cross-sectional view showing other example of a three-terminal ferromagnetic tunnel element of the invention;

FIG. 190 is a schematic cross-sectional view showing other example of a three-terminal ferromagnetic tunnel element of the invention;

FIG. 191 is a schematic cross-sectional view showing other example of a three-terminal ferromagnetic tunnel element of the invention;

FIG. 192 is a schematic cross-sectional view showing other example of a three-terminal ferromagnetic tunnel element of the invention;

FIG. 193 is a schematic cross-sectional view showing other example of a three-terminal ferromagnetic tunnel element of the invention;

FIG. 194 is a schematic cross-sectional view showing other example of a three-terminal ferromagnetic tunnel element of the invention;

FIG. 195 is a schematic cross-sectional view showing other example of a three-terminal ferromagnetic tunnel element of the invention;

FIG. 196 is a schematic cross-sectional view showing other example of a three-terminal ferromagnetic tunnel element of the invention;

FIG. 197 is a schematic cross-sectional view showing other example of a three-terminal ferromagnetic tunnel element of the invention;

FIG. 198 is a schematic cross-sectional view showing other example of a three-terminal ferromagnetic tunnel element of the invention;

FIG. 199 is a schematic cross-sectional view showing other example of a three-terminal ferromagnetic tunnel element of the invention;

FIG. 200 is a schematic cross-sectional view showing other example of a three-terminal ferromagnetic tunnel element of the invention;

FIG. 201 is a schematic cross-sectional view showing other example of a three-terminal ferromagnetic tunnel element of the invention;

FIG. 202 is a schematic cross-sectional view showing other example of a three-terminal ferromagnetic tunnel element of the invention;

FIG. 203 is a schematic cross-sectional view showing other example of a three-terminal ferromagnetic tunnel element of the invention;

FIG. 204 is a schematic cross-sectional view showing other example of a three-terminal ferromagnetic tunnel element of the invention;

FIG. 205 is a schematic cross-sectional view showing other example of a three-terminal ferromagnetic tunnel element of the invention;

FIG. 206 is a schematic cross-sectional view showing other example of a three-terminal ferromagnetic tunnel element of the invention;

FIG. 207 is a schematic cross-sectional view showing other example of a three-terminal ferromagnetic tunnel element of the invention;

FIG. 208 is a schematic cross-sectional view showing other example of a three-terminal ferromagnetic tunnel element of the invention;

FIG. 209 is a schematic cross-sectional view showing other example of a three-terminal ferromagnetic tunnel element of the invention;

FIG. 210 is a schematic cross-sectional view showing other example of a three-terminal ferromagnetic tunnel element of the invention;

FIG. 211 is a schematic cross-sectional view showing other example of a three-terminal ferromagnetic tunnel element of the invention;

FIG. 212 is a schematic cross-sectional view showing other example of a three-terminal ferromagnetic tunnel element of the invention;

FIG. 213 is a schematic cross-sectional view showing other example of a three-terminal ferromagnetic tunnel element of the invention;

FIG. 214 is a schematic cross-sectional view showing other example of a three-terminal ferromagnetic tunnel element of the invention;

FIG. 215 is a schematic cross-sectional view showing other example of a three-terminal ferromagnetic tunnel element of the invention;

FIG. 216 is a schematic cross-sectional view showing other example of a three-terminal ferromagnetic tunnel element of the invention;

FIG. 217 is a schematic cross-sectional view showing other example of a three-terminal ferromagnetic tunnel element of the invention;

FIG. 218 is a schematic cross-sectional view showing other example of a three-terminal ferromagnetic tunnel element of the invention;

FIG. 219 is a schematic cross-sectional view showing other example of a three-terminal ferromagnetic tunnel element of the invention;

FIG. 220 is a schematic cross-sectional view showing other example of a three-terminal ferromagnetic tunnel element of the invention;

FIG. 221 is a schematic cross-sectional view showing other example of a three-terminal ferromagnetic tunnel element of the invention;

FIG. 222 is a schematic cross-sectional view showing other example of a three-terminal ferromagnetic tunnel element of the invention;

FIG. 223 is a schematic cross-sectional view showing other example of a three-terminal ferromagnetic tunnel element of the invention;

FIG. 224 is a schematic cross-sectional view showing other example of a three-terminal ferromagnetic tunnel element of the invention;

FIG. 225 is a schematic cross-sectional view showing other example of a three-terminal ferromagnetic tunnel element of the invention;

FIG. 226 is a schematic cross-sectional view showing other example of a three-terminal ferromagnetic tunnel element of the invention;

FIG. 227 is a schematic cross-sectional view showing other example of a three-terminal ferromagnetic tunnel element of the invention;

FIG. 228 is a schematic cross-sectional view showing other example of a three-terminal ferromagnetic tunnel element of the invention;

FIG. 229 is a schematic perspective view showing a read/write head using a three-terminal ferromagnetic tunnel element of the invention; and FIG. 230 is a schematic view showing an exemplary structure of a magnetic writing device provided with the read/write head using the three-terminal ferromagnetic tunnel element of the invention.

DETAILED DESCRIPTION OF THE INVENTION

Hereinafter, embodiments of the present invention will be described with reference to the accompanying drawings.

[Embodiment 1]

FIGS. 1 to 17 are schematic cross-sectional views showing examples of a three-terminal ferromagnetic tunnel element (hereinafter, referred to as a "three-terminal TMR element") of the invention. The three-terminal TMR elements shown in FIGS. 1 to 17 each have a basic structure of a half-metallic ferromagnetic layer, an insulating barrier layer, a ferromagnetic metal layer, an insulating barrier layer and a half-metallic ferromagnetic layer laminated in this order on a substrate.

Figure 1:
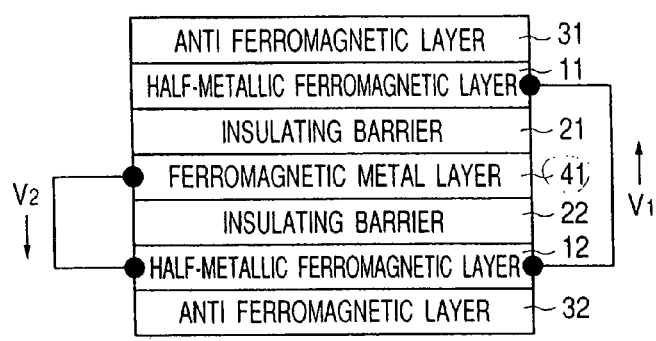
FIG. 1 is a schematic cross-sectional view showing one example of a three-terminal ferromagnetic tunnel element of the present invention.

FIG. 1 is a schematic cross-sectional view showing one example of the three-terminal ferromagnetic tunnel element of the invention. This three-terminal TMR element includes an antiferromagnetic layer 32 (30 nm), a half-metallic ferromagnetic layer 12 (30 nm), an insulating barrier layer 22 (2 nm), a ferromagnetic metal layer 41 (10 nm), an insulating barrier layer 21 (2 nm), a half-metallic ferromagnetic layer 11 (30 nm) and an antiferromagnetic layer 31 (30 nm) laminated in this order on a substrate. An electrode terminal is formed in each of the half-metallic ferromagnetic layers 11 and 12 to form an electric closed-circuit between the layers 11 and 12 (a bias voltage applied by this closed-circuit is defined as $V_1$) while an electrode terminal is formed in each of the ferromagnetic metal layer 41 and the half-metallic ferromagnetic layer 12 to form an electric closed-circuit between the layers 41 and 12 (a bias voltage applied by this closed-circuit is defined as $V_2$). This element was produced by sputtering or deposition technique, and photolithography.

Arrows in the figure represent directions of currents provided to the element, which may be vice versa as long as the relative relationship of the directions remains the same. Specifically, when the direction of a current of the bias voltage $V_1$ is reversed with respect to the arrow in FIG. 1, the direction of the current of the bias voltage $V_2$ should also be reversed. The $V_2$ circuit may be formed between the half-metallic ferromagnetic layer 11 and the ferromagnetic metal layer 41.

Hereinafter, materials used for the respective layers of the above-described three-terminal TMR element will be described. The half-metallic ferromagnetic layers 11 and 12 are made from half-metallic ferromagnets with a very high degree of spin-polarization including $Fe_3O_4$, $CrO_2$, $La_{0.7}Sr_{0.3}MnO_3$, $Sr_2FeMoO_6$ and Mn compounds such as MnSb. The insulating barrier layers 21 and 22 are made of $SrTiO_3$, but they may also be made of MgO, $HfO_2$, TaO, NbO, MoO, $TiO_2$ or $Al_2O_3$. The ferromagnetic metal layer 41 is made of CoFe alloy, but it may also be made of Co or NiFe. The antiferromagnetic layers 31 and 32 are made of NiO.

Figure 2A:
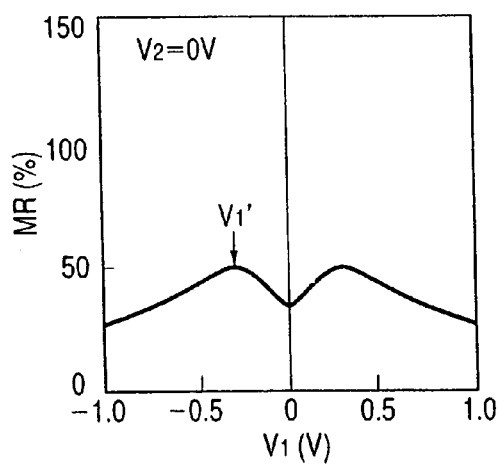
FIGS. 2A and 2B are graphs where
Figure 2B:
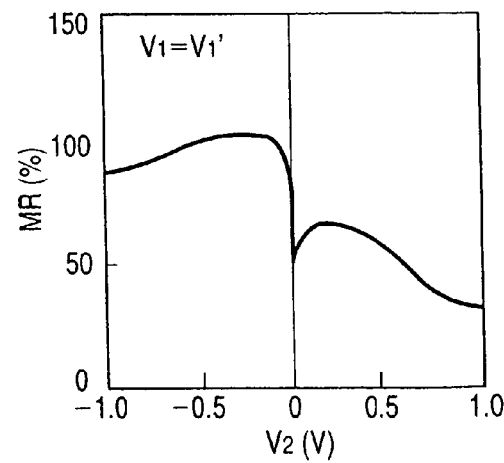

FIG. 2A shows an applied bias voltage $V_1$ dependency of the TMR ratio of the three-terminal TMR element shown in FIG. 1 under $V_2=0$. FIG. 2B shows an applied bias voltage $V_2$ dependency of the TMR ratio of the three-terminal TMR element shown in FIG. 1 under $V_1=V_1'$. Here, $V_1'$ is a value of the applied bias voltage $V_1$ where the highest TMR ratio is obtained in FIG. 2A. According to the present example, the bias voltage dependency of the magnetoresistive ratio between the half-metallic ferromagnetic layers 11 and 12 is such that the TMR ratio becomes the highest at about ±0.25 V and decreases at a bias voltage higher than that. By setting $V_1$ to $V_1'$ and by varying the bias voltage $V_2$ applied between the ferromagnetic metal layer 41 and the half-metallic ferromagnetic layer 12, the magnetoresistive ratio can be doubled with a negative bias voltage, thereby reducing the bias voltage dependency.

Figure 3:
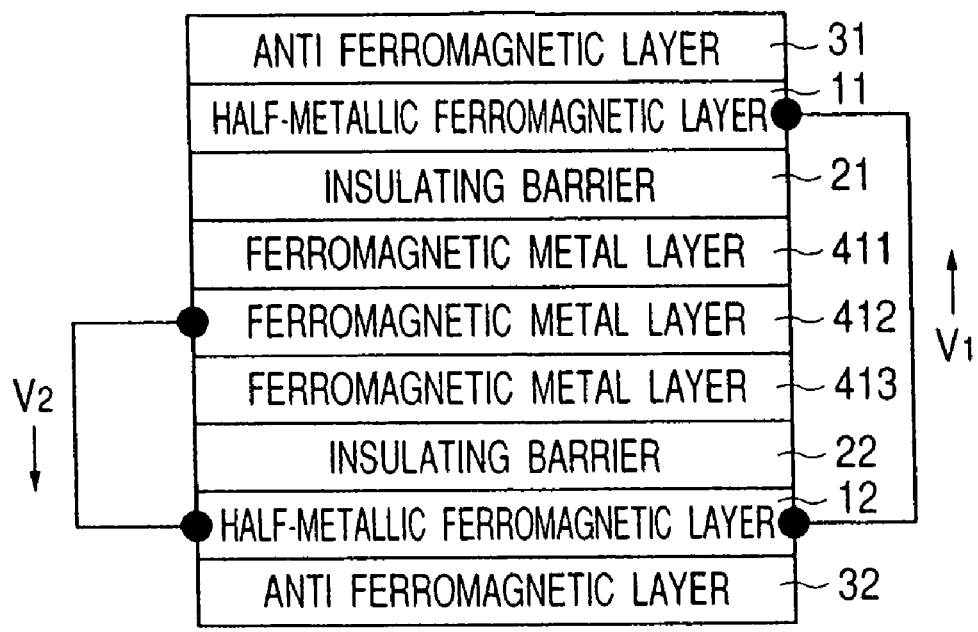
FIG. 3 is a schematic cross-sectional view showing another example of a three-terminal ferromagnetic tunnel element of the invention.

FIG. 3 is a schematic cross-sectional view showing another exemplary three-terminal TMR element of the invention. This three-terminal TMR element has the same structure as that shown in FIG. 1 except that the ferromagnetic metal layer 41 is replaced with a tri-layered film made from ferromagnetic metal layers 411, 412 and 413. This structure eases the magnetization rotation of the ferromagnetic metal layers 411, 412 and 413. In each of the following examples described with respect to FIGS. 5, 9 to 11, and 15 to 17, the ferromagnetic metal layer 41 is made from three layers for the same reason. The ferromagnetic metal layers 411 and 413 are made of a Co-based alloy (CoFe), and the ferromagnetic metal layer 412 is made of a Ni-based alloy (NiFe). The element of the present example had the same TMR characteristics as those shown in FIGS. 2A and 2B.

Figure 4:
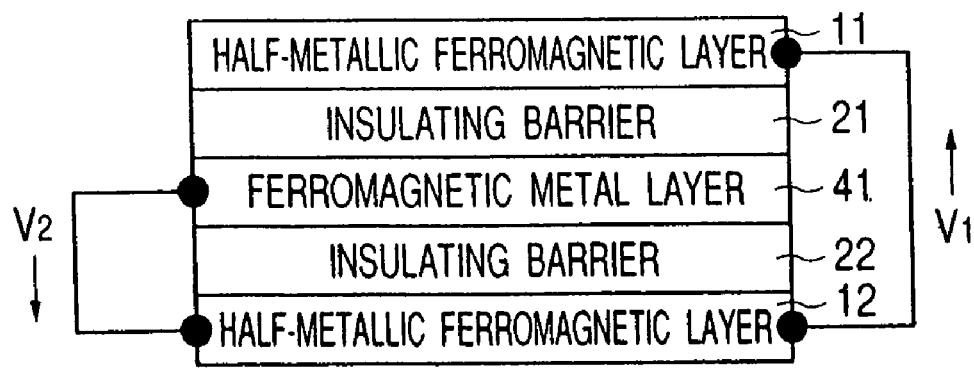
FIG. 4 is a schematic cross-sectional view showing other example of a three-terminal ferromagnetic tunnel element of the invention.

FIG. 4 is a schematic cross-sectional view showing other exemplary three-terminal TMR element of the invention. This three-terminal TMR element has the same structure as that shown in FIG. 1 without the antiferromagnetic layers 31 and 32. The element had the same TMR characteristics as those shown in FIGS. 2A and 2B. In this example, a soft magnetic half-metallic ferromagnetic layer can be applied. In the following examples described with respect to FIGS. 5, and 12 to 17, the antiferromagnetic layers are not provided adjacent to the half-metallic ferromagnetic layers for this reason.

Figure 5:
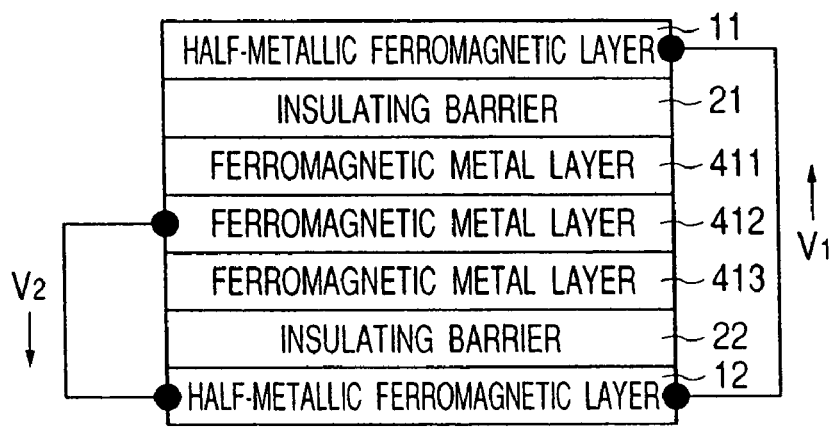
FIG. 5 is a schematic cross-sectional view showing other example of a three-terminal ferromagnetic tunnel element of the invention.

FIG. 5 is a schematic cross-sectional view showing other exemplary three-terminal TMR element of the invention. This three-terminal TMR element has the same structure as that shown in FIG. 3 without the antiferromagnetic layers 31 and 32. The element had the same TMR characteristics as those shown in FIGS. 2A and 2B.

Figure 6:
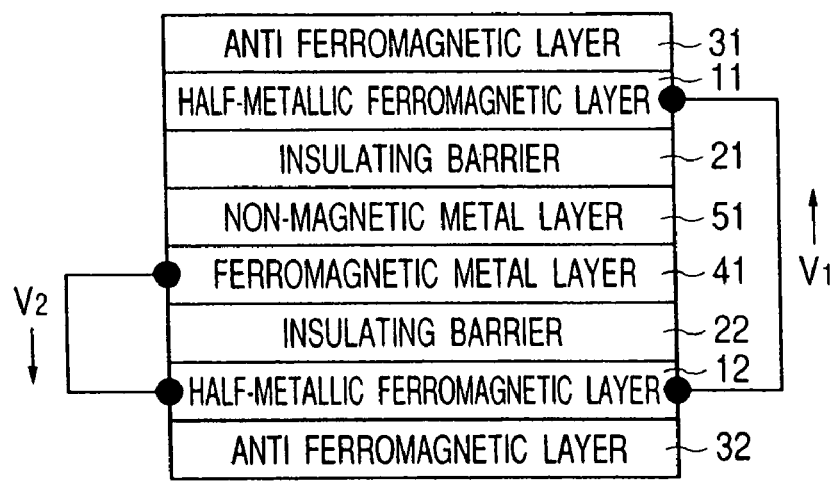
FIG. 6 is a schematic cross-sectional view showing other example of a three-terminal ferromagnetic tunnel element of the invention.

FIG. 6 is a schematic cross-sectional view showing other exemplary three-terminal TMR element of the invention. This three-terminal TMR element has the same structure as that shown in FIG. 1 except that a non-magnetic metal layer 51 is formed between the insulating barrier layer 21 and the ferromagnetic metal layer 41. The non-magnetic metal layer 51 may be selected from Au, Cu, Cr, Zn, Ga, Nb, Mo, Ru, Pd, Ag, Hf, Ta, W, Pt and Bi. The element had the same TMR characteristics as those shown in FIGS. 2A and 2B. By arranging the non-magnetic metal layer adjacent to the ferromagnetic metal layer, the density of states of the bulk of the ferromagnetic metal layer will contribute to conductance, by which the bias voltage dependency of the TMR ratio can be improved. In the following examples described with respect to FIGS. 7 to 17, non-magnetic metal layers are used for the same reason.

Figure 7:
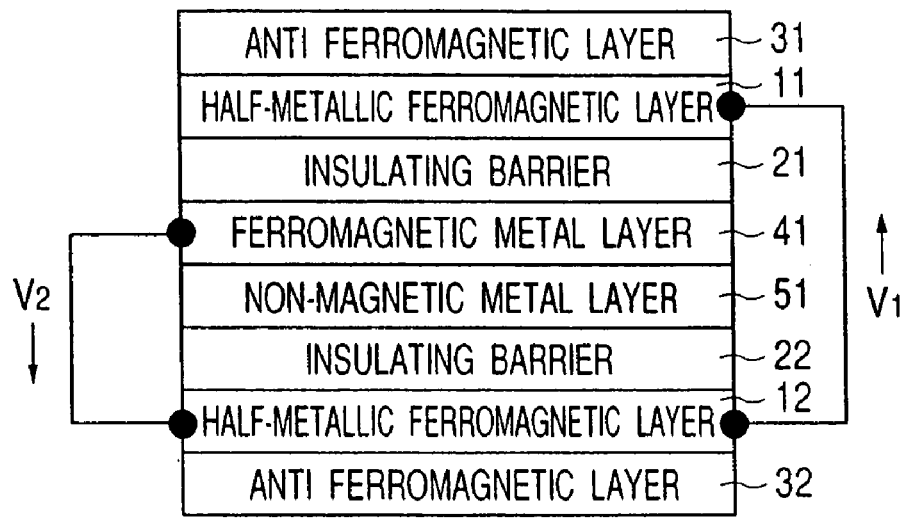
FIG. 7 is a schematic cross-sectional view showing other example of a three-terminal ferromagnetic tunnel element of the invention.

FIG. 7 is a schematic cross-sectional view showing other exemplary three-terminal TMR element of the invention. This three-terminal TMR element has the same structure as that shown in FIG. 6 except that a non-magnetic metal layer 51 is formed between the insulating barrier layer 22 and the ferromagnetic metal layer 41. The element had the same TMR characteristics as those shown in FIGS. 2A and 2B.

Figure 8:
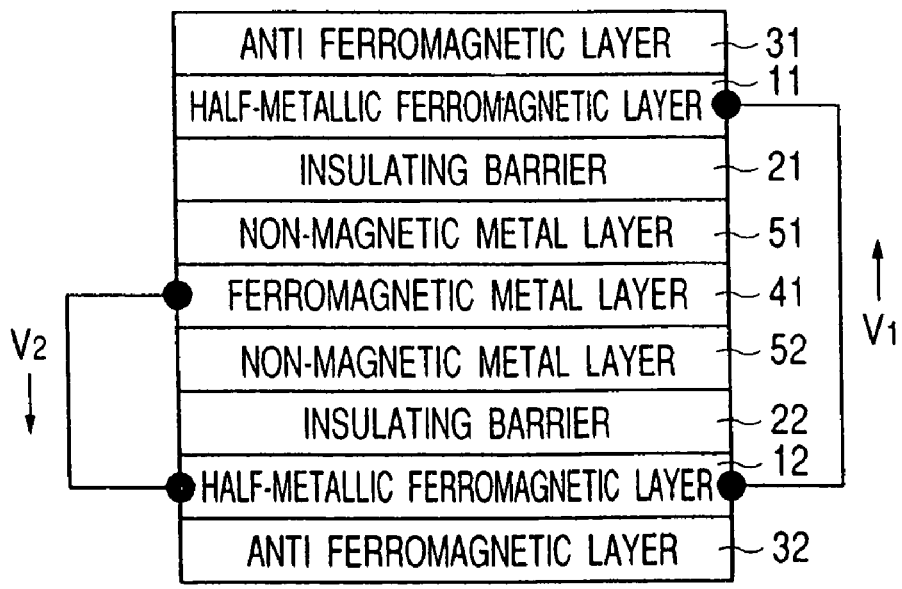
FIG. 8 is a schematic cross-sectional view showing other example of a three-terminal ferromagnetic tunnel element of the invention.

FIG. 8 is a schematic cross-sectional view showing other exemplary three-terminal TMR element of the invention. This three-terminal TMR element has the same structure as that shown in FIG. 1 except that a non-magnetic metal layer 51 is formed between the insulating barrier layer 21 and the ferromagnetic metal layer 41, and a non-magnetic metal layer 52 is formed between the insulating barrier layer 22 and the ferromagnetic metal layer 41. Similar to the non-magnetic metal layer 51, the non-magnetic metal layer 52 may be selected from Au, Cu, Cr, Zn, Ga, Nb, Mo, Ru, Pd, Ag, Hf, Ta, W, Pt and Bi. The element had the same TMR characteristics as those shown in FIGS. 2A and 2B.

Figure 9:
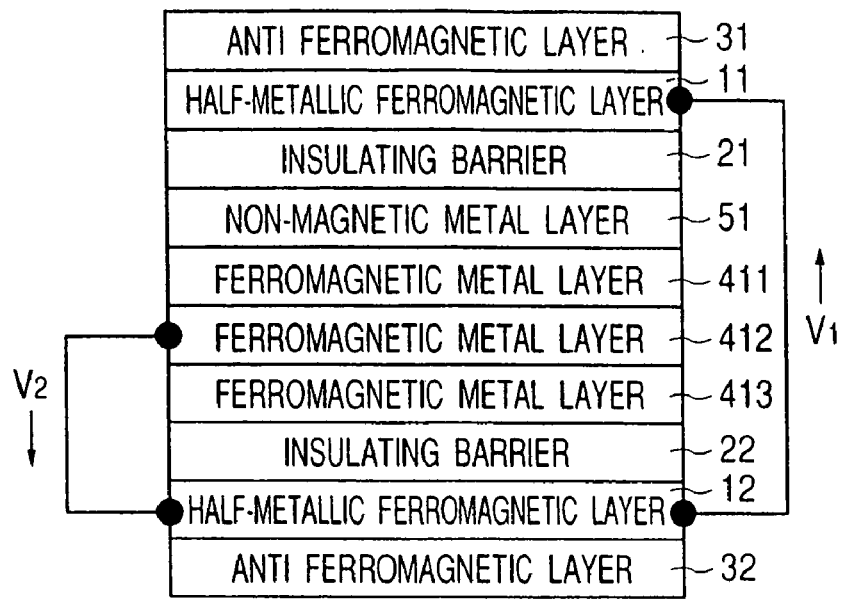
FIG. 9 is a schematic cross-sectional view showing other example of a three-terminal ferromagnetic tunnel element of the invention.

FIG. 9 is a schematic cross-sectional view showing another exemplary three-terminal TMR element of the invention. This three-terminal TMR element has the same structure as that shown in FIG. 6 except that the ferromagnetic metal layer 41 is replaced with a tri-layered film made from ferromagnetic metal layers 411, 412 and 413. The ferromagnetic metal layers 411 and 413 are made of a Co-based alloy (CoFe), and the ferromagnetic metal layer 412 is made of a Ni-based alloy (NiFe). The element of the present example had the same TMR characteristics as those shown in FIGS. 2A and 2B.

Figure 10:
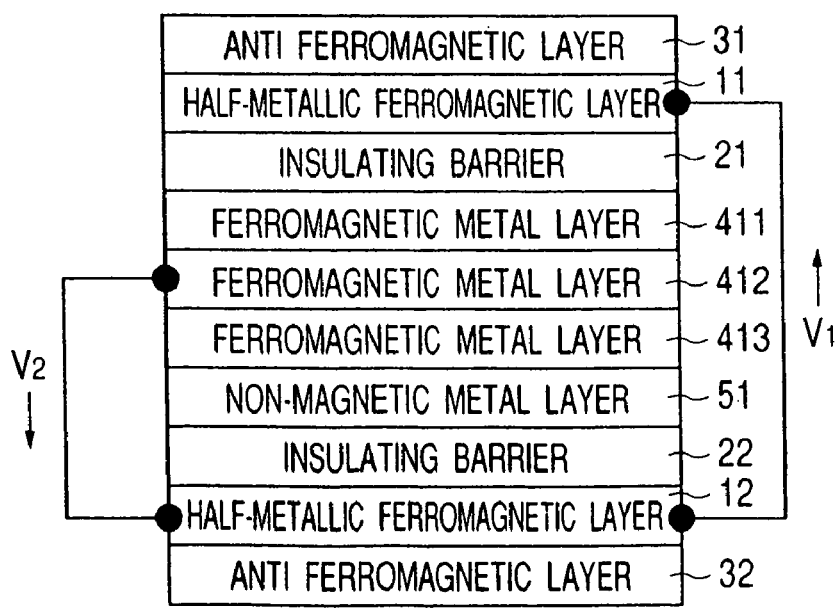
FIG. 10 is a schematic cross-sectional view showing other example of a three-terminal ferromagnetic tunnel element of the invention.

FIG. 10 is a schematic cross-sectional view showing another exemplary three-terminal TMR element of the invention. This three-terminal TMR element has the same structure as that shown in FIG. 7 except that the ferromagnetic metal layer 41 is replaced with a tri-layered film made from ferromagnetic metal layers 411, 412 and 413. The ferromagnetic metal layers 411 and 413 are made of a Co-based alloy (CoFe), and the ferromagnetic metal layer 412 is made of a Ni-based alloy (NiFe). The element of the present example had the same TMR characteristics as those shown in FIGS. 2A and 2B.

Figure 11:
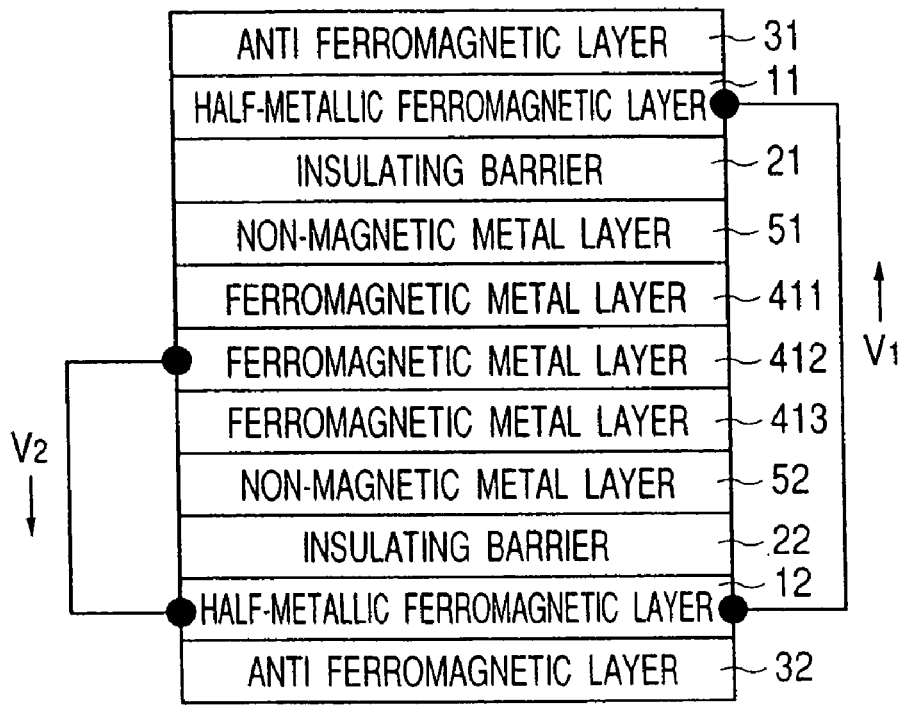
FIG. 11 is a schematic cross-sectional view showing other example of a three-terminal ferromagnetic tunnel element of the invention.

FIG. 11 is a schematic cross-sectional view showing another exemplary three-terminal TMR element of the invention. This three-terminal TMR element has the same structure as that shown in FIG. 8 except that the ferromagnetic metal layer 41 is replaced with a tri-layered film made from ferromagnetic metal layers 411, 412 and 413. The ferromagnetic metal layers 411 and 413 are made of a Co-based alloy (CoFe), and the ferromagnetic metal layer 412 is made of a Ni-based alloy (NiFe). The element of the present example had the same TMR characteristics as those shown in FIGS. 2A and 2B.

Figure 12:
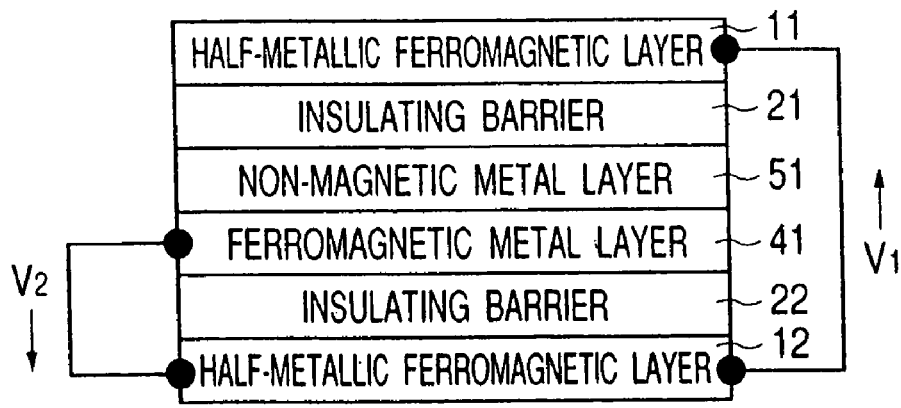
FIG. 12 is a schematic cross-sectional view showing other example of a three-terminal ferromagnetic tunnel element of the invention.

FIG. 12 is a schematic cross-sectional view showing other exemplary three-terminal TMR element of the invention. This three-terminal TMR element has the same structure as that shown in FIG. 6 without the antiferromagnetic layers 31 and 32. The element had the same TMR characteristics as those shown in FIGS. 2A and 2B.

Figure 13:
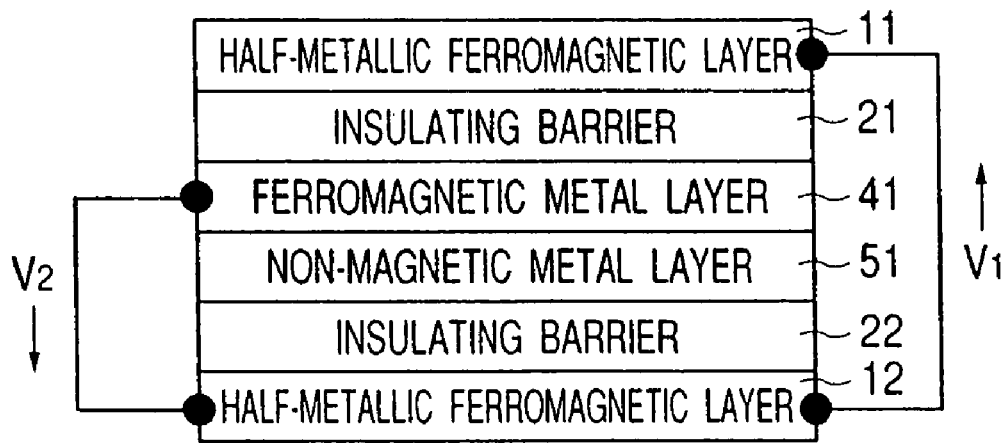
FIG. 13 is a schematic cross-sectional view showing other example of a three-terminal ferromagnetic tunnel element of the invention.

FIG. 13 is a schematic cross-sectional view showing other exemplary three-terminal TMR element of the invention. This three-terminal TMR element has the same structure as that shown in FIG. 7 without the antiferromagnetic layers 31 and 32. The element had the same TMR characteristics as those shown in FIGS. 2A and 2B.

Figure 14:
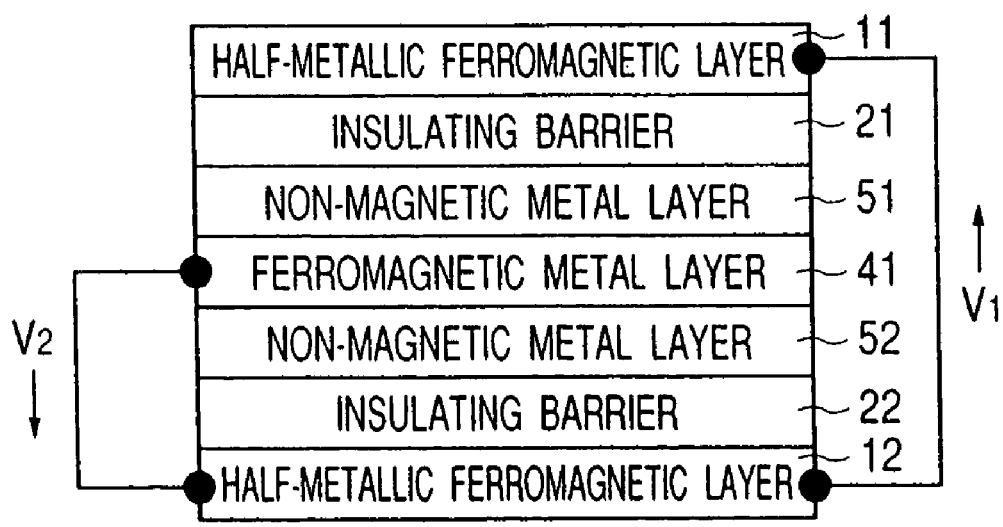
FIG. 14 is a schematic cross-sectional view showing other example of a three-terminal ferromagnetic tunnel element of the invention.

FIG. 14 is a schematic cross-sectional view showing other exemplary three-terminal TMR element of the invention. This three-terminal TMR element has the same structure as that shown in FIG. 8 without the antiferromagnetic layers 31 and 32. The element had the same TMR characteristics as those shown in FIGS. 2A and 2B.

Figure 15:
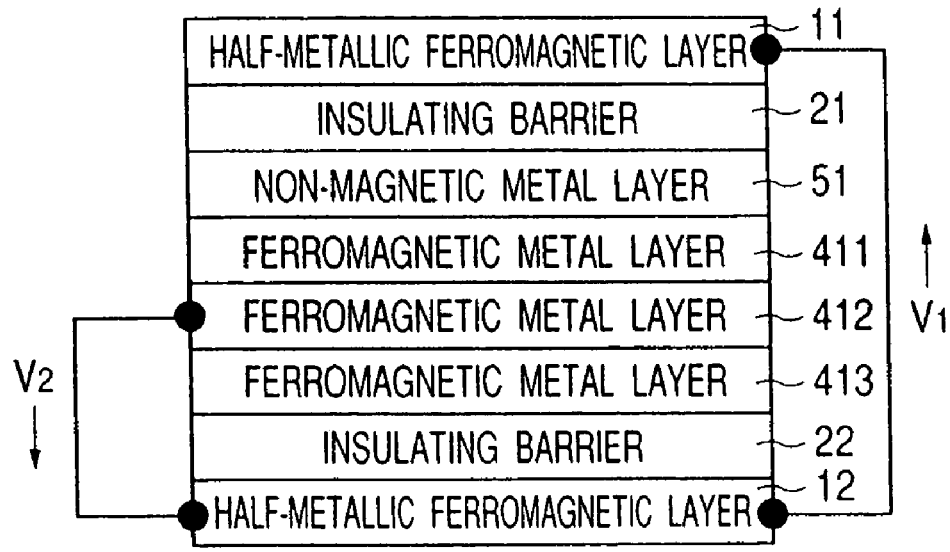
FIG. 15 is a schematic cross-sectional view showing other example of a three-terminal ferromagnetic tunnel element of the invention.

FIG. 15 is a schematic cross-sectional view showing other exemplary three-terminal TMR element of the invention. This three-terminal TMR element has the same structure as that shown in FIG. 9 without the antiferromagnetic layers 31 and 32. The element had the same TMR characteristics as those shown in FIGS. 2A and 2B.

Figure 16:
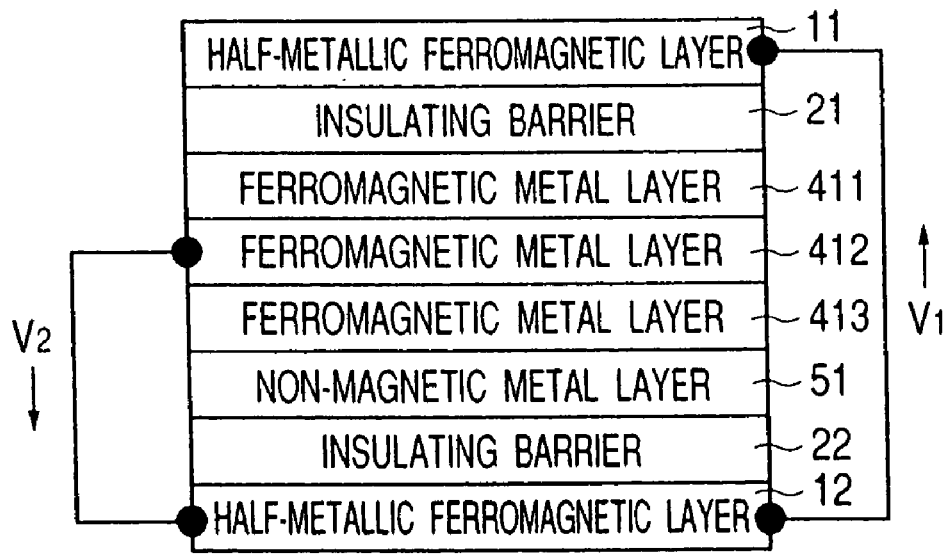
FIG. 16 is a schematic cross-sectional view showing other example of a three-terminal ferromagnetic tunnel element of the invention.

FIG. 16 is a schematic cross-sectional view showing other exemplary three-terminal TMR element of the invention. This three-terminal TMR element has the same structure as that shown in FIG. 10 without the antiferromagnetic layers 31 and 32. The element had the same TMR characteristics as those shown in FIGS. 2A and 2B.

Figure 17:
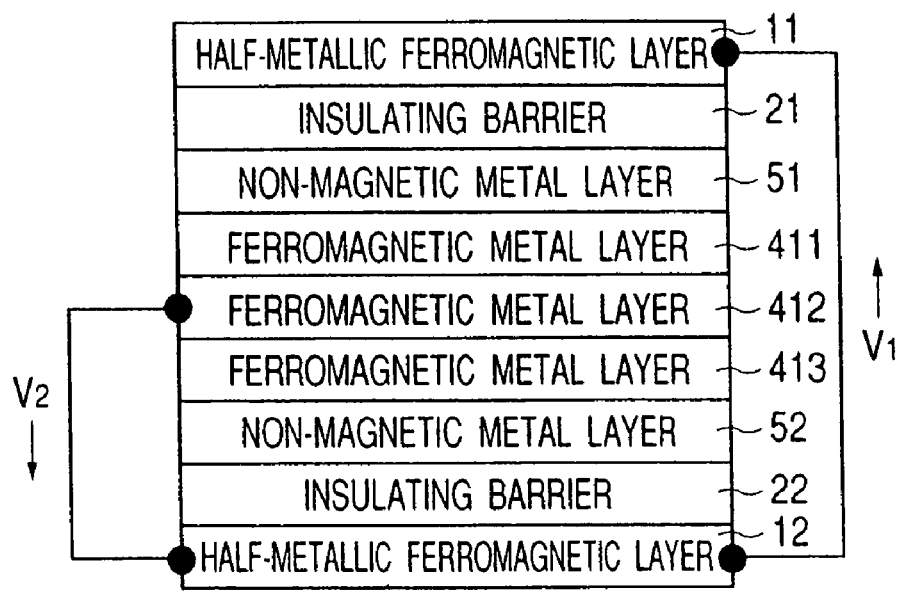
FIG. 17 is a schematic cross-sectional view showing other example of a three-terminal ferromagnetic tunnel element of the invention.

FIG. 17 is a schematic cross-sectional view showing other exemplary three-terminal TMR element of the invention. This three-terminal TMR element has the same structure as that shown in FIG. 11 without the antiferromagnetic layers 31 and 32. The element had the same TMR characteristics as those shown in FIGS. 2A and 2B.

In the examples shown in FIGS. 3 to 17, the bias voltage $V_2$ may be applied between the half-metallic ferromagnetic layer 11 and the ferromagnetic metal layer 41 (412).

[Embodiment 2]

In the examples shown in FIGS. 18 to 34, each of the three-terminal TMR elements has a basic structure where a ferromagnetic metal layer, an insulating barrier layer, a half-metallic ferromagnetic layer, an insulating barrier layer and a ferromagnetic metal layer are laminated on a substrate in this order.

Figure 18:
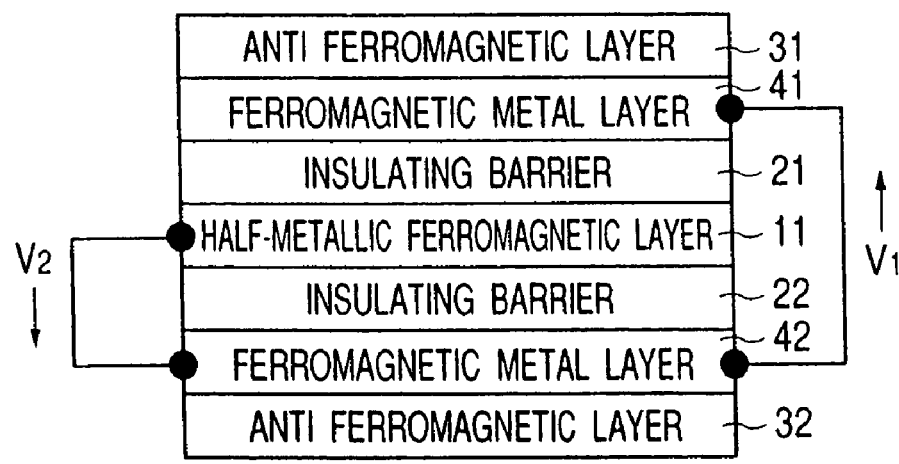
FIG. 18 is a schematic cross-sectional view showing other example of a three-terminal ferromagnetic tunnel element of the invention.

FIG. 18 is a schematic cross-sectional view showing other example of the three-terminal ferromagnetic tunnel element of the invention. The three-terminal TMR element of this example includes an antiferromagnetic layer 32 (30 nm), a ferromagnetic metal layer 42 (5 nm), an insulating barrier layer 22 (2 nm), a half-metallic ferromagnetic layer 11 (30 nm), an insulating barrier layer 21 (2 nm), a ferromagnetic metal layer 41 (5 nm), and an antiferromagnetic layer 31 (30 nm) laminated in this order on a substrate. An electrode terminal is formed in each of the ferromagnetic metal layers 41 and 42 to form an electric closed-circuit between the layers 41 and 42 (a bias voltage applied by this closed-circuit is defined as $V_1$) while an electrode terminal is formed in each of the ferromagnetic metal layer 42 and the half-metallic ferromagnetic layer 11 to form an electric closed-circuit between the layers 42 and 11 (a bias voltage applied by this closed-circuit is defined as $V_2$). This element was produced by sputtering or deposition technique, and photolithography.

Arrows in the figure represent directions of currents provided to the element, which may be vice versa as long as the relative relationship of the directions remains the same. Specifically, when the direction of a current of the bias voltage $V_1$ is reversed with respect to the arrow in FIG. 18, the direction of the current of the bias voltage $V_2$ should also be reversed. In this example, the bias voltage $V_2$ may be applied between the half-metallic ferromagnetic layer 11 and the ferromagnetic metal layer 41.

Hereinafter, materials used for the respective layers of the above-described three-terminal TMR element will be described. The half-metallic ferromagnetic layer 11 is made from a half-metallic ferromagnet with very high degree of spin-polarization including $Fe_3O_4$, $CrO_2$, $La_{0.7}Sr_{0.3}MnO_3$, $Sr_2FeMoO_6$ and Mn compounds such as MnSb. The insulating barrier layers 21 and 22 are made of $SrTiO_3$, but they may also be made of MgO, $HfO_2$, TaO, NbO, MoO, $TiO_2$ or $Al_2O_3$. The ferromagnetic metal layers 41 and 42 are made of CoFe alloy, but they may also be made of Co or NiFe. The antiferromagnetic layers 31 and 32 are made of PtMn.

Figure 19A:
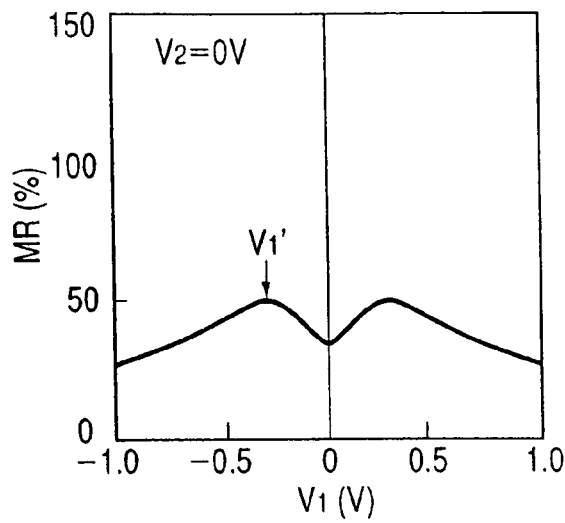
FIGS. 19A and 19B are graphs where
Figure 19B:
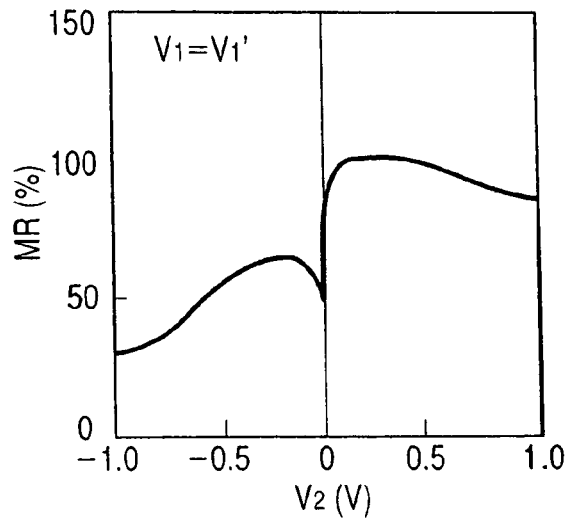

FIG. 19A shows an applied bias voltage $V_1$ dependency of the TMR ratio of the three-terminal TMR element shown in FIG. 18 under $V_2$=0. FIG. 19B shows an applied bias voltage $V_2$ dependency of the TMR ratio of the three-terminal TMR element shown in FIG. 18 under $V_1=V_1'$. Here, $V_1'$ is a value of the bias voltage $V_1$ where the highest TMR ratio is obtained in FIG. 19A. The three-terminal TMR element of this example has the same effect as that described with reference to FIGS. 2A and 2B except that the increase in the magnetoresistive ratio and well bias voltage dependency is obtained with a positive bias voltage due to the arrangement of the material as the ferromagnetic layer.

Figure 20:
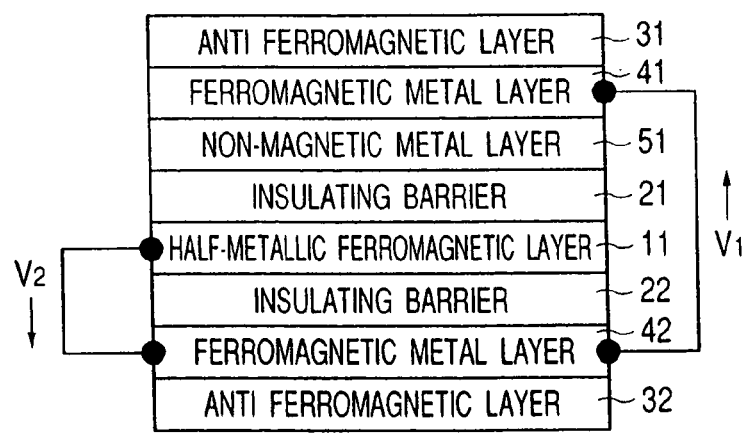
FIG. 20 is a schematic cross-sectional view showing other example of a three-terminal ferromagnetic tunnel element of the invention.

FIG. 20 is a schematic cross-sectional view showing other exemplary three-terminal TMR element of the invention. The three-terminal TMR element of this example has the same structure as that shown in FIG. 18 except that a non-magnetic metal layer 51 is formed between the ferromagnetic metal layer 41 and the insulating barrier layer 21. The non-magnetic metal layer 51 is selected from Au, Cu, Cr, Zn, Ga, Nb, Mo, Ru, Pd, Ag, Hf, Ta, W, Pt and Bi. The element had the same TMR characteristics as those shown in FIGS. 19A and 19B. By arranging the non-magnetic metal layer adjacent to the ferromagnetic metal layer, the effects described with reference to FIG. 6 can be realized. In the following examples described with respect to FIGS. 22 to 34, non-magnetic metal layers are arranged adjacent to ferromagnetic metal layers for the same reason.

Figure 21:
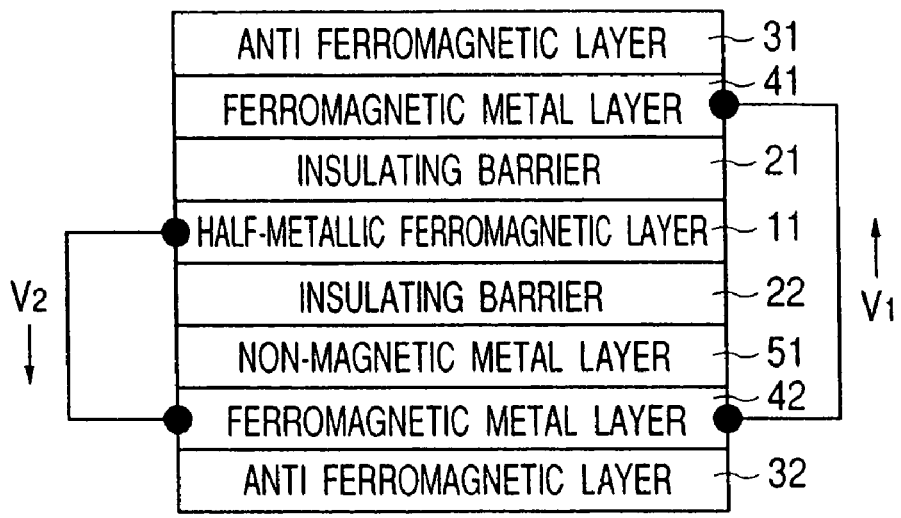
FIG. 21 is a schematic cross-sectional view showing other example of a three-terminal ferromagnetic tunnel element of the invention.

FIG. 21 is a schematic cross-sectional view showing other exemplary three-terminal TMR element of the invention. The three-terminal TMR element of this example has the same structure as that shown in FIG. 20 except that a non-magnetic metal layer 51 is formed between the ferromagnetic metal layer 42 and the insulating barrier layer 22. The element had the same TMR characteristics as those shown in FIGS. 19A and 19B.

Figure 22:
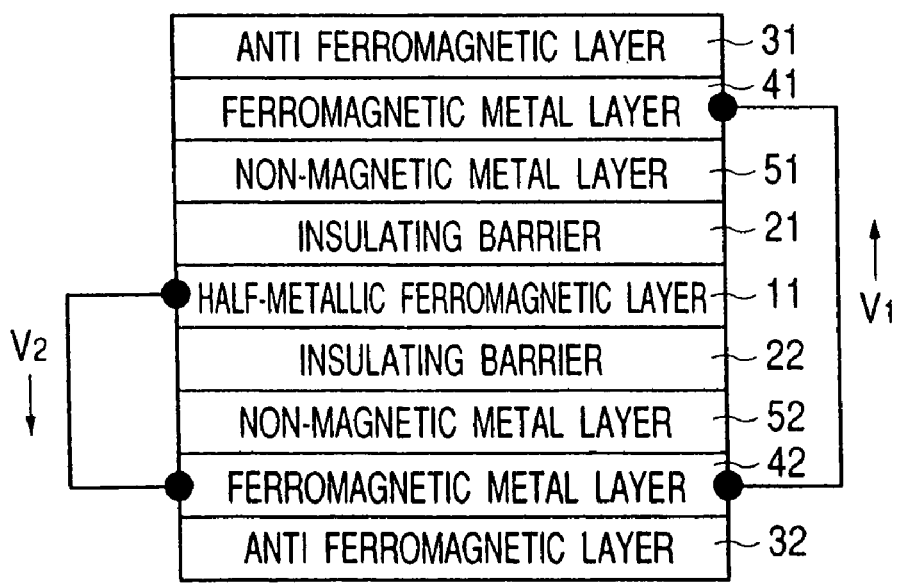
FIG. 22 is a schematic cross-sectional view showing other example of a three-terminal ferromagnetic tunnel element of the invention.

FIG. 22 is a schematic cross-sectional view showing other exemplary three-terminal TMR element of the invention. The three-terminal TMR element of this example has the same structure as that shown in FIG. 18 except that a non-magnetic metal layer 51 is formed between the ferromagnetic metal layer 41 and the insulating barrier layer 21, and a non-magnetic metal layer 52 is formed between the ferromagnetic metal layer 41 and the insulating barrier layer 22. Similar to the non-magnetic metal layer 51, the non-magnetic metal layer 52 may be selected from Au, Cu, Cr, Zn, Ga, Nb, Mo, Ru, Pd, Ag, Hf, Ta, W, Pt and Bi. The element had the same TMR characteristics as those shown in FIGS. 19A and 19B.

Figure 23:
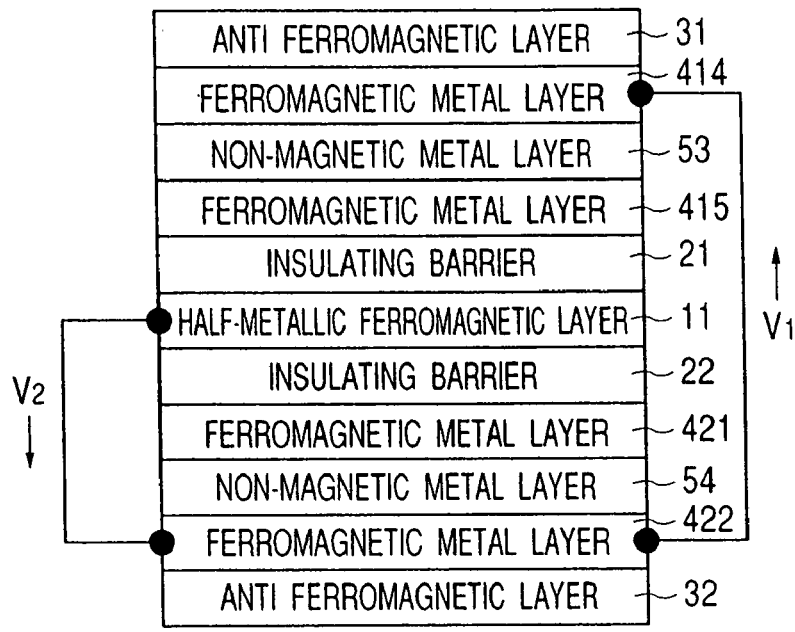
FIG. 23 is a schematic cross-sectional view showing other example of a three-terminal ferromagnetic tunnel element of the invention.

FIG. 23 is a schematic cross-sectional view showing other exemplary three-terminal TMR element of the invention. The three-terminal TMR element of this example has the same structure as that shown in FIG. 18 except that the ferromagnetic metal layer 41 is replaced with a tri-layered film made from a ferromagnetic metal layer 414, a non-magnetic metal layer 53 and a ferromagnetic metal layer 415, and the ferromagnetic metal layer 42 is replaced with a tri-layered film made from a ferromagnetic metal layer 421, a non-magnetic metal layer 54 and a ferromagnetic metal layer 422. This structure eases the magnetization rotation of the half-metallic ferromagnetic layer 11. In the following examples, the ferromagnetic metal layer 41 is also replaced with the tri-layered film for the same reason. The ferromagnetic metal layers 414, 415, 421 and 422 are made of a Co-based alloy. The non-magnetic metal layers 53 and 54 are made of either Ru or Cu. The element of the present example had the same TMR characteristics as those shown in FIGS. 19A and 19B.

Figure 24:
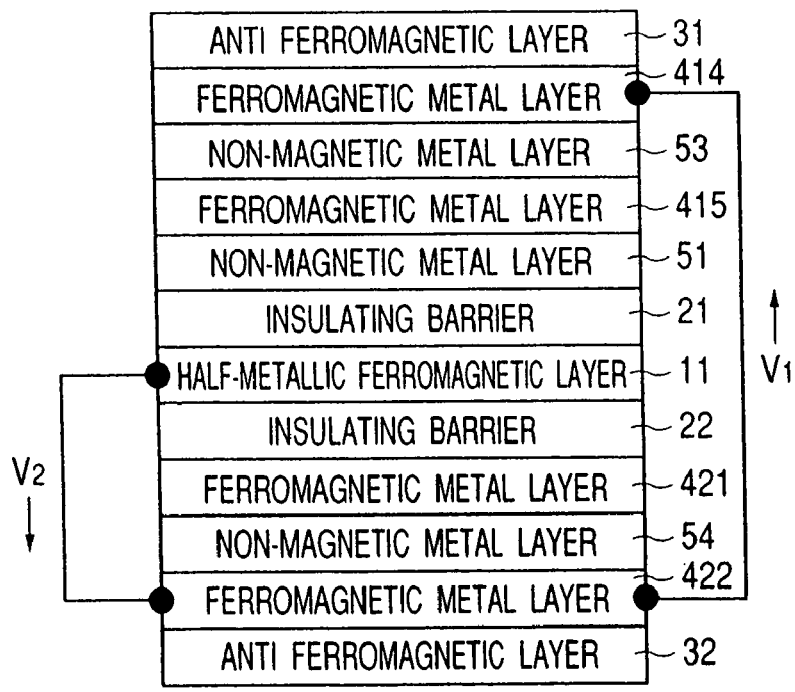
FIG. 24 is a schematic cross-sectional view showing other example of a three-terminal ferromagnetic tunnel element of the invention.

FIG. 24 is a schematic cross-sectional view showing other exemplary three-terminal TMR element of the invention. The three-terminal TMR element of this example has the same structure as that shown in FIG. 20 except that the ferromagnetic metal layer 41 is replaced with a tri-layered film made from a ferromagnetic metal layer 414, a non-magnetic metal layer 53 and a ferromagnetic metal layer 415, and the ferromagnetic metal layer 42 is replaced with a tri-layered film made from a ferromagnetic metal layer 421, a non-magnetic metal layer 54 and a ferromagnetic metal layer 422. The ferromagnetic metal layers 414, 415, 421 and 422 are made of a Co-based alloy. The non-magnetic metal layers 53 and 54 are made of either Ru or Cu. The element of the present example had the same TMR characteristics as those shown in FIGS. 19A and 19B.

Figure 25:
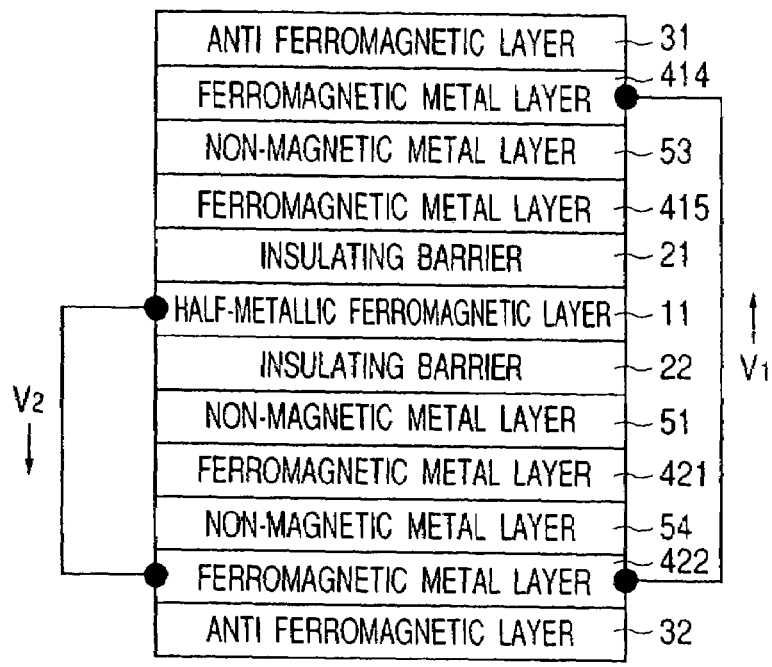
FIG. 25 is a schematic cross-sectional view showing other example of a three-terminal ferromagnetic tunnel element of the invention.

FIG. 25 is a schematic cross-sectional view showing other exemplary three-terminal TMR element of the invention. The three-terminal TMR element of this example has the same structure as that shown in FIG. 21 except that the ferromagnetic metal layer 41 is replaced with a tri-layered film made from a ferromagnetic metal layer 414, a non-magnetic metal layer 53 and a ferromagnetic metal layer 415, and the ferromagnetic metal layer 42 is replaced with a tri-layered film made from a ferromagnetic metal layer 421, a non-magnetic metal layer 54 and a ferromagnetic metal layer 422. The ferromagnetic metal layers 414, 415, 421 and 422 are made of a Co-based alloy. The non-magnetic metal layers 53 and 54 may be made of either Ru or Cu. The element of the present example had the same TMR characteristics as those shown in FIGS. 19A and 19B.

Figure 26:
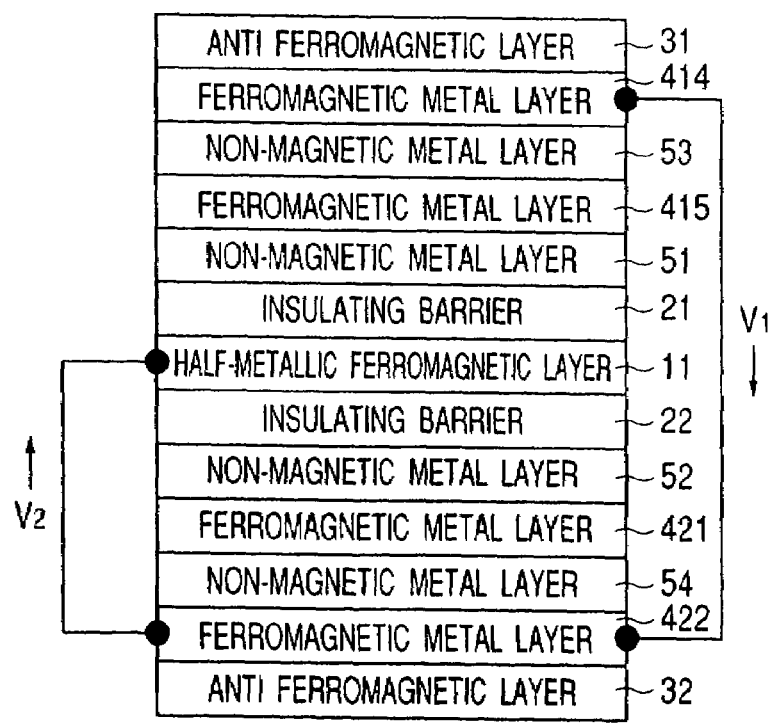
FIG. 26 is a schematic cross-sectional view showing other example of a three-terminal ferromagnetic tunnel element of the invention.

FIG. 26 is a schematic cross-sectional view showing other exemplary three-terminal TMR element of the invention. The three-terminal TMR element of this example has the same structure as that shown in FIG. 22 except that the ferromagnetic metal layer 41 is replaced with a tri-layered film made from a ferromagnetic metal layer 414, a non-magnetic metal layer 53 and a ferromagnetic metal layer 415, and the ferromagnetic metal layer 42 is replaced with a tri-layered film made from a ferromagnetic metal layer 421, a non-magnetic metal layer 54 and a ferromagnetic metal layer 422. The ferromagnetic metal layers 414, 415, 421 and 422 are made of a Co-based alloy. The non-magnetic metal layers 53 and 54 may be made of either Ru or Cu. The element of the present example had the same TMR characteristics as those shown in FIGS. 19A and 19B.

Figure 27:
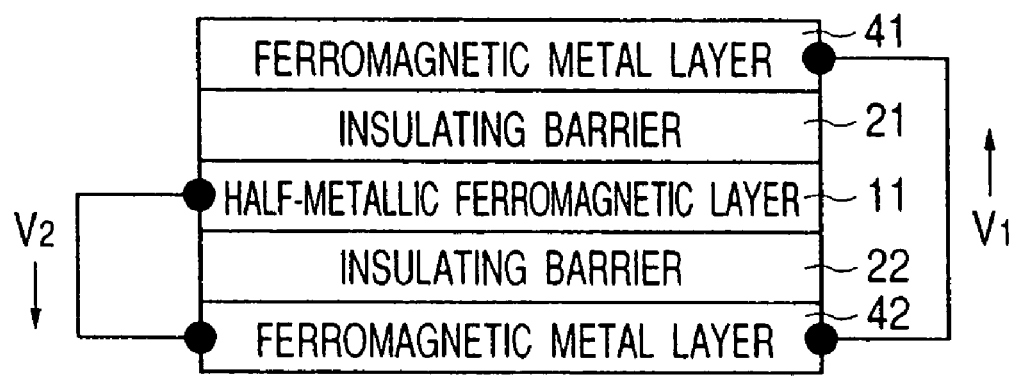
FIG. 27 is a schematic cross-sectional view showing other example of a three-terminal ferromagnetic tunnel element of the invention.

FIG. 27 is a schematic cross-sectional view showing other exemplary three-terminal TMR element of the invention. The three-terminal TMR element of this example has the same structure as that shown in FIG. 18 without the antiferromagnetic layers 31 and 32. This structure allows the use of a soft magnetic half-metallic ferromagnetic layer. In the following examples, the antiferromagnetic layers are not provided adjacent to the half-metallic ferromagnetic layers for this reason. The element had the same TMR characteristics as those shown in FIGS. 19A and 19B.

Figure 28:
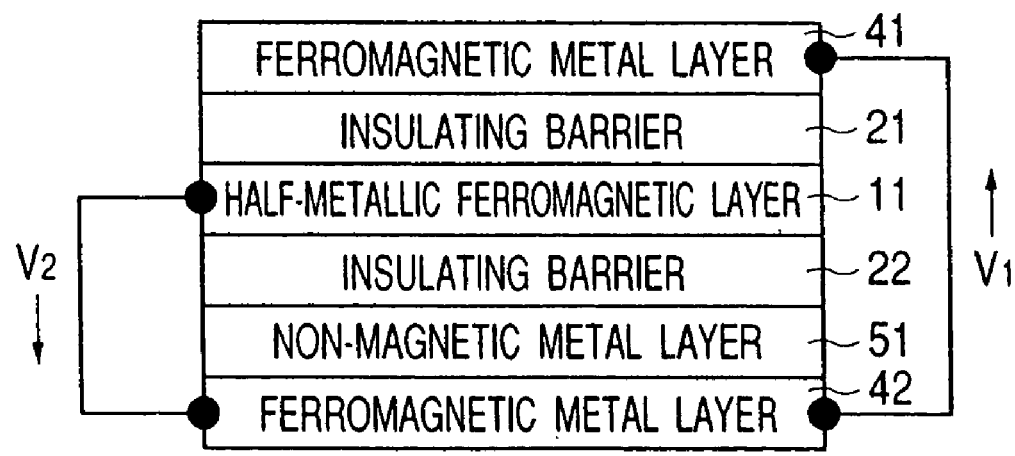
FIG. 28 is a schematic cross-sectional view showing other example of a three-terminal ferromagnetic tunnel element of the invention.

FIG. 28 is a schematic cross-sectional view showing other exemplary three-terminal TMR element of the invention. The three-terminal TMR element of this example has the same structure as that shown in FIG. 21 without the antiferromagnetic layers 31 and 32. The element had the same TMR characteristics as those shown in FIGS. 19A and 19B.

Figure 29:
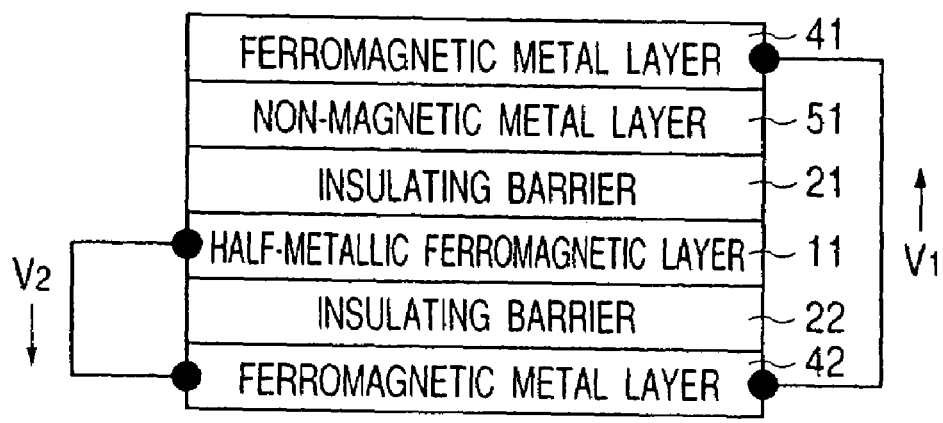
FIG. 29 is a schematic cross-sectional view showing other example of a three-terminal ferromagnetic tunnel element of the invention.

FIG. 29 is a schematic cross-sectional view showing other exemplary three-terminal TMR element of the invention. The three-terminal TMR element of this example has the same structure as that shown in FIG. 20 without the antiferromagnetic layers 31 and 32. The element had the same TMR characteristics as those shown in FIGS. 19A and 19B.

Figure 30:
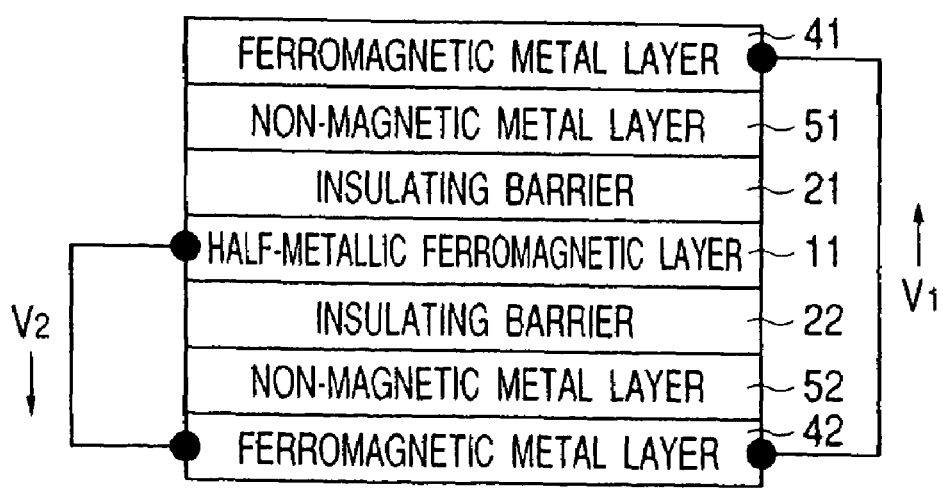
FIG. 30 is a schematic cross-sectional view showing other example of a three-terminal ferromagnetic tunnel element of the invention.

FIG. 30 is a schematic cross-sectional view showing other exemplary three-terminal TMR element of the invention. The three-terminal TMR element of this example has the same structure as that shown in FIG. 22 without the antiferromagnetic layers 31 and 32. The element had the same TMR characteristics as those shown in FIGS. 19A and 19B.

Figure 31:
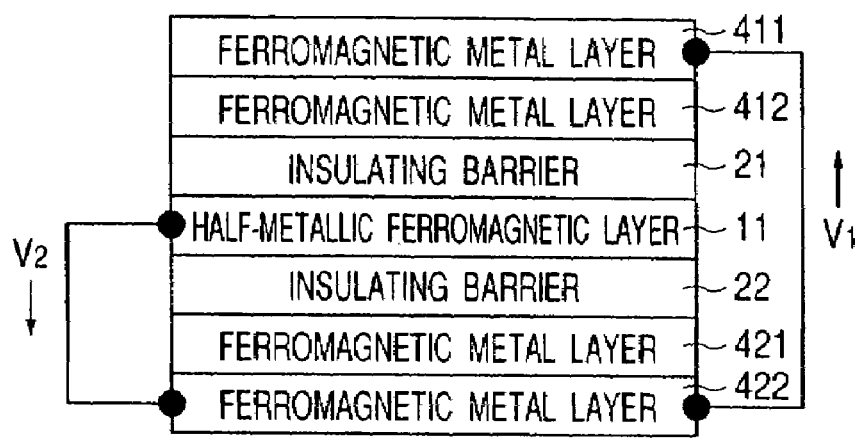
FIG. 31 is a schematic cross-sectional view showing other example of a three-terminal ferromagnetic tunnel element of the invention.

FIG. 31 is a schematic cross-sectional view showing other exemplary three-terminal TMR element of the invention. The three-terminal TMR element of this example has the same structure as that shown in FIG. 27 except that the ferromagnetic metal layer 41 is replaced with a double-layered film made from ferromagnetic metal layers 411 and 412, and the ferromagnetic metal layer 42 is replaced with a double-layered film made from ferromagnetic metal layers 421 and 422. Replacing the ferromagnetic metal layers 41 and 42 with the double-layered structures eases the magnetization rotation, thereby enhancing magnetization sensitivity of the magnetoresistive ratio. The element of the present example had the same TMR characteristics as those shown in FIGS. 19A and 19B.

Figure 32:
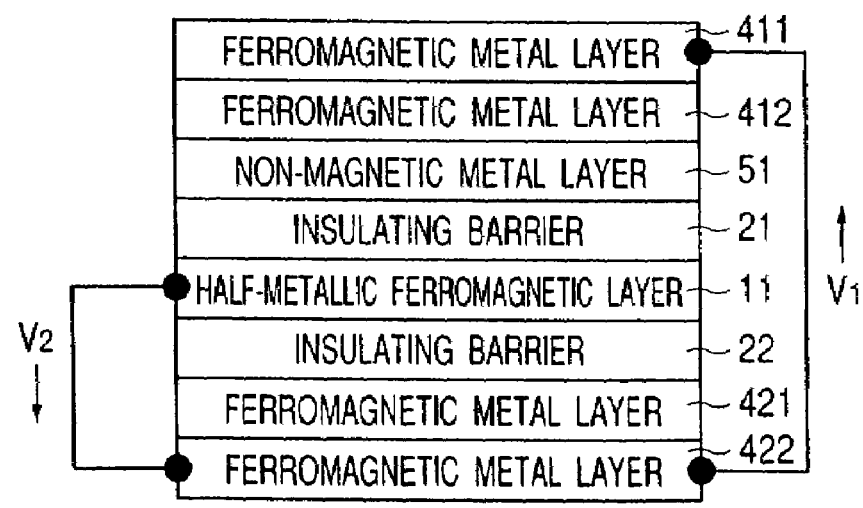
FIG. 32 is a schematic cross-sectional view showing other example of a three-terminal ferromagnetic tunnel element of the invention.

FIG. 32 is a schematic cross-sectional view showing other exemplary three-terminal TMR element of the invention. The three-terminal TMR element of this example has the same structure as that shown in FIG. 28 except that the ferromagnetic metal layer 41 is replaced with a double-layered film made from ferromagnetic metal layers 411 and 412, and the ferromagnetic metal layer 42 is replaced with a double-layered film made from ferromagnetic metal layers 421 and 422. The element of the present example had the same TMR characteristics as those shown in FIGS. 19A and 19B.

Figure 33:
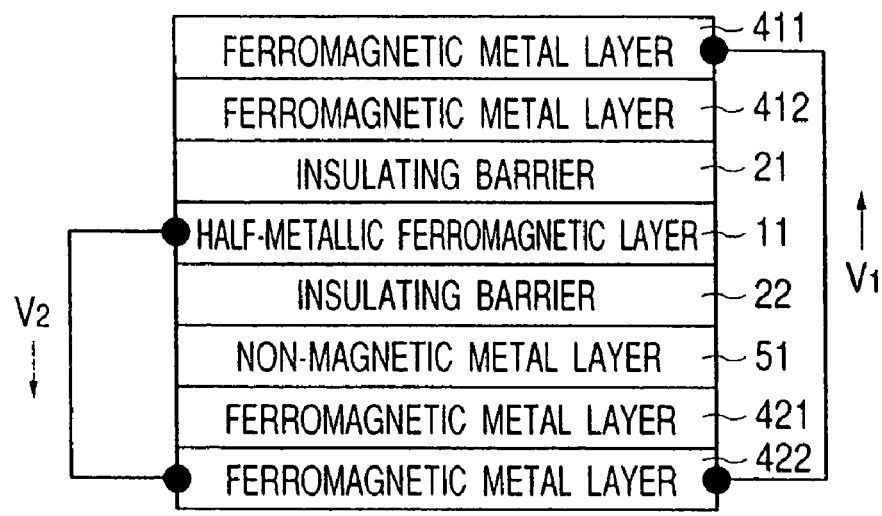
FIG. 33 is a schematic cross-sectional view showing other example of a three-terminal ferromagnetic tunnel element of the invention.

FIG. 33 is a schematic cross-sectional view showing other exemplary three-terminal TMR element of the invention. The three-terminal TMR element of this example has the same structure as that shown in FIG. 29 except that the ferromagnetic metal layer 41 is replaced with a double-layered film made from ferromagnetic metal layers 411 and 412, and the ferromagnetic metal layer 42 is replaced with a double-layered film made from ferromagnetic metal layers 421 and 422. The element of the present example had the same TMR characteristics as those shown in FIGS. 19A and 19B.

Figure 34:
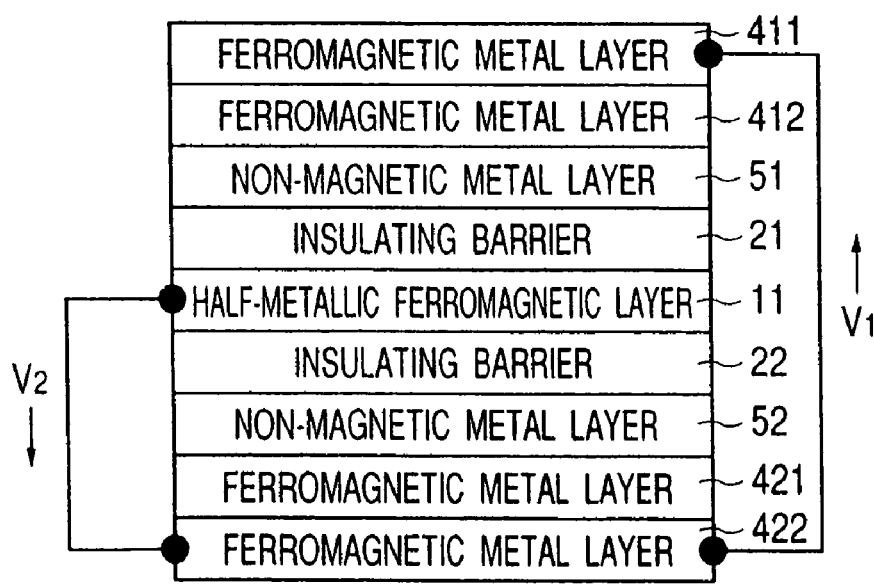
FIG. 34 is a schematic cross-sectional view showing other example of a three-terminal ferromagnetic tunnel element of the invention.

FIG. 34 is a schematic cross-sectional view showing other exemplary three-terminal TMR element of the invention. The three-terminal TMR element of this example has the same structure as that shown in FIG. 30 except that the ferromagnetic metal layer 41 is replaced with a double-layered film made from ferromagnetic metal layers 411 and 412, and the ferromagnetic metal layer 42 is replaced with a double-layered film made from ferromagnetic metal layers 421 and 422. The element of the present example had the same TMR characteristics as those shown in FIGS. 19A and 19B. In the structures shown in FIGS. 20 to 34, the bias voltage $V_2$ may be applied between the half-metallic ferromagnetic layer 11 and the ferromagnetic metal layer 41 (411, 414).

[Embodiment 3]

Figure 35:
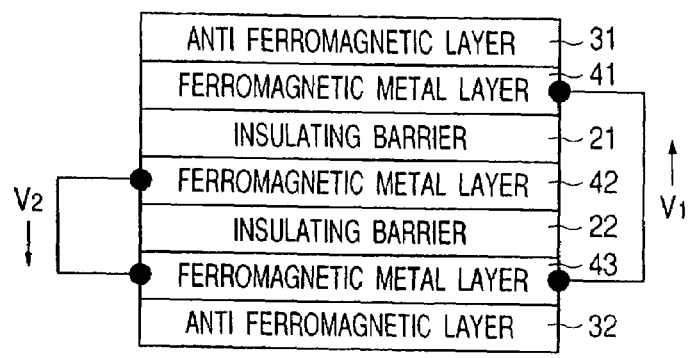
FIG. 35 is a schematic cross-sectional view showing other example of a three-terminal ferromagnetic tunnel element of the invention.
Figure 99:
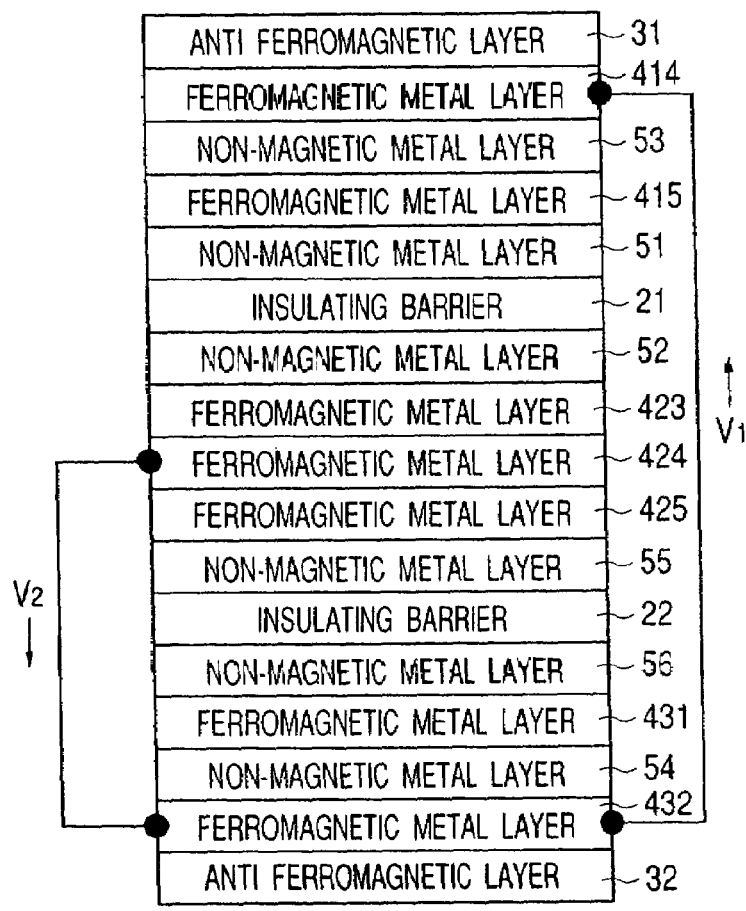
FIG. 99 is a schematic cross-sectional view showing other example of a three-terminal ferromagnetic tunnel element of the invention.

In the examples shown in FIGS. 35 to 99, each of the three-terminal TMR elements has a basic structure where a ferromagnetic metal layer, an insulating barrier layer, a ferromagnetic metal layer, an insulating barrier layer and a ferromagnetic metal layer are laminated on a substrate in this order.

FIG. 35 is a schematic cross-sectional view showing other example of the three-terminal ferromagnetic tunnel element of the invention. The three-terminal TMR element of this example includes an antiferromagnetic layer 32 (12 nm), a ferromagnetic metal layer 43 (3 nm), an insulating barrier layer 22 (1 nm), a ferromagnetic metal layer 42 (5 nm), an insulating barrier layer 21 (1 nm), a ferromagnetic metal layer 41 (3 nm), and an antiferromagnetic layer 31 (12 nm) laminated in this order on a substrate. An electrode terminal is formed in each of the ferromagnetic metal layers 41 and 43 to form an electric closed-circuit between the layers 41 and 43 (a bias voltage applied by this closed-circuit is defined as $V_1$) while an electrode terminal is formed in each of the ferromagnetic metal layer 42 and 43 to form an electric closed-circuit between the layers 42 and 43 (a bias voltage applied by this closed-circuit is defined as $V_2$). This element was produced by sputtering or deposition technique, and photolithography. Arrows in the figure represent directions of currents provided to the element, which may be vice versa as long as the relative relationship of the directions remains the same. In this example, the bias voltage $V_2$ may be applied between the ferromagnetic metal layers 41 and 42.

Hereinafter, materials used for the respective layers of the above-described three-terminal TMR element will be described. The insulating barrier layers 21 and 22 are made of $SrTiO_3$, but they may also be made of MgO, $HfO_2$, TaO, NbO, MoO, $TiO_2$ or $Al_2O_3$. The ferromagnetic metal layers 41, 42 and 43 are made of CoFe alloy, but they may also be made of Co or NiFe. The antiferromagnetic layers 31 and 32 are made of PtMn.

Figure 36A:
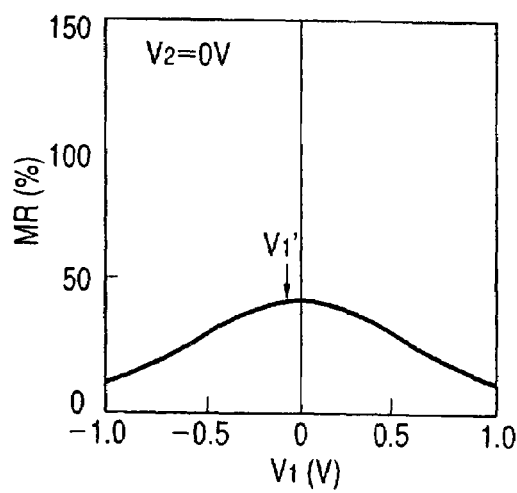
FIGS. 36A and 36B are graphs where
Figure 36B:
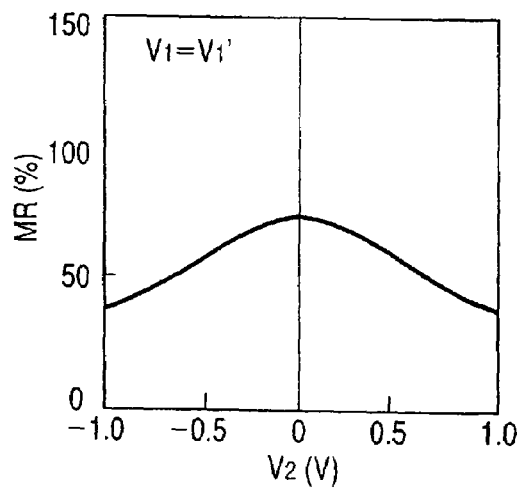

FIG. 36A shows an applied bias voltage $V_1$ dependency of the TMR ratio of the three-terminal TMR element shown in FIG. 35 under $V_2=0$. FIG. 36B shows an applied bias voltage $V_2$ dependency of the TMR ratio of the three-terminal TMR element shown in FIG. 35 under $V_1=V_1'$. Here, $V_1'$ is a value of the bias voltage where the highest TMR ratio is obtained in FIG. 36A. In the present structure, $V_1'$ is almost 0, but an increase in the magnetoresistive ratio can be realized by varying $V_2$. With the bias voltage dependency of the present example, a magnetoresistive ratio of 50% can be obtained when the bias voltage $V_2$ is ±0.5 V.

Figure 37:
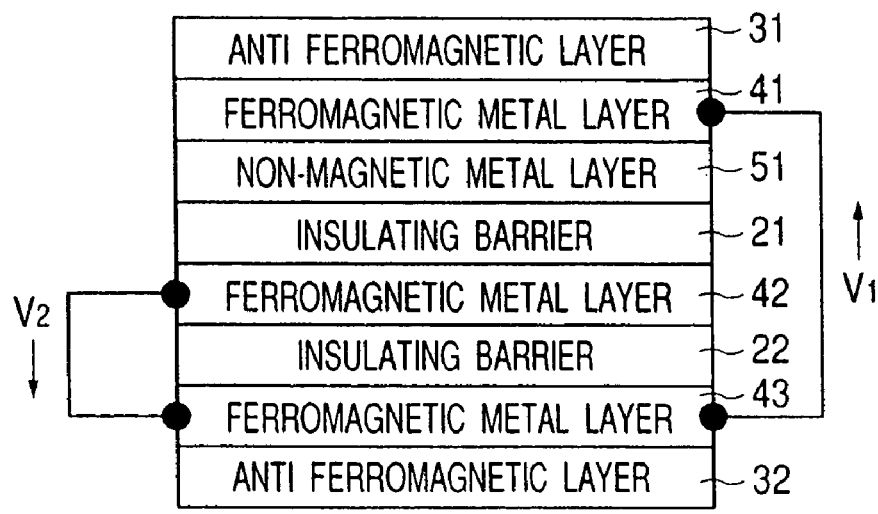
FIG. 37 is a schematic cross-sectional view showing other example of a three-terminal ferromagnetic tunnel element of the invention.

FIG. 37 is a schematic cross-sectional view showing other exemplary three-terminal TMR element of the invention. The element of this example has the same structure as that shown in FIG. 35 except that a non-magnetic metal layer 51 is formed between the ferromagnetic metal layer 41 and the insulating barrier layer 21. By arranging the non-magnetic metal layer to be adjacent to the ferromagnetic metal layer, the effects described with reference to FIG. 6 can be realized. In the following examples, non-magnetic metal layers are arranged adjacent to ferromagnetic metal layers for the same reason. The non-magnetic metal layer 51 may be selected from Au, Cu, Cr, Zn, Ga, Nb, Mo, Ru, Pd, Ag, Hf, Ta, W, Pt and Bi. The element had the same TMR characteristics as those shown in FIGS. 36A and 36B.

Figure 38:
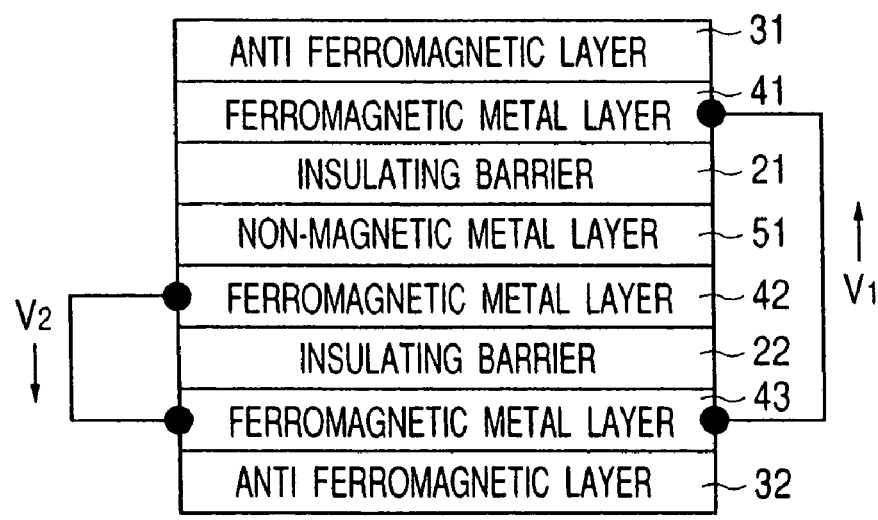
FIG. 38 is a schematic cross-sectional view showing other example of a three-terminal ferromagnetic tunnel element of the invention.

FIG. 38 is a schematic cross-sectional view showing other exemplary three-terminal TMR element of the invention. The element of this example has the same structure as that shown in FIG. 35 except that a non-magnetic metal layer 51 is formed between the ferromagnetic metal layer 42 and the insulating barrier layer 21. The element had the same TMR characteristics as those shown in FIGS. 36A and 36B.

Figure 39:
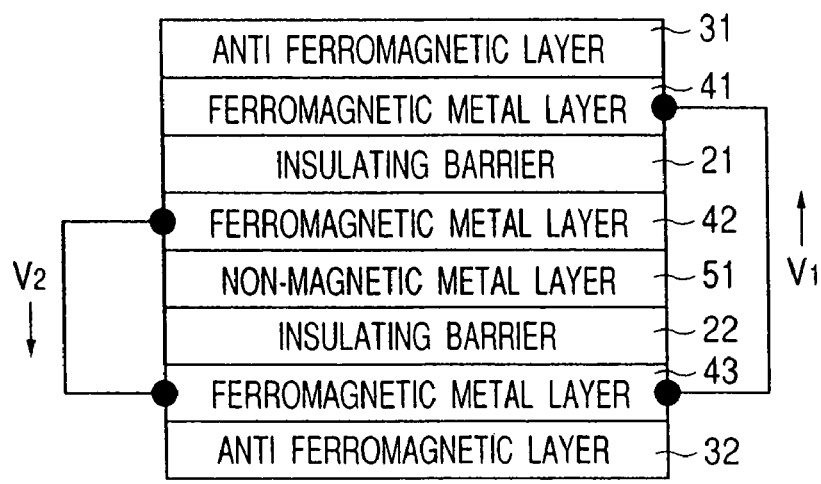
FIG. 39 is a schematic cross-sectional view showing other example of a three-terminal ferromagnetic tunnel element of the invention.

FIG. 39 is a schematic cross-sectional view showing other exemplary three-terminal TMR element of the invention. The element of this example has the same structure as that shown in FIG. 35 except that a non-magnetic metal layer 51 is formed between the ferromagnetic metal layer 42 and the insulating barrier layer 22. The element had the same TMR characteristics as those shown in FIGS. 36A and 36B.

Figure 40:
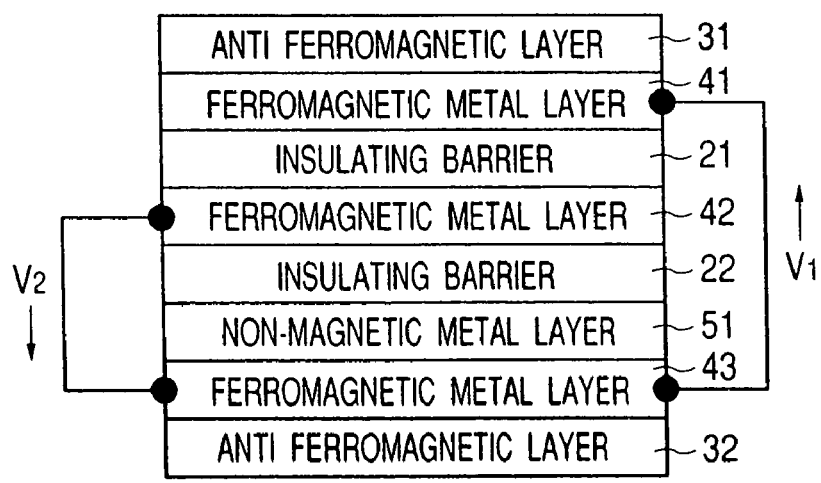
FIG. 40 is a schematic cross-sectional view showing other example of a three-terminal ferromagnetic tunnel element of the invention.

FIG. 40 is a schematic cross-sectional view showing other exemplary three-terminal TMR element of the invention. The element of this example has the same structure as that shown in FIG. 35 except that a non-magnetic metal layer 51 is formed between the ferromagnetic metal layer 43 and the insulating barrier layer 22. The element had the same TMR characteristics as those shown in FIGS. 36A and 36B.

Figure 41:
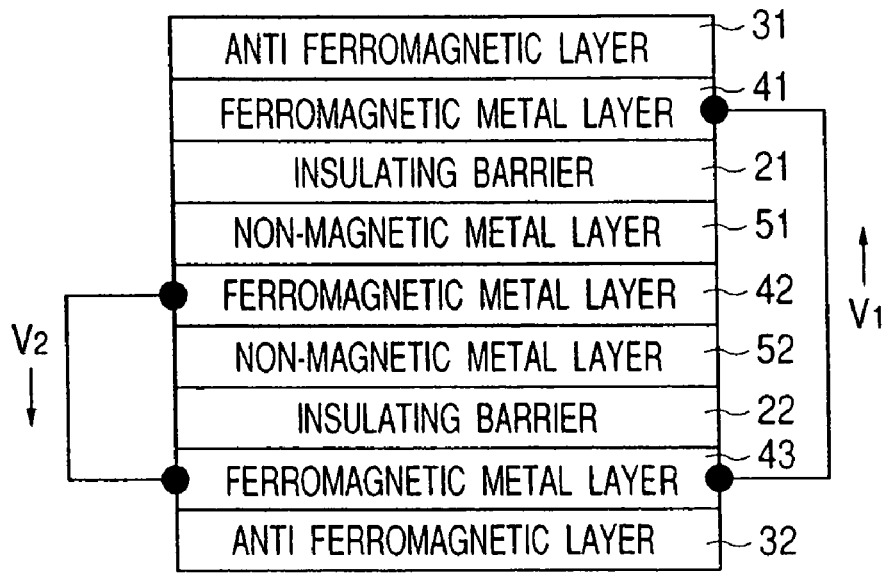
FIG. 41 is a schematic cross-sectional view showing other example of a three-terminal ferromagnetic tunnel element of the invention.

FIG. 41 is a schematic cross-sectional view showing other exemplary three-terminal TMR element of the invention. The element of this example has the same structure as that shown in FIG. 35 except that a non-magnetic metal layer 51 is formed between the ferromagnetic metal layer 42 and the insulating barrier layer 21, and a non-magnetic metal layer 52 is formed between the ferromagnetic metal layer 42 and the insulating barrier layer 22. Similar to the non-magnetic metal layer 51, the non-magnetic metal layer 52 may be selected from Au, Cu, Cr, Zn, Ga, Nb, Mo, Ru, Pd, Ag, Hf, Ta, W, Pt and Bi. The element had the same TMR characteristics as those shown in FIGS. 36A and 36B.

Figure 42:
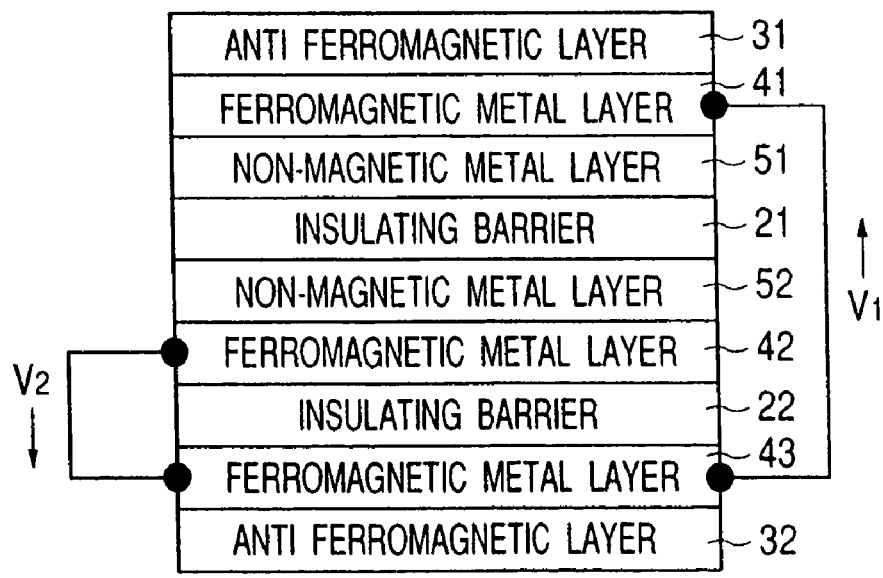
FIG. 42 is a schematic cross-sectional view showing other example of a three-terminal ferromagnetic tunnel element of the invention.

FIG. 42 is a schematic cross-sectional view showing other exemplary three-terminal TMR element of the invention. The element of this example has the same structure as that shown in FIG. 35 except that a non-magnetic metal layer 51 is formed between the ferromagnetic metal layer 41 and the insulating barrier layer 21, and a non-magnetic layer 52 is formed between the ferromagnetic metal layer 42 and the insulating barrier layer 21. The element had the same TMR characteristics as those shown in FIGS. 36A and 36B.

Figure 43:
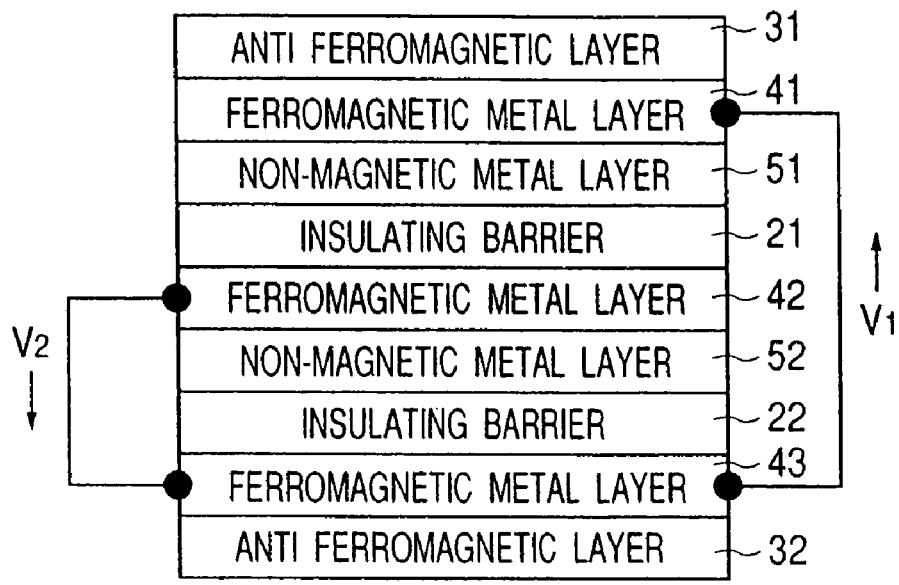
FIG. 43 is a schematic cross-sectional view showing other example of a three-terminal ferromagnetic tunnel element of the invention.

FIG. 43 is a schematic cross-sectional view showing other exemplary three-terminal TMR element of the invention. The element of this example has the same structure as that shown in FIG. 35 except that a non-magnetic metal layer 51 is formed between the ferromagnetic metal layer 41 and the insulating barrier layer 21, and a non-magnetic layer 52 is formed between the ferromagnetic metal layer 42 and the insulating barrier layer 22. The element had the same TMR characteristics as those shown in FIGS. 36A and 36B.

Figure 44:
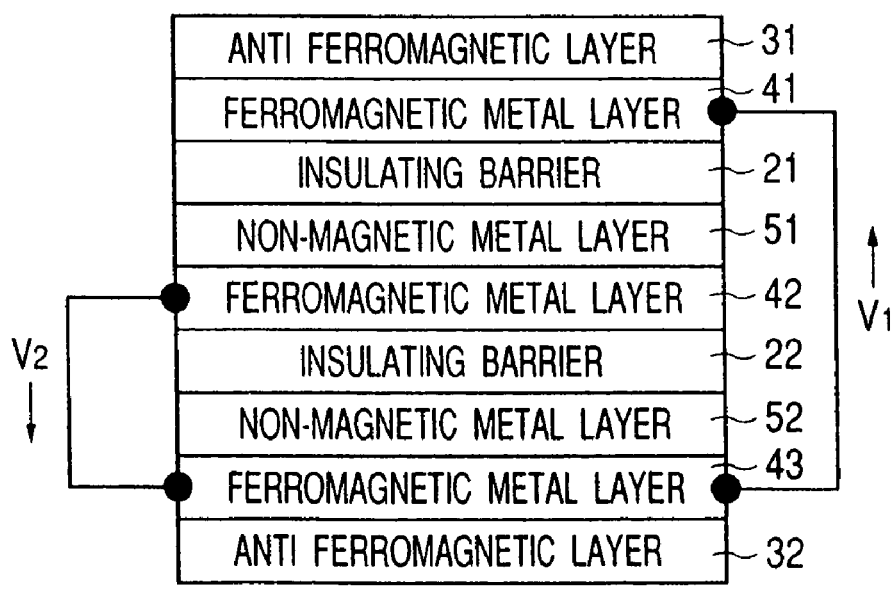
FIG. 44 is a schematic cross-sectional view showing other example of a three-terminal ferromagnetic tunnel element of the invention.

FIG. 44 is a schematic cross-sectional view showing other exemplary three-terminal TMR element of the invention. The element of this example has the same structure as that shown in FIG. 35 except that a non-magnetic metal layer 51 is formed between the ferromagnetic metal layer 42 and the insulating barrier layer 21, and a non-magnetic layer 52 is formed between the ferromagnetic metal layer 43 and the insulating barrier layer 22. The element had the same TMR characteristics as those shown in FIGS. 36A and 36B.

Figure 45:
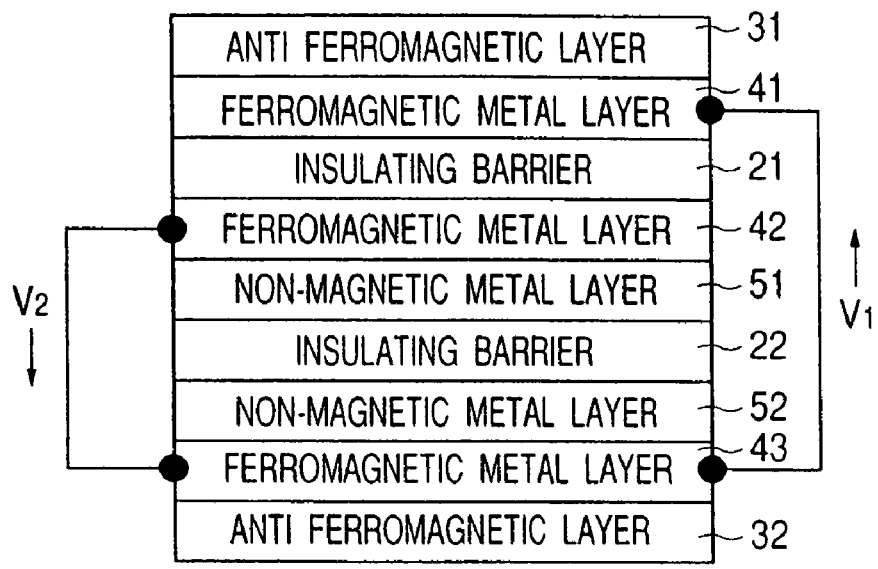
FIG. 45 is a schematic cross-sectional view showing other example of a three-terminal ferromagnetic tunnel element of the invention.

FIG. 45 is a schematic cross-sectional view showing other exemplary three-terminal TMR element of the invention. The element of this example has the same structure as that shown in FIG. 35 except that a non-magnetic metal layer 51 is formed between the ferromagnetic metal layer 42 and the insulating barrier layer 22, and a non-magnetic layer 52 is formed between the ferromagnetic metal layer 43 and the insulating barrier layer 22. The element had the same TMR characteristics as those shown in FIGS. 36A and 36B.

Figure 46:
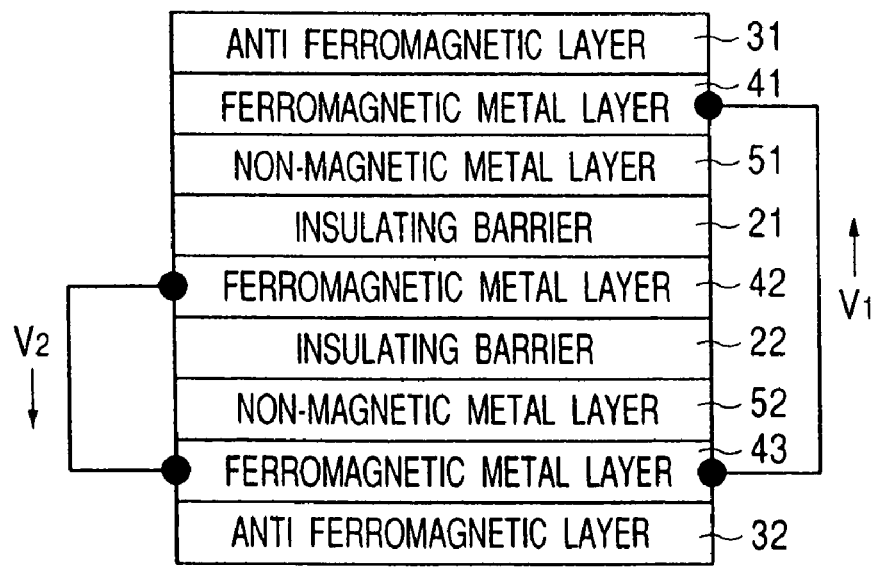
FIG. 46 is a schematic cross-sectional view showing other example of a three-terminal ferromagnetic tunnel element of the invention.

FIG. 46 is a schematic cross-sectional view showing other exemplary three-terminal TMR element of the invention. The element of this example has the same structure as that shown in FIG. 35 except that a non-magnetic metal layer 51 is formed between the ferromagnetic metal layer 41 and the insulating barrier layer 21, and a non-magnetic layer 52 is formed between the ferromagnetic metal layer 43 and the insulating barrier layer 22. The element had the same TMR characteristics as those shown in FIGS. 36A and 36B.

Figure 47:
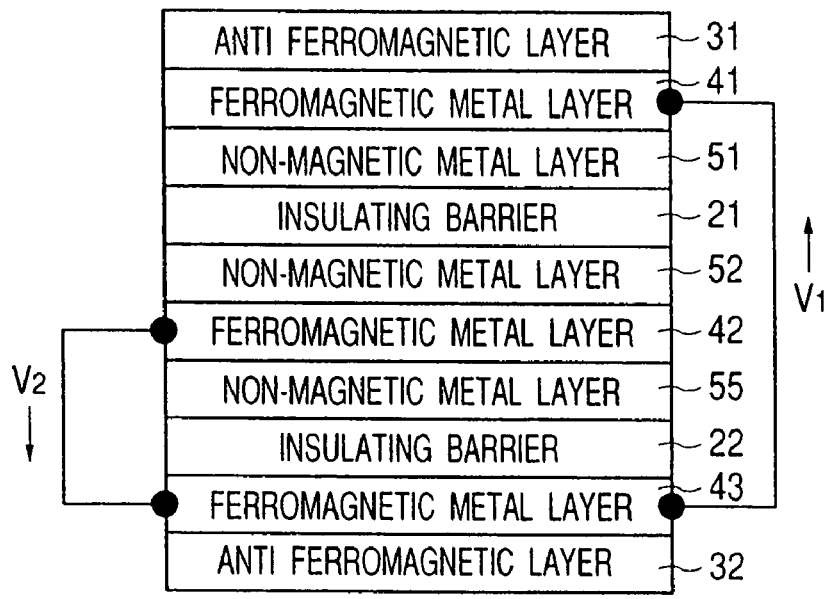
FIG. 47 is a schematic cross-sectional view showing other example of a three-terminal ferromagnetic tunnel element of the invention.

FIG. 47 is a schematic cross-sectional view showing other exemplary three-terminal TMR element of the invention. The element of this example has the same structure as that shown in FIG. 35 except that a non-magnetic metal layer 51 is formed between the ferromagnetic metal layer 41 and the insulating barrier layer 21, a non-magnetic layer 52 is formed between the ferromagnetic metal layer 42 and the insulating barrier layer 21, and a non-magnetic metal layer 55 is formed between the ferromagnetic metal layer 42 and the insulating barrier layer 22. The element had the same TMR characteristics as those shown in FIGS. 36A and 36B.

Figure 48:
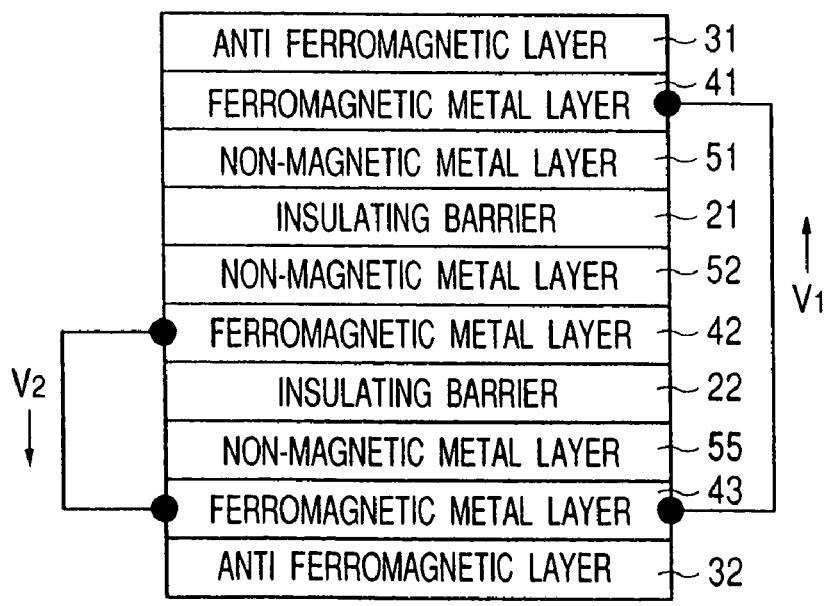
FIG. 48 is a schematic cross-sectional view showing other example of a three-terminal ferromagnetic tunnel element of the invention.

FIG. 48 is a schematic cross-sectional view showing other exemplary three-terminal TMR element of the invention. The element of this example has the same structure as that shown in FIG. 35 except that a non-magnetic metal layer 51 is formed between the ferromagnetic metal layer 41 and the insulating barrier layer 21, a non-magnetic layer 52 is formed between the ferromagnetic metal layer 42 and the insulating barrier layer 21, and a non-magnetic metal layer 55 is formed between the ferromagnetic metal layer 43 and the insulating barrier layer 22. The element had the same TMR characteristics as those shown in FIGS. 36A and 36B.

Figure 49:
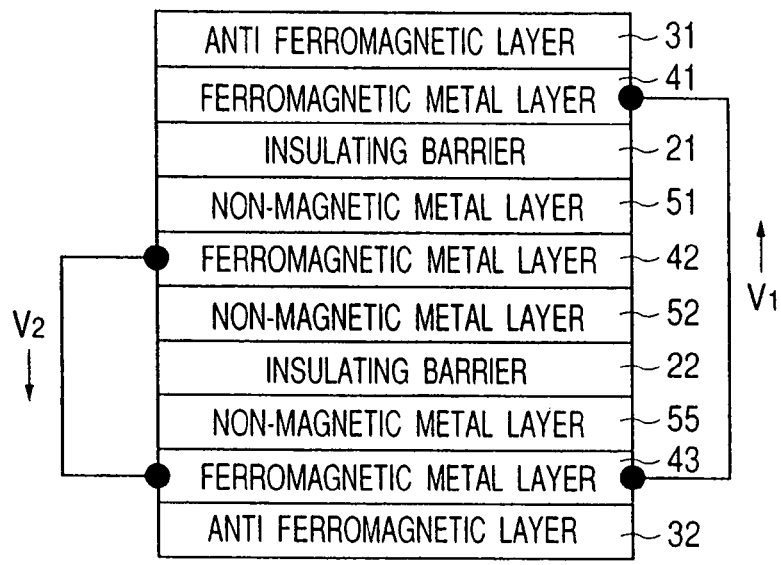
FIG. 49 is a schematic cross-sectional view showing other example of a three-terminal ferromagnetic tunnel element of the invention.

FIG. 49 is a schematic cross-sectional view showing other exemplary three-terminal TMR element of the invention. The element of this example has the same structure as that shown in FIG. 35 except that a non-magnetic metal layer 51 is formed between the ferromagnetic metal layer 42 and the insulating barrier layer 21, a non-magnetic layer 52 is formed between the ferromagnetic metal layer 42 and the insulating barrier layer 22, and a non-magnetic metal layer 55 is formed between the ferromagnetic metal layer 43 and the insulating barrier layer 22. The element had the same TMR characteristics as those shown in FIGS. 36A and 36B.

Figure 50:
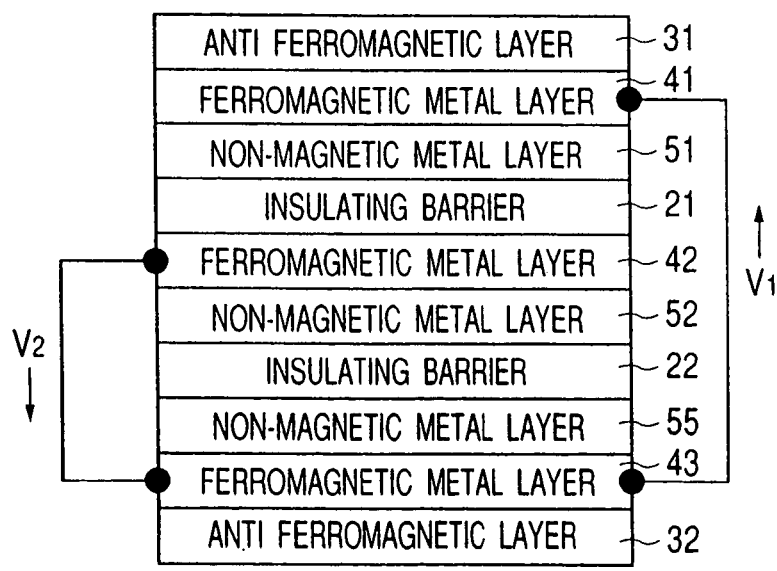
FIG. 50 is a schematic cross-sectional view showing other example of a three-terminal ferromagnetic tunnel element of the invention.

FIG. 50 is a schematic cross-sectional view showing other exemplary three-terminal TMR element of the invention. The element of this example has the same structure as that shown in FIG. 35 except that a non-magnetic metal layer 51 is formed between the ferromagnetic metal layer 41 and the insulating barrier layer 21, a non-magnetic layer 52 is formed between the ferromagnetic metal layer 42 and the insulating barrier layer 22, and a non-magnetic metal layer 55 is formed between the ferromagnetic metal layer 43 and the insulating barrier layer 22. The element had the same TMR characteristics as those shown in FIGS. 36A and 36B.

Figure 51:
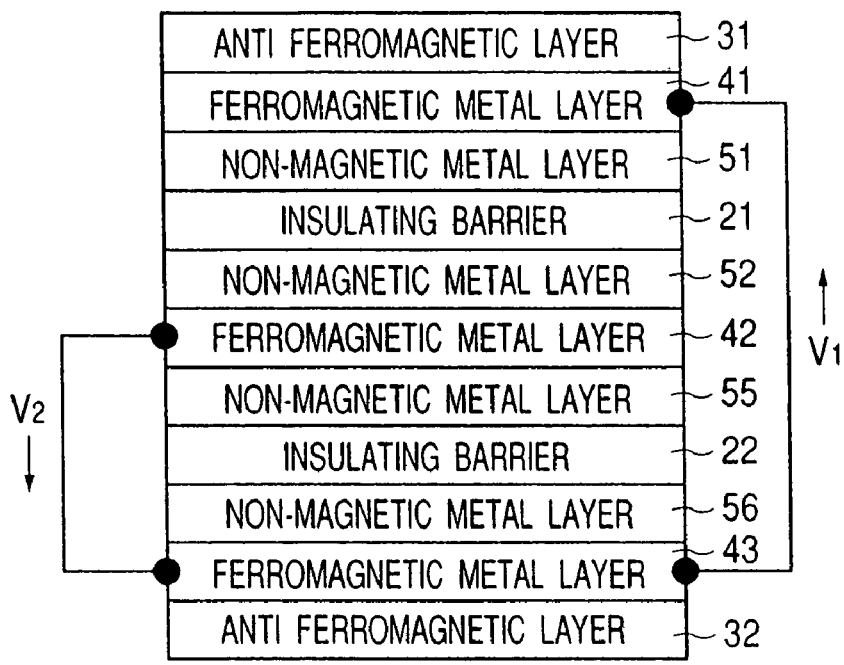
FIG. 51 is a schematic cross-sectional view showing other example of a three-terminal ferromagnetic tunnel element of the invention.

FIG. 51 is a schematic cross-sectional view showing other exemplary three-terminal TMR element of the invention. The element of this example has the same structure as that shown in FIG. 35 except that a non-magnetic metal layer 51 is formed between the ferromagnetic metal layer 41 and the insulating barrier layer 21, a non-magnetic layer 52 is formed between the ferromagnetic metal layer 42 and the insulating barrier layer 21, a non-magnetic metal layer 55 is formed between the ferromagnetic metal layer 42 and the insulating barrier layer 22, and a non-magnetic metal layer 56 is formed between the ferromagnetic metal layer 43 and the insulating barrier layer 22. The element had the same TMR characteristics as those shown in FIGS. 36A and 36B.

Figure 52:
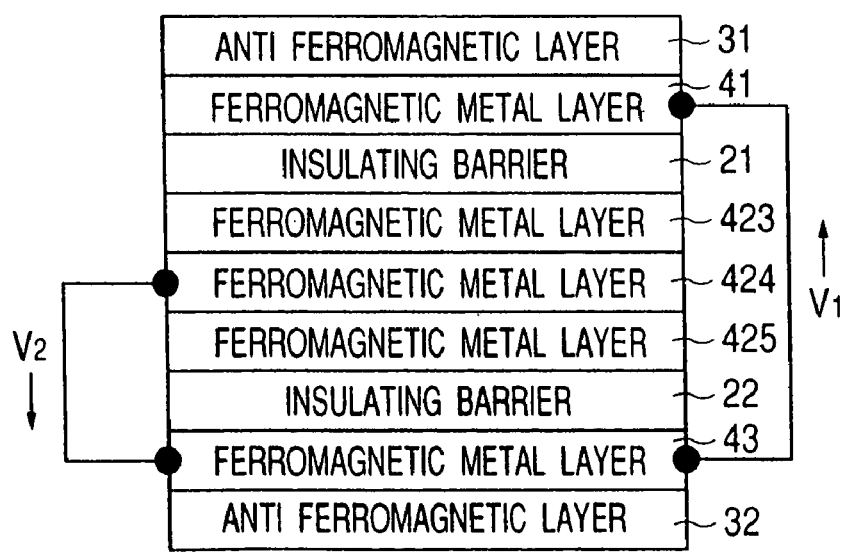
FIG. 52 is a schematic cross-sectional view showing other example of a three-terminal ferromagnetic tunnel element of the invention.

FIG. 52 is a schematic cross-sectional view showing other exemplary three-terminal TMR element of the invention. The element of this example has the same structure as that shown in FIG. 35 except that the ferromagnetic metal layer 42 is replaced with a tri-layered film made from ferromagnetic metal layers 423, 424 and 425. This structure eases the magnetization rotation of the ferromagnetic metal layers 423, 424 and 425. In the following examples, the ferromagnetic metal layer 42 is also replaced with the tri-layered film for the same reason. The ferromagnetic metal layers 423 and 425 are made of a Co-based alloy while the ferromagnetic metal layer 424 is made of a Ni-based alloy. The element of the present example had the same TMR characteristics as those shown in FIGS. 36A and 36B.

Figure 53:
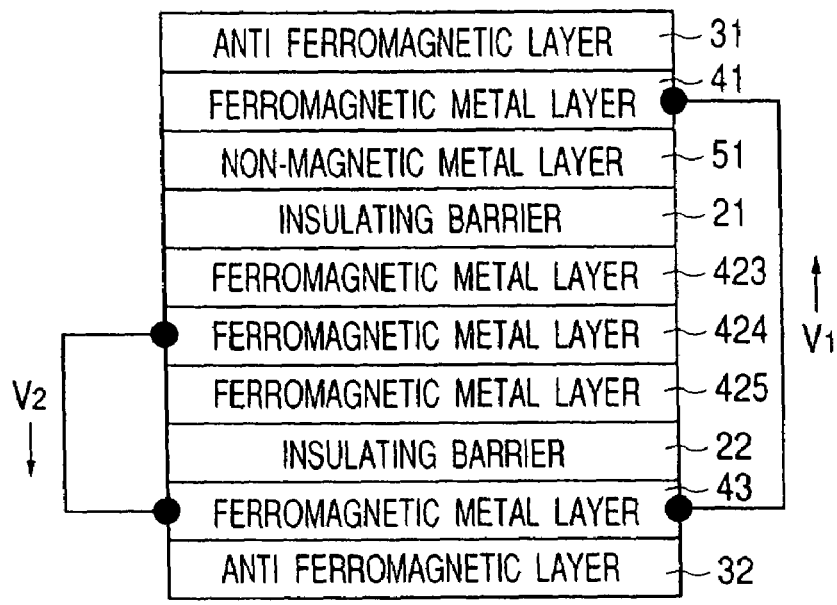
FIG. 53 is a schematic cross-sectional view showing other example of a three-terminal ferromagnetic tunnel element of the invention.

FIG. 53 is a schematic cross-sectional view showing another exemplary three-terminal TMR element of the invention. The element of this example has the same structure as that shown in FIG. 37 except that the ferromagnetic metal layer 42 is replaced with a tri-layered film made from ferromagnetic metal layers 423, 424 and 425. The element of the present example had the same TMR characteristics as those shown in FIGS. 36A and 36B.

Figure 54:
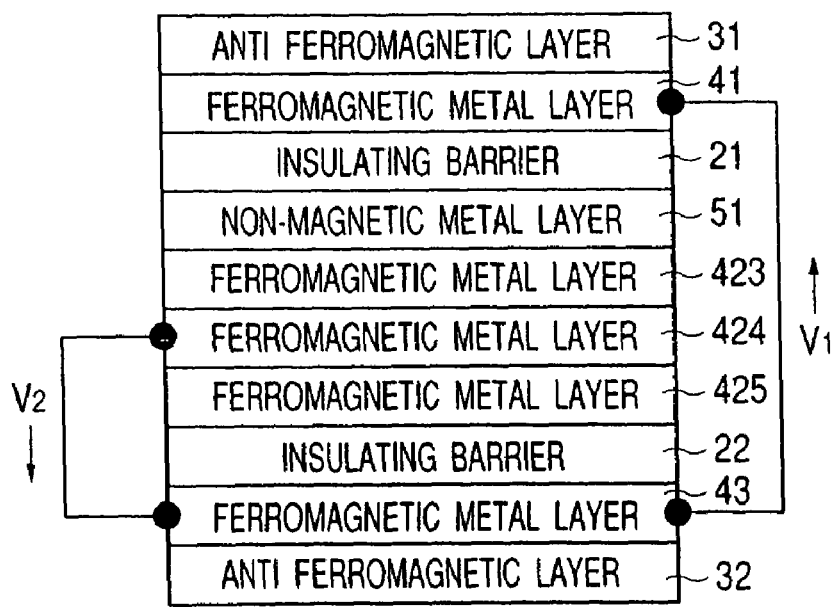
FIG. 54 is a schematic cross-sectional view showing other example of a three-terminal ferromagnetic tunnel element of the invention.

FIG. 54 is a schematic cross-sectional view showing another exemplary three-terminal TMR element of the invention. The element of this example has the same structure as that shown in FIG. 38 except that the ferromagnetic metal layer 42 is replaced with a tri-layered film made from ferromagnetic metal layers 423, 424 and 425. The element of the present example had the same TMR characteristics as those shown in FIGS. 36A and 36B.

Figure 55:
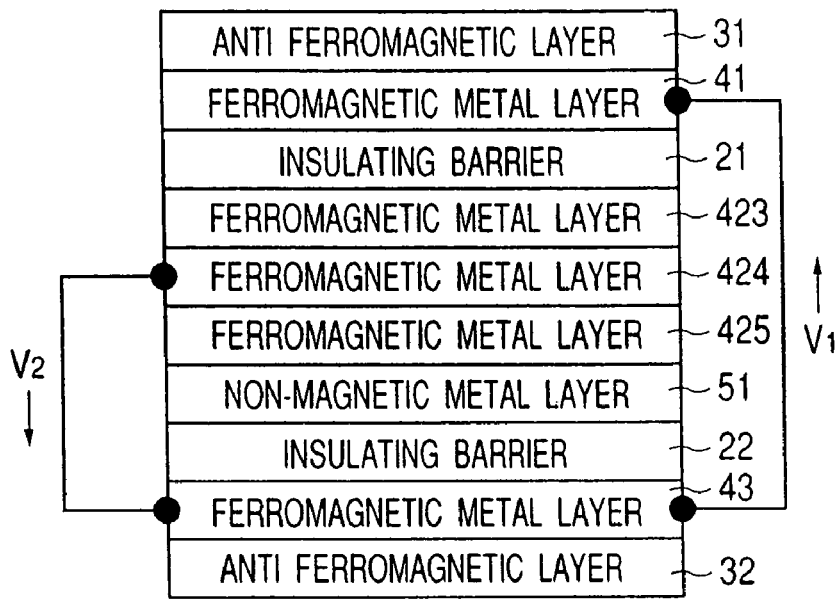
FIG. 55 is a schematic cross-sectional view showing other example of a three-terminal ferromagnetic tunnel element of the invention.

FIG. 55 is a schematic cross-sectional view showing another exemplary three-terminal TMR element of the invention. The element of this example has the same structure as that shown in FIG. 39 except that the ferromagnetic metal layer 42 is replaced with a tri-layered film made from ferromagnetic metal layers 423, 424 and 425. The element of the present example had the same TMR characteristics as those shown in FIGS. 36A and 36B.

Figure 56:
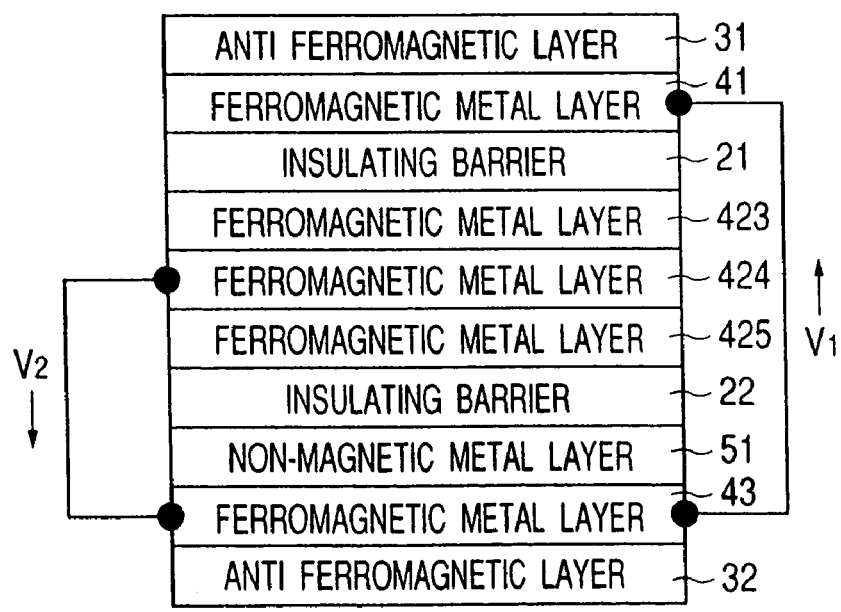
FIG. 56 is a schematic cross-sectional view showing other example of a three-terminal ferromagnetic tunnel element of the invention.

FIG. 56 is a schematic cross-sectional view showing another exemplary three-terminal TMR element of the invention. The element of this example has the same structure as that shown in FIG. 40 except that the ferromagnetic metal layer 42 is replaced with a tri-layered film made from ferromagnetic metal layers 423, 424 and 425. The element of the present example had the same TMR characteristics as those shown in FIGS. 36A and 36B.

Figure 57:
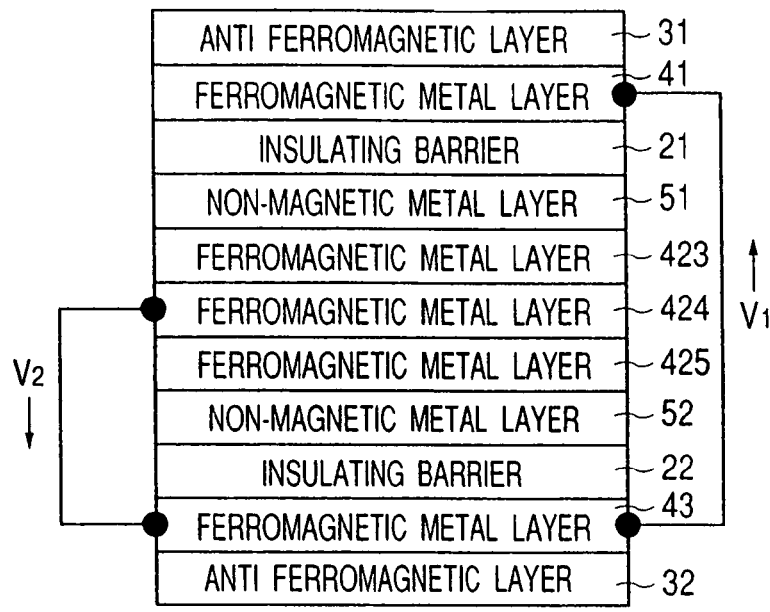
FIG. 57 is a schematic cross-sectional view showing other example of a three-terminal ferromagnetic tunnel element of the invention.

FIG. 57 is a schematic cross-sectional view showing another exemplary three-terminal TMR element of the invention. The element of this example has the same structure as that shown in FIG. 41 except that the ferromagnetic metal layer 42 is replaced with a tri-layered film made from ferromagnetic metal layers 423, 424 and 425. The element of the present example had the same TMR characteristics as those shown in FIGS. 36A and 36B.

Figure 58:
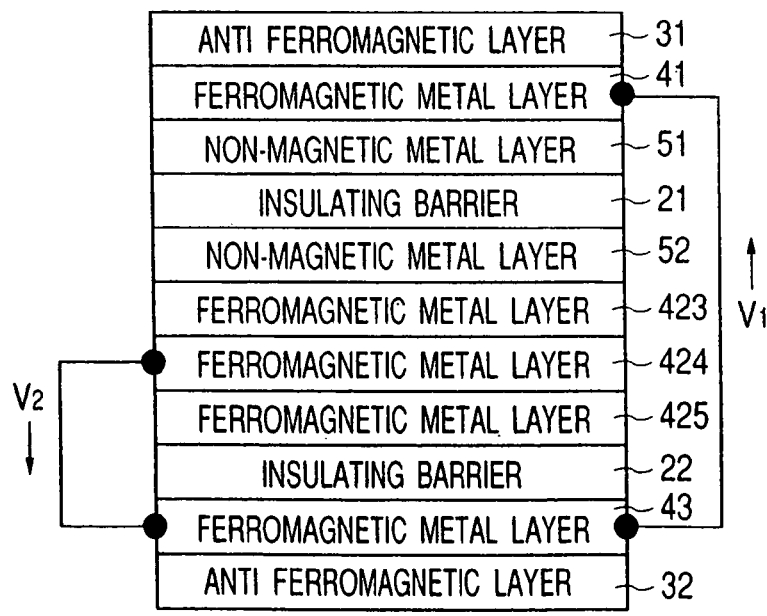
FIG. 58 is a schematic cross-sectional view showing other example of a three-terminal ferromagnetic tunnel element of the invention.

FIG. 58 is a schematic cross-sectional view showing another exemplary three-terminal TMR element of the invention. The element of this example has the same structure as that shown in FIG. 42 except that the ferromagnetic metal layer 42 is replaced with a tri-layered film made from ferromagnetic metal layers 423, 424 and 425. The element of the present example had the same TMR characteristics as those shown in FIGS. 36A and 36B.

Figure 59:
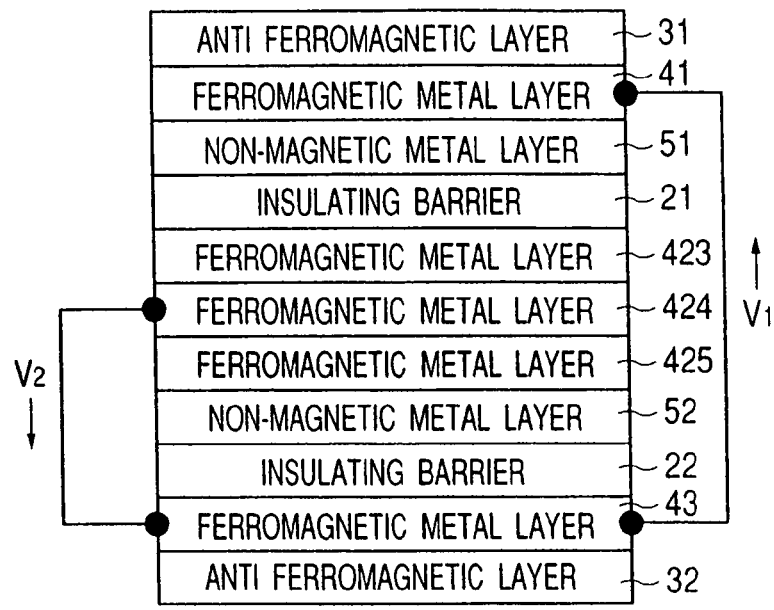
FIG. 59 is a schematic cross-sectional view showing other example of a three-terminal ferromagnetic tunnel element of the invention.

FIG. 59 is a schematic cross-sectional view showing another exemplary three-terminal TMR element of the invention. The element of this example has the same structure as that shown in FIG. 43 except that the ferromagnetic metal layer 42 is replaced with a tri-layered film made from ferromagnetic metal layers 423, 424 and 425. The element of the present example had the same TMR characteristics as those shown in FIGS. 36A and 36B.

Figure 60:
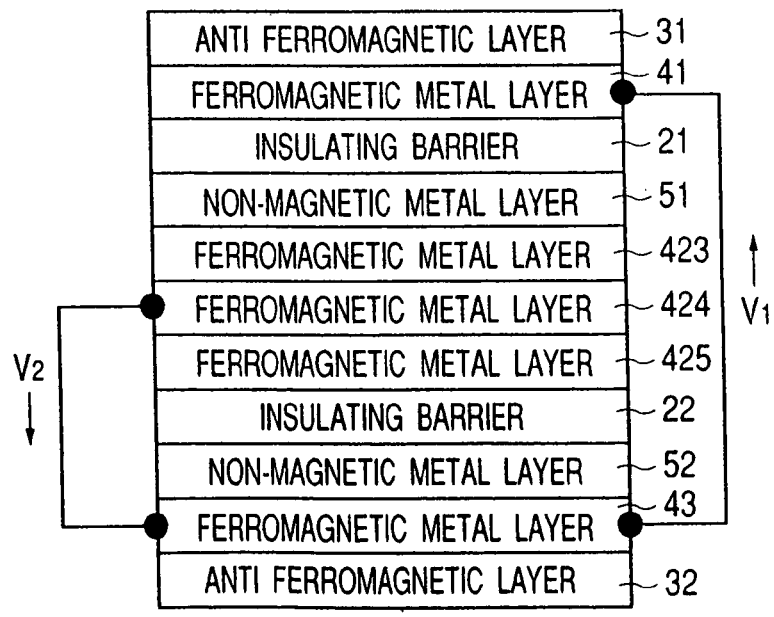
FIG. 60 is a schematic cross-sectional view showing other example of a three-terminal ferromagnetic tunnel element of the invention.

FIG. 60 is a schematic cross-sectional view showing another exemplary three-terminal TMR element of the invention. The element of this example has the same structure as that shown in FIG. 44 except that the ferromagnetic metal layer 42 is replaced with a tri-layered film made from ferromagnetic metal layers 423, 424 and 425. The element of the present example had the same TMR characteristics as those shown in FIGS. 36A and 36B.

Figure 61:
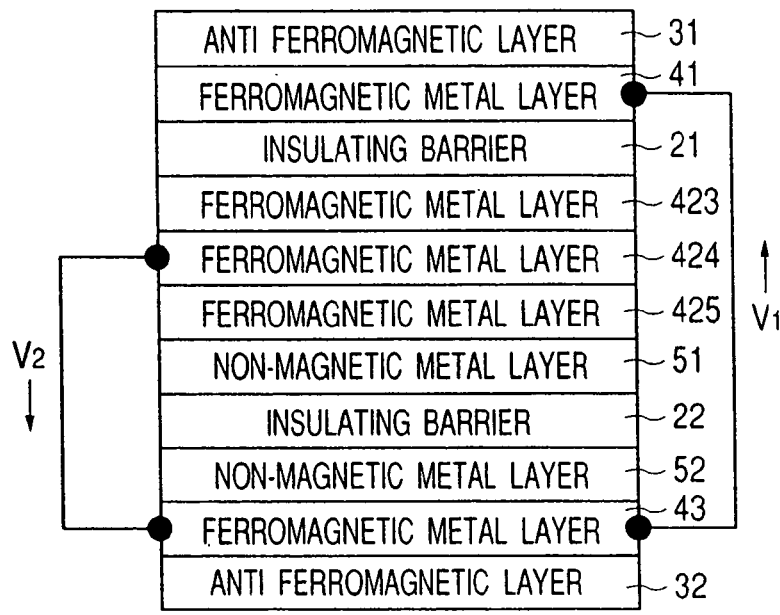
FIG. 61 is a schematic cross-sectional view showing other example of a three-terminal ferromagnetic tunnel element of the invention.

FIG. 61 is a schematic cross-sectional view showing another exemplary three-terminal TMR element of the invention. The element of this example has the same structure as that shown in FIG. 45 except that the ferromagnetic metal layer 42 is replaced with a tri-layered film made from ferromagnetic metal layers 423, 424 and 425. The element of the present example had the same TMR characteristics as those shown in FIGS. 36A and 36B.

Figure 62:
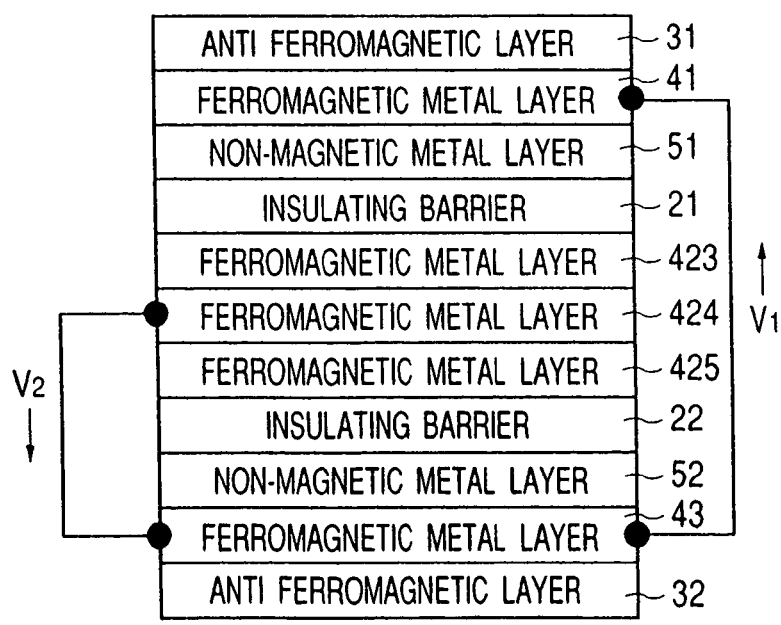
FIG. 62 is a schematic cross-sectional view showing other example of a three-terminal ferromagnetic tunnel element of the invention.

FIG. 62 is a schematic cross-sectional view showing another exemplary three-terminal TMR element of the invention. The element of this example has the same structure as that shown in FIG. 46 except that the ferromagnetic metal layer 42 is replaced with a tri-layered film made from ferromagnetic metal layers 423, 424 and 425. The element of the present example had the same TMR characteristics as those shown in FIGS. 36A and 36B.

Figure 63:
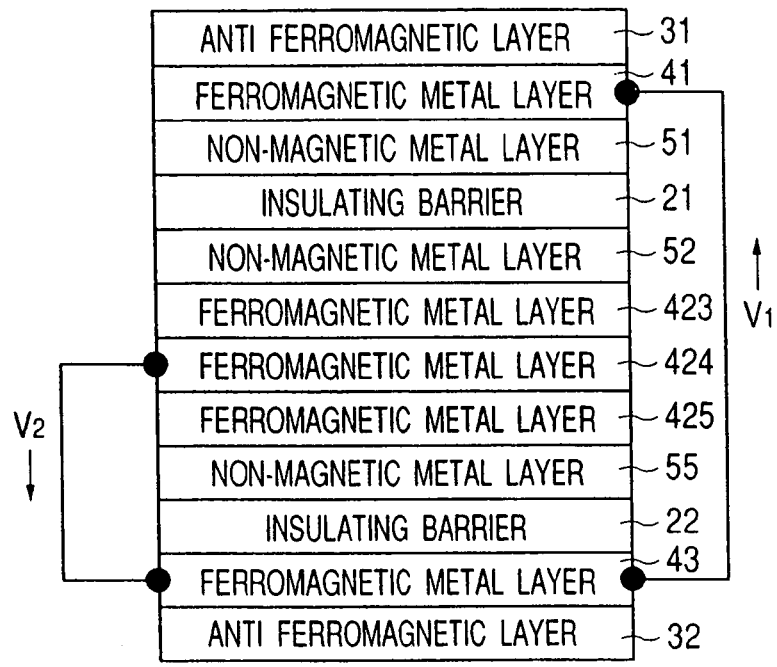
FIG. 63 is a schematic cross-sectional view showing other example of a three-terminal ferromagnetic tunnel element of the invention.

FIG. 63 is a schematic cross-sectional view showing another exemplary three-terminal TMR element of the invention. The element of this example has the same structure as that shown in FIG. 47 except that the ferromagnetic metal layer 42 is replaced with a tri-layered film made from ferromagnetic metal layers 423, 424 and 425. The element of the present example had the same TMR characteristics as those shown in FIGS. 36A and 36B.

Figure 64:
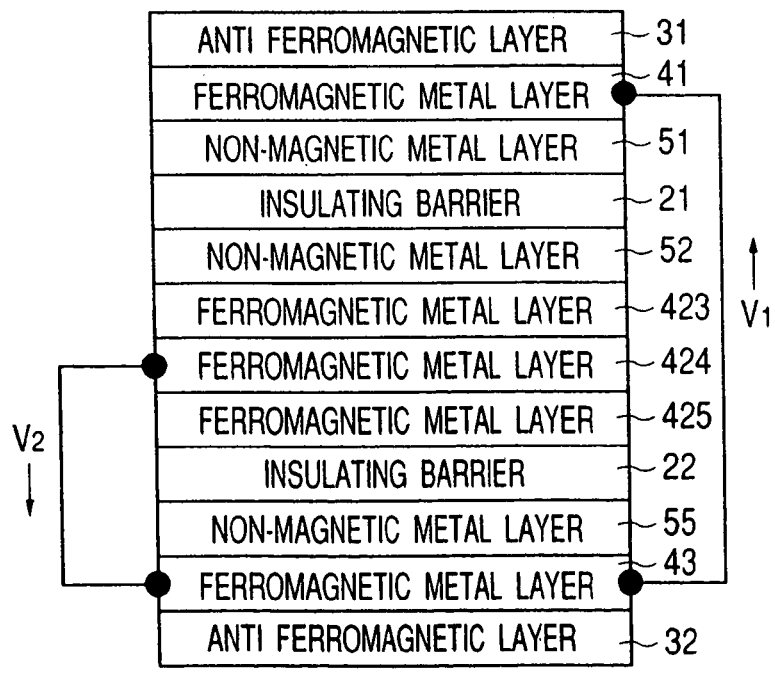
FIG. 64 is a schematic cross-sectional view showing other example of a three-terminal ferromagnetic tunnel element of the invention.

FIG. 64 is a schematic cross-sectional view showing another exemplary three-terminal TMR element of the invention. The element of this example has the same structure as that shown in FIG. 48 except that the ferromagnetic metal layer 42 is replaced with a tri-layered film made from ferromagnetic metal layers 423, 424 and 425. The element of the present example had the same TMR characteristics as those shown in FIGS. 36A and 36B.

Figure 65:
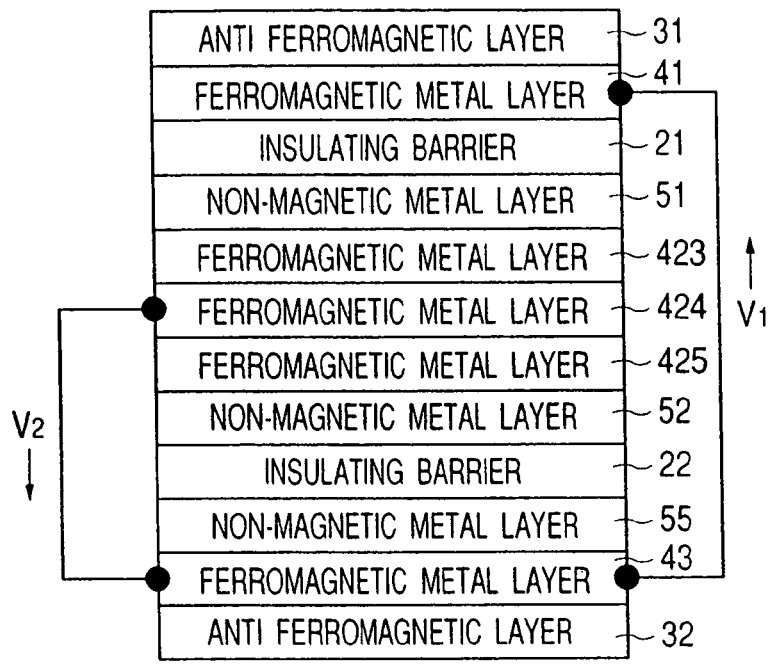
FIG. 65 is a schematic cross-sectional view showing other example of a three-terminal ferromagnetic tunnel element of the invention.

FIG. 65 is a schematic cross-sectional view showing another exemplary three-terminal TMR element of the invention. The element of this example has the same structure as that shown in FIG. 49 except that the ferromagnetic metal layer 42 is replaced with a tri-layered film made from ferromagnetic metal layers 423, 424 and 425. The element of the present example had the same TMR characteristics as those shown in FIGS. 36A and 36B.

Figure 66:
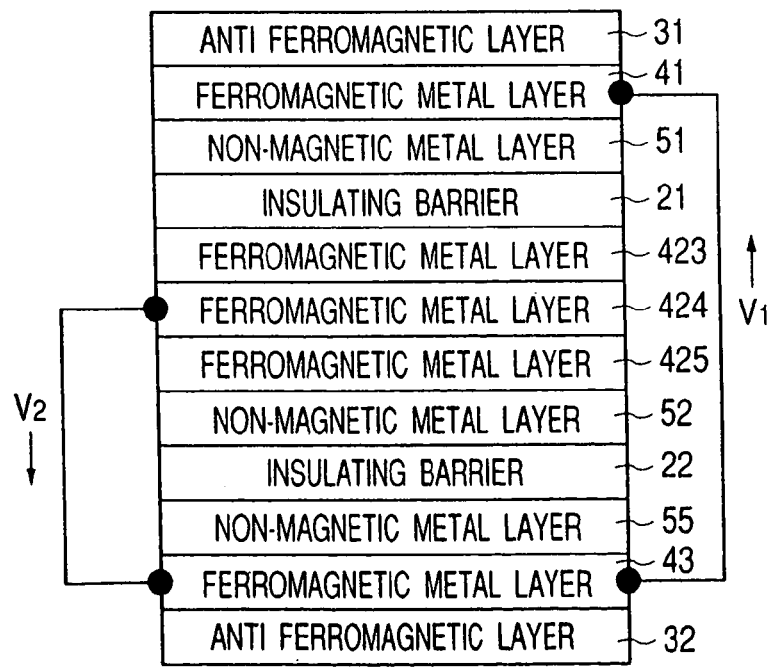
FIG. 66 is a schematic cross-sectional view showing other example of a three-terminal ferromagnetic tunnel element of the invention.

FIG. 66 is a schematic cross-sectional view showing another exemplary three-terminal TMR element of the invention. The element of this example has the same structure as that shown in FIG. 50 except that the ferromagnetic metal layer 42 is replaced with a tri-layered film made from ferromagnetic metal layers 423, 424 and 425. The element of the present example had the same TMR characteristics as those shown in FIGS. 36A and 36B.

Figure 67:
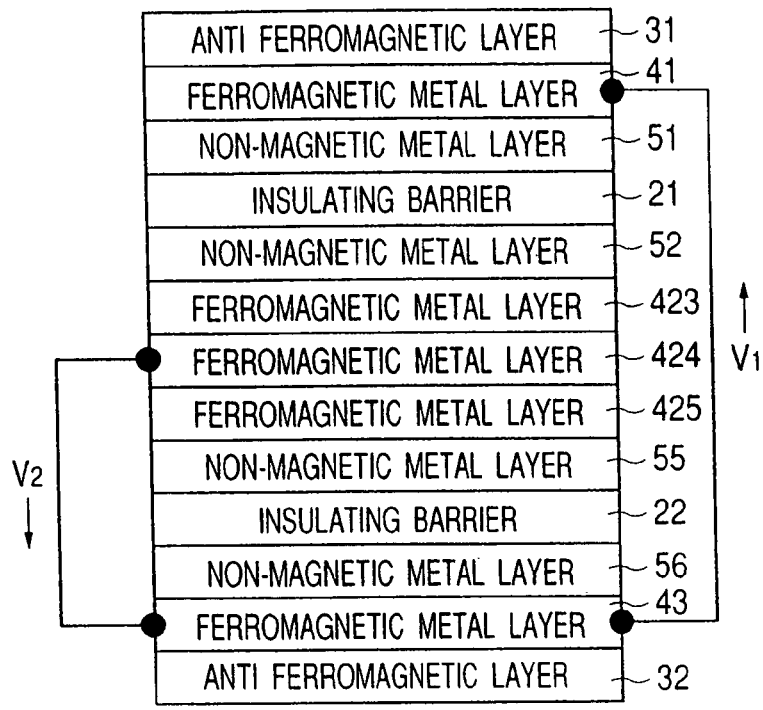
FIG. 67 is a schematic cross-sectional view showing other example of a three-terminal ferromagnetic tunnel element of the invention.

FIG. 67 is a schematic cross-sectional view showing another exemplary three-terminal TMR element of the invention. The element of this example has the same structure as that shown in FIG. 51 except that the ferromagnetic metal layer 42 is replaced with a tri-layered film made from ferromagnetic metal layers 423, 424 and 425. The element of the present example had the same TMR characteristics as those shown in FIGS. 36A and 36B.

Figure 68:
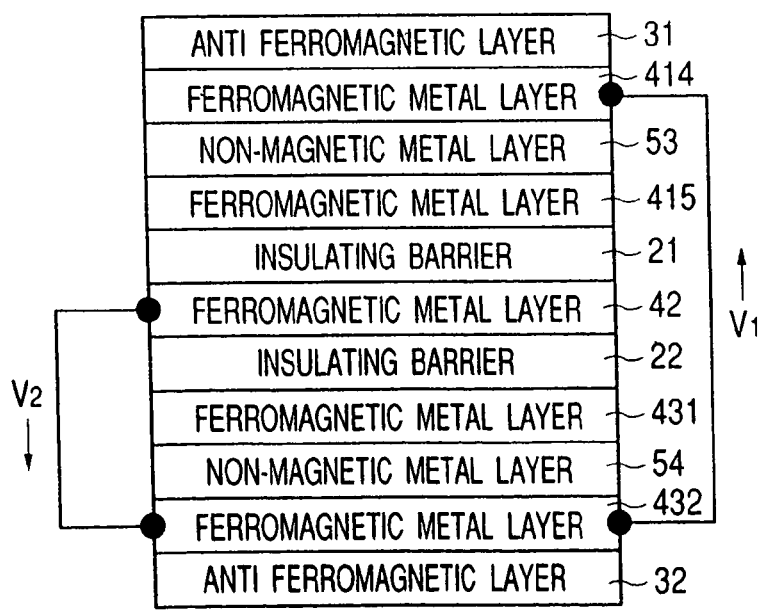
FIG. 68 is a schematic cross-sectional view showing other example of a three-terminal ferromagnetic tunnel element of the invention.

FIG. 68 is a schematic cross-sectional view showing other exemplary three-terminal TMR element of the invention. The element of this example has the same structure as that shown in FIG. 35 except that the ferromagnetic metal layer 41 is replaced with a tri-layered film made from a ferromagnetic metal layer 414, a non-magnetic metal layer 53 and a ferromagnetic metal layer 415, and the ferromagnetic metal layer 43 is replaced with a tri-layered film made from a ferromagnetic metal layer 431, a non-magnetic metal layer 54 and a ferromagnetic metal layer 432. The ferromagnetic metal layers 414, 415, 431 and 432 are made of a Co-based alloy. The non-magnetic metal layers 53 and 54 are made of either Ru or Cu. The element of the present example had the same TMR characteristics as those shown in FIGS. 36A and 36B.

Figure 69:
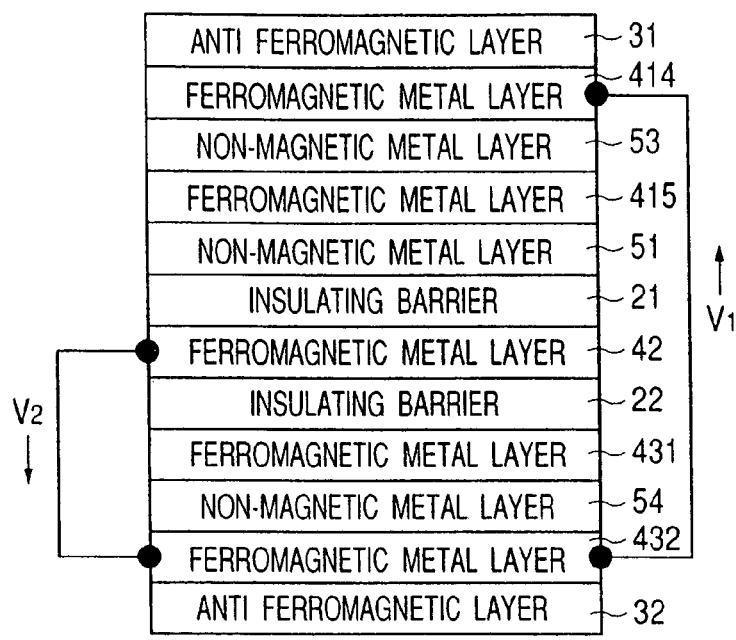
FIG. 69 is a schematic cross-sectional view showing other example of a three-terminal ferromagnetic tunnel element of the invention.

FIG. 69 is a schematic cross-sectional view showing other exemplary three-terminal TMR element of the invention. The element of this example has the same structure as that shown in FIG. 37 except that the ferromagnetic metal layer 41 is replaced with a tri-layered film made from a ferromagnetic metal layer 414, a non-magnetic metal layer 53 and a ferromagnetic metal layer 415, and the ferromagnetic metal layer 43 is replaced with a tri-layered film made from a ferromagnetic metal layer 431, a non-magnetic metal layer 54 and a ferromagnetic metal layer 432. The element of the present example had the same TMR characteristics as those shown in FIGS. 36A and 36B.

Figure 70:
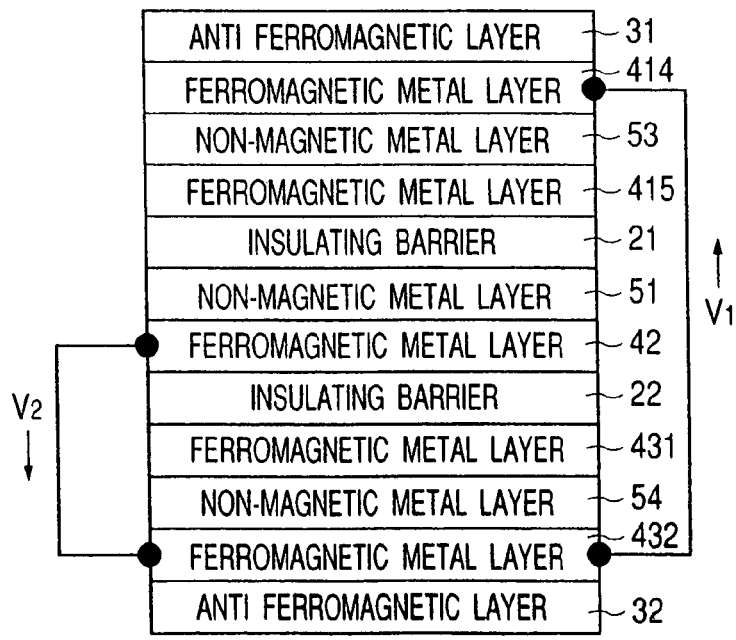
FIG. 70 is a schematic cross-sectional view showing other example of a three-terminal ferromagnetic tunnel element of the invention.

FIG. 70 is a schematic cross-sectional view showing other exemplary three-terminal TMR element of the invention. The element of this example has the same structure as that shown in FIG. 38 except that the ferromagnetic metal layer 41 is replaced with a tri-layered film made from a ferromagnetic metal layer 414, a non-magnetic metal layer 53 and a ferromagnetic metal layer 415, and the ferromagnetic metal layer 43 is replaced with a tri-layered film made from a ferromagnetic metal layer 431, a non-magnetic metal layer 54 and a ferromagnetic metal layer 432. The element of the present example had the same TMR characteristics as those shown in FIGS. 36A and 36B.

Figure 71:
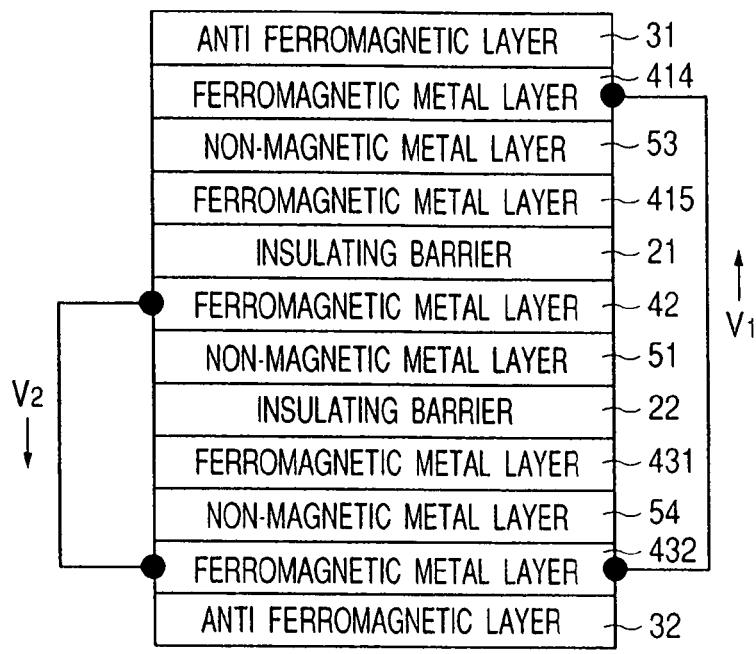
FIG. 71 is a schematic cross-sectional view showing other example of a three-terminal ferromagnetic tunnel element of the invention.

FIG. 71 is a schematic cross-sectional view showing other exemplary three-terminal TMR element of the invention. The element of this example has the same structure as that shown in FIG. 39 except that the ferromagnetic metal layer 41 is replaced with a tri-layered film made from a ferromagnetic metal layer 414, a non-magnetic metal layer 53 and a ferromagnetic metal layer 415, and the ferromagnetic metal layer 43 is replaced with a tri-layered film made from a ferromagnetic metal layer 431, a non-magnetic metal layer 54 and a ferromagnetic metal layer 432. The element of the present example had the same TMR characteristics as those shown in FIGS. 36A and 36B.

Figure 72:
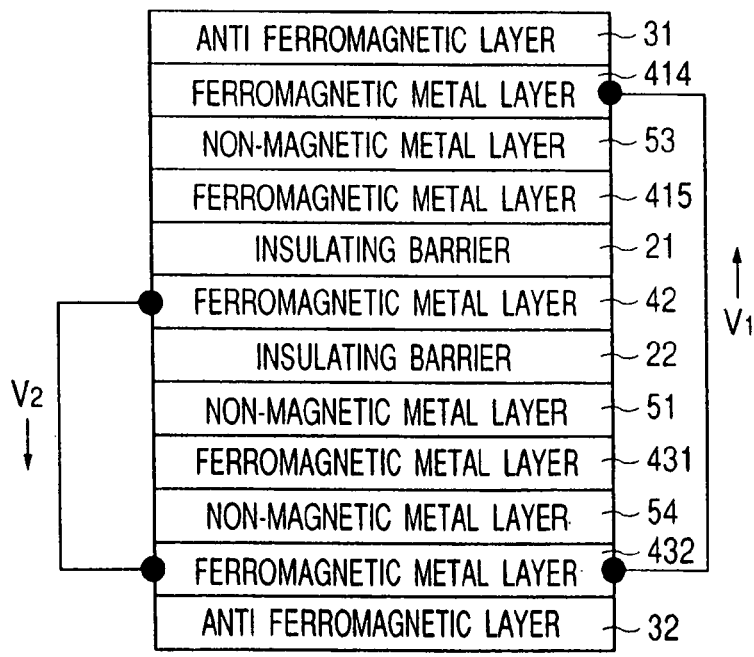
FIG. 72 is a schematic cross-sectional view showing other example of a three-terminal ferromagnetic tunnel element of the invention.

FIG. 72 is a schematic cross-sectional view showing other exemplary three-terminal TMR element of the invention. The element of this example has the same structure as that shown in FIG. 40 except that the ferromagnetic metal layer 41 is replaced with a tri-layered film made from a ferromagnetic metal layer 414, a non-magnetic metal layer 53 and a ferromagnetic metal layer 415, and the ferromagnetic metal layer 43 is replaced with a tri-layered film made from a ferromagnetic metal layer 431, a non-magnetic metal layer 54 and a ferromagnetic metal layer 432. The element of the present example had the same TMR characteristics as those shown in FIGS. 36A and 36B.

Figure 73:
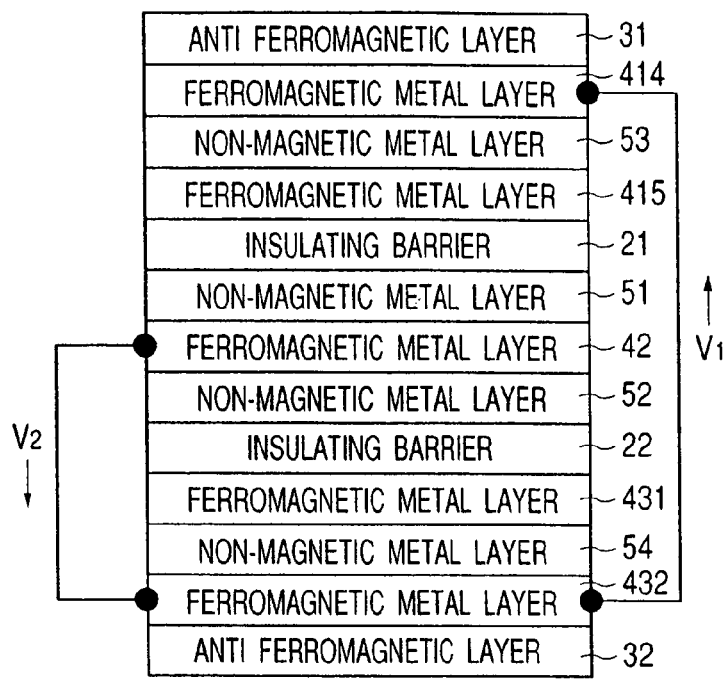
FIG. 73 is a schematic cross-sectional view showing other example of a three-terminal ferromagnetic tunnel element of the invention.

FIG. 73 is a schematic cross-sectional view showing other exemplary three-terminal TMR element of the invention. The element of this example has the same structure as that shown in FIG. 41 except that the ferromagnetic metal layer 41 is replaced with a tri-layered film made from a ferromagnetic metal layer 414, a non-magnetic metal layer 53 and a ferromagnetic metal layer 415, and the ferromagnetic metal layer 43 is replaced with a tri-layered film made from a ferromagnetic metal layer 431, a non-magnetic metal layer 54 and a ferromagnetic metal layer 432. The element of the present example had the same TMR characteristics as those shown in FIGS. 36A and 36B.

Figure 74:
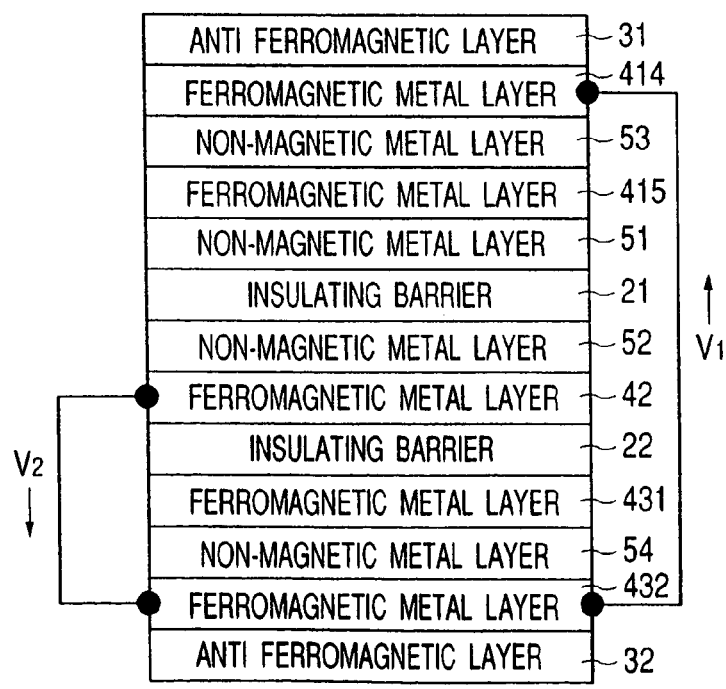
FIG. 74 is a schematic cross-sectional view showing other example of a three-terminal ferromagnetic tunnel element of the invention.

FIG. 74 is a schematic cross-sectional view showing other exemplary three-terminal TMR element of the invention. The element of this example has the same structure as that shown in FIG. 42 except that the ferromagnetic metal layer 41 is replaced with a tri-layered film made from a ferromagnetic metal layer 414, a non-magnetic metal layer 53 and a ferromagnetic metal layer 415, and the ferromagnetic metal layer 43 is replaced with a tri-layered film made from a ferromagnetic metal layer 431, a non-magnetic metal layer 54 and a ferromagnetic metal layer 432. The element of the present example had the same TMR characteristics as those shown in FIGS. 36A and 36B.

Figure 75:
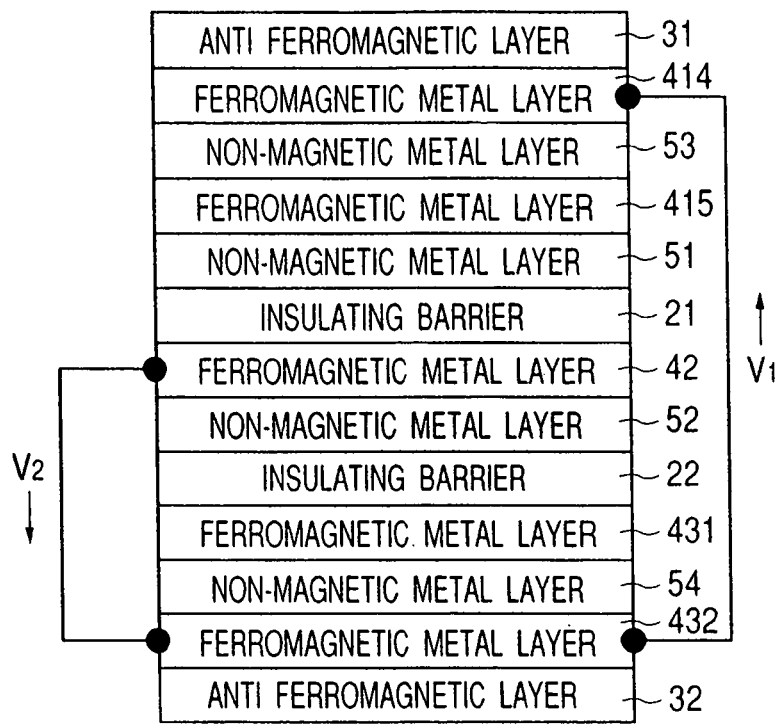
FIG. 75 is a schematic cross-sectional view showing other example of a three-terminal ferromagnetic tunnel element of the invention.

FIG. 75 is a schematic cross-sectional view showing other exemplary three-terminal TMR element of the invention. The element of this example has the same structure as that shown in FIG. 43 except that the ferromagnetic metal layer 41 is replaced with a tri-layered film made from a ferromagnetic metal layer 414, a non-magnetic metal layer 53 and a ferromagnetic metal layer 415, and the ferromagnetic metal layer 43 is replaced with a tri-layered film made from a ferromagnetic metal layer 431, a non-magnetic metal layer 54 and a ferromagnetic metal layer 432. The element of the present example had the same TMR characteristics as those shown in FIGS. 36A and 36B.

Figure 76:
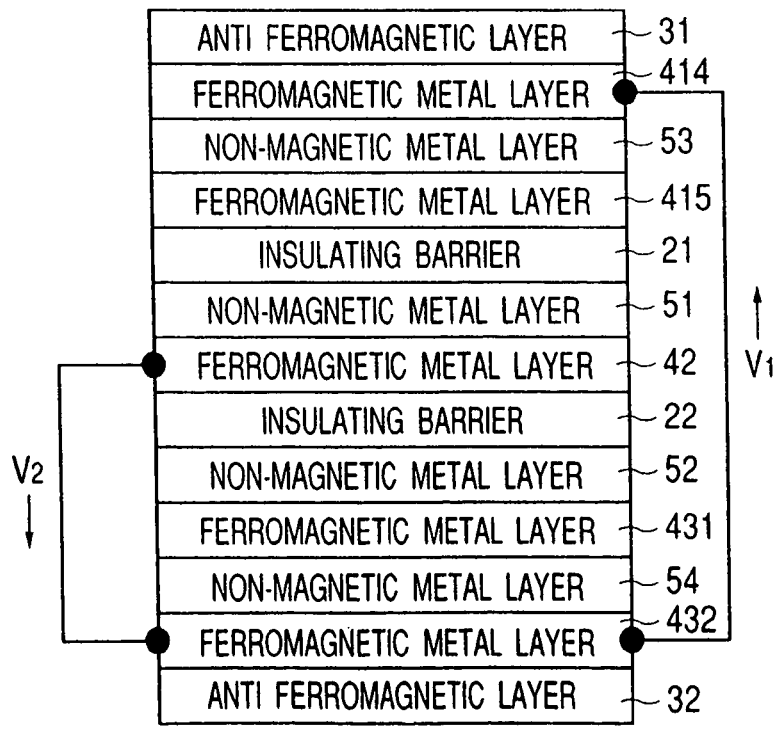
FIG. 76 is a schematic cross-sectional view showing other example of a three-terminal ferromagnetic tunnel element of the invention.

FIG. 76 is a schematic cross-sectional view showing other exemplary three-terminal TMR element of the invention. The element of this example has the same structure as that shown in FIG. 44 except that the ferromagnetic metal layer 41 is replaced with a tri-layered film made from a ferromagnetic metal layer 414, a non-magnetic metal layer 53 and a ferromagnetic metal layer 415, and the ferromagnetic metal layer 43 is replaced with a tri-layered film made from a ferromagnetic metal layer 431, a non-magnetic metal layer 54 and a ferromagnetic metal layer 432. The element of the present example had the same TMR characteristics as those shown in FIGS. 36A and 36B.

Figure 77:
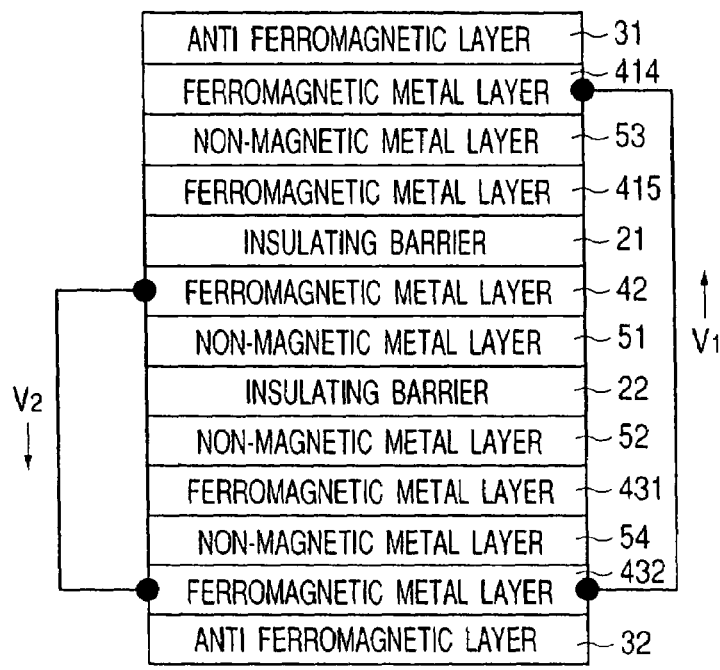
FIG. 77 is a schematic cross-sectional view showing other example of a three-terminal ferromagnetic tunnel element of the invention.

FIG. 77 is a schematic cross-sectional view showing other exemplary three-terminal TMR element of the invention. The element of this example has the same structure as that shown in FIG. 45 except that the ferromagnetic metal layer 41 is replaced with a tri-layered film made from a ferromagnetic metal layer 414, a non-magnetic metal layer 53 and a ferromagnetic metal layer 415, and the ferromagnetic metal layer 43 is replaced with a tri-layered film made from a ferromagnetic metal layer 431, a non-magnetic metal layer 54 and a ferromagnetic metal layer 432. The element of the present example had the same TMR characteristics as those shown in FIGS. 36A and 36B.

Figure 78:
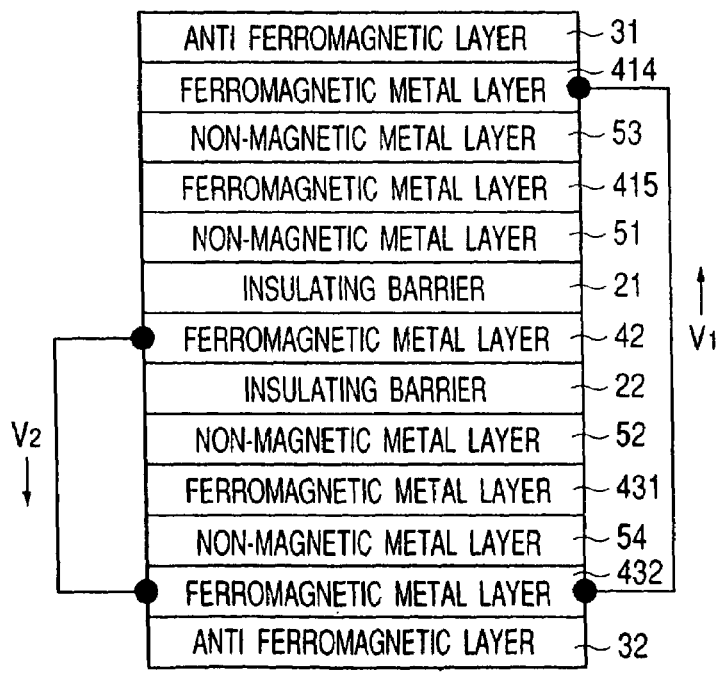
FIG. 78 is a schematic cross-sectional view showing other example of a three-terminal ferromagnetic tunnel element of the invention.

FIG. 78 is a schematic cross-sectional view showing other exemplary three-terminal TMR element of the invention. The element of this example has the same structure as that shown in FIG. 46 except that the ferromagnetic metal layer 41 is replaced with a tri-layered film made from a ferromagnetic metal layer 414, a non-magnetic metal layer 53 and a ferromagnetic metal layer 415, and the ferromagnetic metal layer 43 is replaced with a tri-layered film made from a ferromagnetic metal layer 431, a non-magnetic metal layer 54 and a ferromagnetic metal layer 432. The element of the present example had the same TMR characteristics as those shown in FIGS. 36A and 36B.

Figure 79:
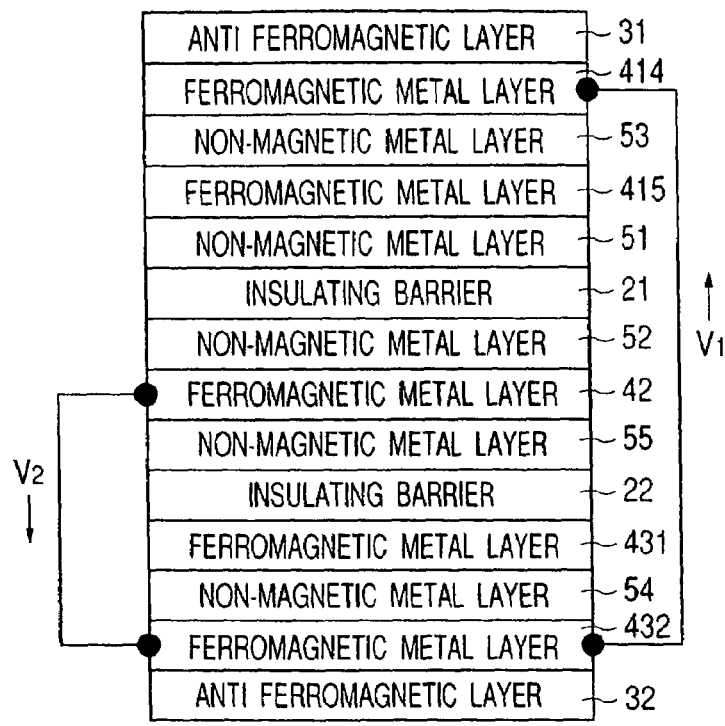
FIG. 79 is a schematic cross-sectional view showing other example of a three-terminal ferromagnetic tunnel element of the invention.

FIG. 79 is a schematic cross-sectional view showing other exemplary three-terminal TMR element of the invention. The element of this example has the same structure as that shown in FIG. 47 except that the ferromagnetic metal layer 41 is replaced with a tri-layered film made from a ferromagnetic metal layer 414, a non-magnetic metal layer 53 and a ferromagnetic metal layer 415, and the ferromagnetic metal layer 43 is replaced with a tri-layered film made from a ferromagnetic metal layer 431, a non-magnetic metal layer 54 and a ferromagnetic metal layer 432. The element of the present example had the same TMR characteristics as those shown in FIGS. 36A and 36B.

Figure 80:
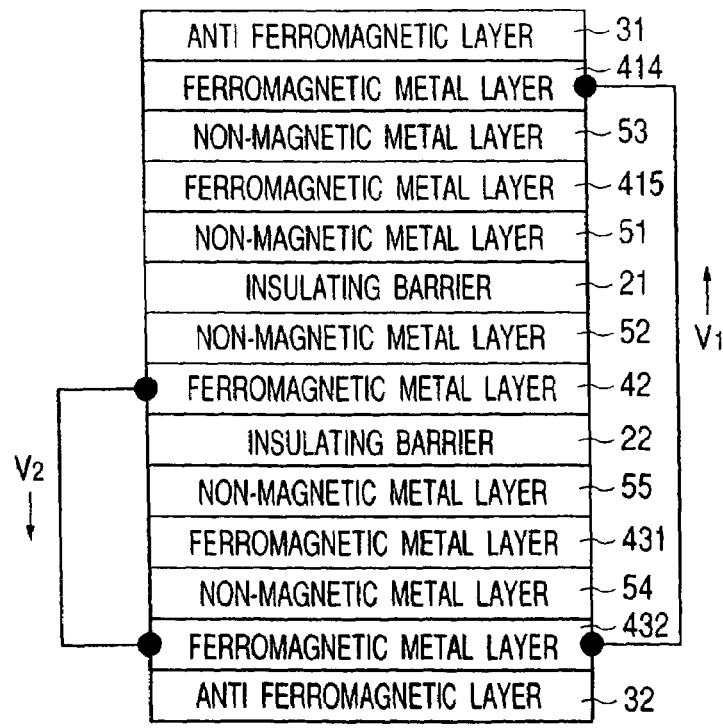
FIG. 80 is a schematic cross-sectional view showing other example of a three-terminal ferromagnetic tunnel element of the invention.

FIG. 80 is a schematic cross-sectional view showing other exemplary three-terminal TMR element of the invention. The element of this example has the same structure as that shown in FIG. 48 except that the ferromagnetic metal layer 41 is replaced with a tri-layered film made from a ferromagnetic metal layer 414, a non-magnetic metal layer 53 and a ferromagnetic metal layer 415, and the ferromagnetic metal layer 43 is replaced with a tri-layered film made from a ferromagnetic metal layer 431, a non-magnetic metal layer 54 and a ferromagnetic metal layer 432. The element of the present example had the same TMR characteristics as those shown in FIGS. 36A and 36B.

Figure 81:
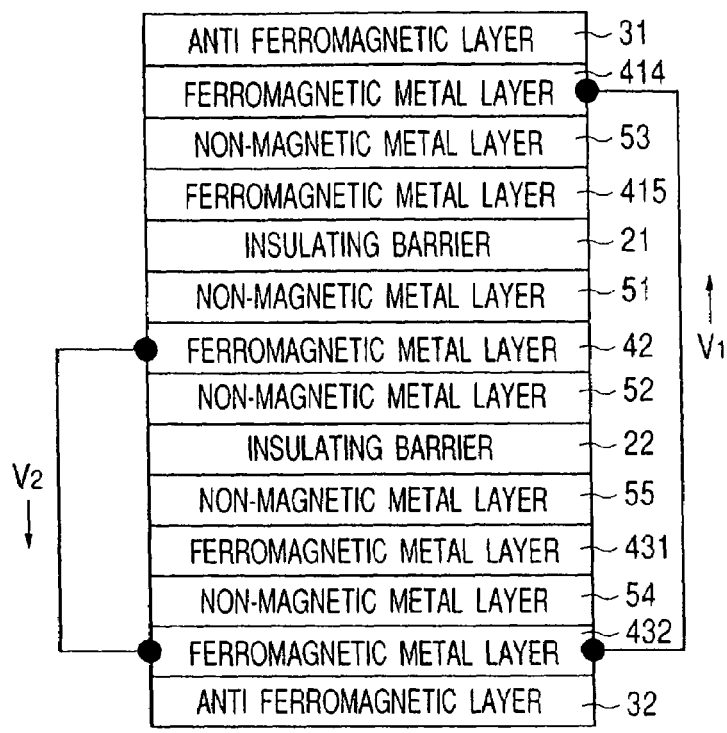
FIG. 81 is a schematic cross-sectional view showing other example of a three-terminal ferromagnetic tunnel element of the invention.

FIG. 81 is a schematic cross-sectional view showing other exemplary three-terminal TMR element of the invention. The element of this example has the same structure as that shown in FIG. 49 except that the ferromagnetic metal layer 41 is replaced with a tri-layered film made from a ferromagnetic metal layer 414, a non-magnetic metal layer 53 and a ferromagnetic metal layer 415, and the ferromagnetic metal layer 43 is replaced with a tri-layered film made from a ferromagnetic metal layer 431, a non-magnetic metal layer 54 and a ferromagnetic metal layer 432. The element of the present example had the same TMR characteristics as those shown in FIGS. 36A and 36B.

Figure 82:
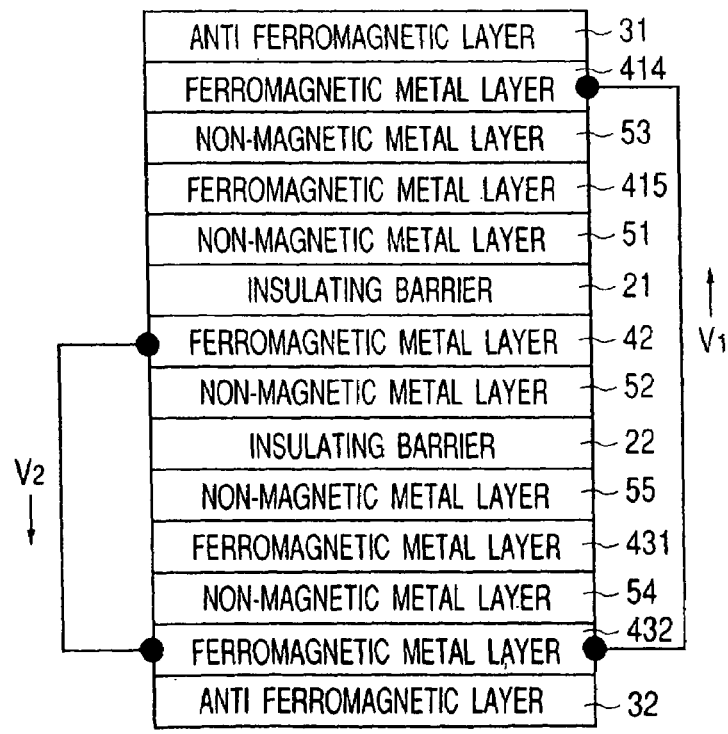
FIG. 82 is a schematic cross-sectional view showing other example of a three-terminal ferromagnetic tunnel element of the invention.

FIG. 82 is a schematic cross-sectional view showing other exemplary three-terminal TMR element of the invention. The element of this example has the same structure as that shown in FIG. 50 except that the ferromagnetic metal layer 41 is replaced with a tri-layered film made from a ferromagnetic metal layer 414, a non-magnetic metal layer 53 and a ferromagnetic metal layer 415, and the ferromagnetic metal layer 43 is replaced with a tri-layered film made from a ferromagnetic metal layer 431, a non-magnetic metal layer 54 and a ferromagnetic metal layer 432. The element of the present example had the same TMR characteristics as those shown in FIGS. 36A and 36B.

Figure 83:
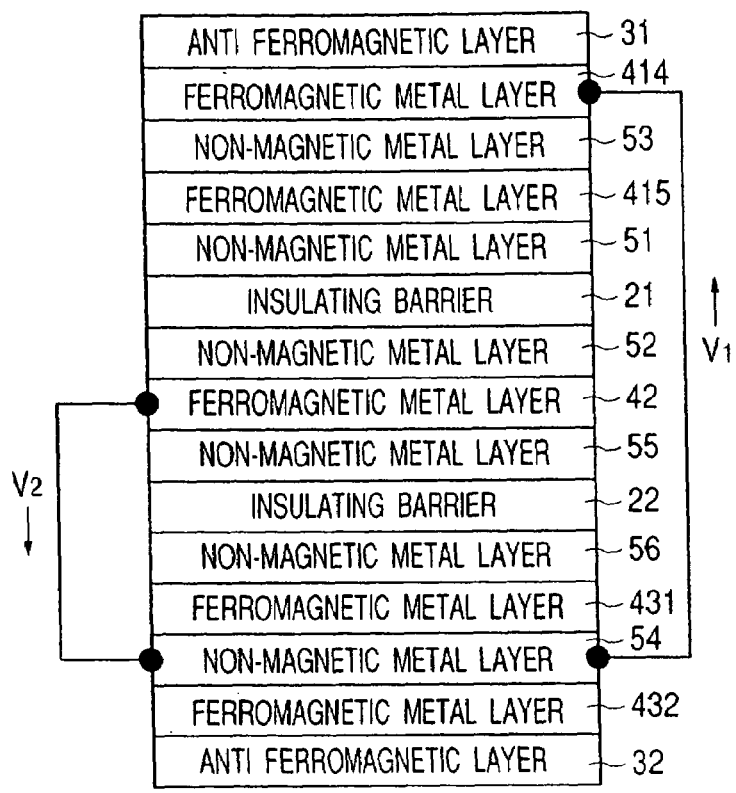
FIG. 83 is a schematic cross-sectional view showing other example of a three-terminal ferromagnetic tunnel element of the invention.

FIG. 83 is a schematic cross-sectional view showing other exemplary three-terminal TMR element of the invention. The element of this example has the same structure as that shown in FIG. 51 except that the ferromagnetic metal layer 41 is replaced with a tri-layered film made from a ferromagnetic metal layer 414, a non-magnetic metal layer 53 and a ferromagnetic metal layer 415, and the ferromagnetic metal layer 43 is replaced with a tri-layered film made from a ferromagnetic metal layer 431, a non-magnetic metal layer 54 and a ferromagnetic metal layer 432. The element of the present example had the same TMR characteristics as those shown in FIGS. 36A and 36B.

Figure 84:
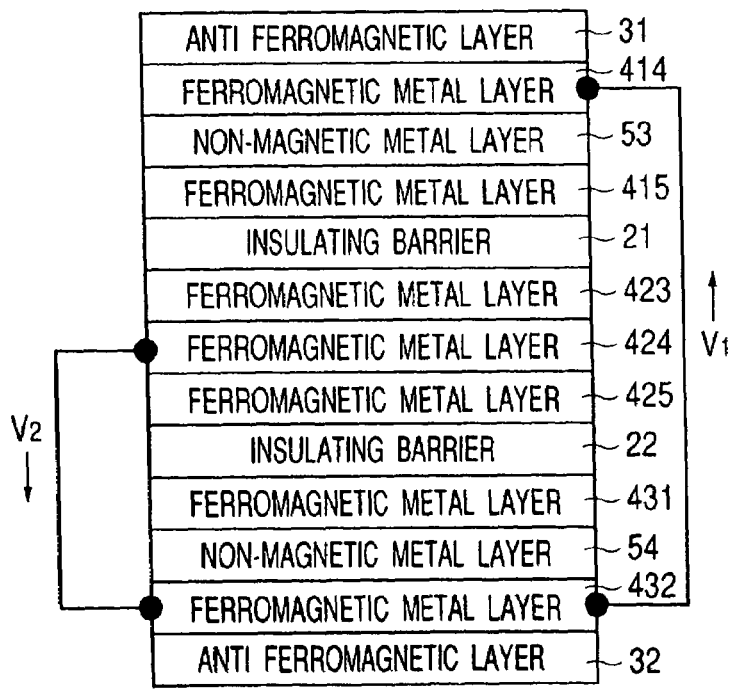
FIG. 84 is a schematic cross-sectional view showing other example of a three-terminal ferromagnetic tunnel element of the invention.

FIG. 84 is a schematic cross-sectional view showing other exemplary three-terminal TMR element of the invention. The element of this example has the same structure as that shown in FIG. 68 except that the ferromagnetic metal layer 42 is replaced with a tri-layered film made from ferromagnetic metal layers 423, 424 and 425. The element of the present example had the same TMR characteristics as those shown in FIGS. 36A and 36B.

Figure 85:
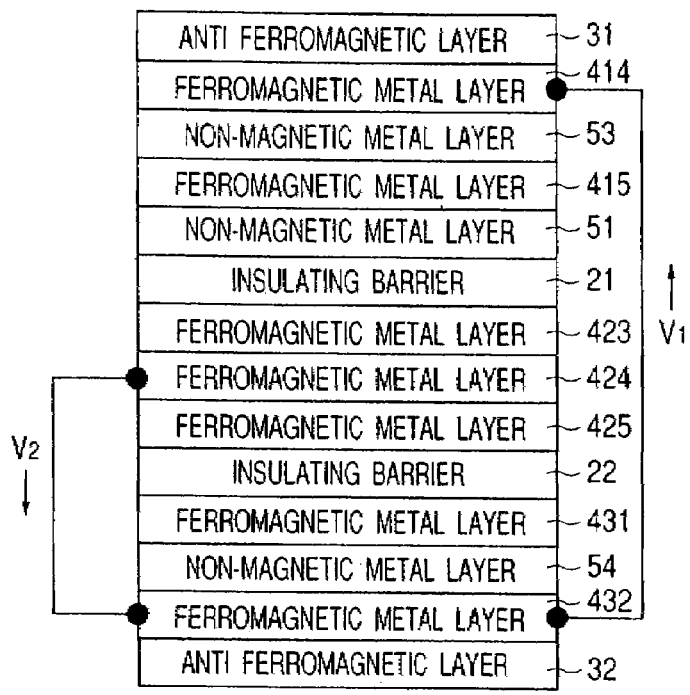
FIG. 85 is a schematic cross-sectional view showing other example of a three-terminal ferromagnetic tunnel element of the invention.

FIG. 85 is a schematic cross-sectional view showing other exemplary three-terminal TMR element of the invention. The element of this example has the same structure as that shown in FIG. 69 except that the ferromagnetic metal layer 42 is replaced with a tri-layered film made from ferromagnetic metal layers 423, 424 and 425. The element of the present example had the same TMR characteristics as those shown in FIGS. 36A and 36B.

Figure 86:
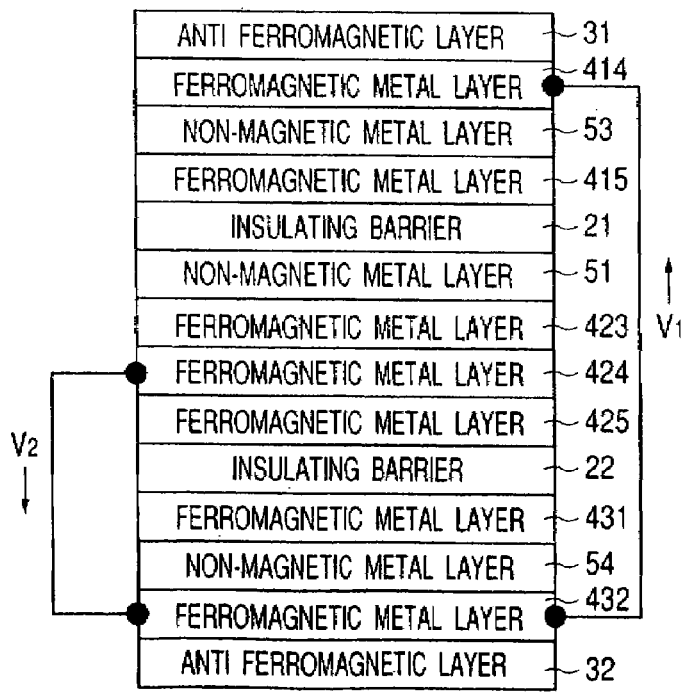
FIG. 86 is a schematic cross-sectional view showing other example of a three-terminal ferromagnetic tunnel element of the invention.

FIG. 86 is a schematic cross-sectional view showing other exemplary three-terminal TMR element of the invention. The element of this example has the same structure as that shown in FIG. 70 except that the ferromagnetic metal layer 42 is replaced with a tri-layered film made from ferromagnetic metal layers 423, 424 and 425. The element of the present example had the same TMR characteristics as those shown in FIGS. 36A and 36B.

Figure 87:
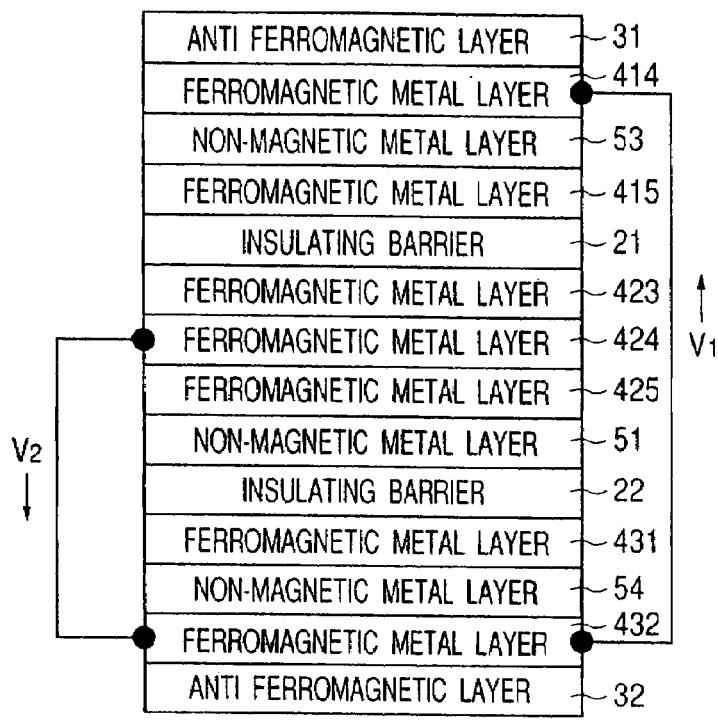
FIG. 87 is a schematic cross-sectional view showing other example of a three-terminal ferromagnetic tunnel element of the invention.

FIG. 87 is a schematic cross-sectional view showing other exemplary three-terminal TMR element of the invention. The element of this example has the same structure as that shown in FIG. 71 except that the ferromagnetic metal layer 42 is replaced with a tri-layered film made from ferromagnetic metal layers 423, 424 and 425. The element of the present example had the same TMR characteristics as those shown in FIGS. 36A and 36B.

Figure 88:
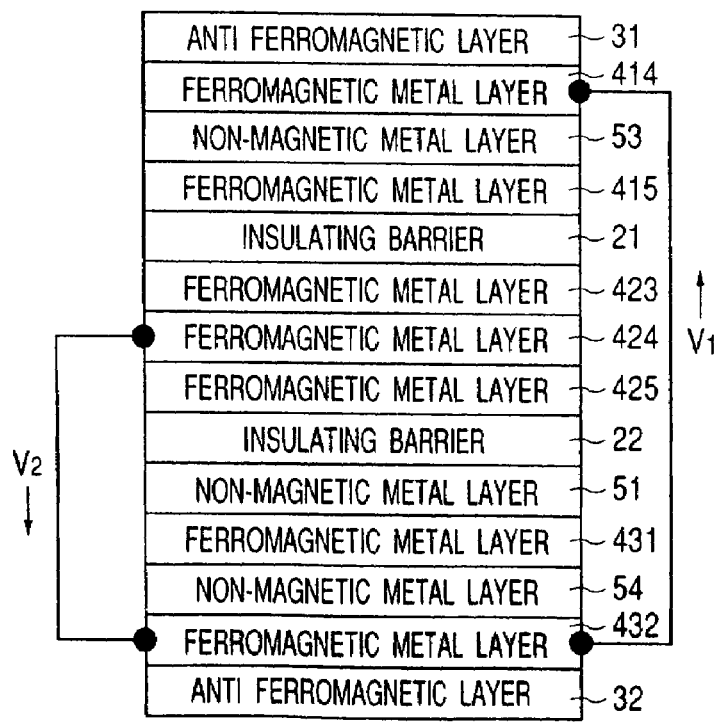
FIG. 88 is a schematic cross-sectional view showing other example of a three-terminal ferromagnetic tunnel element of the invention.

FIG. 88 is a schematic cross-sectional view showing other exemplary three-terminal TMR element of the invention. The element of this example has the same structure as that shown in FIG. 72 except that the ferromagnetic metal layer 42 is replaced with a tri-layered film made from ferromagnetic metal layers 423, 424 and 425. The element of the present example had the same TMR characteristics as those shown in FIGS. 36A and 36B.

Figure 89:
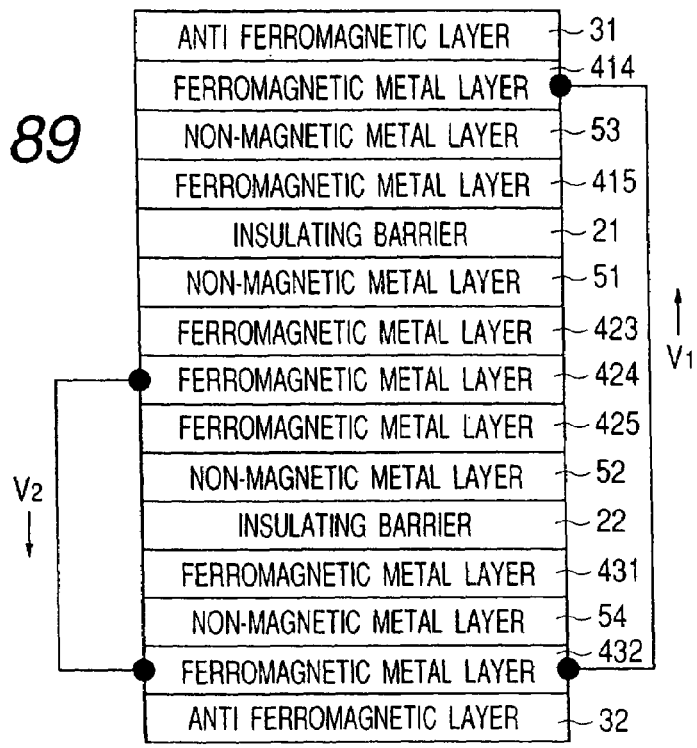
FIG. 89 is a schematic cross-sectional view showing other example of a three-terminal ferromagnetic tunnel element of the invention.

FIG. 89 is a schematic cross-sectional view showing other exemplary three-terminal TMR element of the invention. The element of this example has the same structure as that shown in FIG. 73 except that the ferromagnetic metal layer 42 is replaced with a tri-layered film made from ferromagnetic metal layers 423, 424 and 425. The element of the present example had the same TMR characteristics as those shown in FIGS. 36A and 36B.

Figure 90:
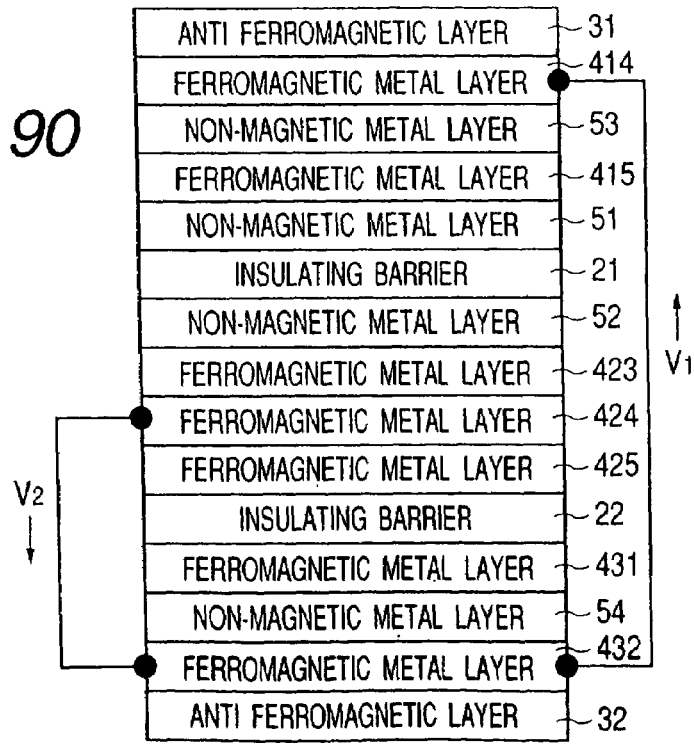
FIG. 90 is a schematic cross-sectional view showing other example of a three-terminal ferromagnetic tunnel element of the invention.

FIG. 90 is a schematic cross-sectional view showing other exemplary three-terminal TMR element of the invention. The element of this example has the same structure as that shown in FIG. 74 except that the ferromagnetic metal layer 42 is replaced with a tri-layered film made from ferromagnetic metal layers 423, 424 and 425. The element of the present example had the same TMR characteristics as those shown in FIGS. 36A and 36B.

Figure 91:
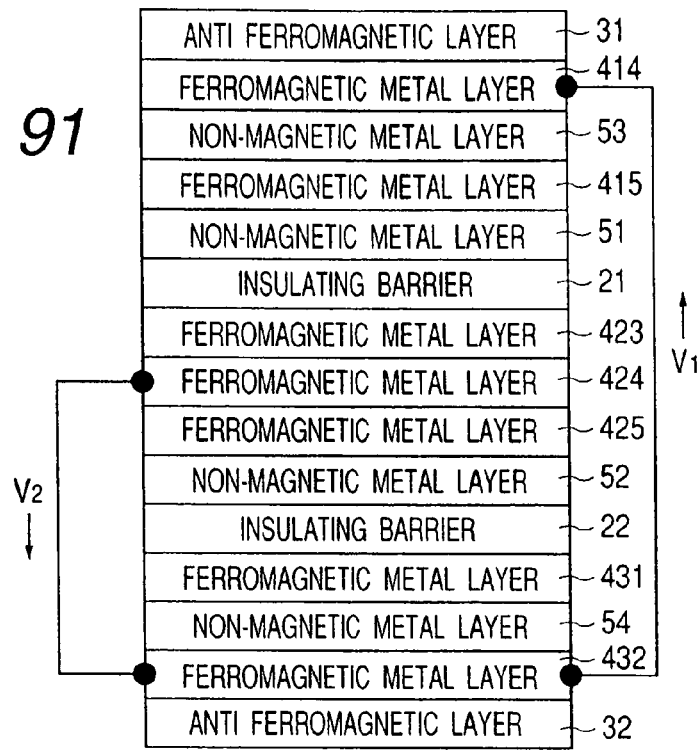
FIG. 91 is a schematic cross-sectional view showing other example of a three-terminal ferromagnetic tunnel element of the invention.

FIG. 91 is a schematic cross-sectional view showing other exemplary three-terminal TMR element of the invention. The element of this example has the same structure as that shown in FIG. 75 except that the ferromagnetic metal layer 42 is replaced with a tri-layered film made from ferromagnetic metal layers 423, 424 and 425. The element of the present example had the same TMR characteristics as those shown in FIGS. 36A and 36B.

Figure 92:
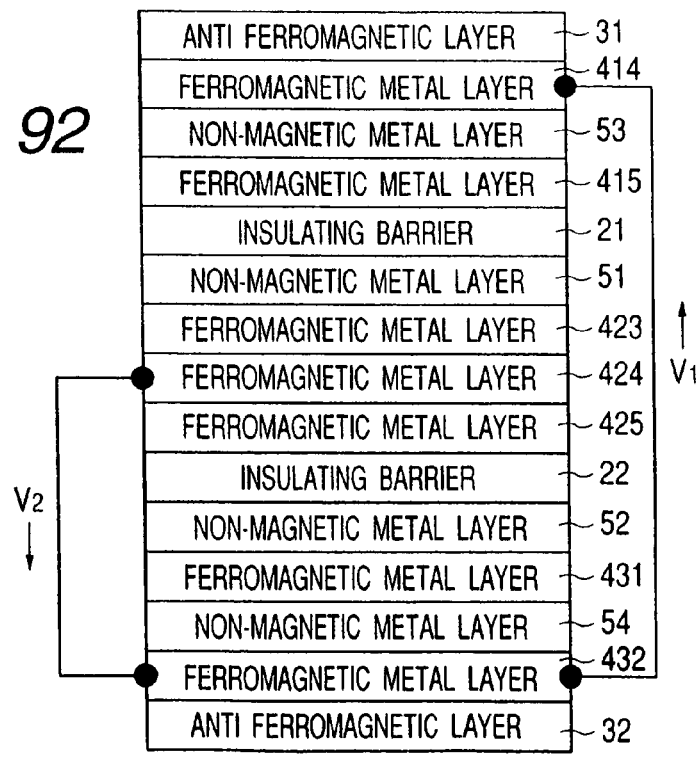
FIG. 92 is a schematic cross-sectional view showing other example of a three-terminal ferromagnetic tunnel element of the invention.

FIG. 92 is a schematic cross-sectional view showing other exemplary three-terminal TMR element of the invention. The element of this example has the same structure as that shown in FIG. 76 except that the ferromagnetic metal layer 42 is replaced with a tri-layered film made from ferromagnetic metal layers 423, 424 and 425. The element of the present example had the same TMR characteristics as those shown in FIGS. 36A and 36B.

Figure 93:
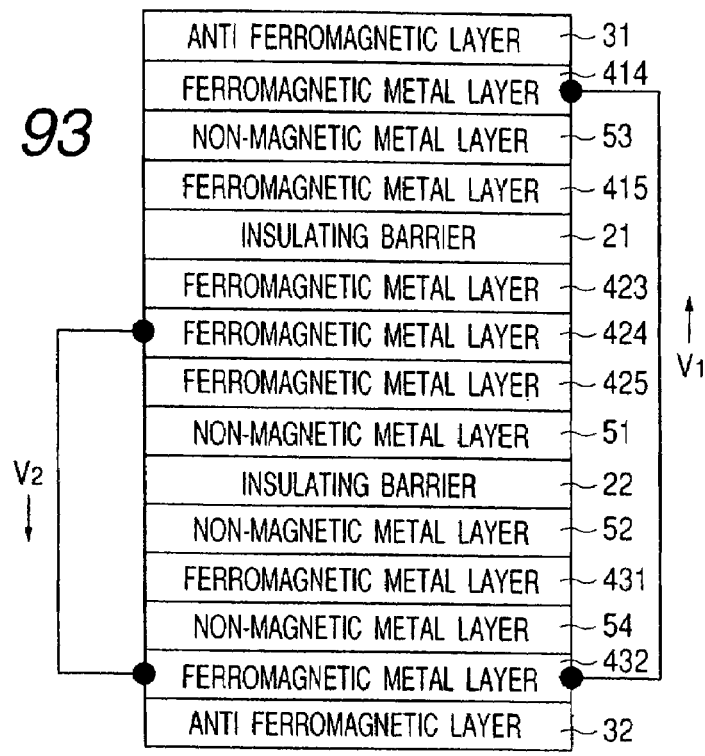
FIG. 93 is a schematic cross-sectional view showing other example of a three-terminal ferromagnetic tunnel element of the invention.

FIG. 93 is a schematic cross-sectional view showing other exemplary three-terminal TMR element of the invention. The element of this example has the same structure as that shown in FIG. 77 except that the ferromagnetic metal layer 42 is replaced with a tri-layered film made from ferromagnetic metal layers 423, 424 and 425. The element of the present example had the same TMR characteristics as those shown in FIGS. 36A and 36B.

Figure 94:
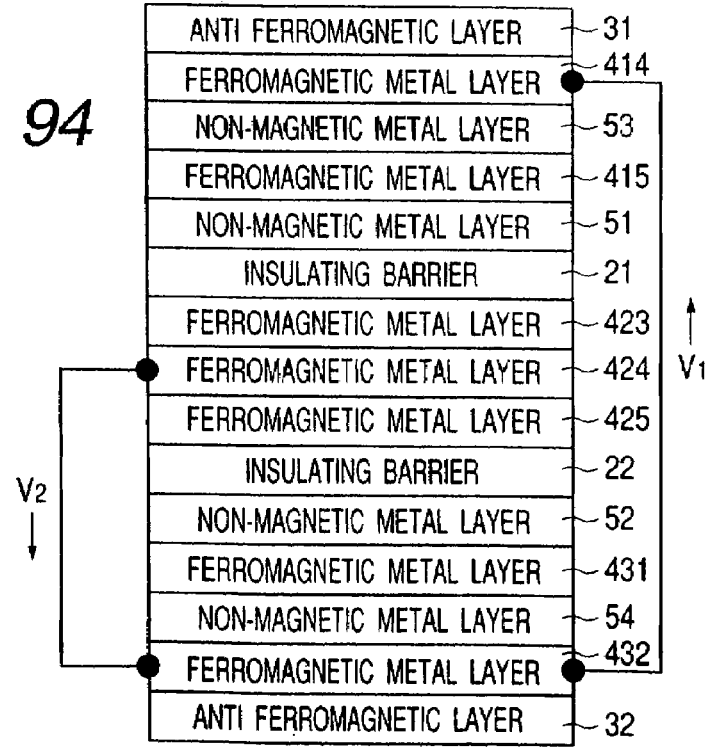
FIG. 94 is a schematic cross-sectional view showing other example of a three-terminal ferromagnetic tunnel element of the invention.

FIG. 94 is a schematic cross-sectional view showing other exemplary three-terminal TMR element of the invention. The element of this example has the same structure as that shown in FIG. 78 except that the ferromagnetic metal layer 42 is replaced with a tri-layered film made from ferromagnetic metal layers 423, 424 and 425. The element of the present example had the same TMR characteristics as those shown in FIGS. 36A and 36B.

Figure 95:
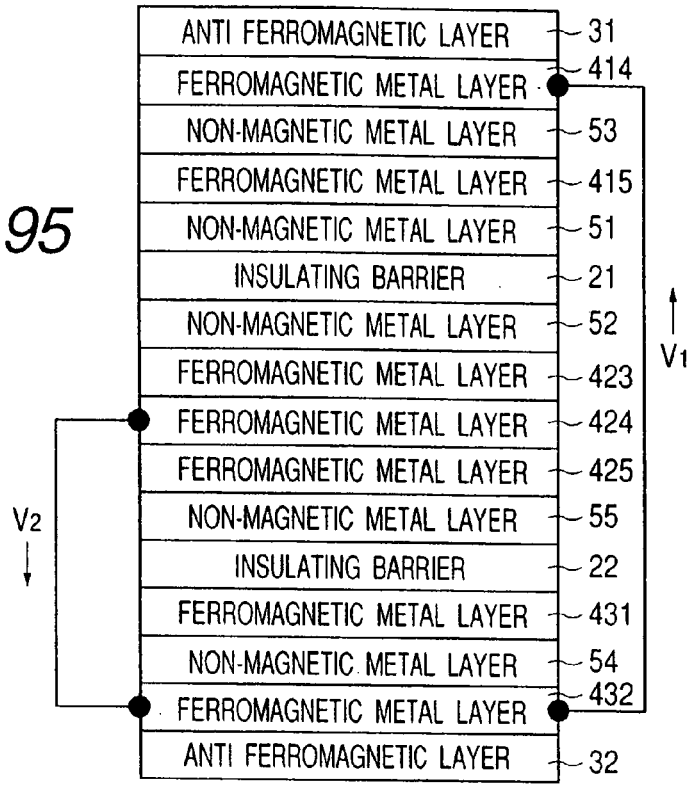
FIG. 95 is a schematic cross-sectional view showing other example of a three-terminal ferromagnetic tunnel element of the invention.

FIG. 95 is a schematic cross-sectional view showing other exemplary three-terminal TMR element of the invention. The element of this example has the same structure as that shown in FIG. 79 except that the ferromagnetic metal layer 42 is replaced with a tri-layered film made from ferromagnetic metal layers 423, 424 and 425. The element of the present example had the same TMR characteristics as those shown in FIGS. 36A and 36B.

Figure 96:
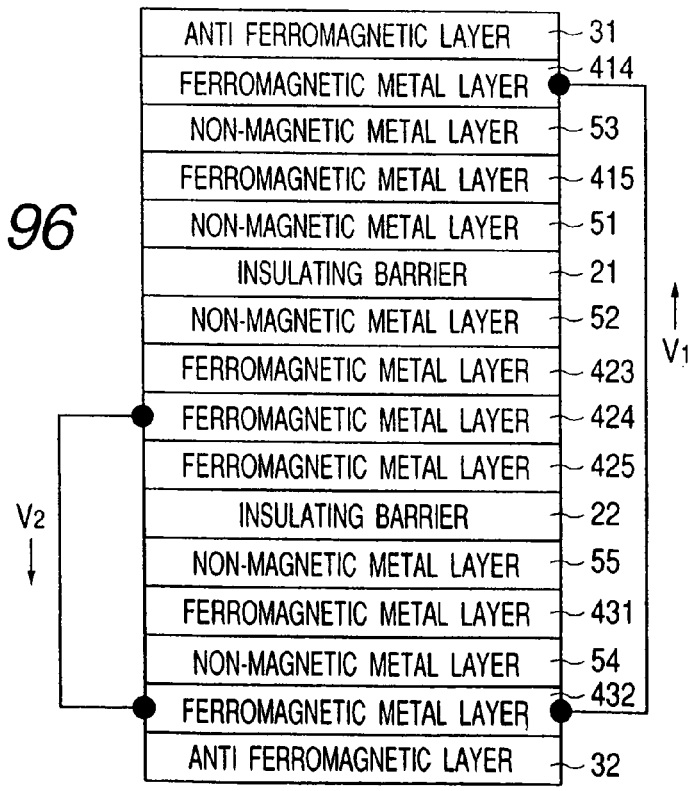
FIG. 96 is a schematic cross-sectional view showing other example of a three-terminal ferromagnetic tunnel element of the invention.

FIG. 96 is a schematic cross-sectional view showing other exemplary three-terminal TMR element of the invention. The element of this example has the same structure as that shown in FIG. 80 except that the ferromagnetic metal layer 42 is replaced with a tri-layered film made from ferromagnetic metal layers 423, 424 and 425. The element of the present example had the same TMR characteristics as those shown in FIGS. 36A and 36B.

Figure 97:
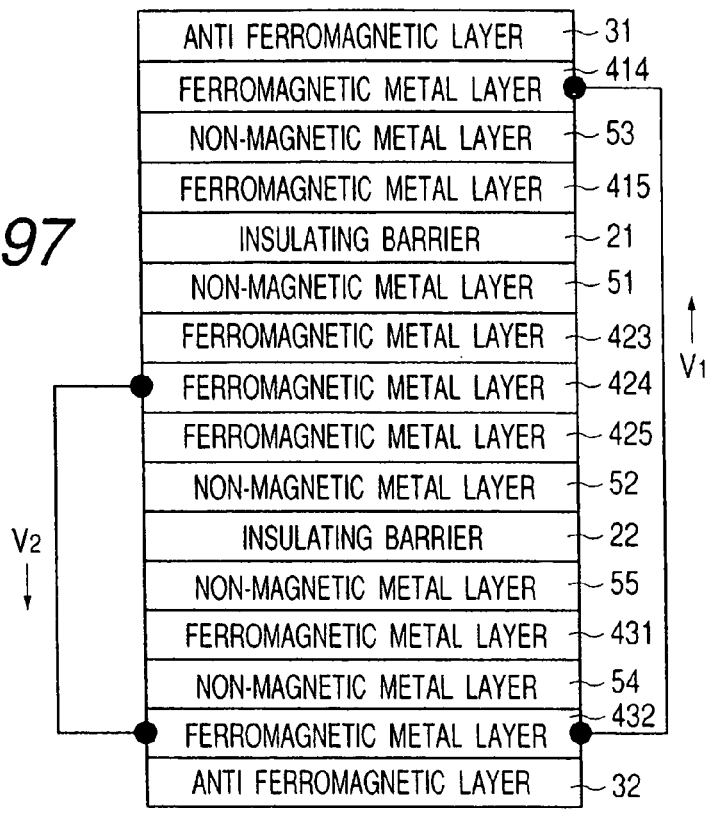
FIG. 97 is a schematic cross-sectional view showing other example of a three-terminal ferromagnetic tunnel element of the invention.

FIG. 97 is a schematic cross-sectional view showing other exemplary three-terminal TMR element of the invention. The element of this example has the same structure as that shown in FIG. 81 except that the ferromagnetic metal layer 42 is replaced with a tri-layered film made from ferromagnetic metal layers 423, 424 and 425. The element of the present example had the same TMR characteristics as those shown in FIGS. 36A and 36B.

Figure 98:
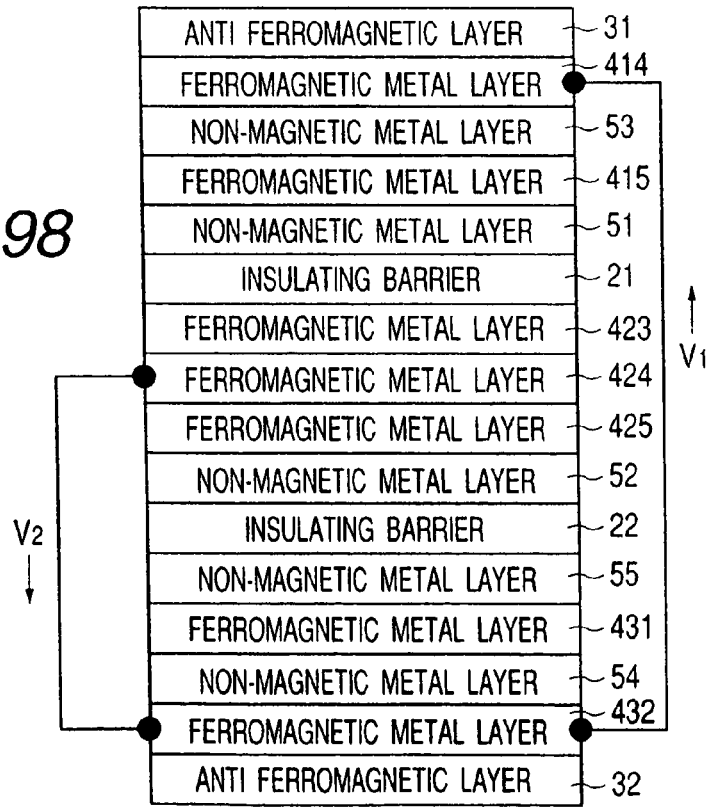
FIG. 98 is a schematic cross-sectional view showing other example of a three-terminal ferromagnetic tunnel element of the invention.

FIG. 98 is a schematic cross-sectional view showing other exemplary three-terminal TMR element of the invention. The element of this example has the same structure as that shown in FIG. 82 except that the ferromagnetic metal layer 42 is replaced with a tri-layered film made from ferromagnetic metal layers 423, 424 and 425. The element of the present example had the same TMR characteristics as those shown in FIGS. 36A and 36B.

FIG. 99 is a schematic cross-sectional view showing other exemplary three-terminal TMR element of the invention. The element of this example has the same structure as that shown in FIG. 83 except that the ferromagnetic metal layer 42 is replaced with a tri-layered film made from ferromagnetic metal layers 423, 424 and 425. The element of the present example had the same TMR characteristics as those shown in FIGS. 36A and 36B. In the examples shown in FIGS. 37 to 99, the bias voltage $V_2$ may be applied between the ferromagnetic metal layers 41 (414) and 42 (424).

[Embodiment 4]

Figure 100:
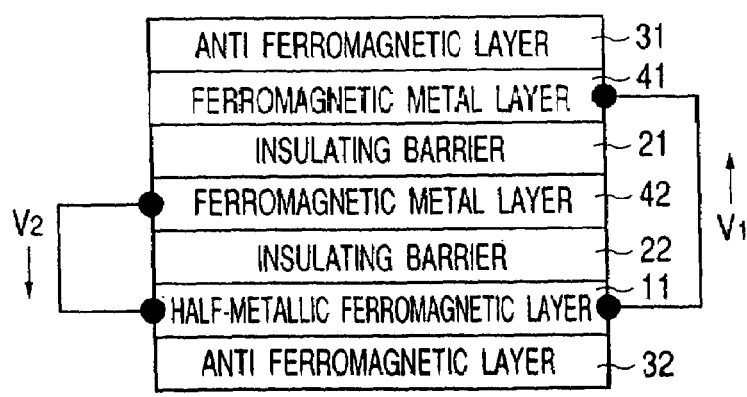
FIG. 100 is a schematic cross-sectional view showing other example of a three-terminal ferromagnetic tunnel element of the invention.

In the examples shown in FIGS. 100 to 228, each of the three-terminal TMR elements has a basic structure where a half-metallic ferromagnetic layer, an insulating barrier layer, a ferromagnetic metal layer, an insulating barrier layer and a ferromagnetic metal layer are laminated on a substrate in this order.

FIG. 100 is a schematic cross-sectional view showing other example of the three-terminal ferromagnetic tunnel element of the invention. The three-terminal TMR element of this example includes an antiferromagnetic layer 32 (30 nm), a half-metallic ferromagnetic layer 11 (30 nm), an insulating barrier layer 22 (2 nm), a ferromagnetic metal layer 42 (10 nm), an insulating barrier layer 21 (1 nm), a ferromagnetic metal layer 41 (5 nm), and an antiferromagnetic layer 31 (12 nm) laminated in this order on a substrate. An electrode terminal is formed in each of the half-metallic ferromagnetic layer 11 and the ferromagnetic metal layer 41 to form an electric closed-circuit between the layers 11 and 41 (a bias voltage applied by this closed-circuit is defined as $V_1$) while an electrode terminal is formed in each of the half-metallic ferromagnetic layer 11 and the ferromagnetic metal layer 42 to form an electric closed-circuit between the layers 11 and 42 (a bias voltage applied by this closed-circuit is defined as $V_2$). This element was produced by sputtering or deposition technique, and photolithography. Arrows in the figure represent directions of currents provided to the element, which may be vice versa as long as the relative relationship of the directions remains the same. In this example, the bias voltage $V_2$ may be applied between the ferromagnetic metal layers 41 and 42.

Hereinafter, materials used for the respective layers of the above-described three-terminal TMR element will be described. The insulating barrier layers 21 and 22 are made of $SrTiO_3$, but they may also be made of MgO, $HfO_2$, TaO, NbO, MoO, $TiO_2$ or $Al_2O_3$. The ferromagnetic metal layers 41 and 42 are made of CoFe alloy, but they may also be made of Co or NiFe. The half-metallic ferromagnetic layer 11 is made from a half-metallic ferromagnet with a very high degree of spin-polarization including $Fe_3O_4$, $CrO_2$, $La_{0.7}Sr_{0.3}MnO_3$, $Sr_2FeMoO_6$ and Mn compounds such as MnSb. The antiferromagnetic layer 32 is made of NiO.

Figure 101A:
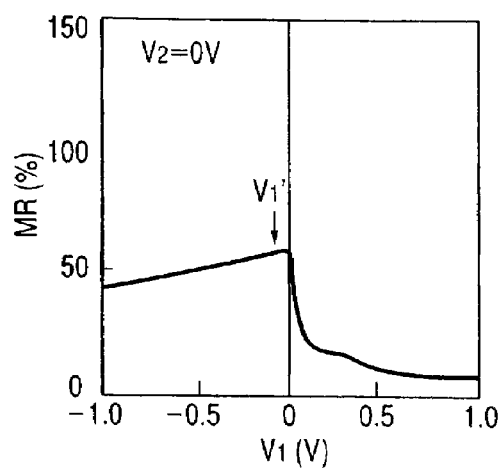
FIGS. 101A and 101B are graphs where
Figure 101B:
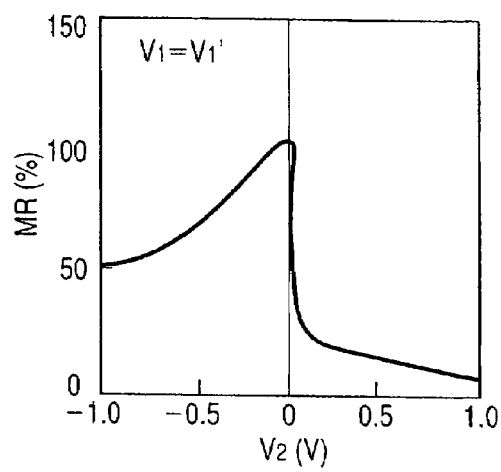

FIG. 101A shows an applied bias voltage $V_1$ dependency of the TMR ratio of the three-terminal TMR element shown in FIG. 100 under $V_2=0$. FIG. 101B shows an applied bias voltage $V_2$ dependency of the TMR ratio of the three-terminal TMR element under $V_1=V_1'$. Here, $V_1'$ is a value of the bias voltage where the highest TMR ratio is obtained in FIG. 101A. This example also has the same effect as that described with reference to FIGS. 2A and 2B. Although the increase in the magnetoresistive ratio is significant at about 0 V due to the arrangement of the material as the ferromagnetic layer, there is no problem.

Figure 102:
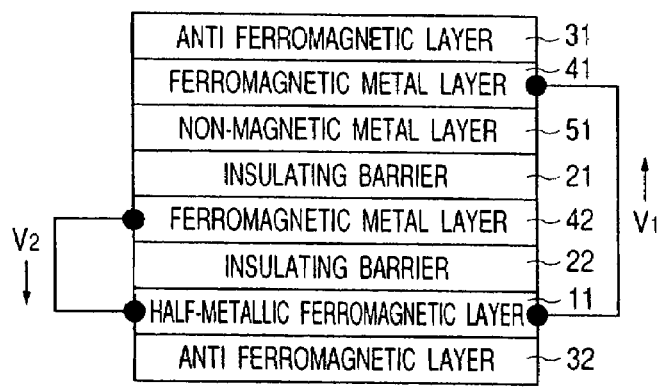
FIG. 102 is a schematic cross-sectional view showing other example of a three-terminal ferromagnetic tunnel element of the invention.

FIG. 102 is a schematic cross-sectional view showing other exemplary three-terminal TMR element of the invention. The element of this example has the same structure as that shown in FIG. 100 except that a non-magnetic metal layer 51 is formed between the ferromagnetic metal layer 41 and the insulating barrier layer 21. By arranging the non-magnetic metal layer to be adjacent to the ferromagnetic metal layer, the effects described with reference to FIG. 6 can be realized. In the following examples, non-magnetic metal layers are arranged adjacent to ferromagnetic metal layers for the same reason. The non-magnetic metal layer 51 may be selected from Au, Cu, Cr, Zn, Ga, Nb, Mo, Ru, Pd, Ag, Hf, Ta, W, Pt and Bi. The element had the same TMR characteristics as those shown in FIGS. 101A and 101B.

Figure 103:
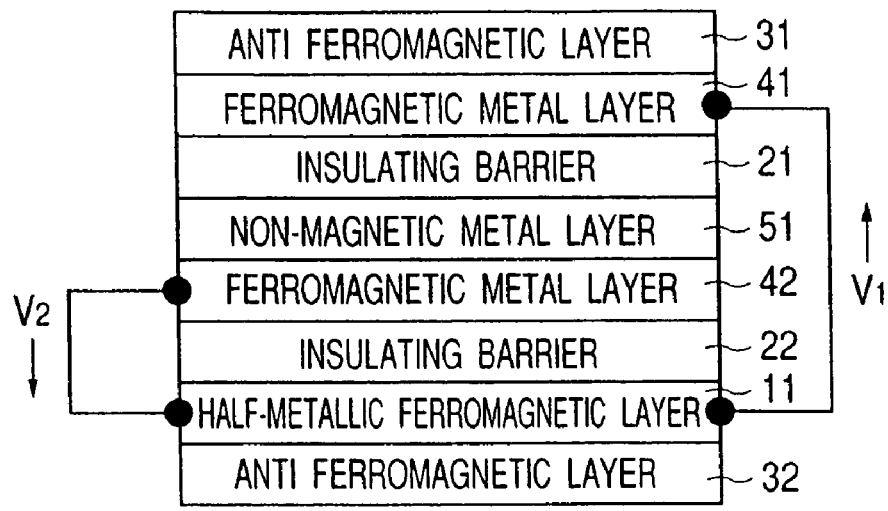
FIG. 103 is a schematic cross-sectional view showing other example of a three-terminal ferromagnetic tunnel element of the invention.

FIG. 103 is a schematic cross-sectional view showing other exemplary three-terminal TMR element of the invention. The element of this example has the same structure as that shown in FIG. 100 except that a non-magnetic metal layer 51 is formed between the ferromagnetic metal layer 42 and the insulating barrier layer 21. The element had the same TMR characteristics as those shown in FIGS. 101A and 101B.

Figure 104:
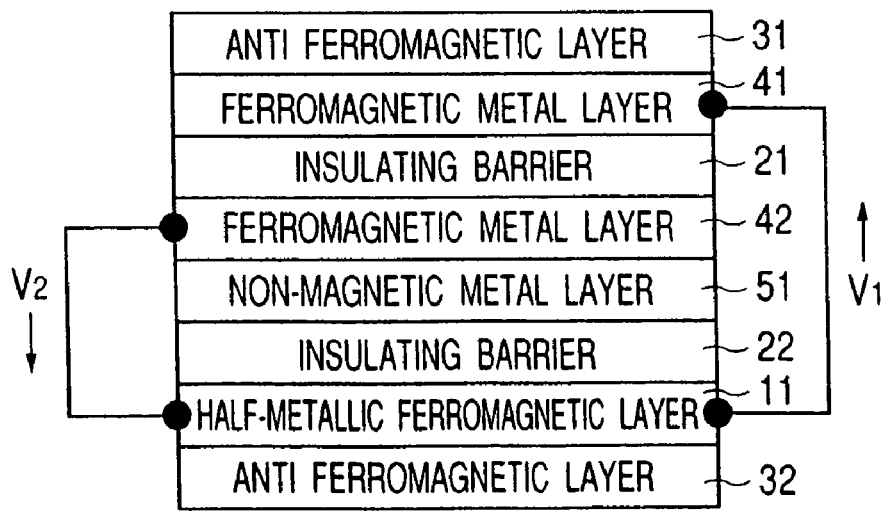
FIG. 104 is a schematic cross-sectional view showing other example of a three-terminal ferromagnetic tunnel element of the invention.

FIG. 104 is a schematic cross-sectional view showing other exemplary three-terminal TMR element of the invention. The element of this example has the same structure as that shown in FIG. 100 except that a non-magnetic metal layer 51 is formed between the ferromagnetic metal layer 42 and the insulating barrier layer 22. The element had the same TMR characteristics as those shown in FIGS. 101A and 101B.

Figure 105:
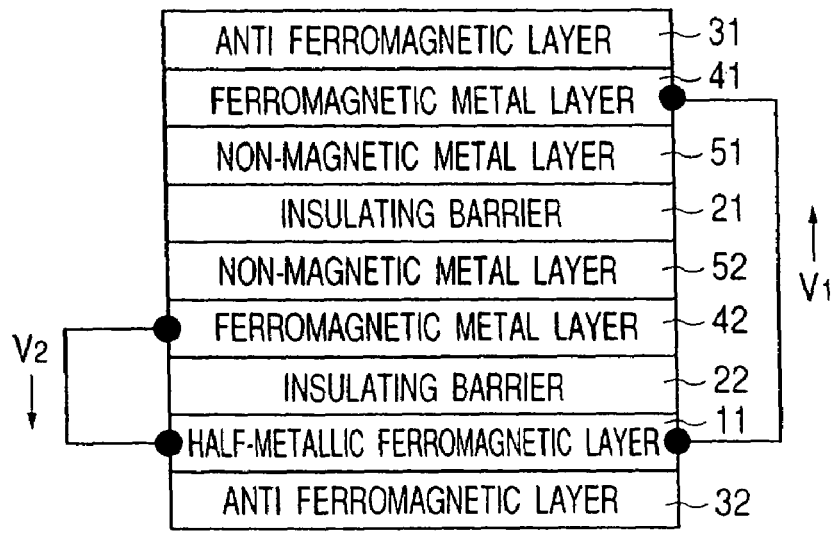
FIG. 105 is a schematic cross-sectional view showing other example of a three-terminal ferromagnetic tunnel element of the invention.

FIG. 105 is a schematic cross-sectional view showing other exemplary three-terminal TMR element of the invention. The element of this example has the same structure as that shown in FIG. 100 except that a non-magnetic metal layer 51 is formed between the ferromagnetic metal layer 41 and the insulating barrier layer 21, and a non-magnetic metal layer 52 is formed between the ferromagnetic metal layer 42 and the insulating barrier layer 21. The non-magnetic metal layers 51 and 52 may be selected from Au, Cu, Cr, Zn, Ga, Nb, Mo, Ru, Pd, Ag, Hf, Ta, W, Pt and Bi. The element had the same TMR characteristics as those shown in FIGS. 101A and 101B.

Figure 106:
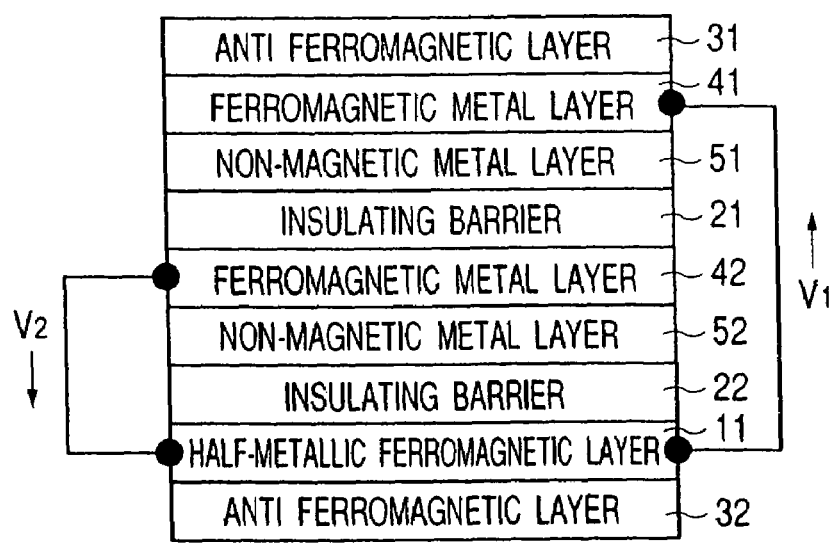
FIG. 106 is a schematic cross-sectional view showing other example of a three-terminal ferromagnetic tunnel element of the invention.

FIG. 106 is a schematic cross-sectional view showing other exemplary three-terminal TMR element of the invention. The element of this example has the same structure as that shown in FIG. 100 except that a non-magnetic metal layer 51 is formed between the ferromagnetic metal layer 41 and the insulating barrier layer 21, and a non-magnetic metal layer 52 is formed between the ferromagnetic metal layer 42 and the insulating barrier layer 22. The element had the same TMR characteristics as those shown in FIGS. 101A and 101B.

Figure 107:
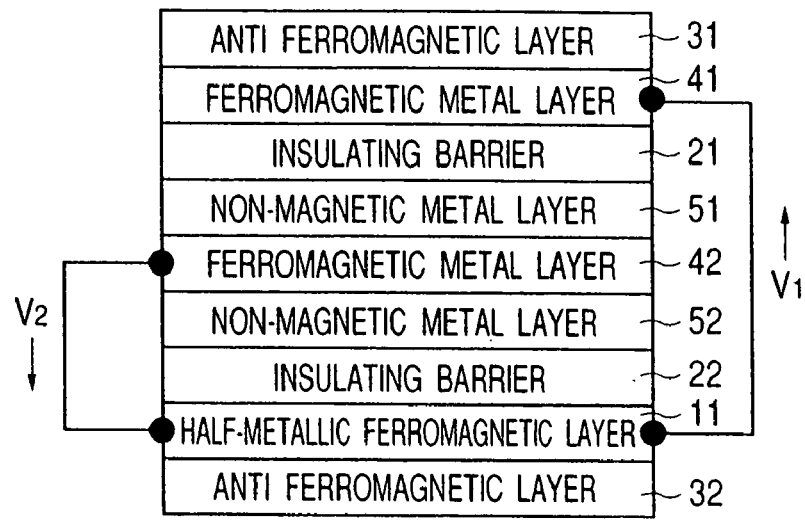
FIG. 107 is a schematic cross-sectional view showing other example of a three-terminal ferromagnetic tunnel element of the invention.

FIG. 107 is a schematic cross-sectional view showing other exemplary three-terminal TMR element of the invention. The element of this example has the same structure as that shown in FIG. 100 except that a non-magnetic metal layer 51 is formed between the ferromagnetic metal layer 42 and the insulating barrier layer 21, and a non-magnetic metal layer 52 is formed between the ferromagnetic metal layer 42 and the insulating barrier layer 22. The element had the same TMR characteristics as those shown in FIGS. 101A and 101B.

Figure 108:
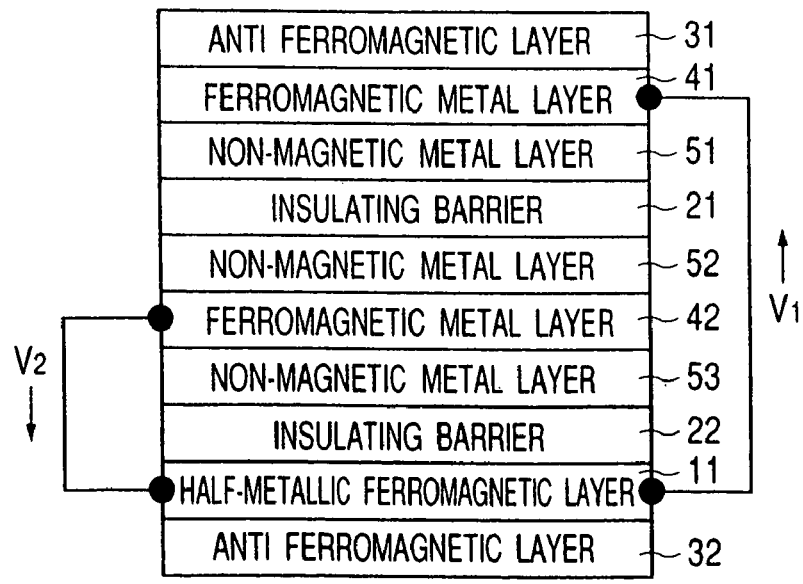
FIG. 108 is a schematic cross-sectional view showing other example of a three-terminal ferromagnetic tunnel element of the invention.

FIG. 108 is a schematic cross-sectional view showing other exemplary three-terminal TMR element of the invention. The element of this example has the same structure as that shown in FIG. 100 except that a non-magnetic metal layer 51 is formed between the ferromagnetic metal layer 41 and the insulating barrier layer 21, a non-magnetic metal layer 52 is formed between the ferromagnetic metal layer 42 and the insulating barrier layer 21, and a non-magnetic metal layer 53 is formed between the ferromagnetic metal layer 42 and the insulating barrier layer 22. Similar to the non-magnetic metal layer 51, the non-magnetic metal layer 53 may be any one of Au, Cu, Cr, Zn, Ga, Nb, Mo, Ru, Pd, Ag, Hf, Ta, W, Pt and Bi. The element had the same TMR characteristics as those shown in FIGS. 101A and 101B.

Figure 109:
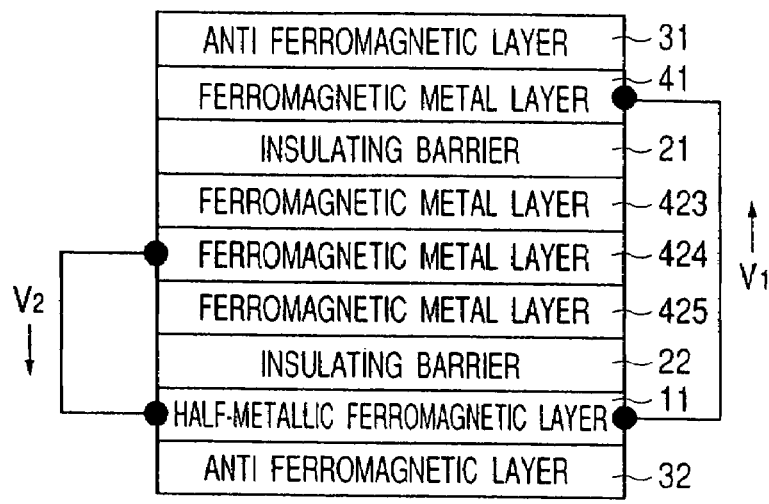
FIG. 109 is a schematic cross-sectional view showing other example of a three-terminal ferromagnetic tunnel element of the invention.

FIG. 109 is a schematic cross-sectional view showing other exemplary three-terminal TMR element of the invention. The element of this example has the same structure as that shown in FIG. 100 except that the ferromagnetic metal layer 42 is replaced with a tri-layered film made from ferromagnetic metal layers 423, 424 and 425. This structure eases the magnetization rotation of the ferromagnetic metal layers 423, 424 and 425. In the following examples, the ferromagnetic metal layer 42 is also replaced with the tri-layered film for the same reason. The ferromagnetic metal layers 423 and 425 are made of a Co-based alloy while the ferromagnetic metal layer 424 is made of a Ni-based alloy. The element of the present example had the same TMR characteristics as those shown in FIGS. 101A and 101B.

Figure 110:
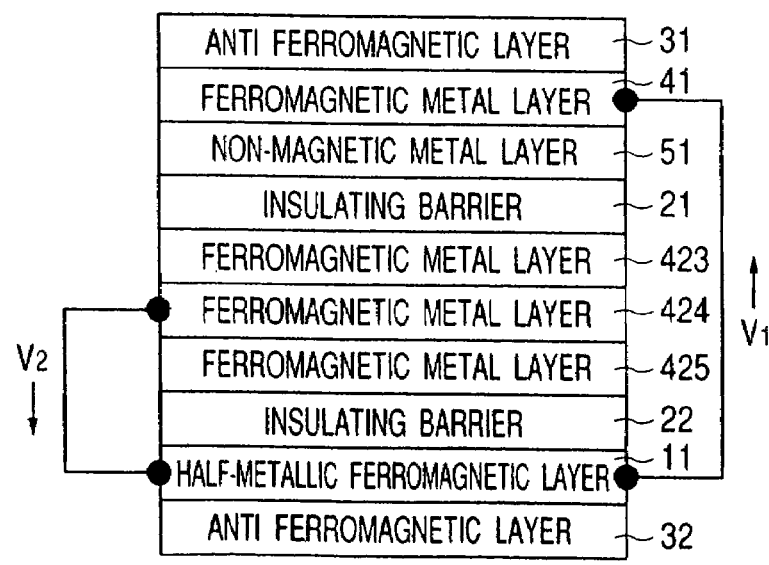
FIG. 110 is a schematic cross-sectional view showing other example of a three-terminal ferromagnetic tunnel element of the invention.

FIG. 110 is a schematic cross-sectional view showing another exemplary three-terminal TMR element of the invention. The element of this example has the same structure as that shown in FIG. 102 except that the ferromagnetic metal layer 42 is replaced with a tri-layered film made from ferromagnetic metal layers 423, 424 and 425. The element of the present example had the same TMR characteristics as those shown in FIGS. 101A and 101B.

Figure 111:
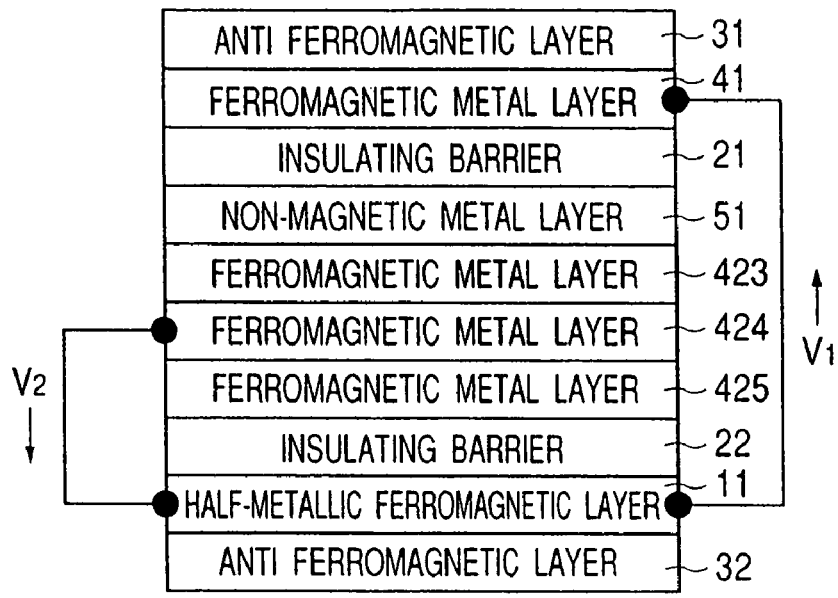
FIG. 111 is a schematic cross-sectional view showing other example of a three-terminal ferromagnetic tunnel element of the invention.

FIG. 111 is a schematic cross-sectional view showing another exemplary three-terminal TMR element of the invention. The element of this example has the same structure as that shown in FIG. 103 except that the ferromagnetic metal layer 42 is replaced with a tri-layered film made from ferromagnetic metal layers 423, 424 and 425. The element of the present example had the same TMR characteristics as those shown in FIGS. 101A and 101B.

Figure 112:
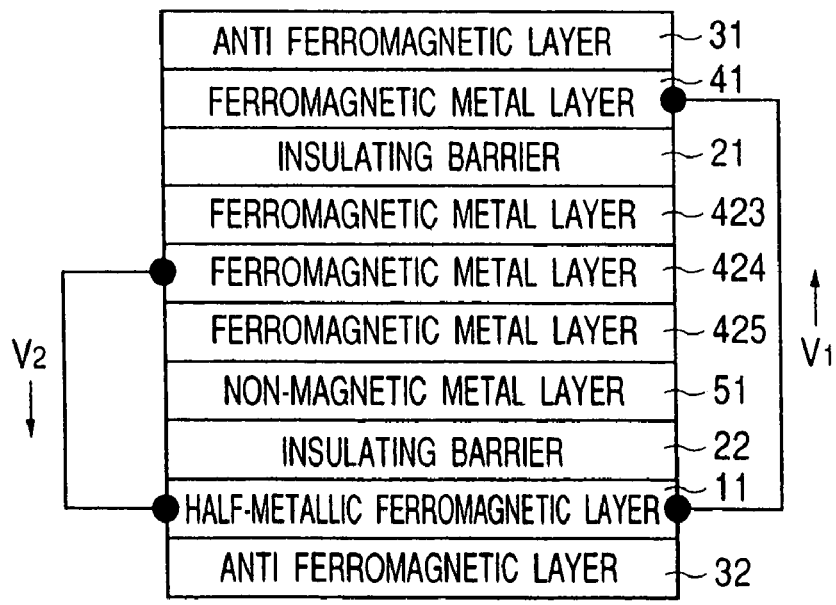
FIG. 112 is a schematic cross-sectional view showing other example of a three-terminal ferromagnetic tunnel element of the invention.

FIG. 112 is a schematic cross-sectional view showing another exemplary three-terminal TMR element of the invention. The element of this example has the same structure as that shown in FIG. 104 except that the ferromagnetic metal layer 42 is replaced with a tri-layered film made from ferromagnetic metal layers 423, 424 and 425. The element of the present example had the same TMR characteristics as those shown in FIGS. 101A and 101B.

Figure 113:
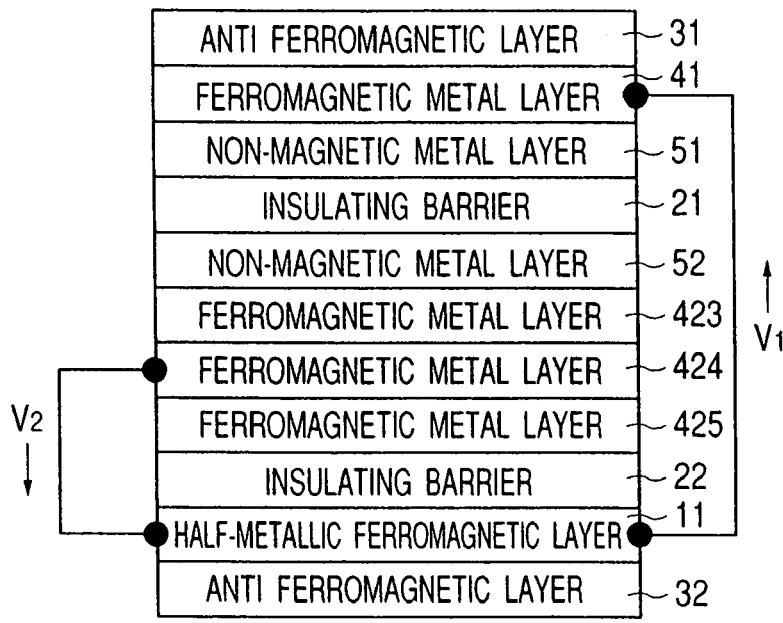
FIG. 113 is a schematic cross-sectional view showing other example of a three-terminal ferromagnetic tunnel element of the invention.

FIG. 113 is a schematic cross-sectional view showing another exemplary three-terminal TMR element of the invention. The element of this example has the same structure as that shown in FIG. 105 except that the ferromagnetic metal layer 42 is replaced with a tri-layered film made from ferromagnetic metal layers 423, 424 and 425. The element of the present example had the same TMR characteristics as those shown in FIGS. 101A and 101B.

Figure 114:
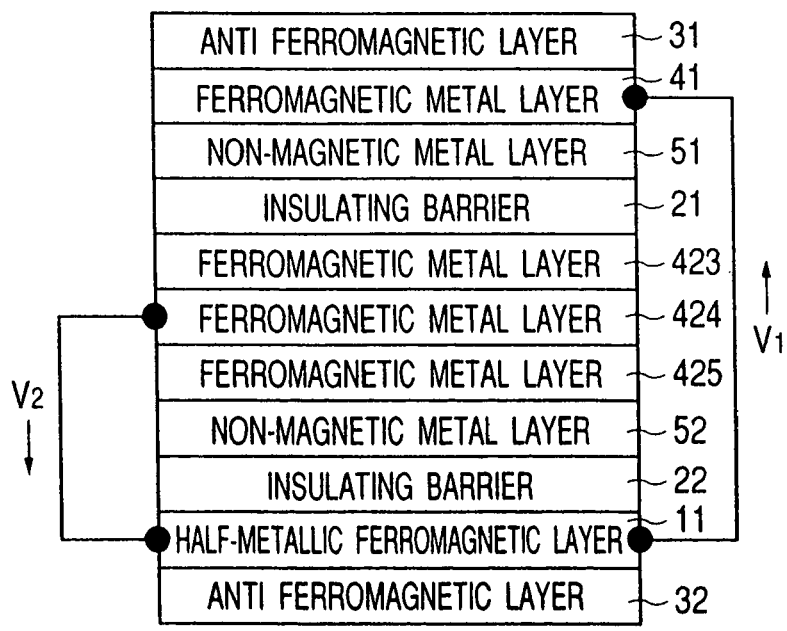
FIG. 114 is a schematic cross-sectional view showing other example of a three-terminal ferromagnetic tunnel element of the invention.

FIG. 114 is a schematic cross-sectional view showing another exemplary three-terminal TMR element of the invention. The element of this example has the same structure as that shown in FIG. 106 except that the ferromagnetic metal layer 42 is replaced with a tri-layered film made from ferromagnetic metal layers 423, 424 and 425. The element of the present example had the same TMR characteristics as those shown in FIGS. 101A and 101B.

Figure 115:
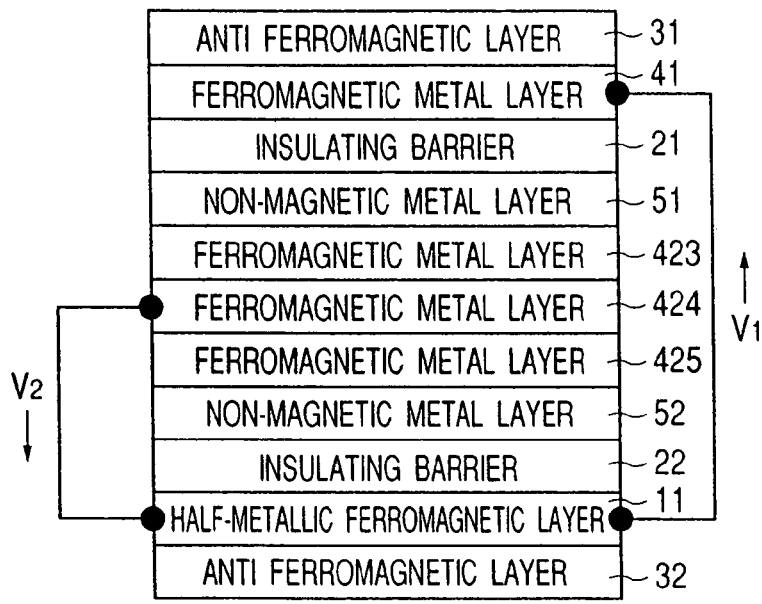
FIG. 115 is a schematic cross-sectional view showing other example of a three-terminal ferromagnetic tunnel element of the invention.

FIG. 115 is a schematic cross-sectional view showing another exemplary three-terminal TMR element of the invention. The element of this example has the same structure as that shown in FIG. 107 except that the ferromagnetic metal layer 42 is replaced with a tri-layered film made from ferromagnetic metal layers 423, 424 and 425. The element of the present example had the same TMR characteristics as those shown in FIGS. 101A and 101B.

Figure 116:
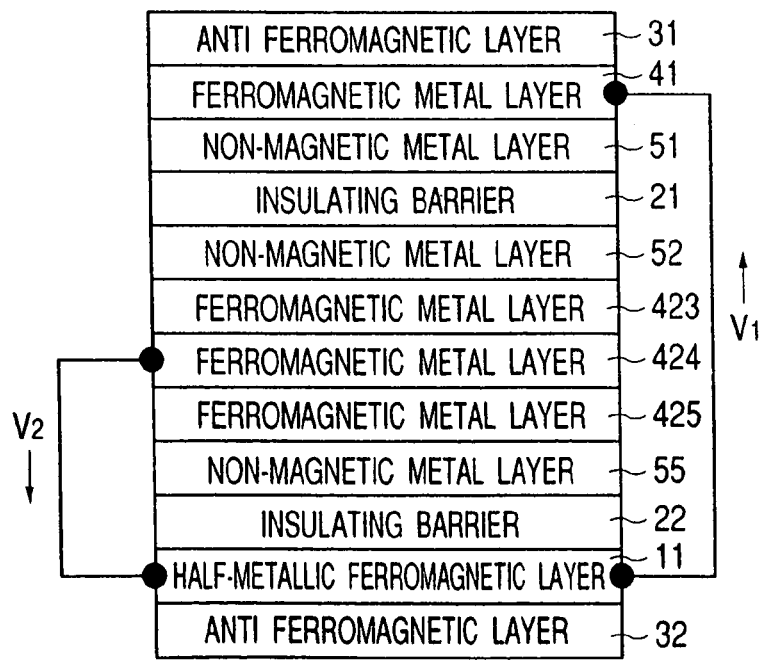
FIG. 116 is a schematic cross-sectional view showing other example of a three-terminal ferromagnetic tunnel element of the invention.

FIG. 116 is a schematic cross-sectional view showing another exemplary three-terminal TMR element of the invention. The element of this example has the same structure as that shown in FIG. 108 except that the ferromagnetic metal layer 42 is replaced with a tri-layered film made from ferromagnetic metal layers 423, 424 and 425. The element of the present example had the same TMR characteristics as those shown in FIGS. 101A and 101B.

Figure 117:
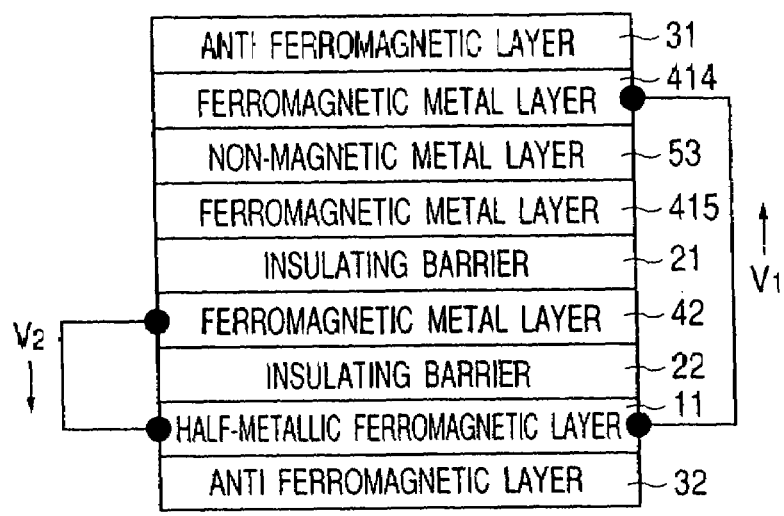
FIG. 117 is a schematic cross-sectional view showing other example of a three-terminal ferromagnetic tunnel element of the invention.

FIG. 117 is a schematic cross-sectional view showing another exemplary three-terminal TMR element of the invention. The element of this example has the same structure as that shown in FIG. 100 except that the ferromagnetic metal layer 41 is replaced with a tri-layered film made from a ferromagnetic metal layer 414, a non-magnetic metal layer 53 and a ferromagnetic metal layer 415. The ferromagnetic metal layers 414 and 415 are made of a Co-based alloy. The non-magnetic metal layer 53 is made of either Ru or Cu. The element of the present example had the same TMR characteristics as those shown in FIGS. 101A and 101B.

Figure 118:
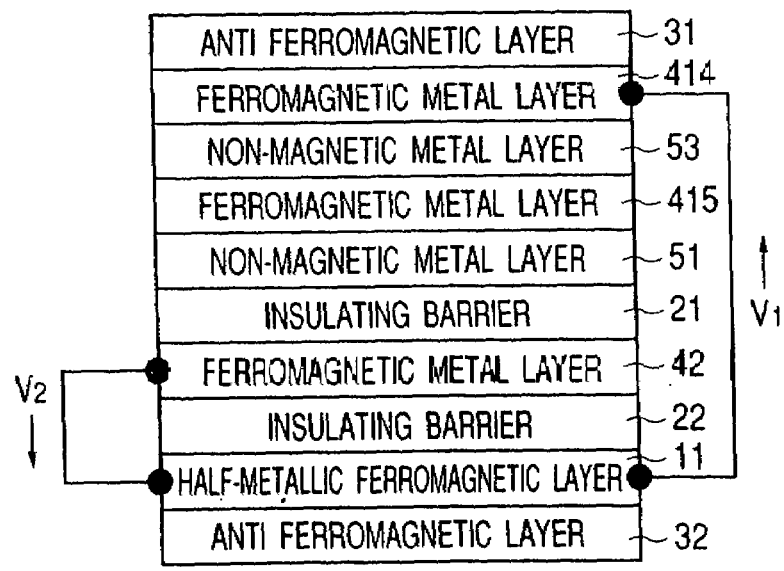
FIG. 118 is a schematic cross-sectional view showing other example of a three-terminal ferromagnetic tunnel element of the invention.

FIG. 118 is a schematic cross-sectional view showing another exemplary three-terminal TMR element of the invention. The element of this example has the same structure as that shown in FIG. 102 except that the ferromagnetic metal layer 41 is replaced with a tri-layered film made from a ferromagnetic metal layer 414, a non-magnetic metal layer 53 and a ferromagnetic metal layer 415. The element of the present example had the same TMR characteristics as those shown in FIGS. 101A and 101B.

Figure 119:
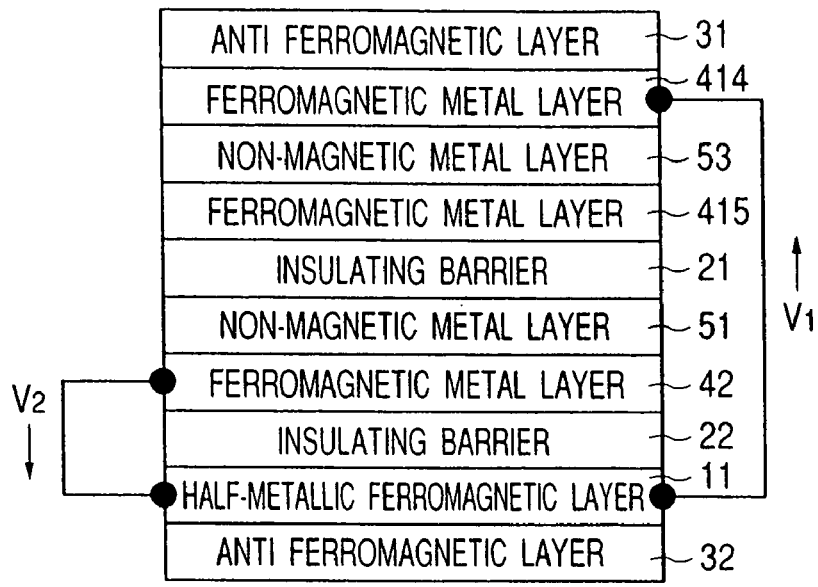
FIG. 119 is a schematic cross-sectional view showing other example of a three-terminal ferromagnetic tunnel element of the invention.

FIG. 119 is a schematic cross-sectional view showing another exemplary three-terminal TMR element of the invention. The element of this example has the same structure as that shown in FIG. 103 except that the ferromagnetic metal layer 41 is replaced with a tri-layered film made from a ferromagnetic metal layer 414, a non-magnetic metal layer 53 and a ferromagnetic metal layer 415. The element of the present example had the same TMR characteristics as those shown in FIGS. 101A and 101B.

Figure 120:
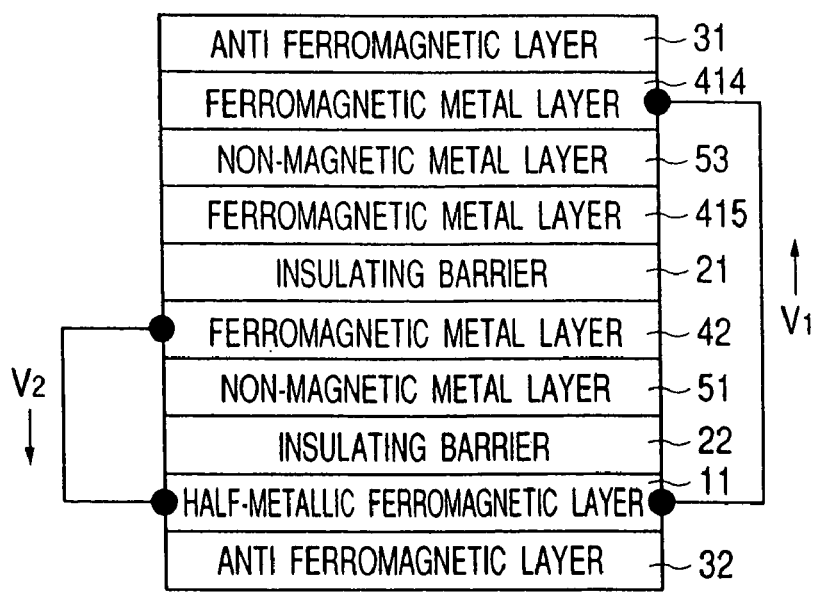

FIG. 120 is a schematic cross-sectional view showing another exemplary three-terminal TMR element of the invention. The element of this example has the same structure as that shown in FIG. 104 except that the ferromagnetic metal layer 41 is replaced with a tri-layered film made from a ferromagnetic metal layer 414, a non-magnetic metal layer 53 and a ferromagnetic metal layer 415. The element of the present example had the same TMR characteristics as those shown in FIGS. 101A and 101B.

Figure 121:
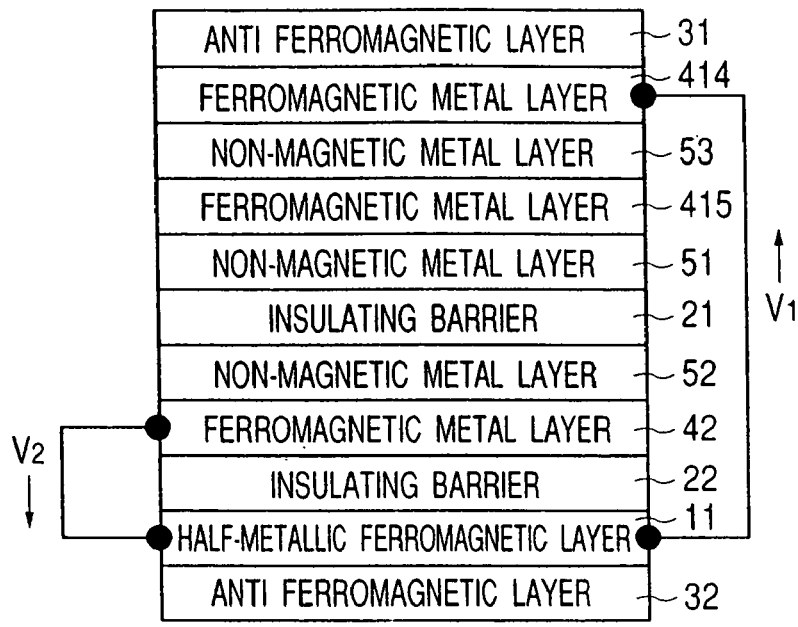

FIG. 121 is a schematic cross-sectional view showing another exemplary three-terminal TMR element of the invention. The element of this example has the same structure as that shown in FIG. 105 except that the ferromagnetic metal layer 41 is replaced with a tri-layered film made from a ferromagnetic metal layer 414, a non-magnetic metal layer 53 and a ferromagnetic metal layer 415. The element of the present example had the same TMR characteristics as those shown in FIGS. 101A and 101B.

Figure 122:
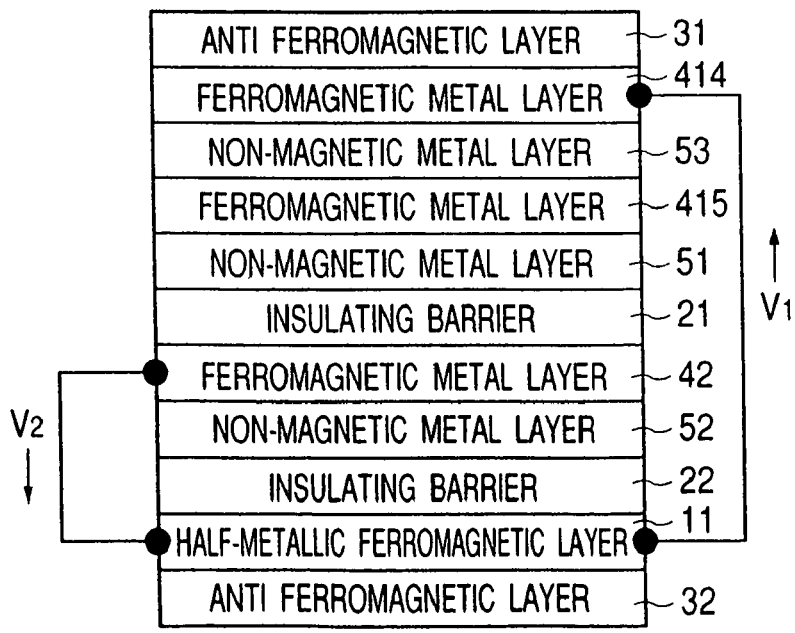

FIG. 122 is a schematic cross-sectional view showing another exemplary three-terminal TMR element of the invention. The element of this example has the same structure as that shown in FIG. 106 except that the ferromagnetic metal layer 41 is replaced with a tri-layered film made from a ferromagnetic metal layer 414, a non-magnetic metal layer 53 and a ferromagnetic metal layer 415. The element of the present example had the same TMR characteristics as those shown in FIGS. 101A and 101B.

Figure 123:
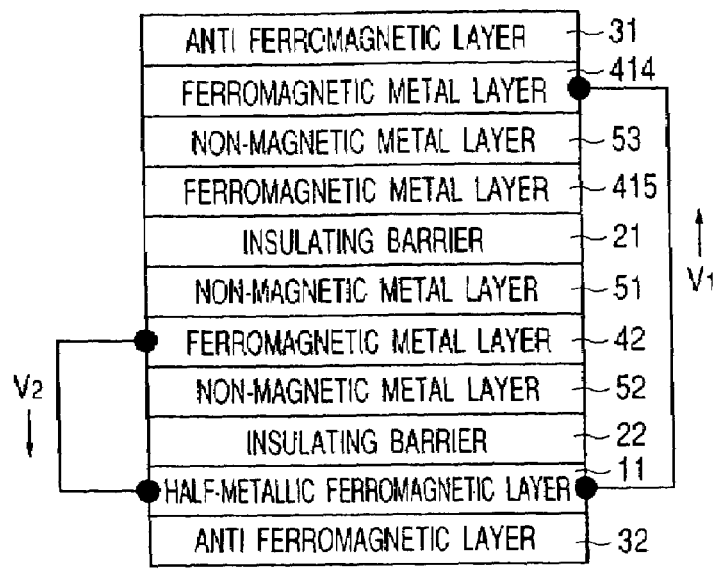

FIG. 123 is a schematic cross-sectional view showing another exemplary three-terminal TMR element of the invention. The element of this example has the same structure as that shown in FIG. 107 except that the ferromagnetic metal layer 41 is replaced with a tri-layered film made from a ferromagnetic metal layer 414, a non-magnetic metal layer 53 and a ferromagnetic metal layer 415. The element of the present example had the same TMR characteristics as those shown in FIGS. 101A and 101B.

Figure 124:
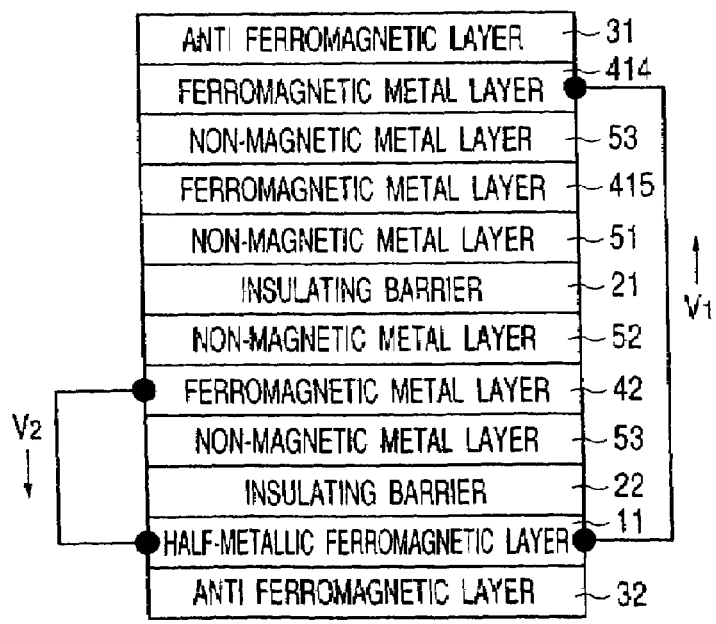

FIG. 124 is a schematic cross-sectional view showing another exemplary three-terminal TMR element of the invention. The element of this example has the same structure as that shown in FIG. 108 except that the ferromagnetic metal layer 41 is replaced with a tri-layered film made from a ferromagnetic metal layer 414, a non-magnetic metal layer 53 and a ferromagnetic metal layer 415. The element of the present example had the same TMR characteristics as those shown in FIGS. 101A and 101B.

Figure 125:
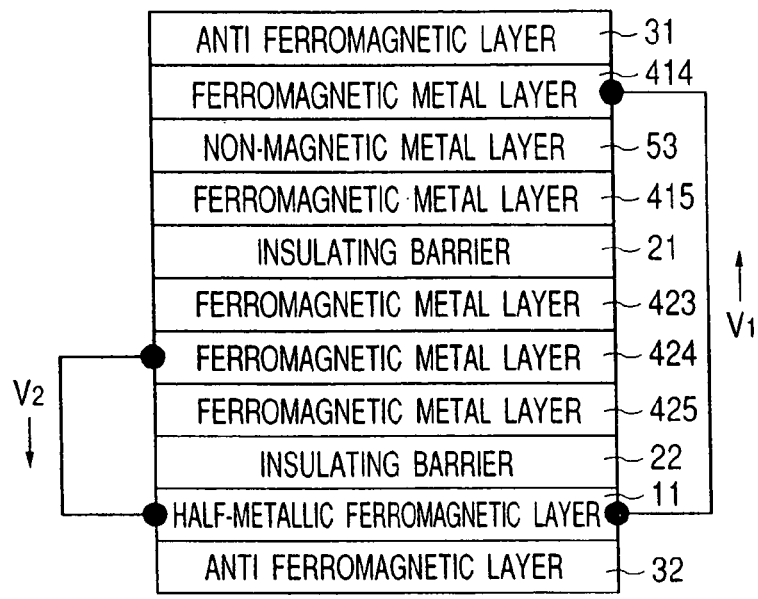

FIG. 125 is a schematic cross-sectional view showing another exemplary three-terminal TMR element of the invention. The element of this example has the same structure as that shown in FIG. 109 except that the ferromagnetic metal layer 41 is replaced with a tri-layered film made from a ferromagnetic metal layer 414, a non-magnetic metal layer 53 and a ferromagnetic metal layer 415. The element of the present example had the same TMR characteristics as those shown in FIGS. 101A and 101B.

Figure 126:
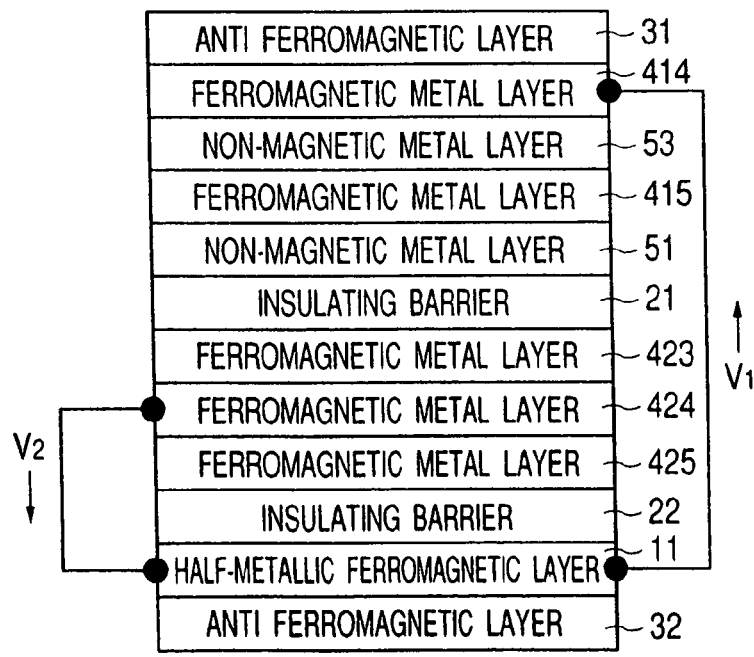

FIG. 126 is a schematic cross-sectional view showing another exemplary three-terminal TMR element of the invention. The element of this example has the same structure as that shown in FIG. 110 except that the ferromagnetic metal layer 41 is replaced with a tri-layered film made from a ferromagnetic metal layer 414, a non-magnetic metal layer 53 and a ferromagnetic metal layer 415. The element of the present example had the same TMR characteristics as those shown in FIGS. 101A and 101B.

Figure 127:
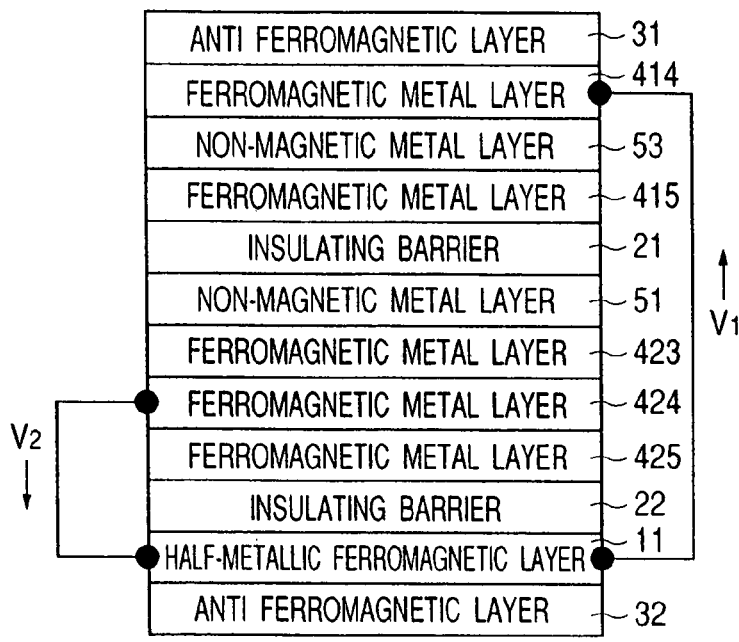

FIG. 127 is a schematic cross-sectional view showing another exemplary three-terminal TMR element of the invention. The element of this example has the same structure as that shown in FIG. 111 except that the ferromagnetic metal layer 41 is replaced with a tri-layered film made from a ferromagnetic metal layer 414, a non-magnetic metal layer 53 and a ferromagnetic metal layer 415. The element of the present example had the same TMR characteristics as those shown in FIGS. 101A and 101B.

Figure 128:
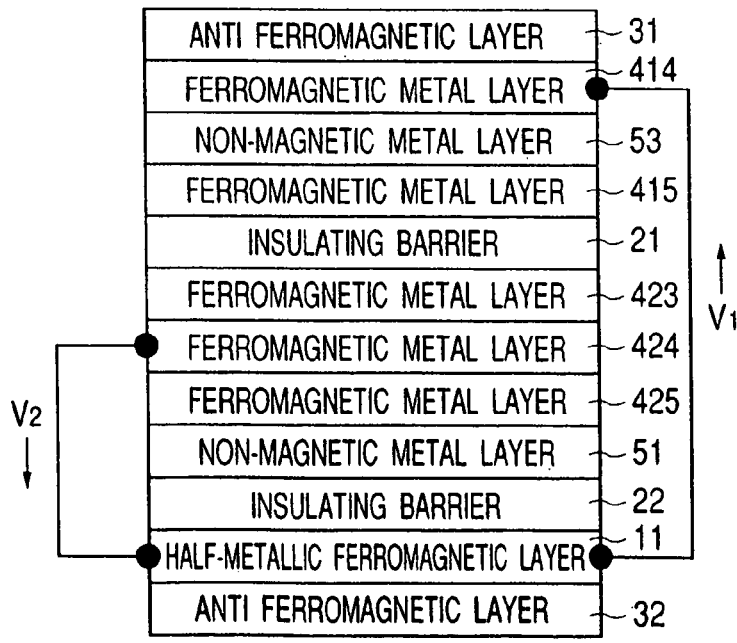

FIG. 128 is a schematic cross-sectional view showing another exemplary three-terminal TMR element of the invention. The element of this example has the same structure as that shown in FIG. 112 except that the ferromagnetic metal layer 41 is replaced with a tri-layered film made from a ferromagnetic metal layer 414, a non-magnetic metal layer 53 and a ferromagnetic metal layer 415. The element of the present example had the same TMR characteristics as those shown in FIGS. 101A and 101B.

Figure 129:
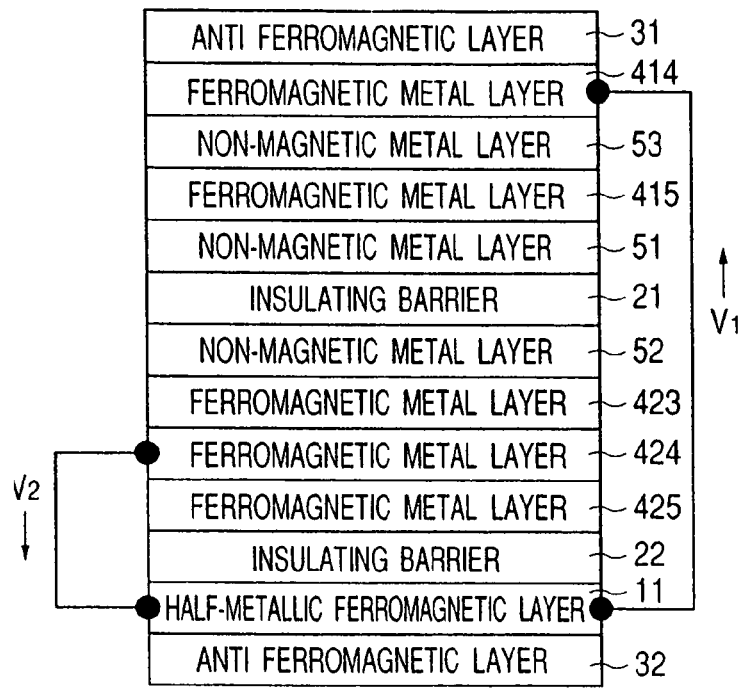

FIG. 129 is a schematic cross-sectional view showing another exemplary three-terminal TMR element of the invention. The element of this example has the same structure as that shown in FIG. 113 except that the ferromagnetic metal layer 41 is replaced with a tri-layered film made from a ferromagnetic metal layer 414, a non-magnetic metal layer 53 and a ferromagnetic metal layer 415. The element of the present example had the same TMR characteristics as those shown in FIGS. 101A and 101B.

Figure 130:
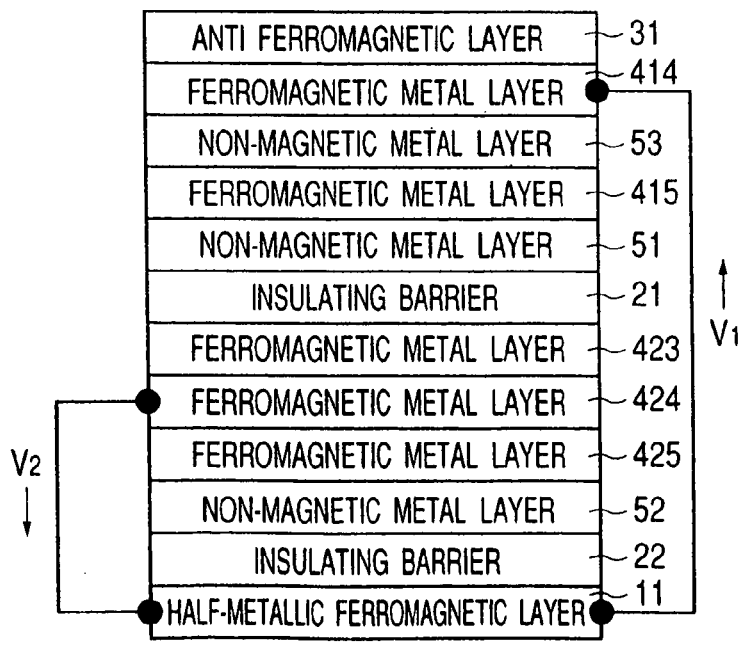

FIG. 130 is a schematic cross-sectional view showing another exemplary three-terminal TMR element of the invention. The element of this example has the same structure as that shown in FIG. 114 except that the ferromagnetic metal layer 41 is replaced with a tri-layered film made from a ferromagnetic metal layer 414, a non-magnetic metal layer 53 and a ferromagnetic metal layer 415. The element of the present example had the same TMR characteristics as those shown in FIGS. 101A and 101B.

Figure 131:
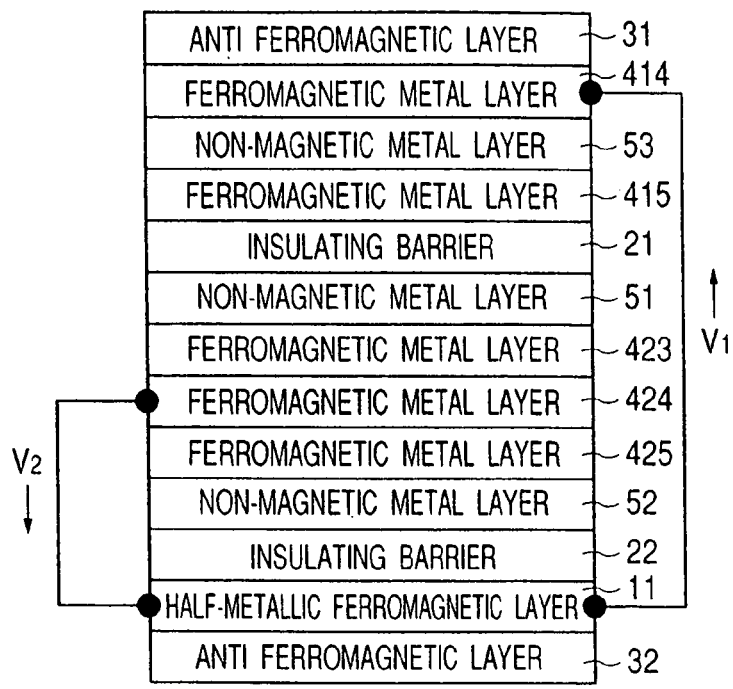

FIG. 131 is a schematic cross-sectional view showing another exemplary three-terminal TMR element of the invention. The element of this example has the same structure as that shown in FIG. 115 except that the ferromagnetic metal layer 41 is replaced with a tri-layered film made from a ferromagnetic metal layer 414, a non-magnetic metal layer 53 and a ferromagnetic metal layer 415. The element of the present example had the same TMR characteristics as those shown in FIGS. 101A and 101B.

FIG. 132 is a schematic cross-sectional view showing another exemplary three-terminal TMR element of the invention. The element of this example has the same structure as that shown in FIG. 116 except that the ferromagnetic metal layer 41 is replaced with a tri-layered film made from a ferromagnetic metal layer 414, a non-magnetic metal layer 53 and a ferromagnetic metal layer 415. The element of the present example had the same TMR characteristics as those shown in FIGS. 101A and 101B.

FIG. 133 is a schematic cross-sectional view showing other exemplary three-terminal TMR element of the invention. The element of this example has the same structure as that shown in FIG. 100 without the antiferromagnetic layers 31 and 32. The element had the same TMR characteristics as those shown in FIGS. 101A and 101B. This structure allows an application of a soft magnetic half-metallic ferromagnetic layer. In some of the following examples, the antiferromagnetic layers are not provided for this reason.

FIG. 134 is a schematic cross-sectional view showing other exemplary three-terminal TMR element of the invention. The element of this example has the same structure as that shown in FIG. 102 without the antiferromagnetic layers 31 and 32. The element had the same TMR characteristics as those shown in FIGS. 101A and 101B.

FIG. 135 is a schematic cross-sectional view showing other exemplary three-terminal TMR element of the invention. The element of this example has the same structure as that shown in FIG. 103 without the antiferromagnetic layers 31 and 32. The element had the same TMR characteristics as those shown in FIGS. 101A and 101B.

FIG. 136 is a schematic cross-sectional view showing other exemplary three-terminal TMR element of the invention. The element of this example has the same structure as that shown in FIG. 104 without the antiferromagnetic layers 31 and 32. The element had the same TMR characteristics as those shown in FIGS. 101A and 101B.

FIG. 137 is a schematic cross-sectional view showing other exemplary three-terminal TMR element of the invention. The element of this example has the same structure as that shown in FIG. 105 without the antiferromagnetic layers 31 and 32. The element had the same TMR characteristics as those shown in FIGS. 101A and 101B.

FIG. 138 is a schematic cross-sectional view showing other exemplary three-terminal TMR element of the invention. The element of this example has the same structure as that shown in FIG. 106 without the antiferromagnetic layers 31 and 32. The element had the same TMR characteristics as those shown in FIGS. 101A and 101B.

FIG. 139 is a schematic cross-sectional view showing other exemplary three-terminal TMR element of the invention. The element of this example has the same structure as that shown in FIG. 107 without the antiferromagnetic layers 31 and 32. The element had the same TMR characteristics as those shown in FIGS. 101A and 101B.

FIG. 140 is a schematic cross-sectional view showing other exemplary three-terminal TMR element of the invention. The element of this example has the same structure as that shown in FIG. 108 without the antiferromagnetic layers 31 and 32. The element had the same TMR characteristics as those shown in FIGS. 101A and 101B.

FIG. 141 is a schematic cross-sectional view showing other exemplary three-terminal TMR element of the invention. The element of this example has the same structure as that shown in FIG. 109 without the antiferromagnetic layers 31 and 32. The element had the same TMR characteristics as those shown in FIGS. 101A and 101B.

FIG. 142 is a schematic cross-sectional view showing other exemplary three-terminal TMR element of the invention. The element of this example has the same structure as that shown in FIG. 110 without the antiferromagnetic layers 31 and 32. The element had the same TMR characteristics as those shown in FIGS. 101A and 101B.

FIG. 143 is a schematic cross-sectional view showing other exemplary three-terminal TMR element of the invention. The element of this example has the same structure as that shown in FIG. 111 without the antiferromagnetic layers 31 and 32. The element had the same TMR characteristics as those shown in FIGS. 101A and 101B.

FIG. 144 is a schematic cross-sectional view showing other exemplary three-terminal TMR element of the invention. The element of this example has the same structure as that shown in FIG. 112 without the antiferromagnetic layers 31 and 32. The element had the same TMR characteristics as those shown in FIGS. 101A and 101B.

FIG. 145 is a schematic cross-sectional view showing other exemplary three-terminal TMR element of the invention. The element of this example has the same structure as that shown in FIG. 113 without the antiferromagnetic layers 31 and 32. The element had the same TMR characteristics as those shown in FIGS. 101A and 101B.

FIG. 146 is a schematic cross-sectional view showing other exemplary three-terminal TMR element of the invention. The element of this example has the same structure as that shown in FIG. 114 without the antiferromagnetic layers 31 and 32. The element had the same TMR characteristics as those shown in FIGS. 101A and 101B.

FIG. 147 is a schematic cross-sectional view showing other exemplary three-terminal TMR element of the invention. The element of this example has the same structure as that shown in FIG. 115 without the antiferromagnetic layers 31 and 32. The element had the same TMR characteristics as those shown in FIGS. 101A and 101B.

FIG. 148 is a schematic cross-sectional view showing other exemplary three-terminal TMR element of the invention. The element of this example has the same structure as that shown in FIG. 116 without the antiferromagnetic layers 31 and 32. The element had the same TMR characteristics as those shown in FIGS. 101A and 101B.

FIG. 149 is a schematic cross-sectional view showing other exemplary three-terminal TMR element of the invention. The element of this example has the same structure as that shown in FIG. 133 except that the ferromagnetic metal layer 41 is replaced with a double-layered film made from ferromagnetic metal layers 411 and 412. The ferromagnetic metal layer 411 is made of a Co-based alloy while the ferromagnetic metal layer 412 is made of a Ni-based alloy. The element of the present example had the same TMR characteristics as those shown in FIGS. 101A and 101B.

FIG. 150 is a schematic cross-sectional view showing other exemplary three-terminal TMR element of the invention. The element of this example has the same structure as that shown in FIG. 134 except that the ferromagnetic metal layer 41 is replaced with a double-layered film made from ferromagnetic metal layers 411 and 412. The element of the present example had the same TMR characteristics as those shown in FIGS. 101A and 101B.

FIG. 151 is a schematic cross-sectional view showing other exemplary three-terminal TMR element of the invention. The element of this example has the same structure as that shown in FIG. 135 except that the ferromagnetic metal layer 41 is replaced with a double-layered film made from ferromagnetic metal layers 411 and 412. The element of the present example had the same TMR characteristics as those shown in FIGS. 101A and 101B.

FIG. 152 is a schematic cross-sectional view showing other exemplary three-terminal TMR element of the invention. The element of this example has the same structure as that shown in FIG. 136 except that the ferromagnetic metal layer 41 is replaced with a double-layered film made from ferromagnetic metal layers 411 and 412. The element of the present example had the same TMR characteristics as those shown in FIGS. 101A and 101B.

FIG. 153 is a schematic cross-sectional view showing other exemplary three-terminal TMR element of the invention. The element of this example has the same structure as that shown in FIG. 137 except that the ferromagnetic metal layer 41 is replaced with a double-layered film made from ferromagnetic metal layers 411 and 412. The element of the present example had the same TMR characteristics as those shown in FIGS. 101A and 101B.

FIG. 154 is a schematic cross-sectional view showing other exemplary three-terminal TMR element of the invention. The element of this example has the same structure as that shown in FIG. 138 except that the ferromagnetic metal layer 41 is replaced with a double-layered film made from ferromagnetic metal layers 411 and 412. The element of the present example had the same TMR characteristics as those shown in FIGS. 101A and 101B.

FIG. 155 is a schematic cross-sectional view showing other exemplary three-terminal TMR element of the invention. The element of this example has the same structure as that shown in FIG. 139 except that the ferromagnetic metal layer 41 is replaced with a double-layered film made from ferromagnetic metal layers 411 and 412. The element of the present example had the same TMR characteristics as those shown in FIGS. 101A and 101B.

FIG. 156 is a schematic cross-sectional view showing other exemplary three-terminal TMR element of the invention. The element of this example has the same structure as that shown in FIG. 140 except that the ferromagnetic metal layer 41 is replaced with a double-layered film made from ferromagnetic metal layers 411 and 412. The element of the present example had the same TMR characteristics as those shown in FIGS. 101A and 101B.

FIG. 157 is a schematic cross-sectional view showing other exemplary three-terminal TMR element of the invention. The element of this example has the same structure as that shown in FIG. 141 except that the ferromagnetic metal layer 41 is replaced with a double-layered film made from ferromagnetic metal layers 411 and 412. The element of the present example had the same TMR characteristics as those shown in FIGS. 101A and 101B.

FIG. 158 is a schematic cross-sectional view showing other exemplary three-terminal TMR element of the invention. The element of this example has the same structure as that shown in FIG. 142 except that the ferromagnetic metal layer 41 is replaced with a double-layered film made from ferromagnetic metal layers 411 and 412. The element of the present example had the same TMR characteristics as those shown in FIGS. 101A and 101B.

FIG. 159 is a schematic cross-sectional view showing other exemplary three-terminal TMR element of the invention. The element of this example has the same structure as that shown in FIG. 143 except that the ferromagnetic metal layer 41 is replaced with a double-layered film made from ferromagnetic metal layers 411 and 412. The element of the present example had the same TMR characteristics as those shown in FIGS. 101A and 101B.

FIG. 160 is a schematic cross-sectional view showing other exemplary three-terminal TMR element of the invention. The element of this example has the same structure as that shown in FIG. 144 except that the ferromagnetic metal layer 41 is replaced with a double-layered film made from ferromagnetic metal layers 411 and 412. The element of the present example had the same TMR characteristics as those shown in FIGS. 101A and 101B.

FIG. 161 is a schematic cross-sectional view showing other exemplary three-terminal TMR element of the invention. The element of this example has the same structure as that shown in FIG. 145 except that the ferromagnetic metal layer 41 is replaced with a double-layered film made from ferromagnetic metal layers 411 and 412. The element of the present example had the same TMR characteristics as those shown in FIGS. 101A and 101B.

FIG. 162 is a schematic cross-sectional view showing other exemplary three-terminal TMR element of the invention. The element of this example has the same structure as that shown in FIG. 146 except that the ferromagnetic metal layer 41 is replaced with a double-layered film made from ferromagnetic metal layers 411 and 412. The element of the present example had the same TMR characteristics as those shown in FIGS. 101A and 101B.

FIG. 163 is a schematic cross-sectional view showing other exemplary three-terminal TMR element of the invention. The element of this example has the same structure as that shown in FIG. 147 except that the ferromagnetic metal layer 41 is replaced with a double-layered film made from ferromagnetic metal layers 411 and 412. The element of the present example had the same TMR characteristics as those shown in FIGS. 101A and 101B.

FIG. 164 is a schematic cross-sectional view showing other exemplary three-terminal TMR element of the invention. The element of this example has the same structure as that shown in FIG. 148 except that the ferromagnetic metal layer 41 is replaced with a double-layered film made from ferromagnetic metal layers 411 and 412. The element of the present example had the same TMR characteristics as those shown in FIGS. 101A and 101B.

FIG. 165 is a schematic cross-sectional view showing other exemplary three-terminal TMR element of the invention. The element of this example has the same structure as that shown in FIG. 100 without the antiferromagnetic layer 32. This structure allows an application of a soft magnetic half-metallic ferromagnetic layer. The element had the same TMR characteristics as those shown in FIGS. 101A and 101B.

FIG. 166 is a schematic cross-sectional view showing other exemplary three-terminal TMR element of the invention. The element of this example has the same structure as that shown in FIG. 102 without the antiferromagnetic layer 32. The element had the same TMR characteristics as those shown in FIGS. 101A and 101B.

FIG. 167 is a schematic cross-sectional view showing other exemplary three-terminal TMR element of the invention. The element of this example has the same structure as that shown in FIG. 103 without the antiferromagnetic layer 32. The element had the same TMR characteristics as those shown in FIGS. 101A and 101B.

FIG. 168 is a schematic cross-sectional view showing other exemplary three-terminal TMR element of the invention. The element of this example has the same structure as that shown in FIG. 104 without the antiferromagnetic layer 32. The element had the same TMR characteristics as those shown in FIGS. 101A and 101B.

FIG. 169 is a schematic cross-sectional view showing other exemplary three-terminal TMR element of the invention. The element of this example has the same structure as that shown in FIG. 105 without the antiferromagnetic layer 32. The element had the same TMR characteristics as those shown in FIGS. 101A and 101B.

FIG. 170 is a schematic cross-sectional view showing other exemplary three-terminal TMR element of the invention. The element of this example has the same structure as that shown in FIG. 106 without the antiferromagnetic layer 32. The element had the same TMR characteristics as those shown in FIGS. 101A and 101B.

FIG. 171 is a schematic cross-sectional view showing other exemplary three-terminal TMR element of the invention. The element of this example has the same structure as that shown in FIG. 107 without the antiferromagnetic layer 32. The element had the same TMR characteristics as those shown in FIGS. 101A and 101B.

FIG. 172 is a schematic cross-sectional view showing other exemplary three-terminal TMR element of the invention. The element of this example has the same structure as that shown in FIG. 108 without the antiferromagnetic layer 32. The element had the same TMR characteristics as those shown in FIGS. 101A and 101B.

FIG. 173 is a schematic cross-sectional view showing other exemplary three-terminal TMR element of the invention. The element of this example has the same structure as that shown in FIG. 109 without the antiferromagnetic layer 32. The element had the same TMR characteristics as those shown in FIGS. 101A and 101B.

FIG. 174 is a schematic cross-sectional view showing other exemplary three-terminal TMR element of the invention. The element of this example has the same structure as that shown in FIG. 110 without the antiferromagnetic layer 32. The element had the same TMR characteristics as those shown in FIGS. 101A and 101B.

FIG. 175 is a schematic cross-sectional view showing other exemplary three-terminal TMR element of the invention. The element of this example has the same structure as that shown in FIG. 111 without the antiferromagnetic layer 32. The element had the same TMR characteristics as those shown in FIGS. 101A and 101B.

FIG. 176 is a schematic cross-sectional view showing other exemplary three-terminal TMR element of the invention. The element of this example has the same structure as that shown in FIG. 112 without the antiferromagnetic layer 32. The element had the same TMR characteristics as those shown in FIGS. 101A and 101B.

FIG. 177 is a schematic cross-sectional view showing other exemplary three-terminal TMR element of the invention. The element of this example has the same structure as that shown in FIG. 113 without the antiferromagnetic layer 32. The element had the same TMR characteristics as those shown in FIGS. 101A and 101B.

FIG. 178 is a schematic cross-sectional view showing other exemplary three-terminal TMR element of the invention. The element of this example has the same structure as that shown in FIG. 114 without the antiferromagnetic layer 32. The element had the same TMR characteristics as those shown in FIGS. 101A and 101B.

FIG. 179 is a schematic cross-sectional view showing other exemplary three-terminal TMR element of the invention. The element of this example has the same structure as that shown in FIG. 115 without the antiferromagnetic layer 32. The element had the same TMR characteristics as those shown in FIGS. 101A and 101B.

FIG. 180 is a schematic cross-sectional view showing other exemplary three-terminal TMR element of the invention. The element of this example has the same structure as that shown in FIG. 116 without the antiferromagnetic layer 32. The element had the same TMR characteristics as those shown in FIGS. 101A and 101B.

FIG. 181 is a schematic cross-sectional view showing other exemplary three-terminal TMR element of the invention. The element of this example has the same structure as that shown in FIG. 117 without the antiferromagnetic layer 32. The element had the same TMR characteristics as those shown in FIGS. 101A and 101B.

FIG. 182 is a schematic cross-sectional view showing other exemplary three-terminal TMR element of the invention. The element of this example has the same structure as that shown in FIG. 118 without the antiferromagnetic layer 32. The element had the same TMR characteristics as those shown in FIGS. 101A and 101B.

FIG. 183 is a schematic cross-sectional view showing other exemplary three-terminal TMR element of the invention. The element of this example has the same structure as that shown in FIG. 119 without the antiferromagnetic layer 32. The element had the same TMR characteristics as those shown in FIGS. 101A and 101B.

FIG. 184 is a schematic cross-sectional view showing other exemplary three-terminal TMR element of the invention. The element of this example has the same structure as that shown in FIG. 120 without the antiferromagnetic layer 32. The element had the same TMR characteristics as those shown in FIGS. 101A and 101B.

FIG. 185 is a schematic cross-sectional view showing other exemplary three-terminal TMR element of the invention. The element of this example has the same structure as that shown in FIG. 121 without the antiferromagnetic layer 32. The element had the same TMR characteristics as those shown in FIGS. 101A and 101B.

FIG. 186 is a schematic cross-sectional view showing other exemplary three-terminal TMR element of the invention. The element of this example has the same structure as that shown in FIG. 122 without the antiferromagnetic layer 32. The element had the same TMR characteristics as those shown in FIGS. 101A and 101B.

FIG. 187 is a schematic cross-sectional view showing other exemplary three-terminal TMR element of the invention. The element of this example has the same structure as that shown in FIG. 123 without the antiferromagnetic layer 32. The element had the same TMR characteristics as those shown in FIGS. 101A and 101B.

FIG. 188 is a schematic cross-sectional view showing other exemplary three-terminal TMR element of the invention. The element of this example has the same structure as that shown in FIG. 124 without the antiferromagnetic layer 32. The element had the same TMR characteristics as those shown in FIGS. 101A and 101B.

FIG. 189 is a schematic cross-sectional view showing other exemplary three-terminal TMR element of the invention. The element of this example has the same structure as that shown in FIG. 125 without the antiferromagnetic layer 32. The element had the same TMR characteristics as those shown in FIGS. 101A and 101B.

FIG. 190 is a schematic cross-sectional view showing other exemplary three-terminal TMR element of the invention. The element of this example has the same structure as that shown in FIG. 126 without the antiferromagnetic layer 32. The element had the same TMR characteristics as those shown in FIGS. 101A and 101B.

FIG. 191 is a schematic cross-sectional view showing other exemplary three-terminal TMR element of the invention. The element of this example has the same structure as that shown in FIG. 127 without the antiferromagnetic layer 32. The element had the same TMR characteristics as those shown in FIGS. 101A and 101B.

FIG. 192 is a schematic cross-sectional view showing other exemplary three-terminal TMR element of the invention. The element of this example has the same structure as that shown in FIG. 128 without the antiferromagnetic layer 32. The element had the same TMR characteristics as those shown in FIGS. 101A and 101B.

FIG. 193 is a schematic cross-sectional view showing other exemplary three-terminal TMR element of the invention. The element of this example has the same structure as that shown in FIG. 129 without the antiferromagnetic layer 32. The element had the same TMR characteristics as those shown in FIGS. 101A and 101B.

FIG. 194 is a schematic cross-sectional view showing other exemplary three-terminal TMR element of the invention. The element of this example has the same structure as that shown in FIG. 130 without the antiferromagnetic layer 32. The element had the same TMR characteristics as those shown in FIGS. 101A and 101B.

FIG. 195 is a schematic cross-sectional view showing other exemplary three-terminal TMR element of the invention. The element of this example has the same structure as that shown in FIG. 131 without the antiferromagnetic layer 32. The element had the same TMR characteristics as those shown in FIGS. 101A and 101B.

FIG. 196 is a schematic cross-sectional view showing other exemplary three-terminal TMR element of the invention. The element of this example has the same structure as that shown in FIG. 132 without the antiferromagnetic layer 32. The element had the same TMR characteristics as those shown in FIGS. 101A and 101B.

FIG. 197 is a schematic cross-sectional view showing other exemplary three-terminal TMR element of the invention. The element of this example has the same structure as that shown in FIG. 100 without the antiferromagnetic layer 31. Removal of the antiferromagnetic layer 31 eases magnetization rotation of the ferromagnetic metal layer 41. The element had the same TMR characteristics as those shown in FIGS. 101A and 101B.

FIG. 198 is a schematic cross-sectional view showing other exemplary three-terminal TMR element of the invention. The element of this example has the same structure as that shown in FIG. 102 without the antiferromagnetic layer 31. The element had the same TMR characteristics as those shown in FIGS. 101A and 101B.

FIG. 199 is a schematic cross-sectional view showing other exemplary three-terminal TMR element of the invention. The element of this example has the same structure as that shown in FIG. 103 without the antiferromagnetic layer 31. The element had the same TMR characteristics as those shown in FIGS. 101A and 101B.

FIG. 200 is a schematic cross-sectional view showing other exemplary three-terminal TMR element of the invention. The element of this example has the same structure as that shown in FIG. 104 without the antiferromagnetic layer 31. The element had the same TMR characteristics as those shown in FIGS. 101A and 101B.

FIG. 201 is a schematic cross-sectional view showing other exemplary three-terminal TMR element of the invention. The element of this example has the same structure as that shown in FIG. 105 without the antiferromagnetic layer 31. The element had the same TMR characteristics as those shown in FIGS. 101A and 101B.

FIG. 202 is a schematic cross-sectional view showing other exemplary three-terminal TMR element of the invention. The element of this example has the same structure as that shown in FIG. 106 without the antiferromagnetic layer 31. The element had the same TMR characteristics as those shown in FIGS. 101A and 101B.

FIG. 203 is a schematic cross-sectional view showing other exemplary three-terminal TMR element of the invention. The element of this example has the same structure as that shown in FIG. 107 without the antiferromagnetic layer 31. The element had the same TMR characteristics as those shown in FIGS. 101A and 101B.

FIG. 204 is a schematic cross-sectional view showing other exemplary three-terminal TMR element of the invention. The element of this example has the same structure as that shown in FIG. 108 without the antiferromagnetic layer 31. The element had the same TMR characteristics as those shown in FIGS. 101A and 101B.

FIG. 205 is a schematic cross-sectional view showing other exemplary three-terminal TMR element of the invention. The element of this example has the same structure as that shown in FIG. 109 without the antiferromagnetic layer 31. The element had the same TMR characteristics as those shown in FIGS. 101A and 101B.

FIG. 206 is a schematic cross-sectional view showing other exemplary three-terminal TMR element of the invention. The element of this example has the same structure as that shown in FIG. 110 without the antiferromagnetic layer 31. The element had the same TMR characteristics as those shown in FIGS. 101A and 101B.

FIG. 207 is a schematic cross-sectional view showing other exemplary three-terminal TMR element of the invention. The element of this example has the same structure as that shown in FIG. 111 without the antiferromagnetic layer 31. The element had the same TMR characteristics as those shown in FIGS. 101A and 101B.

FIG. 208 is a schematic cross-sectional view showing other exemplary three-terminal TMR element of the invention. The element of this example has the same structure as that shown in FIG. 112 without the antiferromagnetic layer 31. The element had the same TMR characteristics as those shown in FIGS. 101A and 101B.

FIG. 209 is a schematic cross-sectional view showing other exemplary three-terminal TMR element of the invention. The element of this example has the same structure as that shown in FIG. 113 without the antiferromagnetic layer 31. The element had the same TMR characteristics as those shown in FIGS. 101A and 101B.

FIG. 210 is a schematic cross-sectional view showing other exemplary three-terminal TMR element of the invention. The element of this example has the same structure as that shown in FIG. 114 without the antiferromagnetic layer 31. The element had the same TMR characteristics as those shown in FIGS. 101A and 101B.

FIG. 211 is a schematic cross-sectional view showing other exemplary three-terminal TMR element of the invention. The element of this example has the same structure as that shown in FIG. 115 without the antiferromagnetic layer 31. The element had the same TMR characteristics as those shown in FIGS. 101A and 101B.

FIG. 212 is a schematic cross-sectional view showing other exemplary three-terminal TMR element of the invention. The element of this example has the same structure as that shown in FIG. 116 without the antiferromagnetic layer 31. The element had the same TMR characteristics as those shown in FIGS. 101A and 101B.

FIG. 213 is a schematic cross-sectional view showing other exemplary three-terminal TMR element of the invention. According to this example, the lamination film shown in FIG. 149 is formed on the antiferromagnetic layer 31. The element of the present example had the same TMR characteristics as those shown in FIGS. 101A and 101B.

FIG. 214 is a schematic cross-sectional view showing other exemplary three-terminal TMR element of the invention. According to this example, the lamination film shown in FIG. 150 is formed on the antiferromagnetic layer 31. The element of the present example had the same TMR characteristics as those shown in FIGS. 101A and 101B.

FIG. 215 is a schematic cross-sectional view showing other exemplary three-terminal TMR element of the invention. According to this example, the lamination film shown in FIG. 151 is formed on the antiferromagnetic layer 31. The element of the present example had the same TMR characteristics as those shown in FIGS. 101A and 101B.

FIG. 216 is a schematic cross-sectional view showing other exemplary three-terminal TMR element of the invention. According to this example, the lamination film shown in FIG. 152 is formed on the antiferromagnetic layer 31. The element of the present example had the same TMR characteristics as those shown in FIGS. 101A and 101B.

FIG. 217 is a schematic cross-sectional view showing other exemplary three-terminal TMR element of the invention. According to this example, the lamination film shown in FIG. 153 is formed on the antiferromagnetic layer 31. The element of the present example had the same TMR characteristics as those shown in FIGS. 101A and 101B.

FIG. 218 is a schematic cross-sectional view showing other exemplary three-terminal TMR element of the invention. According to this example, the lamination film shown in FIG. 154 is formed on the antiferromagnetic layer 31. The element of the present example had the same TMR characteristics as those shown in FIGS. 101A and 101B.

FIG. 219 is a schematic cross-sectional view showing other exemplary three-terminal TMR element of the invention. According to this example, the lamination film shown in FIG. 155 is formed on the antiferromagnetic layer 31. The element of the present example had the same TMR characteristics as those shown in FIGS. 101A and 101B.

FIG. 220 is a schematic cross-sectional view showing other exemplary three-terminal TMR element of the invention. According to this example, the lamination film shown in FIG. 156 is formed on the antiferromagnetic layer 31. The element of the present example had the same TMR characteristics as those shown in FIGS. 101A and 101B.

FIG. 221 is a schematic cross-sectional view showing other exemplary three-terminal TMR element of the invention. According to this example, the lamination film shown in FIG. 157 is formed on the antiferromagnetic layer 31. The element of the present example had the same TMR characteristics as those shown in FIGS. 101A and 101B.

FIG. 222 is a schematic cross-sectional view showing other exemplary three-terminal TMR element of the invention. According to this example, the lamination film shown in FIG. 158 is formed on the antiferromagnetic layer 31. The element of the present example had the same TMR characteristics as those shown in FIGS. 101A and 101B.

FIG. 223 is a schematic cross-sectional view showing other exemplary three-terminal TMR element of the invention. According to this example, the lamination film shown in FIG. 159 is formed on the antiferromagnetic layer 31. The element of the present example had the same TMR characteristics as those shown in FIGS. 101A and 101B.

FIG. 224 is a schematic cross-sectional view showing other exemplary three-terminal TMR element of the invention. According to this example, the lamination film shown in FIG. 160 is formed on the antiferromagnetic layer 31. The element of the present example had the same TMR characteristics as those shown in FIGS. 101A and 101B.

FIG. 225 is a schematic cross-sectional view showing other exemplary three-terminal TMR element of the invention. According to this example, the lamination film shown in FIG. 162 is formed on the antiferromagnetic layer 31. The element of the present example had the same TMR characteristics as those shown in FIGS. 101A and 101B.

FIG. 226 is a schematic cross-sectional view showing other exemplary three-terminal TMR element of the invention. According to this example, the lamination film shown in FIG. 162 is formed on the antiferromagnetic layer 31. The element of the present example had the same TMR characteristics as those shown in FIGS. 101A and 101B.

FIG. 227 is a schematic cross-sectional view showing other exemplary three-terminal TMR element of the invention. According to this example, the lamination film shown in FIG. 163 is formed on the antiferromagnetic layer 31. The element of the present example had the same TMR characteristics as those shown in FIGS. 101A and 101B.

FIG. 228 is a schematic cross-sectional view showing other exemplary three-terminal TMR element of the invention. According to this example, the lamination film shown in FIG. 164 is formed on the antiferromagnetic layer 31. The element of the present example had the same TMR characteristics as those shown in FIGS. 101A and 101B. In the examples shown in FIGS. 102 to 228, the bias voltage $V_2$ may be applied between the ferromagnetic metal layers 41 (414) and 42 (424).

FIG. 229 is a schematic perspective view of a magnetic head provided with a magnetic sensor incorporating a three-terminal TMR element 1 of the invention. The magnetic head is provided with the three-terminal TMR element 1, Au electrodes 61 and a NiFe upper shield/lower core 60 with a thickness of 1 mm on a base 66. Coils 64 and an upper core 65 are further formed thereon. The three-terminal TMR element 1 serves as a reader while the upper core 65 and the upper shield/lower core 60 serve as a writer. An $Al_2O_3$ insulating layers 62 will prevent an electric leak between the upper magnetic layer and the intermediate magnetic layer of the three-terminal TMR element 1 and an electric leak between the lower magnetic layer and the intermediate magnetic layer of the element 1. A NiFe lower shield/electrode 63 is used to form an electrode terminal that is introduced in the lower magnetic layer of the three-terminal TMR element 1.

FIG. 230 is a schematic view showing an exemplary structure of a magnetic read/write device of the invention. A spindle motor 93 rotates a record medium 91 for magnetically recoding information. An actuator 92 guides a head slider 90 on a track of the record medium 91. Specifically, in a magnetic disk device, a read head and a write head formed on the head slider 90 will move near a predetermined writing position on the record medium 91 to sequentially write and read signals.

Preferably, the actuator 92 is a rotary actuator. The write signals are written on the medium by the write head via a signal processor 94, and the signals are obtained based on an output from the read head via the signal processor 94. For moving the read head on a predetermined recoding track, a highly-sensitive output from the read head is used to detect the position on the track and the actuator is controlled to align the head slider.

Although only a single head slider 90 and a single recoding medium 91 are shown in FIG. 230, they may be used in multiple. The recoding medium 91 may allow writing information on both sides. When information should be written on both disk faces, the head sliders 90 are arranged on both sides of the disk. The magnetic writing device with the above-described three-terminal TMR element has superior characteristics for coping with a high density than a magnetic writing device provided with a conventional magnetic sensor.

The present invention provides a three-terminal ferromagnetic tunnel element whose magnetoresistance has an improved bias voltage characteristic due to a bias voltage applied to one of the tunnel junctions. Further, by employing half-metallic ferromagnets in the three-terminal ferromagnetic tunnel element, enhancement of the magnetoresistance to twice the level of conventional ferromagnetic tunnels is stably obtained.

What is claimed is:

1. A ferromagnetic tunnel magnetoresistive element, comprising: a first antiferromagnetic layer; a half-metallic ferromagnetic layer formed on the first antiferromagnetic layer; a first insulating barrier layer formed on the first half-metallic ferromagnetic layer; a first ferromagnetic metal layer formed on the first insulating barrier layer; a second insulating barrier layer formed on the first ferromagnetic metal layer; a second ferromagnetic metal layer formed on the second insulating barrier layer; and a second antiferromagnetic layer formed on the second ferromagnetic metal layer, wherein the element further comprises a first terminal for applying a first bias voltage between the half-metallic ferromagnetic layer and the second ferromagnetic metal layer, and a second terminal for applying a second bias voltage between the first ferromagnetic metal layer and the half-metallic ferromagnetic layer or the second ferromagnetic metal layer.

2. A ferromagnetic tunnel magnetoresistive element according to claim 1, wherein the first ferromagnetic metal layer is formed of a lamination of three ferromagnetic metal layers.

3. A magnetic head provided with a magnetoresistive element comprising: a first antiferromagnetic layer; a half-metallic ferromagnetic layer formed on the first antiferromagnetic layer; a first insulating barrier layer formed on the first half-metallic ferromagnetic layer; a first ferromagnetic metal layer formed on the first insulating barrier layer; a second insulating barrier layer formed on the first ferromagnetic metal layer; a second ferromagnetic metal layer formed on the second insulating barrier layer; and a second antiferromagnetic layer formed on the second ferromagnetic metal layer, wherein the element further comprises a first terminal for applying a first bias voltage between the half-metallic ferromagnetic layer and the second ferromagnetic metal layer, and a second terminal for applying a second bias voltage between the first ferromagnetic metal layer and the half-metallic ferromagnetic layer or the second ferromagnetic metal layer.

4. A magnetic head according to claim 3, wherein the first ferromagnetic metal layer is formed of a lamination of three ferromagnetic metal layers.

* * * * *